US012813151B2

(12) United States Patent
Watabe et al.

(10) Patent No.: US 12,813,151 B2
(45) Date of Patent: Nov. 24, 2026

(54) FABRICATING METHOD OF LIGHT-EMITTING DEVICE COMPRISING PATTERNING LIGHT-EMITTING LAYER IN LIGHTING THAT DOES NOT COMPRISE VISIBLE LIGHT WITH SHORT WAVELENGTH

(71) Applicant: Semiconductor Energy Laboratory Co., Ltd., Kanagawa-ken (JP)

(72) Inventors: Takeyoshi Watabe, Atsugi (JP); Nobuharu Ohsawa, Zama (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 547 days.

(21) Appl. No.: 18/133,059

(22) Filed: Apr. 11, 2023

(65) Prior Publication Data

US 2023/0337512 A1 Oct. 19, 2023

(30) Foreign Application Priority Data

Apr. 15, 2022 (JP) ................................ 2022-067439
Jul. 4, 2022 (JP) ................................ 2022-107645

(51) Int. Cl.
*H10K 71/20* (2023.01)

(52) U.S. Cl.
CPC ................................ *H10K 71/233* (2023.02)

(58) Field of Classification Search
None
See application file for complete search history.

(56) References Cited

U.S. PATENT DOCUMENTS

| | | | |
|---|---|---|---|
| 5,953,985 | A | 9/1999 | Kobayashi |
| 6,120,338 | A | 9/2000 | Hirano et al. |
| 11,094,903 | B2 | 8/2021 | Ohsawa et al. |
| 11,588,125 | B2 | 2/2023 | Ohsawa et al. |

(Continued)

FOREIGN PATENT DOCUMENTS

| | | |
|---|---|---|
| JP | 2000-036385 A | 2/2000 |
| JP | 2003-059663 A | 2/2003 |

(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

(Continued)

*Primary Examiner* — Daniel Whalen
(74) *Attorney, Agent, or Firm* — Husch Blackwell LLP

(57) ABSTRACT

An electronic device or a light-emitting device with high design flexibility and favorable reliability is provided by the following steps. A light-emitting layer containing organic compounds is formed over a substrate provided with a first electrode, the substrate is held in lighting of a light source whose shortest-wavelength peak among spectrum peaks is positioned at a wavelength longer than a longest-wavelength absorption edge among absorption edges in absorption spectra of the organic compounds, a sacrificial layer is formed over the light-emitting layer, at least the light-emitting layer is processed into an island shape by a lithography method, and a second electrode is formed over the light-emitting layer.

19 Claims, 50 Drawing Sheets

(56) References Cited

U.S. PATENT DOCUMENTS

| | | | | |
|---|---|---|---|---|
| 2002/0072139 | A1 | 6/2002 | Kashiwabara | |
| 2011/0148290 | A1 | 6/2011 | Oota | |
| 2012/0252150 | A1* | 10/2012 | Hiroki | H10K 71/00 438/34 |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2015/0060826 | A1 | 3/2015 | Matsumoto. et al. | |
| 2015/0069360 | A1 | 3/2015 | Sato | |
| 2015/0076476 | A1 | 3/2015 | Odaka et al. | |
| 2016/0172595 | A1 | 6/2016 | Malinowski et al. | |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2018/0190908 | A1 | 7/2018 | Ke et al. | |
| 2020/0203662 | A1 | 6/2020 | Mollard et al. | |
| 2021/0193975 | A1* | 6/2021 | Kaiho | H10K 71/00 |
| 2022/0223671 | A1 | 7/2022 | Yamazaki et al. | |
| 2023/0006140 | A1 | 1/2023 | Nakamura et al. | |
| 2023/0009750 | A1 | 1/2023 | Yamazaki et al. | |
| 2023/0209851 | A1 | 6/2023 | Ohsawa et al. | |

FOREIGN PATENT DOCUMENTS

| | | | |
|---|---|---|---|
| JP | 2008-098106 | A | 4/2008 |
| JP | 2008-147072 | A | 6/2008 |
| JP | 2008-251270 | A | 10/2008 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2018-201012 | A | 12/2018 |
| JP | 2019-179696 | A | 10/2019 |
| JP | 2020-160305 | A | 10/2020 |
| WO | WO-2018/087625 | | 5/2018 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

FIG. 20A
100C
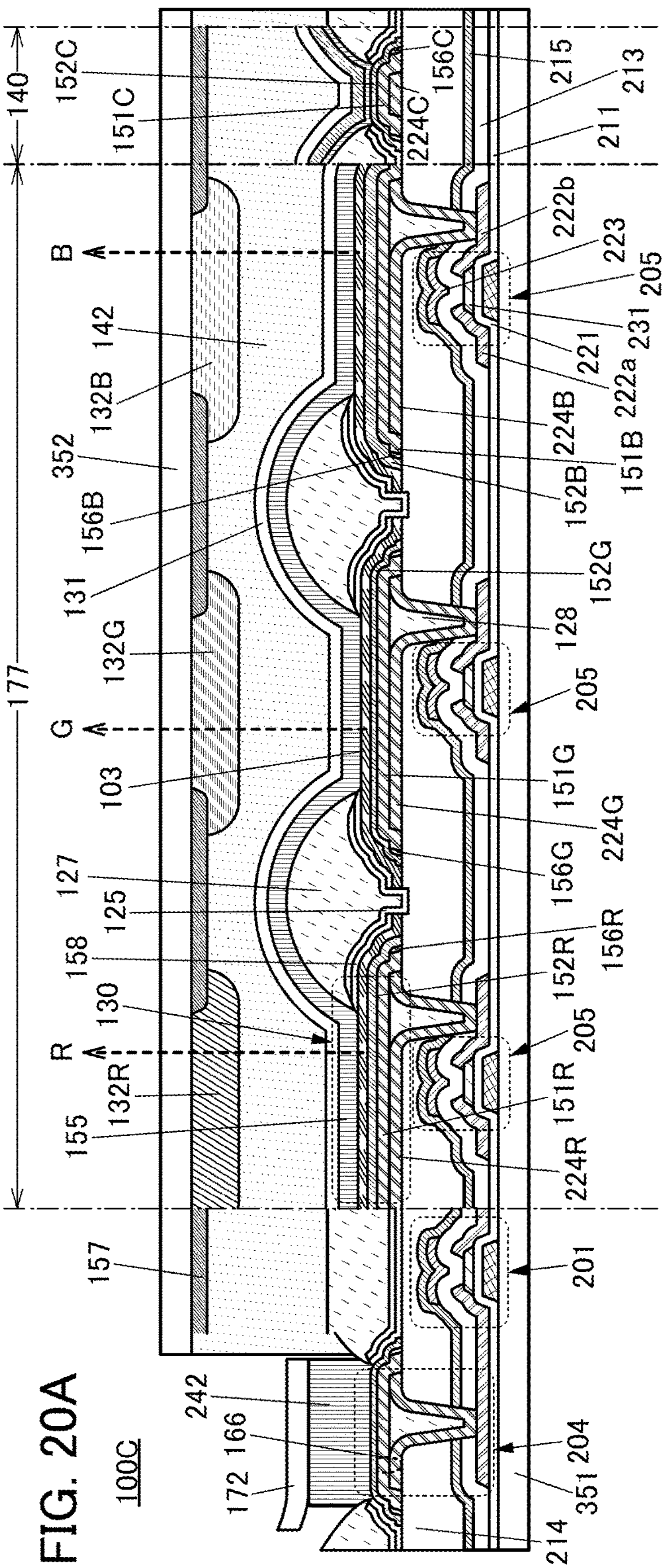
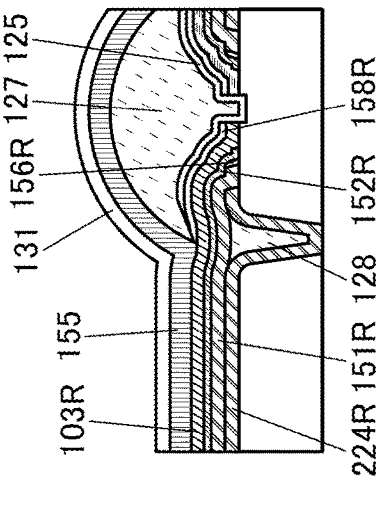
FIG. 20B
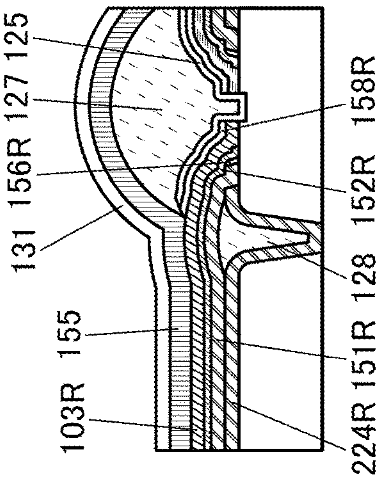
FIG. 20C
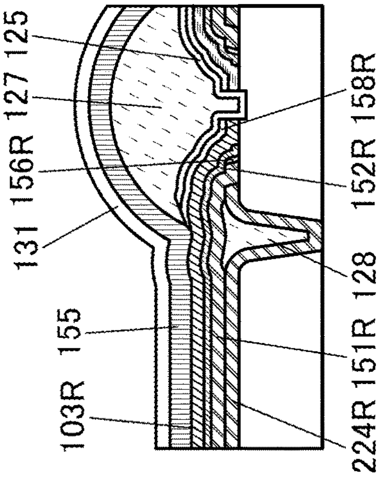
FIG. 20D

FABRICATING METHOD OF LIGHT-EMITTING DEVICE COMPRISING PATTERNING LIGHT-EMITTING LAYER IN LIGHTING THAT DOES NOT COMPRISE VISIBLE LIGHT WITH SHORT WAVELENGTH

BACKGROUND OF THE INVENTION

1. Field of the Invention

One embodiment of the present invention relates to a light-emitting device, a display module, an electronic device, and a method for fabricating any of them.

Note that one embodiment of the present invention is not limited to the above technical field. Examples of the technical field of one embodiment of the present invention include a semiconductor device, a light-emitting apparatus, a power storage device, a memory device, an electronic device, a lighting device, an input device (e.g., a touch sensor), an input/output device (e.g., a touch panel), a method for driving any of them, and a method for fabricating any of them.

2. Description of the Related Art

Light-emitting devices (also referred to as light-emitting elements) including organic compounds and utilizing electroluminescence (EL) have been put to practical use. In the basic structure of such organic EL devices, an organic compound layer containing a light-emitting material is sandwiched between a pair of electrodes. Carriers are injected by application of voltage to the device, and recombination energy of the carriers is used, whereby light emission can be obtained from the light-emitting material.

Light-emitting apparatuses including light-emitting devices have been developed, for example. Light-emitting devices utilizing an EL phenomenon (also referred to as EL devices or EL elements) have features such as ease of reduction in thickness and weight, high-speed response to input signals, and capability of DC constant voltage driving, and have been used in light-emitting apparatuses.

Recent light-emitting apparatuses have been expected to be applied to a variety of uses. Usage examples of large-sized light-emitting apparatuses include a television device for home use (also referred to as a TV or a television receiver), digital signage, and a public information display (PID). In addition, a smartphone, a tablet terminal, and the like each including a touch panel are being developed as portable information terminals.

Higher-resolution light-emitting apparatuses have been required. For example, devices for virtual reality (VR), augmented reality (AR), substitutional reality (SR), or mixed reality (MR) are given as devices requiring high-resolution light-emitting apparatuses and have been actively developed.

Patent Document 1 discloses a light-emitting apparatus using an organic EL device (also referred to as an organic EL element) for VR. Patent Document 2 discloses a light-emitting device with a low driving voltage and high reliability that includes an electron-injection layer formed using a mixed film of a transition metal and an organic compound including an unshared electron pair.

REFERENCE

Patent Documents

[Patent Document 1] PCT International Publication No. 2018/087625

[Patent Document 2] Japanese Published Patent Application No. 2018-201012

SUMMARY OF THE INVENTION

An object of one embodiment of the present invention is to provide a light-emitting apparatus with high design flexibility. Another object of one embodiment of the present invention is to provide a light-emitting apparatus with high display quality. Another object of one embodiment of the present invention is to provide a high-resolution light-emitting apparatus. Another object of one embodiment of the present invention is to provide a high-definition light-emitting apparatus. Another object of one embodiment of the present invention is to provide a highly reliable light-emitting apparatus. Another object of one embodiment of the present invention is to provide a novel light-emitting apparatus that is highly convenient, useful, or reliable. Another object of one embodiment of the present invention is to provide a novel display module that is highly convenient, useful, or reliable. Another object of one embodiment of the present invention is to provide a novel electronic device that is highly convenient, useful, or reliable. Another object of one embodiment of the present invention is to provide a novel light-emitting apparatus, a novel display module, a novel electronic device, or a novel semiconductor device.

Note that the description of these objects does not preclude the existence of other objects. One embodiment of the present invention does not need to achieve all of these objects. Other objects can be derived from the description of the specification, the drawings, and the claims.

One embodiment of the present invention is a method for fabricating a light-emitting device, including the steps of forming a light-emitting layer containing organic compounds over a substrate provided with a first electrode, holding the substrate in lighting of a light source whose shortest-wavelength peak among spectrum peaks is positioned at a wavelength longer than a longest-wavelength absorption edge among absorption edges in absorption spectra of the organic compounds, forming a sacrificial layer over the light-emitting layer, processing at least the light-emitting layer into an island shape by a lithography method, and forming a second electrode over the light-emitting layer.

In the above embodiment, it is preferred that at least part of the sacrificial layer over the light-emitting layer be removed and then the substrate be held in the lighting.

One embodiment of the present invention is a method for fabricating a light-emitting device, including the steps of forming a light-emitting layer containing organic compounds over a substrate provided with a first electrode, forming a sacrificial layer over the light-emitting layer, processing at least the light-emitting layer into an island shape by a lithography method, removing at least part of the sacrificial layer over the light-emitting layer, holding the substrate in lighting of a light source whose shortest-wavelength peak among spectrum peaks is positioned at a wavelength longer than a longest-wavelength absorption edge among absorption edges in absorption spectra of the organic compounds, and forming a second electrode over the light-emitting layer.

In the above embodiment, an organic compound that has the longest-wavelength absorption edge among the organic compounds contained in the light-emitting layer preferably emits fluorescent light.

In the above embodiment, an organic compound that has the longest-wavelength absorption edge among the organic compounds contained in the light-emitting layer is preferably not a complex.

In the above embodiment, a HOMO level of an organic compound that has the longest-wavelength absorption edge among the organic compounds contained in the light-emitting layer is preferably higher than or equal to −5.8 eV.

One embodiment of the present invention is a method for fabricating a light-emitting device, including the steps of forming a light-emitting layer over a substrate provided with a first electrode, holding the substrate in lighting of a light source whose shortest-wavelength peak among spectrum peaks is positioned at a wavelength longer than or equal to 480 nm, forming a sacrificial layer over the light-emitting layer, processing at least the light-emitting layer into an island shape by a lithography method, and forming a second electrode over the light-emitting layer.

In the above embodiment, it is preferred that at least part of the sacrificial layer over the light-emitting layer be removed and then the substrate be held in the lighting.

One embodiment of the present invention is a method for fabricating a light-emitting device, including the steps of forming a light-emitting layer over a substrate provided with a first electrode, forming a sacrificial layer over the light-emitting layer, processing at least the light-emitting layer into an island shape by a lithography method, removing at least part of the sacrificial layer over the light-emitting layer, holding the substrate in lighting of a light source whose shortest-wavelength peak among spectrum peaks is positioned at a wavelength longer than or equal to 480 nm, and forming a second electrode over the light-emitting layer.

In the above embodiment, the shortest-wavelength peak among the spectrum peaks of the light source is preferably positioned at a wavelength longer than or equal to 500 nm.

In the above embodiment, the shortest-wavelength peak among the spectrum peaks of the light source is preferably positioned at a wavelength longer than or equal to 550 nm.

One embodiment of the present invention is a method for fabricating a light-emitting device, including the steps of forming a light-emitting layer over a substrate provided with a first electrode, holding the substrate in lighting with an illuminance less than or equal to 120 lux, forming a sacrificial layer over the light-emitting layer, processing at least the light-emitting layer into an island shape by a lithography method, and forming a second electrode over the light-emitting layer.

In the above embodiment, it is preferred that at least part of the sacrificial layer over the light-emitting layer be removed and then the substrate be held in the lighting.

One embodiment of the present invention is a method for fabricating a light-emitting device, including the steps of forming a light-emitting layer over a substrate provided with a first electrode, forming a sacrificial layer over the light-emitting layer, processing at least the light-emitting layer into an island shape by a lithography method, removing at least part of the sacrificial layer over the light-emitting layer, holding the substrate in lighting with an illuminance less than or equal to 120 lux, and forming a second electrode over the light-emitting layer.

In the above embodiment, the illuminance is preferably less than or equal to 10 lux.

In the above embodiment, it is preferred that the substrate be held in an atmosphere containing oxygen.

Another embodiment of the present invention is a light-emitting device including an intermediate layer and a second light-emitting layer in addition to the above light-emitting layer between the first electrode and the second electrode described above.

One embodiment of the present invention can provide a light-emitting apparatus with high design flexibility. Another embodiment of the present invention can provide a light-emitting apparatus with high display quality. Another embodiment of the present invention can provide a high-resolution light-emitting apparatus. Another embodiment of the present invention can provide a high-definition light-emitting apparatus. Another embodiment of the present invention can provide a highly reliable light-emitting apparatus. Another embodiment of the present invention can provide a novel light-emitting apparatus that is highly convenient, useful, or reliable. Another embodiment of the present invention can provide a novel display module that is highly convenient, useful, or reliable. Another embodiment of the present invention can provide a novel electronic device that is highly convenient, useful, or reliable. Another embodiment of the present invention can provide a novel light-emitting apparatus, a novel display module, a novel electronic device, or a novel semiconductor device.

Note that the description of these effects does not preclude the existence of other effects. One embodiment of the present invention does not necessarily have all of these effects. Other effects can be derived from the description of the specification, the drawings, and the claims.

BRIEF DESCRIPTION OF THE DRAWINGS

FIGS. 20A to 20D are cross-sectional views each illustrating a structure example of a light-emitting apparatus.

DETAILED DESCRIPTION OF THE INVENTION

Embodiment 1

In this embodiment, a light-emitting device of one embodiment of the present invention will be described.

Figure 1A:
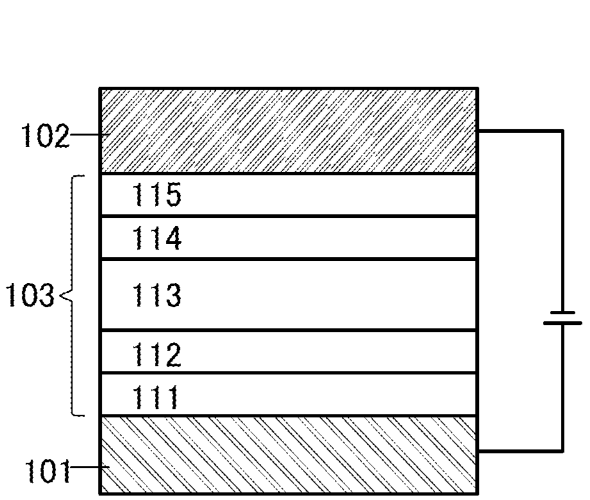
FIGS. 1A to 1C each illustrate a structure of a light-emitting device according to an embodiment.

FIG. 1A illustrates a structure of a light-emitting device 100 of one embodiment of the present invention. As illustrated in FIG. 1A, the light-emitting device 100 includes a first electrode 101, a second electrode 102, and an organic compound layer 103 between the first electrode 101 and the second electrode 102. In the organic compound layer 103, a hole-injection layer 111, a hole-transport layer 112, a light-emitting layer 113, an electron-transport layer 114, and an electron-injection layer 115 are sequentially stacked. The light-emitting layer 113 contains at least a light-emitting substance.

Figure 1B:
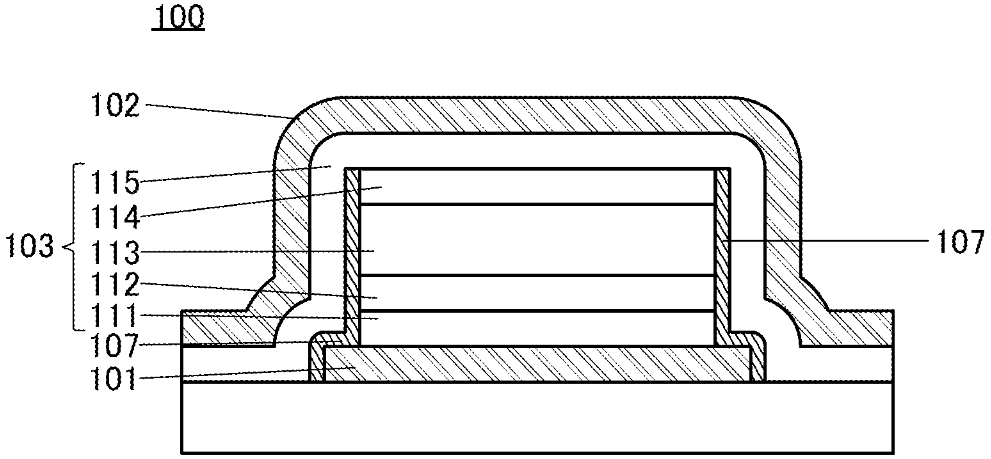
Figure 1C:
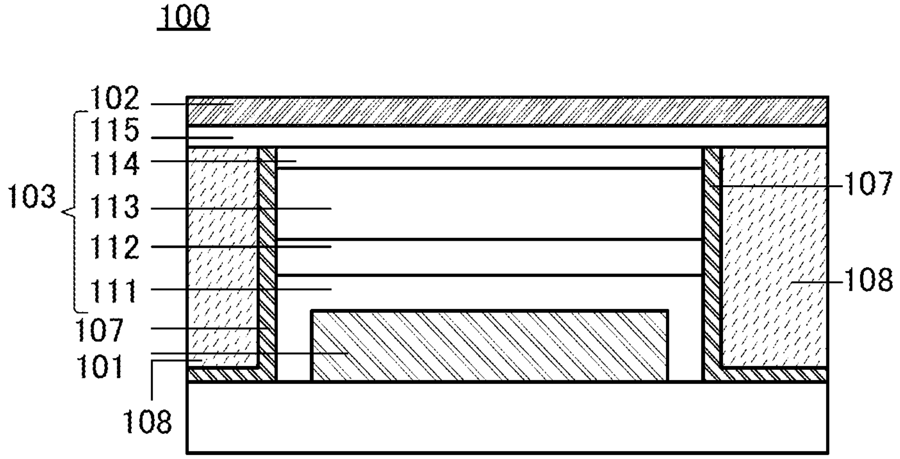

FIGS. 1B and 1C each illustrate an example of a specific structure of the light-emitting device 100 in FIG. 1A. In FIG. 1B, the hole-injection layer 111, the hole-transport layer 112, the light-emitting layer 113, the electron-transport layer 114, and the electron-injection layer 115 are sequentially stacked over the first electrode 101. As illustrated in the cross-sectional view in FIG. 1B, end portions (or side surfaces) of the hole-injection layer 111, the hole-transport layer 112, the light-emitting layer 113, and the electron-transport layer 114 may be positioned on an inner side than an end portion (or side surface) of the first electrode 101. In addition, the end portions (or side surfaces) of the hole-injection layer 111, the hole-transport layer 112, the light-emitting layer 113, and the electron-transport layer 114, and part of the top surface and the end portion (or side surface) of the first electrode 101 are in contact with an insulating layer 107.

Although the electron-injection layer 115 is part of the organic compound layer 103, the shape of the electron-injection layer 115 differs from those of the other layers of the organic compound layer 103 (the hole-injection layer 111, the hole-transport layer 112, the light-emitting layer 113, and the electron-transport layer 114), as illustrated in FIG. 1B. However, the shape of the electron-injection layer 115 can be the same as that of the second electrode 102. The electron-injection layer 115 and the second electrode 102 can be shared by a plurality of light-emitting devices; hence, the fabrication process of the light-emitting device 100 can be simplified and the throughput can be improved.

In the case of forming the light-emitting layers 113 (e.g., R, G, and B light-emitting layers) separately, a film formation method using a shielding mask such as a metal mask is generally used. However, the film formation method using a metal mask has limitations in miniaturization. A finer pattern can be obtained when a hard mask is used for processing of a film to be the hole-injection layer 111, a film to be the hole-transport layer 112, a film to be the light-emitting layer 113, and a film to be the electron-transport layer 114.

However, since an inorganic material is used for the hard mask while organic compounds are used for the film to be the hole-injection layer 111, the film to be the hole-transport layer 112, the film to be the light-emitting layer 113, and the film to be the electron-transport layer 114, substrate holding time (including time for transfer between manufacturing apparatuses and standby time) occurs between the processes, and the substrate is exposed to the air and lighting in the holding time, in some cases.

An organic compound used for the light-emitting layer 113 has a function of being excited by absorbing light. The excited organic compound and water or oxygen in the air might react with each other to generate an oxygen adduct. In other words, when the organic compound is irradiated with light having a wavelength that is absorbed by the organic compound while a molecule having high reactivity such as oxygen exists, a deterioration product might be generated in the organic compound. However, employing evacuation throughout the manufacturing line requires a significant investment.

The present inventors have found out that an environment where lighting is adjusted is suitable for transfer or holding a substrate in which layers containing organic compounds, including the light-emitting layer 113, are stacked. Adjustment of lighting illuminating the light-emitting layer 113 can inhibit generation of a deterioration product in the organic compound even in an atmosphere containing oxygen. For example, generation of a deterioration product in the organic compound can be inhibited even in an atmosphere containing oxygen at higher than or equal to 10%, higher than or equal to 15%, or higher than or equal to 20%.

The substrate is preferably transferred or held in lighting whose spectrum is at a wavelength longer than the absorption edge of the absorption spectrum of an organic compound having the longest-wavelength absorption edge among the organic compounds contained in the light-emitting layer, for example. Thus, the substrate is preferably transferred or held in lighting whose shortest-wavelength peak among light emission spectrum peaks is positioned at a wavelength longer than the absorption edge of the absorption spectrum of the organic compound having the longest-wavelength absorption edge among the organic compounds contained in the light-emitting layer. Alternatively, the substrate is preferably transferred or held in lighting whose emission edge is positioned at a wavelength longer than the absorption edge of the absorption spectrum of the organic compound having the longest-wavelength absorption edge among the organic compounds contained in the light-emitting layer. Since the absorption spectrum of the organic compound does not overlap with the spectrum of the lighting, the organic compound in the light-emitting layer is not photoexcited in an atmosphere containing oxygen; accordingly, generation of a deterioration product can be inhibited.

Note that an absorption edge can be determined as the intersection of a tangent and the lateral axis (representing wavelength) or the baseline. The tangent is drawn at the half maximum of the longest-wavelength shoulder peak or the longest-wavelength peak of the absorption spectrum on a longer wavelength side. An emission edge can be determined as the intersection of a tangent and the lateral axis (representing wavelength) or the baseline. The tangent is drawn at the half maximum of the shortest-wavelength shoulder peak or the shortest-wavelength peak of the spectrum of a light source on a shorter wavelength side.

Specifically, the substrate is preferably transferred or held in lighting of the light source whose shortest-wavelength peak among spectrum peaks is positioned at greater than or equal to 480 nm. The shortest-wavelength peak among the peaks in the spectrum of the light souce is further preferably positioned at greater than or equal to 550 nm, still further preferably greater than or equal to 580 nm. Alternatively, the substrate is preferably transferred or held in lighting of the light source whose emission edge of the spectrum is positioned at greater than or equal to 480 nm. The emission edge of the spectrum of the light source is further preferably positioned at greater than or equal to 550 nm, still further preferably greater than or equal to 580 nm.

Alternatively, the illuminance of the lighting is preferably set less than or equal to 120 lx (lux). It is further preferred to set the illuminance of the lighting less than or equal to 10 lx.

It is preferred to use yellow light (light of a fluorescent lamp or light of a light-emitting diode (LED)) which does not include light with a wavelength shorter than 500 nm for the lighting, for example. It is further preferred to use orange light (light of a fluorescent lamp or light of a light-emitting diode (LED)) which does not include light with a wavelength shorter than 530 nm. Light of a low-pressure sodium lamp can also be used. Light of an incandescent lamp, fluorescent light, light of a light-emitting diode (LED), light of a halogen lamp, or sunlight can be used as long as an optical filter that can shield light with a short wavelength is used. As the optical filter that can shield light with a short wavelength, for example, a band-pass filter or a long-pass filter (short-wavelength cut filter) can be used. The above lighting can result in low illuminance.

When the substrate is held (transferred or on standby) in an environment where the lighting is adjusted, an organic compound having a relatively high HOMO level can be used. For example, an organic compound having a HOMO level higher than or equal to −5.8 eV can be used for the light-emitting layer 113. Alternatively, an organic compound having a HOMO level higher than or equal to −5.6 eV can be used. Further alternatively, an organic compound having a HOMO level higher than or equal to −5.5 eV can be used. Still further alternatively, an organic compound having a HOMO level higher than or equal to −5.4 eV can be used. In the case of using an organic compound having a high HOMO level, irradiation of light with a wavelength that is absorbed by the organic compound is reduced, in which case a highly reliable light-emitting device can be fabricated even when the light-emitting device is exposed to an air atmosphere.

To prevent quenching due to oxygen, an organic compound that emits light from a singlet excited state is preferably used, and an organic compound that emits fluorescent light is further preferably used. Thus, an aromatic compound or a heteroaromatic compound is preferably used, and a compound that does not contain a metal and is not a complex is preferably used.

Figure 2:
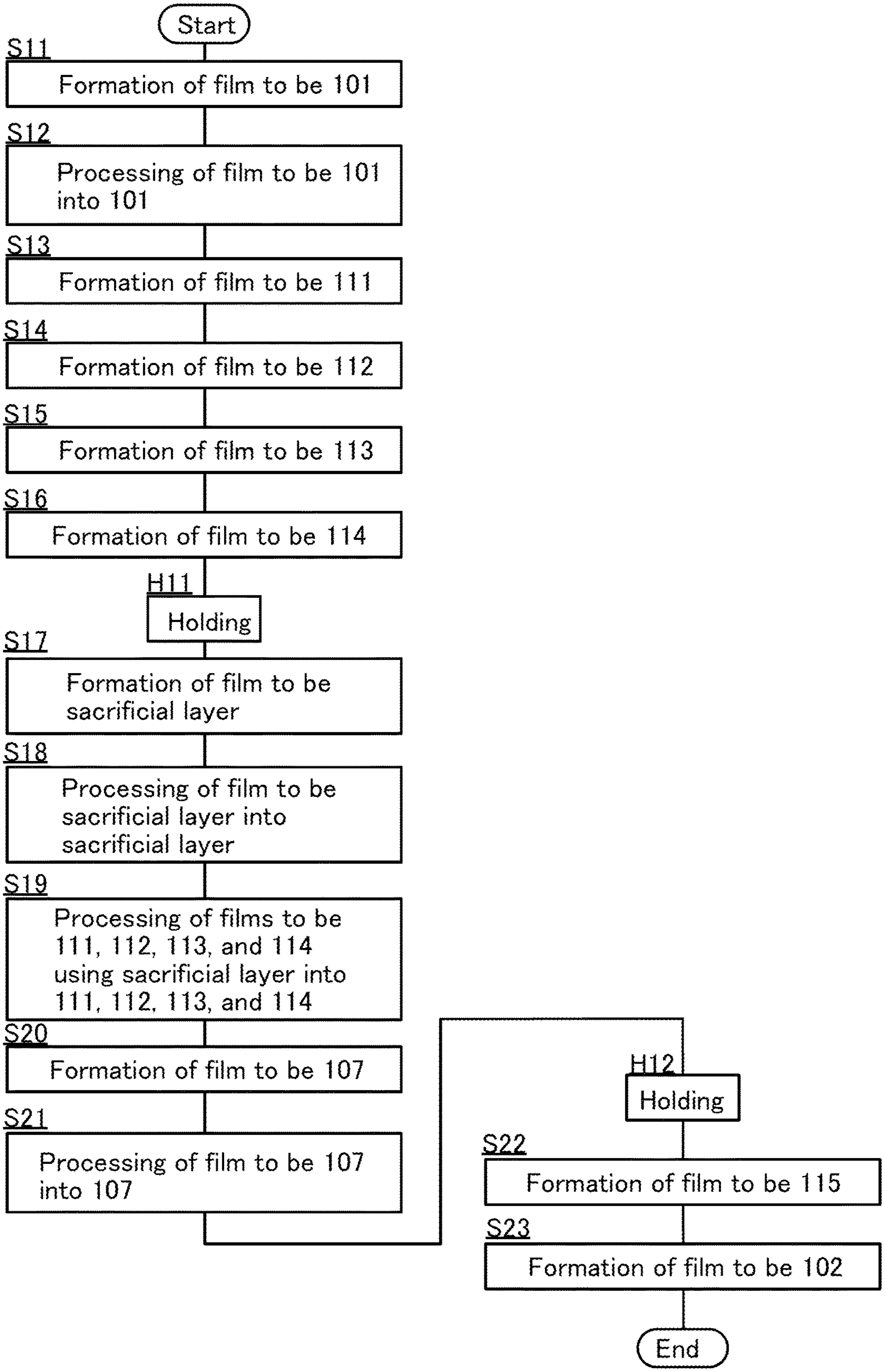
FIG. 2 is a flow chart showing a fabrication process of a light-emitting device according to an embodiment.

A fabrication process of the light-emitting device illustrated in FIG. 1B will be briefly described below with reference to a flow chart shown in FIG. 2. Embodiment 2 can be referred to for the specific description.

The components of the light-emitting device can be formed by repeating film formation and processing using a hard mask.

First, a film to be the first electrode 101 is formed over a substrate using a film formation apparatus (S11). Then, the film to be the first electrode 101 is processed into the first electrode 101 (S12).

Next, the film to be the hole-injection layer 111, the film to be the hole-transport layer 112, the film to be the light-emitting layer 113, and the film to be the electron-transport layer 114 are sequentially formed (S13, S14, S15, and S16).

In the case where the substrate over which the film to be the hole-injection layer 111, the film to be the hole-transport layer 112, the film to be the light-emitting layer 113, and the film to be the electron-transport layer 114 are formed is transferred while being exposed to the air, a substrate holding step (H11) is performed in an environment where lighting is adjusted. In other words, lighting with which an oxygen adduct is not generated in an organic compound contained in the film to be the light-emitting layer 113 is used. Specifically, the wavelength or illuminance of the lighting is preferably adjusted.

After that, a film to be a sacrificial layer is formed (S17). Accordingly, the film to be the light-emitting layer 113 is entirely covered with the film to be the sacrificial layer and is shielded from atmospheric components. Hence, lighting adjustment is not necessarily performed between the step of forming the film to be the sacrificial layer (S17) and the step of processing the film to be the sacrificial layer (S18). Note that in this specification and the like, the sacrificial layer can be referred to as a mask layer when the sacrificial layer functions as a mask.

After the film to be the sacrificial layer is processed, the film to be the electron-transport layer 114 is processed using the sacrificial layer as a mask (S19). The film to be the hole-injection layer 111, the film to be the hole-transport layer 112, and the film to be the light-emitting layer 113 are also processed in this step; accordingly, the hole-injection layer 111, the hole-transport layer 112, the light-emitting layer 113, and the electron-transport layer 114 having exposed side surfaces are formed. Thus, in the case where the substrate is transferred while being exposed to the air in a later step, for example, the substrate is preferably held in an environment where lighting is adjusted.

Next, a film to be the insulating layer 107 is formed (S20). The side surfaces of the hole-injection layer 111, the hole-transport layer 112, the light-emitting layer 113, and the electron-transport layer 114 are covered in this step and thus are shielded from the atmospheric components. In the case where transfer or the like is performed between this step and the subsequent step of processing the film to be the insulating layer 107 (S21), lighting adjustment is not necessarily performed.

Subsequently, the film to be the insulating layer 107 is processed into the insulating layer 107. Since the film to be the insulating layer 107 is processed into the insulating layer 107 here, the top surface of the electron-transport layer 114 is exposed and a layer including the light-emitting layer 113 is exposed to the air. For this reason, it is highly possible that the light-emitting layer 113 is exposed to the air in the case where the substrate is transferred after the step S21. Thus, a substrate holding step (H12) is performed in an environment where lighting is adjusted.

With the insulating layer 107, the end portions (or side surfaces) of the hole-injection layer 111, the hole-transport layer 112, the light-emitting layer 113, and the electron-transport layer 114 can be protected. This can reduce damage to the layers due to a fabrication process and prevent an electrical connection caused by contact with another layer.

Next, a film to be the electron-injection layer 115 and a film to be the second electrode 102 are formed to cover the hole-injection layer 111, the hole-transport layer 112, the light-emitting layer 113, the electron-transport layer 114, and the insulating layer 107 (S22 and S23).

The light-emitting device may have a structure illustrated in FIG. 1C. In this structure, the hole-injection layer 111, the hole-transport layer 112, the light-emitting layer 113, the electron-transport layer 114, and the electron-injection layer 115 are sequentially stacked over the first electrode 101 to cover the first electrode 101. As can be seen from the cross sectional view in FIG. 1C, end portions of the hole-injection layer 111, the hole-transport layer 112, the light-emitting layer 113, and the electron-transport layer 114 are positioned on the outer side than an end portion (or side surface) of the first electrode 101. The insulating layer 107 is in contact with the end portions of the hole-injection layer 111, the hole-transport layer 112, the light-emitting layer 113, and the electron-transport layer 114.

The insulating layer 107 is in contact with the end portions (or side surfaces) of the hole-injection layer 111, the end portions (or side surfaces) of the hole-transport layer 112, the end portions (or side surfaces) of the light-emitting layer 113, and the end portions (or side surfaces) of the electron-transport layer 114. The insulating layer 107 is positioned between an insulating layer 108 and each of the end portions (or side surfaces) of the hole-injection layer 111, the hole-transport layer 112, the light-emitting layer 113, and the electron-transport layer 114. The electron-injection layer 115 is provided over the insulating layer 108, the insulating layer 107, and the electron-transport layer 114. The insulating layer 108 can be formed using an organic compound or an inorganic compound.

When the insulating layer 108 is formed using an organic compound, an acrylic resin, a polyimide resin, an epoxy resin, a polyamide resin, a polyimide-amide resin, a siloxane resin, a benzocyclobutene-based resin, a phenol resin, precursors of these resins, or the like can be used, for example. A photosensitive resin may be used. The photosensitive resin may be a positive-type photosensitive resin or a negative-type photosensitive resin.

When formed using a photosensitive resin, the insulating layer 108 can be formed through only light-exposure and development steps in the fabrication process; thus, the influence on other layers by dry etching, wet etching, or the like can be reduced. A negative photosensitive resin is preferably used, in which case a photomask (light-exposure mask) used in this step can sometimes be used also in a different step.

With the device structures illustrated in FIGS. 1B and 1C, some layers in the organic compound layer 103 are in some cases exposed to the air when being patterned into desired shapes in the fabrication process. Thus, in some cases, an oxygen adduct is generated in an organic compound contained in the hole-injection layer 111, the hole-transport layer 112, the light-emitting layer 113, or the electron-transport layer 114, leading to reductions in reliability and luminance of the light-emitting device.

When lighting irradiating the substrate is adjusted in the fabrication process of the light-emitting device 100 described in Embodiment 1, generation of an oxygen adduct in an organic compound contained in the light-emitting layer 113 can be inhibited, for example. Note that since the electron-injection layer 115, which is a component of the organic compound layer 103, is formed after the formation of the electron-transport layer 114 in this case, the structures of the electron-injection layer 115 and the second electrode 102 are different from those of the other layers in the organic compound layer 103 (the hole-injection layer 111, the hole-transport layer 112, the light-emitting layer 113, and the electron-transport layer 114).

Note that the light-emitting devices 100 having the shapes illustrated in FIGS. 1B and 1C are examples of a device structure that can be subjected to patterning in such a fabrication method, but the shape of the light-emitting device of one embodiment of the present invention is not limited to the shapes. With the device structure of one embodiment of the present invention, reductions in efficiency and reliability in the light-emitting device can be inhibited.

The insulating layer 107 illustrated in each of FIGS. 1B and 1C is not necessarily provided when not needed. For example, when electrical continuity between the electron-injection layer 115 and each of the hole-injection layer 111 and hole-transport layer 112 is sufficiently low, the light-emitting device 100 does not necessarily include the insulating layer 107.

Materials that can be used for the first electrode 101, the second electrode 102, the hole-injection layer 111, the hole-transport layer 112, the light-emitting layer 113, the electron-injection layer 115, and the insulating layer 107 will be described later in an embodiment below.

The structures described in this embodiment can be used in combination with any of the structures described in the other embodiments as appropriate.

Embodiment 2

Figure 3A:
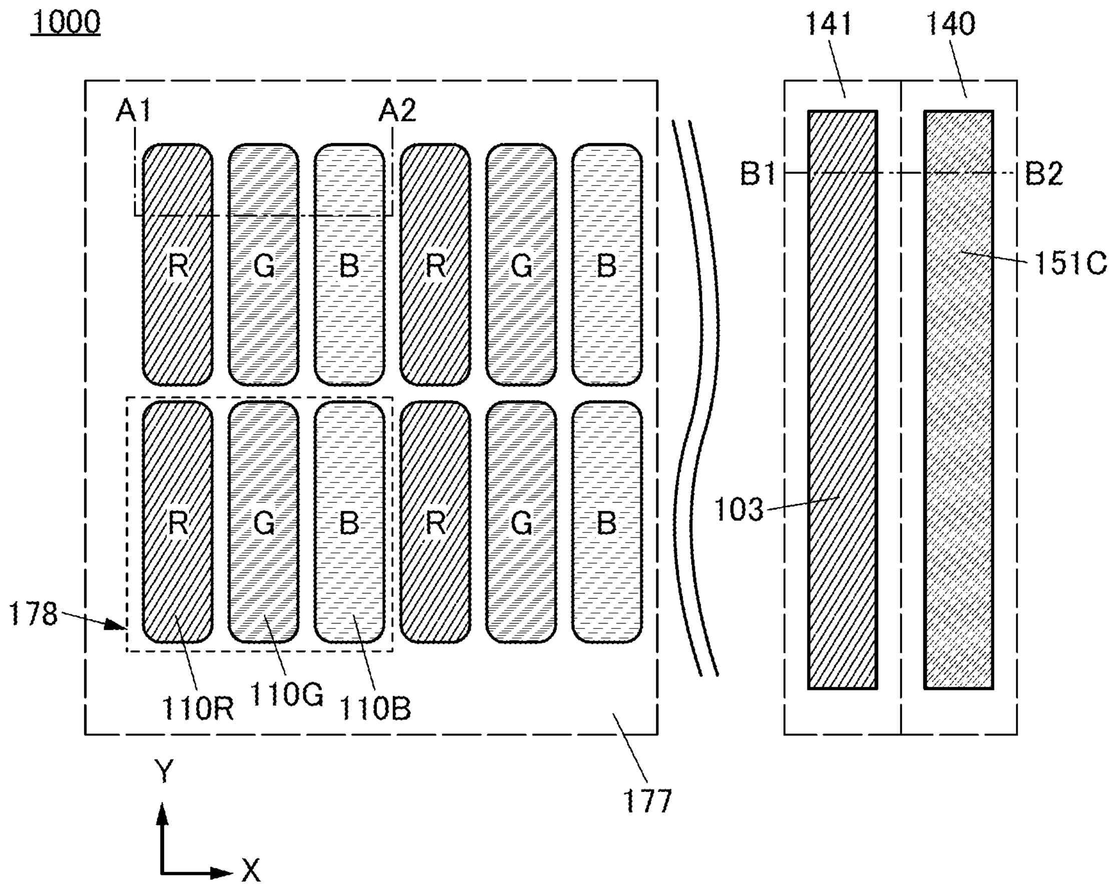
FIGS. 3A and 3B are a top view and a cross-sectional view, respectively, of a light-emitting apparatus.
Figure 3B:
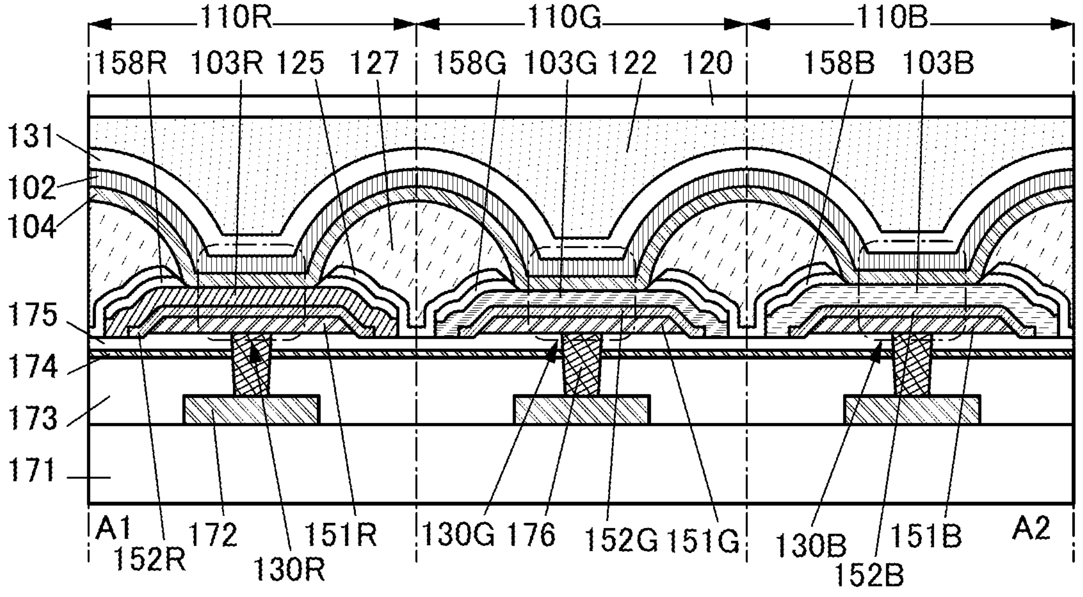

As illustrated as an example in FIGS. 3A and 3B, a plurality of light-emitting devices 130 are formed over an insulating layer 175 to constitute a light-emitting apparatus. Note that the structure of the light-emitting device 100 described in the above embodiment can be used for each of the light-emitting devices 130. In this embodiment, the light-emitting apparatus of one embodiment of the present invention will be described in detail.

A light-emitting apparatus 1000 includes a pixel portion 177 in which a plurality of pixels 178 are arranged in matrix. The pixel 178 includes a subpixel 110R, a subpixel 110G, and a subpixel 110B.

In this specification and the like, for example, matters common to the subpixels 110R, 110G, and 110B are sometimes described using the collective term "subpixel 110". As for components that are distinguished from each other using letters of the alphabet, matters common to the components are sometimes described using reference numerals excluding the letters of the alphabet.

The subpixel 110R emits red light, the subpixel 110G emits green light, and the subpixel 110B emits blue light. Thus, an image can be displayed on the pixel portion 177. Note that in this embodiment, three colors of red (R), green (G), and blue (B) are given as examples of colors of light emitted by subpixels; however, the structure of the present invention is not limited to this structure. That is, subpixels of a different combination of colors may be employed. The number of subpixels is not limited to three, and four or more subpixels may be used, for example. Examples of four subpixels include subpixels emitting light of four colors of R, G, B, and white (W), subpixels emitting light of four colors of R, G, B, and yellow (Y), and four subpixels emitting light of R, G, and B and infrared light (IR).

In this specification and the like, the row direction and the column direction are sometimes referred to as the X direction and the Y direction, respectively. The X direction and the Y direction intersect with each other and are perpendicular to each other, for example.

FIG. 3A illustrates an example where subpixels of different colors are arranged in the X direction and subpixels of the same color are arranged in the Y direction. Note that subpixels of different colors may be arranged in the Y direction, and subpixels of the same color may be arranged in the X direction.

A connection portion 140 and a region 141 may be provided outside the pixel portion 177. The region 141 is preferably positioned between the pixel portion 177 and the connection portion 140, for example. The organic compound layer 103 is provided in the region 141. A conductive layer 151C is provided in the connection portion 140.

Although FIG. 3A illustrates an example where the region 141 and the connection portion 140 are positioned on the right side of the pixel portion 177, the positions of the region 141 and the connection portion 140 are not particularly limited. The number of the regions 141 and the number of the connection portions 140 can each be one or more.

FIG. 3B is an example of a cross-sectional view along the dashed-dotted line A1-A2 in FIG. 3A. As illustrated in FIG. 3B, the light-emitting apparatus 1000 includes an insulating layer 171, a conductive layer 172 over the insulating layer 171, an insulating layer 173 over the insulating layer 171 and the conductive layer 172, an insulating layer 174 over the insulating layer 173, and the insulating layer 175 over the insulating layer 174. The insulating layer 171 is preferably provided over a substrate (not illustrated). An opening reaching the conductive layer 172 is provided in the insulating layers 175, 174, and 173, and a plug 176 is provided to fill the opening.

In the pixel portion 177, the light-emitting device 130 is provided over the insulating layer 175 and the plug 176. A protective layer 131 is provided to cover the light-emitting device 130. A substrate 120 is bonded to the protective layer 131 with a resin layer 122. An inorganic insulating layer 125 and an insulating layer 127 over the inorganic insulating layer 125 may be provided between adjacent light-emitting devices 130.

Although FIG. 3B illustrates cross sections of a plurality of the inorganic insulating layers 125 and a plurality of the insulating layers 127, the inorganic insulating layers 125 are connected to each other and the insulating layers 127 are connected to each other when the light-emitting apparatus 1000 is seen from above. That is, the insulating layer 125 and the insulating layer 127 have openings above first electrodes.

In FIG. 3B, a light-emitting device 130R, a light-emitting device 130G, and a light-emitting device 130B are each illustrated as the light-emitting device 130. The light-emitting devices 130R, 130G, and 130B emit light of different colors. For example, the light-emitting device 130R can emit red light, the light-emitting device 130G can emit green light, and the light-emitting device 130B can emit blue light. Alternatively, the light-emitting device 130R, the light-emitting device 130G, or the light-emitting device 130B may emit visible light of another color or infrared light.

Note that the organic compound layer 103 at least includes a light-emitting layer and can include other functional layers (a hole-injection layer, a hole-transport layer, a hole-blocking layer, an electron-blocking layer, an electron-transport layer, an electron-injection layer, and the like). The organic compound layer 103 and a common layer 104 may collectively include functional layers (a hole-injection layer, a hole-transport layer, a hole-blocking layer, a light-emitting layer, an electron-blocking layer, an electron-transport layer, an electron-injection layer, and the like) included in an EL layer that emits light.

The light-emitting apparatus of one embodiment of the present invention can be, for example, a top-emission light-emitting apparatus where light is emitted in the direction opposite to a substrate over which light-emitting devices are formed. Note that the light-emitting apparatus of one embodiment of the present invention may be of a bottom emission type.

The light-emitting device 130R has a structure as described in Embodiment 1. The light-emitting device 130R includes the first electrode (pixel electrode) including a conductive layer 151R and a conductive layer 152R, an organic compound layer 103R over the first electrode, the common layer 104 over the organic compound layer 103R, and the second electrode (common electrode) 102 over the common layer 104.

Note that the common layer 104 is not necessarily provided. The common layer 104 can reduce damage to the organic compound layer 103R caused in a later step. In the case where the common layer 104 is provided, the common layer 104 may function as an electron-injection layer. In the case where the common layer 104 functions as an electron-injection layer, a stack of the organic compound layer 103R and the common layer 104 corresponds to the organic compound layer 103 in Embodiment 1.

Each of the light-emitting devices 130 has a structure as described in Embodiment 1 and includes the first electrode (pixel electrode) including a conductive layer 151 and a conductive layer 152, the organic compound layer 103 over the first electrode, the common layer 104 over the organic compound layer 103, and the second electrode (common electrode) 102 over the common layer 104.

In the light-emitting device, one of the pixel electrode and the common electrode functions as an anode and the other functions as a cathode. Hereinafter, description is made on the assumption that the pixel electrode functions as the anode and the common electrode functions as the cathode unless otherwise specified.

The organic compound layer 103R, the organic compound layer 103G, and the organic compound layer 103B are island-shaped layers that are independent of each other. Alternatively, an organic compound layer of the light-emitting devices of one emission color may be independent of an organic compound layer of the light-emitting devices of another emission color. Providing the island-shaped organic compound layer 103 in each of the light-emitting devices 130 can suppress leakage current between the adjacent light-emitting devices 130 even in a high-resolution light-emitting apparatus. This can prevent crosstalk, so that a light-emitting apparatus with extremely high contrast can be obtained. Specifically, a light-emitting apparatus having high current efficiency at low luminance can be obtained.

The organic compound layer 103 is preferably provided to cover top and side surfaces of the first electrode (pixel electrode) of the light-emitting device 130. In that case, the aperture ratio of the light-emitting apparatus 1000 can be easily increased as compared to the structure where an edge portion of the organic compound layer 103 is positioned inward from an edge portion of the pixel electrode. Covering the side surface of the pixel electrode of the light-emitting device 130 with the organic compound layer 103 can inhibit the pixel electrode from being in contact with the second electrode 102; hence, a short circuit of the light-emitting device 130 can be inhibited. Furthermore, the distance between a light-emitting region (i.e., a region overlapping the pixel electrode) in the organic compound layer 103 and the edge portion of the organic compound layer 103 can be increased. Since the edge portion of the organic compound layer 103 might be damaged by processing, using a region that is away from the edge portion of the organic compound layer 103 as the light-emitting region can increase the reliability of the light-emitting device 130.

In the light-emitting apparatus of one embodiment of the present invention, the first electrode (pixel electrode) of the light-emitting device may have a stacked-layer structure. For example, in the example illustrated in FIG. 3B, the first electrode of the light-emitting device 130 is a stack of the conductive layer 151 and the conductive layer 152.

In the case where the light-emitting apparatus 1000 is a top-emission light-emitting apparatus, for example, in the pixel electrode of the light-emitting device 130, the conductive layer 151 preferably has high visible light reflectance and the conductive layer 152 preferably has a visible-light-transmitting property and a high work function. The higher the visible light reflectance of the pixel electrode is, the higher the efficiency of extraction of the light emitted by the organic compound layer 103 is. In the case where the pixel electrode functions as an anode, the higher the work function of the pixel electrode is, the easier it is to inject holes into the organic compound layer 103. Accordingly, when the pixel electrode of the light-emitting device 130 is a stack of the conductive layer 151 with high visible light reflectance and the conductive layer 152 with a high work function, the light-emitting device 130 can have high light extraction efficiency and a low driving voltage.

Specifically, the visible light reflectance of the conductive layer 151 is preferably higher than or equal to 40% and lower than or equal to 100%, further preferably higher than or equal to 70% and lower than or equal to 100%, for example. When the conductive layer 152 is used as an electrode having a visible-light-transmitting property, the visible light transmittance is preferably higher than or equal to 40%, for example.

In the case where a film formed after the formation of the pixel electrode having a stacked-layer structure is removed by a wet etching method, for example, a stack including the pixel electrode might be impregnated with a chemical solution used for the etching. When the impregnated chemical solution reaches the pixel electrode, galvanic corrosion between a plurality of layers constituting the pixel electrode might occur, leading to deterioration of the pixel electrode.

In view of the above, the conductive layer 152 is preferably formed to cover the top and side surfaces of the conductive layer 151. When the conductive layer 151 is covered with the conductive layer 152, the impregnated chemical solution does not reach the conductive layer 151; thus, occurrence of galvanic corrosion in the pixel electrode can be inhibited. This allows the light-emitting apparatus 1000 to be fabricated by a high-yield method and to be accordingly inexpensive. In addition, generation of a defect in the light-emitting apparatus 1000 can be inhibited, which makes the light-emitting apparatus 1000 highly reliable.

A metal material can be used for the conductive layer 151, for example. Specifically, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals, for example.

For the conductive layer 152, an oxide containing one or more selected from indium, tin, zinc, gallium, titanium, aluminum, and silicon can be used. For example, it is preferable to use a conductive oxide containing one or more of indium oxide, an indium tin oxide, an indium zinc oxide, zinc oxide, zinc oxide containing gallium, titanium oxide, an indium zinc oxide containing gallium, an indium zinc oxide containing aluminum, an indium tin oxide containing silicon, an indium zinc oxide containing silicon, and the like. In particular, an indium tin oxide containing silicon can be suitably used for the conductive layer 152 because of having a work function of higher than or equal to 4.0 eV, for example.

The conductive layer 151 and the conductive layer 152 may each be a stack of a plurality of layers containing different materials. In that case, the conductive layer 151 may include a layer formed using a material that can be used for the conductive layer 152, such as a conductive oxide. Furthermore, the conductive layer 152 may include a layer formed using a material that can be used for the conductive layer 151, such as a metal material. In the case where the conductive layer 151 is a stack of two or more layers, for example, a layer in contact with the conductive layer 152 can contain the same material as a layer of the conductive layer 152 in contact with the conductive layer 151.

The conductive layer 151 preferably has an end portion with a tapered shape. Specifically, the end portion of the conductive layer 151 preferably has a tapered shape with a taper angle of less than 90°. In that case, the conductive layer 152 provided along the side surface of the conductive layer 151 also has an end portion with a tapered shape. When the end portion of the conductive layer 152 has a tapered shape, coverage with the organic compound layer 103 provided along the side surface of the conductive layer 152 can be improved.

In the case where the conductive layer 151 or the conductive layer 152 has a stacked-layer structure, at least one of the stacked layers preferably has a tapered side surface. The stacked layers of the conductive layer(s) may have different tapered shapes.

Figure 4A:
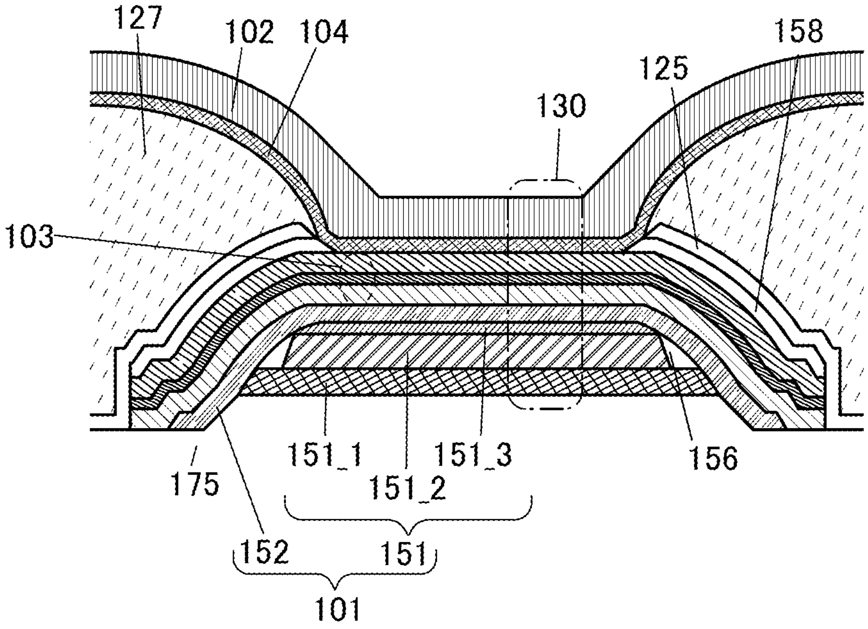
FIGS. 4A to 4D each illustrate a light-emitting device.

FIG. 4A illustrates the case where the conductive layer 151 has a stacked-layer structure of a plurality of layers containing different materials. As illustrated in FIG. 4A, the conductive layer 151 includes a conductive layer 151_1, a conductive layer 151_2 over the conductive layer 151_1, and a conductive layer 151_3 over the conductive layer 151_2. In other words, the conductive layer 151 illustrated in FIG. 4A has a three-layer structure. In the case where the conductive layer 151 is a stack of a plurality of layers as described above, the visible light reflectance of at least one of the layers included in the conductive layer 151 is made higher than that of the conductive layer 152.

In the example illustrated in FIG. 4A, the conductive layer 151_2 is interposed between the conductive layers 151_1 and 151_3. A material that is less likely to change in quality than the conductive layer 151_2 is preferably used for the conductive layers 151_1 and 151_3. The conductive layer 151_1 can be formed using, for example, a material that is less likely to migrate owing to contact with the insulating layer 175 than the material for the conductive layer 151_2. The conductive layer 151_3 can be formed using a material an oxide of which has lower electrical resistivity than an oxide of the material used for the conductive layer 151_2 and which is less likely to be oxidized than the conductive layer 151_2.

In this manner, the structure in which the conductive layer 151_2 is interposed between the conductive layers 151_1 and 151_3 can expand the range of choices for the material for the conductive layer 151_2. The conductive layer 151_2, for example, can thus have higher visible light reflectance than at least one of the conductive layers 151_1 and 151_3. For example, aluminum can be used for the conductive layer 151_2. The conductive layer 151_2 may be formed using an alloy containing aluminum. The conductive layer 151_1 can be formed using titanium; titanium has lower visible light reflectance than aluminum but is less likely to migrate by contact with the insulating layer 175 than aluminum. Furthermore, the conductive layer 151_3 can be formed using titanium; titanium is less likely to be oxidized than aluminum and an oxide of titanium has lower electrical resistivity than aluminum oxide, although titanium has lower visible light reflectance than aluminum.

The conductive layer 151_3 may be formed using silver or an alloy containing silver. Silver is characterized by its visible light reflectance higher than that of titanium. In addition, silver is characterized by being less likely to be oxidized than aluminum, and silver oxide is characterized by its electrical resistivity lower than that of aluminum oxide. Thus, the conductive layer 151_3 formed using silver or an alloy containing silver can suitably increase the visible light reflectance of the conductive layer 151 and inhibit an increase in the electric resistance of the pixel electrode due to oxidation of the conductive layer 151_2. Here, as the alloy containing silver, an alloy of silver, palladium, and copper (Ag—Pd—Cu, also referred to as APC) can be used, for example. When the conductive layer 151_3 is formed using silver or an alloy containing silver and the conductive layer 151_2 is formed using aluminum, the visible light reflectance of the conductive layer 151_3 can be higher than that of the conductive layer 151_2. Here, the conductive layer 151_2 may be formed using silver or an alloy containing silver. The conductive layer 151_1 may be formed using silver or an alloy containing silver.

Meanwhile, a film formed using titanium has better processability in etching than a film formed using silver. Thus, use of titanium for the conductive layer 151_3 can facilitate formation of the conductive layer 151_3. Note that a film formed using aluminum also has better processability in etching than a film formed using silver.

The conductive layer 151 having a stacked-layer structure of a plurality of layers as described above can improve the characteristics of the light-emitting apparatus. For example, the light-emitting apparatus 1000 can have high light extraction efficiency and high reliability.

Here, in the case where the light-emitting device 130 has a microcavity structure, use of silver or an alloy containing silver, i.e., a material with high visible light reflectance, for the conductive layer 151_3 can favorably increase the light extraction efficiency of the light-emitting apparatus 1000.

Depending on the selected material or the processing method of the conductive layer 151, a side surface of the conductive layer 151_2 is positioned on an inner side than side surfaces of the conductive layer 151_1 and the conductive layer 151_3 and a protruding portion might be formed as illustrated in FIG. 4A. The protruding portion might impair coverage of the conductive layer 151 with the conductive layer 152 to cause a step-cut of the conductive layer 152.

Thus, an insulating layer 156 is preferably provided as illustrated in FIG. 4A. FIG. 4A illustrates an example in which the insulating layer 156 is provided over the conductive layer 151_1 to include a region overlapping with the side surface of the conductive layer 151_2. Such a structure can inhibit occurrence of the step-cut or a reduction in the thickness of the conductive layer 152 due to the protruding portion; thus, connection defects or an increase in driving voltage can be inhibited.

Although FIG. 4A illustrates the structure in which the side surface of the conductive layer 151_2 is entirely covered with the insulating layer 156, part of the side surface the conductive layer 151_2 is not necessarily covered with the insulating layer 156. Also in a pixel electrode with a later-described structure, part of the side surface of the conductive layer 151_2 is not necessarily covered with the insulating layer 156.

Here, the insulating layer 156 preferably has a curved surface as illustrated in FIG. 4A. In that case, a step-cut in the conductive layer 152 covering the insulating layer 156 is less likely to occur than in the case where the insulating layer 156 has a perpendicular side surface (a side surface parallel to the Z direction), for example. In addition, a step-cut in the conductive layer 152 covering the insulating layer 156 is less likely to occur also in the case where the side surface of the insulating layer 156 has a tapered shape, or specifically, a tapered shape with a taper angle of less than 90°, than in the case where the insulating layer 156 has a perpendicular side surface, for example. As described above, the light-emitting apparatus 1000 can be fabricated by a high-yield method. Moreover, the light-emitting apparatus 1000 can have high reliability since generation of defects is inhibited therein.

Figure 4B:
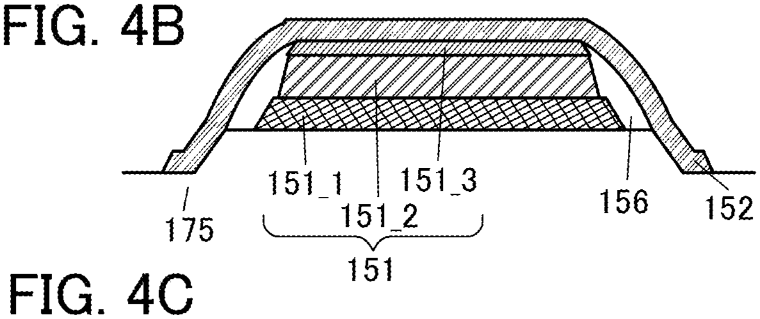
Figure 4C:
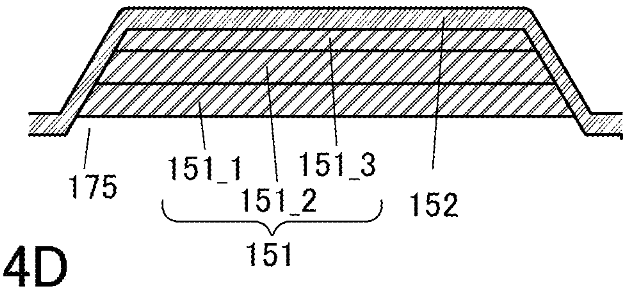
Figure 4D:
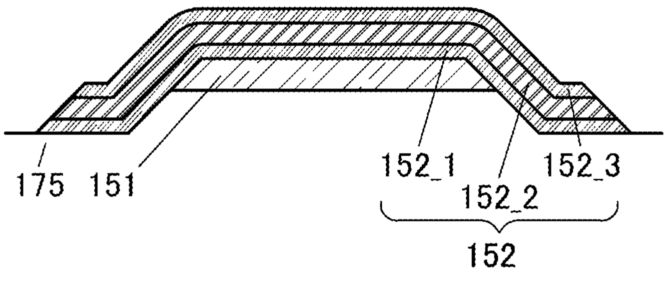

Note that one embodiment of the present invention is not limited thereto. FIGS. 4B to 4D illustrate other examples of the structure of the first electrode 101.

FIG. 4B illustrates a variation structure of the first electrode 101 in FIG. 4A, in which the insulating layer 156 covers the side surfaces of the conductive layers 151_1, 151_2, and 151_3 instead of covering only the side surface of the conductive layer 151_2.

FIG. 4C illustrates a variation structure of the first electrode 101 in FIG. 4A, in which the insulating layer 156 is not provided.

FIG. 4D illustrates a variation structure of the first electrode 101 in FIG. 4A, in which the conductive layer 151 does not have a stacked-layer structure but the conductive layer 152 has a stacked-layer structure.

A conductive layer 152_1 has higher adhesion to a conductive layer 152_2 than the insulating layer 175 does, for example. For the conductive layer 152_1, an oxide containing one or more selected from indium, tin, zinc, gallium, titanium, aluminum, and silicon, for example, can be used. For example, it is preferable to use a conductive oxide containing one or more of indium oxide, an indium tin oxide, an indium zinc oxide, zinc oxide, zinc oxide containing gallium, titanium oxide, an indium titanium oxide, zinc titanate, an aluminum zinc oxide, an indium zinc oxide containing gallium, an indium zinc oxide containing aluminum, an indium tin oxide containing silicon, an indium zinc oxide containing silicon, and the like. Accordingly, peeling of the conductive layer 152_2 can be inhibited. The conductive layer 152_2 is not in contact with the insulating layer 175.

The conductive layer 152_2 is a layer whose visible light reflectance (e.g., reflectance with respect to light with a predetermined wavelength in a range greater than or equal to 400 nm and less than 750 nm) is higher than that of the conductive layers 151, 152_1, and 152_3. The visible light reflectance of the conductive layer 152_2 can be, for example, higher than or equal to 70% and lower than or equal to 100%, and is preferably higher than or equal to 80% and lower than or equal to 100%, further preferably higher than or equal to 90% and lower than or equal to 100%. For the conductive layer 152_2, silver or an alloy containing silver can be used, for example. An example of the alloy containing silver is an alloy of silver, palladium, and copper (APC). In the above manner, the light-emitting apparatus 1000 can have high light extraction efficiency. Note that a metal other than silver may be used for the conductive layer 152_2.

When the conductive layers 151 and 152 serve as the anode, a layer having a high work function is preferably used as the conductive layer 152_3. The conductive layer 152_3 has a higher work function than the conductive layer 152_2, for example. For the conductive layer 152_3, a material similar to the material usable for the conductive layer 152_1 can be used, for example. For example, the conductive layers 152_1 and 152_3 can be formed using the same kind of material.

When the conductive layers 151 and 152 serve as the cathode, a layer having a low work function is preferably used as the conductive layer 152_3. The conductive layer 152_3 has a lower work function than the conductive layer 152_2, for example.

The conductive layer 152_3 is preferably a layer having high visible light transmittance (e.g., transmittance with respect to light with a predetermined wavelength in a range greater than or equal to 400 nm and less than 750 nm). For example, the visible light transmittance of the conductive layer 152_3 is preferably higher than that of the conductive layers 151 and 152_2. The visible light transmittance of the conductive layer 152_3 can be, for example, higher than or equal to 60% and lower than or equal to 100%, and is preferably higher than or equal to 70% and lower than or equal to 100%, further preferably higher than or equal to 80% and lower than or equal to 100%. Accordingly, the amount of light absorbed by the conductive layer 152_3 among light emitted from the organic compound layer 103 can be reduced. As described above, the conductive layer 152_2 under the conductive layer 152_3 can be a layer having high visible light reflectance. Thus, the light-emitting apparatus 1000 can have high light extraction efficiency.

Next, an exemplary method for fabricating the light-emitting apparatus 1000 having the structure illustrated in FIGS. 3A and 3B is described with reference to FIGS. 5A to 5E, FIGS. 6A to 6E, FIGS. 7A to 7C, FIGS. 8A to 8C, FIGS. 9A to 9C, FIGS. 10A to 10C, and FIGS. 11A to 11C.

[Fabrication Method Example 1]

Thin films included in the light-emitting apparatus (e.g., insulating films, semiconductor films, and conductive films) can be formed by a sputtering method, a chemical vapor deposition (CVD) method, a vacuum evaporation method, a pulsed laser deposition (PLD) method, an atomic layer deposition (ALD) method, or the like. Examples of a CVD method include a plasma-enhanced CVD (PECVD) method and a thermal CVD method. An example of a thermal CVD method is a metal organic CVD (MOCVD) method.

Thin films included in the light-emitting apparatus (e.g., insulating films, semiconductor films, and conductive films) can also be formed by a wet process such as spin coating, dipping, spray coating, ink-jetting, dispensing, screen printing, offset printing, doctor blade coating, slit coating, roll coating, curtain coating, or knife coating.

Specifically, for fabrication of the light-emitting device, a vacuum process such as an evaporation method and a solution process such as a spin coating method or an ink-jet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, the functional layers (e.g., the hole-injection layer, the hole-transport layer, the hole-blocking layer, the light-emitting layer, the electron-blocking layer, the electron-transport layer, and the electron-injection layer) included in the organic compound layer can be formed by an evaporation method (e.g., a vacuum evaporation method), a coating method (e.g., a dip coating method, a die coating method, a bar coating method, a spin coating method, or a spray coating method), a printing method (e.g., ink-jetting, screen printing (stencil), offset printing (planography), flexography (relief printing), gravure printing, or micro-contact printing), or the like.

Thin films included in the light-emitting apparatus can be processed by a lithography method, for example. Alternatively, a nanoimprinting method, a sandblasting method, a lift-off method, or the like may be used to process thin films. Alternatively, island-shaped thin films may be directly formed by a film formation method using a shielding mask such as a metal mask.

There are two typical examples of lithography methods. In one of the methods, a resist mask is formed over a thin film that is to be processed, the thin film is processed by etching, for example, and then the resist mask is removed. In the other method, a photosensitive thin film is formed and then processed into a desired shape by light exposure and development.

For etching of thin films, a dry etching method, a wet etching method, a sandblast method, or the like can be used.

Figure 5A:
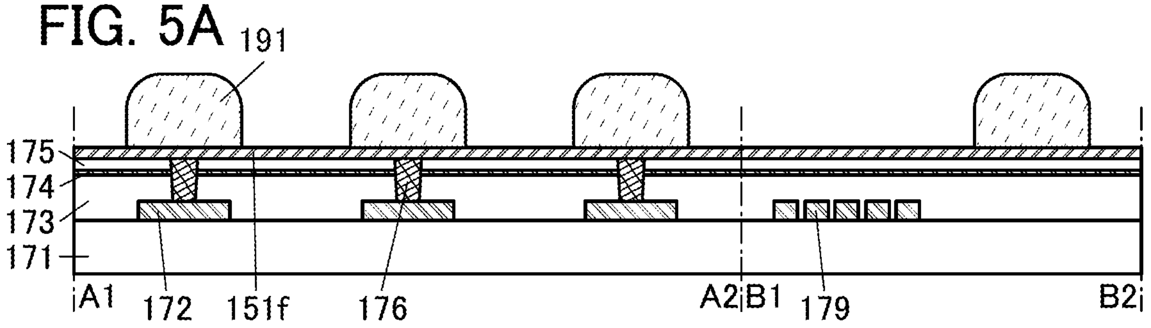
FIGS. 5A to 5E are cross-sectional views illustrating an example of a method for fabricating a light-emitting apparatus.

First, as illustrated in FIG. 5A, the insulating layer 171 is formed over a substrate (not illustrated). Next, the conductive layer 172 and a conductive layer 179 are formed over the insulating layer 171, and the insulating layer 173 is formed over the insulating layer 171 so as to cover the conductive layer 172 and the conductive layer 179. Then, the insulating layer 174 is formed over the insulating layer 173, and the insulating layer 175 is formed over the insulating layer 174.

As the substrate, a substrate that has heat resistance high enough to withstand at least heat treatment performed later can be used. When an insulating substrate is used, it is possible to use a glass substrate, a quartz substrate, a sapphire substrate, a ceramic substrate, an organic resin substrate, or the like. Alternatively, it is possible to use a semiconductor substrate such as a single crystal semiconductor substrate or a polycrystalline semiconductor substrate of silicon, silicon carbide, or the like; a compound semiconductor substrate of silicon germanium or the like; or an SOI substrate.

Next, as illustrated in FIG. 5A, openings reaching the conductive layer 172 are formed in the insulating layers 175, 174, and 173. Then, the plugs 176 are formed to fill the openings.

Next, as illustrated in FIG. 5A, a conductive film 151*f* to be the conductive layers 151R, 151G, 151B, and 151C is formed over the plugs 176 and the insulating layer 175. The conductive film 151*f* can be formed by a sputtering method or a vacuum evaporation method, for example. A metal material can be used for the conductive film 151*f*, for example.

Subsequently, a resist mask 191 is formed over the conductive film 151*f*, for example, as illustrated in FIG. 5A. The resist mask 191 can be formed by application of a photosensitive material (photoresist), light exposure, and development.

Figure 5B:
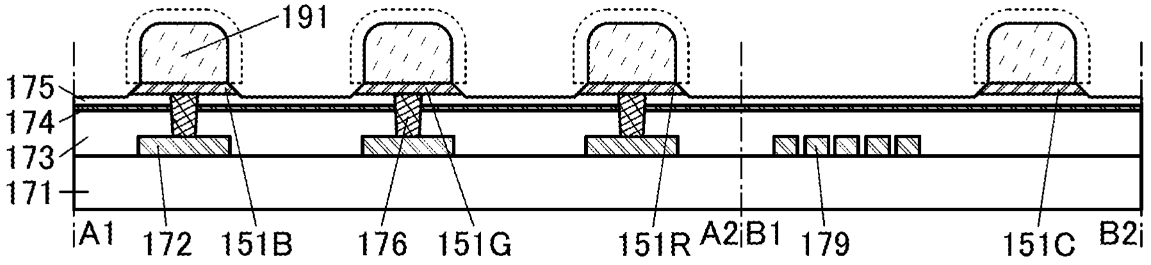

Subsequently, as illustrated in FIG. 5B, the conductive film 151*f* in a region that is not overlapped by the resist mask 191, for example, is removed by an etching method, specifically, a dry etching method, for instance. Note that in the case where the conductive film 151*f* includes a layer formed using a conductive oxide such as an indium tin oxide, for example, the layer may be removed by a wet etching method. In this manner, the conductive layer 151 is formed. In the case where part of the conductive film 151*f* is removed by a dry etching method, for example, a recessed portion (also referred to as a depression) may be formed in a region of the insulating layer 175 that is not overlapped by the conductive layer 151.

Figure 5C:
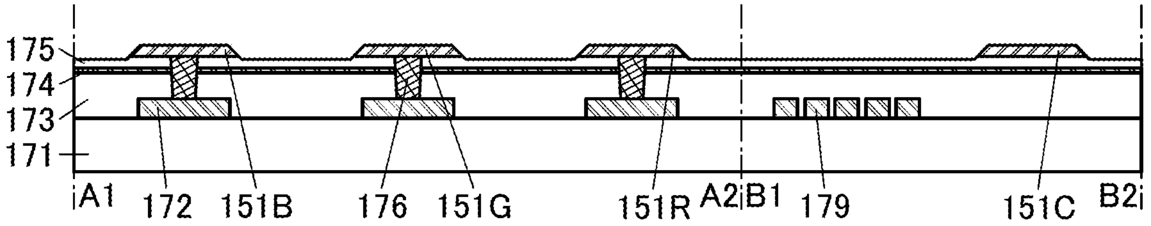

Next, the resist mask 191 is removed as illustrated in FIG. 5C. The resist mask 191 can be removed by ashing using oxygen plasma, for example. Alternatively, an oxygen gas and any of $CF_4$, $C_4F_8$, $SF_6$, $CHF_3$, $Cl_2$, $H_2O$, $BCl_3$, and a Group 18 element such as He may be used. Alternatively, the resist mask 191 may be removed by wet etching.

Figure 5D:
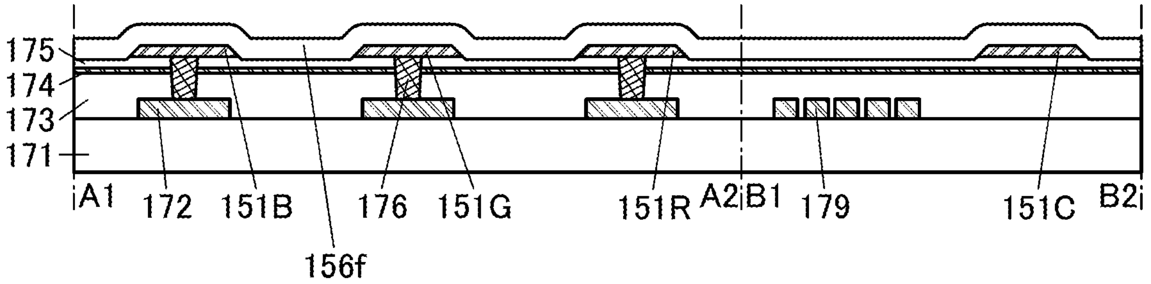

Then, as illustrated in FIG. 5D, an insulating film 156*f* to be an insulating layer 156R, an insulating layer 156G, an insulating layer 156B, and an insulating layer 156C is formed over the conductive layer 151R, the conductive layer 151G, the conductive layer 151B, the conductive layer 151C, and the insulating layer 175. The insulating film 156*f* can be formed by a CVD method, an ALD method, a sputtering method, or a vacuum evaporation method, for example.

For the insulating film 156*f*, an inorganic material can be used. As the insulating film 156*f*, an inorganic insulating film such as an oxide insulating film, a nitride insulating film, an oxynitride insulating film, or a nitride oxide insulating film can be used, for example. For example, an oxide insulating film containing silicon, a nitride insulating film containing silicon, an oxynitride insulating film containing silicon, a nitride oxide insulating film containing silicon, or the like can be used as the insulating film 156*f*. For the insulating film 156*f*, silicon oxynitride can be used, for example.

Figure 5E:
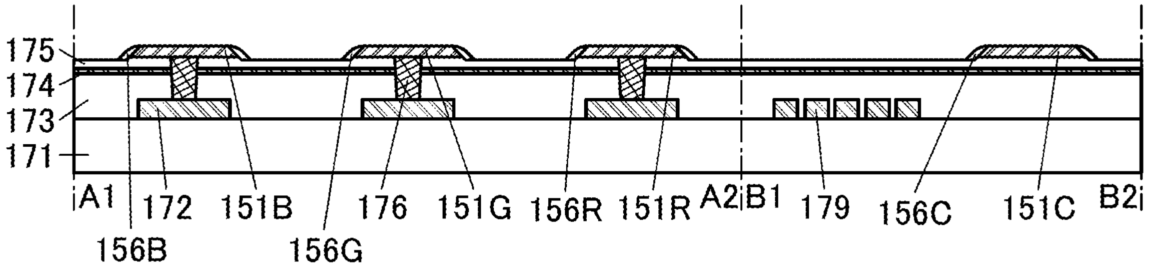

Subsequently, as illustrated in FIG. 5E, the insulating film 156*f* is processed to form the insulating layers 156R, 156G, 156B, and 156C. The insulating layer 156 can be formed by performing etching substantially uniformly on the top surface of the insulating film 156*f*, for example. Such uniform etching for planarization is also referred to as etch back treatment. Note that the insulating layer 156 may be formed by a lithography method.

Figure 6A:
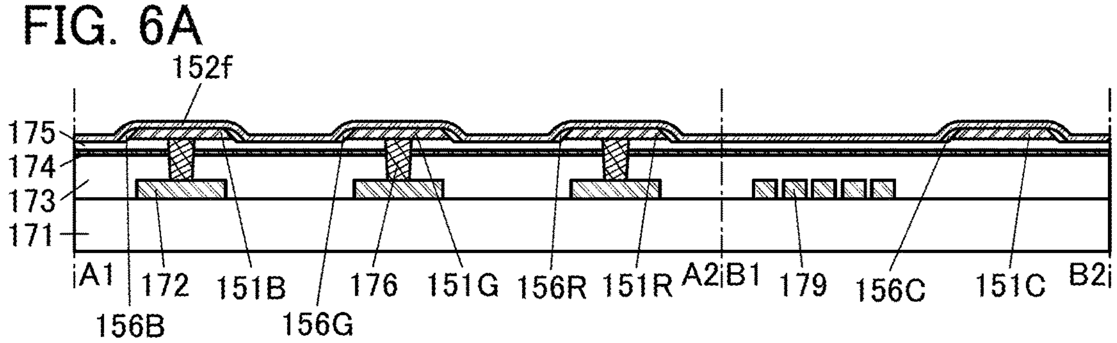
FIGS. 6A to 6E are cross-sectional views illustrating an example of a method for fabricating a light-emitting apparatus.

Then, as illustrated in FIG. 6A, a conductive film **152*f* to be the conductive layers 152R, 152G, and 152B and a conductive layer 152C is formed over the conductive layers 151R, 151G, 151B, and 151C and the insulating layers 156R, 156G, 156B, 156C, and 175. Specifically, the conductive film 152*f* is formed to cover the conductive layers 151R, 151G, 151B, and 151C and the insulating layers 156R, 156G, 156B, and 156**C, for example.

The conductive film **152*f* can be formed by a sputtering method or a vacuum evaporation method, for example. The conductive film 152*f* can be formed by an ALD method. A conductive oxide can be used for the conductive film 152*f*, for example. The conductive film 152*f* can be a stack of a film formed using a metal material and a film formed thereover using a conductive oxide. For example, the conductive film 152*f*** can be a stack of a film formed using titanium, silver, or an alloy containing silver and a film formed thereover using a conductive oxide.

Figure 6B:
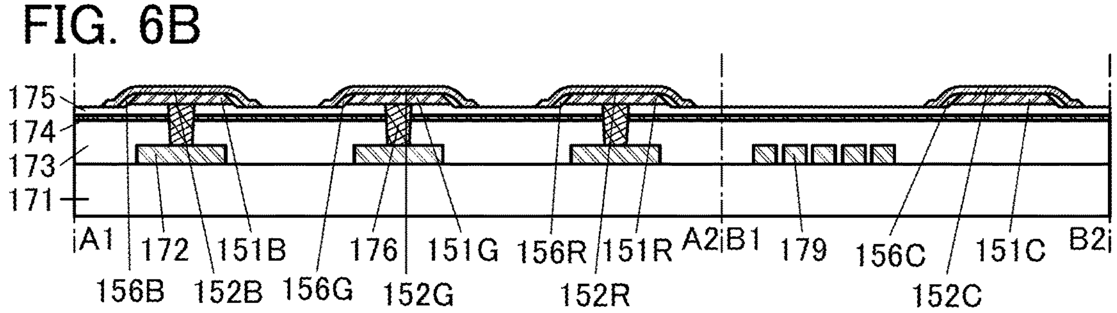

Then, as illustrated in FIG. 6B, the conductive film **152*f* is processed by a lithography method, for example, whereby the conductive layers 152R, 152G, 152B, and 152C are formed. Specifically, after a resist mask is formed, part of the conductive film 152*f* is removed by an etching method, for example. The conductive film 152*f* can be removed by a wet etching method, for example. The conductive film 152*f* may be removed by a dry etching method. Through the above steps, the pixel electrode including the conductive layer 151 and the conductive layer 152** is formed.

Next, hydrophobization treatment is preferably performed on the conductive layer 152. The hydrophobization treatment can change the hydrophilic properties of the subject surface to hydrophobic properties or increase the hydrophobic properties of the subject surface. The hydrophobization treatment for the conductive layer 152 can increase the adhesion between the conductive layer 152 and the organic compound layer 103 formed in a later step and suppress film peeling. Note that the hydrophobization treatment is not necessarily performed.

Figure 6C:
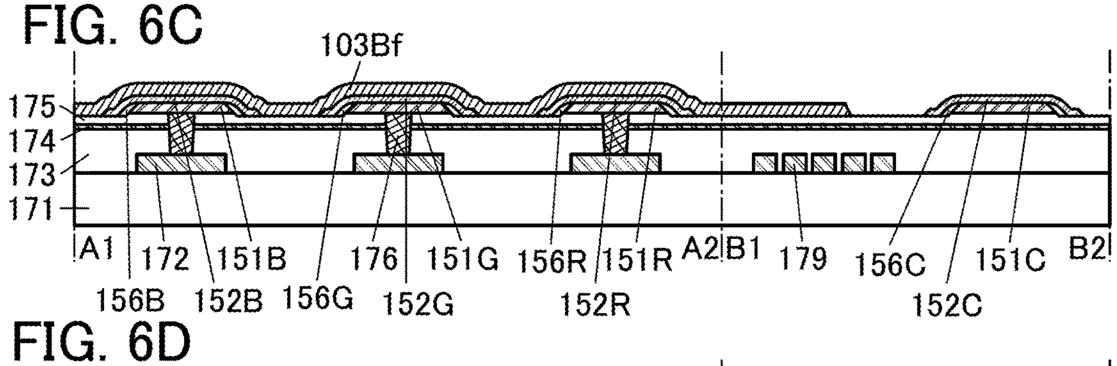

Next, as illustrated in FIG. 6C, an organic compound film 103Bf to be the organic compound layer 103B is formed over the conductive layers 152B, 152G, and 152R and the insulating layer 175.

Note that in one embodiment of the present invention, the organic compound film 103Bf includes a plurality of layers each containing an organic compound. At least one of the layers each containing an organic compound is a light-emitting layer. The structure of the light-emitting device 100 described in Embodiment 1 or the structure of the light-emitting device 130 can be referred to for the specific structure. In the case where the organic compound film 103Bf includes a plurality of light-emitting layers, the light-emitting layers may be stacked with an intermediate layer positioned therebetween.

As illustrated in FIG. 6C, the organic compound film 103Bf is not formed over the conductive layer 152C. For example, a mask for specifying a film formation area (also referred to as an area mask, a rough metal mask, or the like to distinguish from a fine metal mask) is used, so that the organic compound film 103Bf can be formed only in a desired region. Employing a film formation step using an area mask and a processing step using a resist mask enables a light-emitting device to be fabricated by a relatively easy process.

The organic compound film 103Bf can be formed by an evaporation method, specifically a vacuum evaporation method, for example. The organic compound film 103Bf may be formed by a transfer method, a printing method, an ink-jet method, a coating method, or the like.

In the case where the organic compound film 103Bf is exposed in the subsequent steps, the substrate holding step (including transfer between manufacturing apparatuses and storage of the substrate) is performed in an environment where lighting is adjusted. In other words, lighting with which a deterioration product such as an oxygen adduct is not generated in the organic compound film 103Bf is used. Specifically, the wavelength or illuminance of the lighting is adjusted.

The substrate is preferably transferred or held in lighting whose spectrum is at a wavelength longer than the absorption edge of the absorption spectrum of a compound having the longest-wavelength absorption edge among the organic compounds contained in the light-emitting layer, for example. Since the absorption spectrum of the compound does not overlap with the spectrum of the lighting, the organic compound in the light-emitting layer is not photo-excited in an atmosphere containing oxygen; accordingly, generation of a deterioration product can be inhibited.

Specifically, the substrate is preferably transferred or held in lighting whose shortest-wavelength peak among peaks in the spectrum of the light source is positioned at greater than or equal to 480 nm. The shortest-wavelength peak among the peaks in the spectrum of the light source is further preferably positioned at greater than or equal to 550 nm, still further preferably greater than or equal to 580 nm.

Alternatively, the illuminance of the lighting is preferably set less than or equal to 120 lx (lux). It is further preferred to set the illuminance of the lighting less than or equal to 10 lx.

Figure 6D:
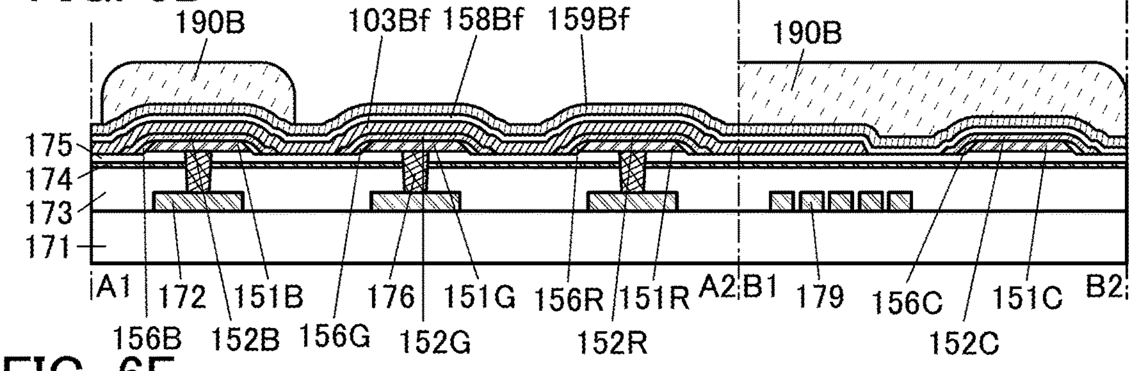

Next, as illustrated in FIG. 6D, a sacrificial film 158Bf to be a sacrificial layer 158B and a mask film 159Bf to be a mask layer 159B are sequentially formed over the organic compound film 103Bf.

Since the organic compound film 103Bf is sealed to block the atmosphere owing to the formation of the sacrificial film 158Bf and the mask film 159Bf, lighting adjustment is not necessarily performed between this film formation step and a step of processing the sacrificial film 158Bf.

The sacrificial film 158Bf and the mask film 159Bf can be formed by a sputtering method, an ALD method (including a thermal ALD method or a PEALD method), a CVD method, or a vacuum evaporation method, for example. Alternatively, the sacrificial film 158Bf and the mask film 159Bf may be formed by the above-described wet process.

The sacrificial film 158Bf and the mask film 159Bf are formed at a temperature lower than the upper temperature limit of the organic compound film 103Bf. The typical substrate temperatures in formation of the sacrificial film 158Bf and the mask film 159Bf are each lower than or equal to 200° C., preferably lower than or equal to 150° C., further preferably lower than or equal to 120° C., still further preferably lower than or equal to 100° C., yet still further preferably lower than or equal to 80° C.

Although this embodiment shows an example where a mask film having a two-layer structure of the sacrificial film 158Bf and the mask film 159Bf is formed, a mask film may have a single-layer structure or a stacked-layer structure of three or more layers.

Providing the sacrificial layer over the organic compound film 103Bf can reduce damage to the organic compound film 103Bf in the fabrication process of the light-emitting apparatus, resulting in an increase in reliability of the light-emitting device.

As the sacrificial film 158Bf, a film that is highly resistant to the process conditions for the organic compound film 103Bf, specifically, a film having high etching selectivity with respect to the organic compound film 103Bf is used. For the mask film 159Bf, a film having high etching selectivity with respect to the sacrificial film 158Bf is used.

The sacrificial film 158Bf and the mask film 159Bf are preferably films that can be removed by a wet etching method. The use of a wet etching method can reduce damage to the organic compound film 103Bf in processing of the sacrificial film 158Bf and the mask film 159Bf, as compared to the case of using a dry etching method.

In the case where a wet etching method is employed, it is particularly preferable to use an acidic chemical solution. As an acidic chemical solution, a chemical solution containing one of phosphoric acid, hydrofluoric acid, nitric acid, acetic acid, oxalic acid, sulfuric acid, and the like or a mixed chemical solution (also referred to as a mixed acid) that contains two or more of these acids is preferably used.

As each of the sacrificial film 158Bf and the mask film 159Bf, one or more of a metal film, an alloy film, a metal oxide film, a semiconductor film, an organic insulating film, and an inorganic insulating film, for example, can be used.

When a film containing a material having a property of blocking ultraviolet rays is used as each of the sacrificial film and the mask film, the organic compound layer can be inhibited from being irradiated with ultraviolet rays in a light exposure step, for example. The organic compound layer is inhibited from being damaged by ultraviolet rays, so that the reliability of the light-emitting device can be improved.

Note that the same effect is obtained when a film containing a material having a property of blocking ultraviolet rays is used for an after-mentioned inorganic insulating film 125*f*.

For each of the sacrificial film 158Bf and the mask film 159Bf, it is preferable to use a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials, for example. It is particularly preferable to use a low-melting-point material such as aluminum or silver.

The sacrificial film 158Bf and the mask film 159Bf can each be formed using a metal oxide such as an In—Ga—Zn oxide, an indium oxide, an In—Zn oxide, an In—Sn oxide, an indium titanium oxide (In—Ti oxide), an indium tin zinc oxide (In—Sn—Zn oxide), an indium titanium zinc oxide (In—Ti—Zn oxide), an indium gallium tin zinc oxide (In—Ga—Sn—Zn oxide), or an indium tin oxide containing silicon.

In addition, in place of gallium described above, an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used.

The sacrificial film 158Bf and the mask film 159Bf are preferably formed using a semiconductor material such as silicon or germanium, for example, for excellent compatibility with a semiconductor manufacturing process. An oxide or a nitride of the semiconductor material can be used. A non-metallic material such as carbon or a compound thereof can be used. A metal such as titanium, tantalum, tungsten, chromium, or aluminum or an alloy containing at least one of these metals can be used. Alternatively, an oxide containing the above-described metal, such as titanium oxide or chromium oxide, or a nitride such as titanium nitride, chromium nitride, or tantalum nitride can be used.

As each of the sacrificial film 158Bf and the mask film 159Bf, any of a variety of inorganic insulating films can be used. In particular, an oxide insulating film is preferable because its adhesion to the organic compound film 103Bf is higher than that of a nitride insulating film. For example, an inorganic insulating material such as aluminum oxide, hafnium oxide, or silicon oxide can be used for the sacrificial film 158Bf and the mask film 159Bf. As the sacrificial film 158Bf and the mask film 159Bf, aluminum oxide films can be formed by an ALD method, for example. An ALD method is preferably used, in which case damage to a base (in particular, the organic compound layer) can be reduced.

One or both of the sacrificial film 158Bf and the mask film 159Bf may be formed using an organic material. For example, as the organic material, a material that can be dissolved in a solvent chemically stable with respect to at least the uppermost film of the organic compound film 103Bf may be used. Specifically, a material that will be dissolved in water or an alcohol can be suitably used. In forming a film of such a material, it is preferable to apply the material dissolved in a solvent such as water or an alcohol by a wet process and then perform heat treatment for evaporating the solvent. At this time, the heat treatment is preferably performed in a reduced-pressure atmosphere, in which case the solvent can be removed at a low temperature in a short time and thermal damage to the organic compound film 103Bf can be reduced accordingly.

The sacrificial film 158Bf and the mask film 159Bf may be formed using an organic resin such as polyvinyl alcohol (PVA), polyvinyl butyral, polyvinylpyrrolidone, polyethylene glycol, polyglycerin, pullulan, water-soluble cellulose, an alcohol-soluble polyamide resin, or a fluorine resin like perfluoropolymer.

For example, an organic film (e.g., a PVA film) formed by an evaporation method or any of the above wet processes can be used as the sacrificial film 158Bf, and an inorganic film (e.g., a silicon nitride film) formed by a sputtering method can be used as the mask film 159Bf.

Subsequently, a resist mask 190B is formed over the mask film 159Bf as illustrated in FIG. 6D. The resist mask 190B can be formed by application of a photosensitive material (photoresist), light exposure, and development.

The resist mask 190B may be formed using either a positive resist material or a negative resist material.

The resist mask 190B is provided at a position overlapping the conductive layer 152B. The resist mask 190B is preferably provided also at a position overlapping the conductive layer 152C. This can inhibit the conductive layer 152C from being damaged during the fabrication process of the light-emitting apparatus. Note that the resist mask 190B is not necessarily provided over the conductive layer 152C. The resist mask 190B is preferably provided to cover the area from the edge portion of the organic compound film 103Bf to the edge portion of the conductive layer 152C (the edge portion closer to the organic compound film 103Bf), as illustrated in the cross-sectional view along the line B1-B2 in FIG. 6C.

Figure 6E:
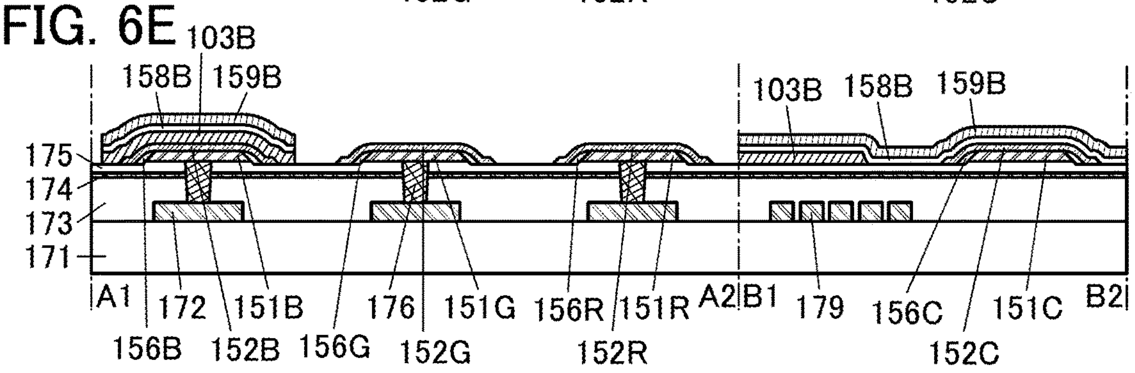

Next, as illustrated in FIG. 6E, part of the mask film 159Bf is removed using the resist mask 190B, whereby the mask layer 159B is formed. The mask layer 159B remains over the conductive layers 152B and 152C. After that, the resist mask 190B is removed. Then, part of the sacrificial film 158Bf is removed using the mask layer 159B as a mask (also referred to as a hard mask), whereby the sacrificial layer 158B is formed.

Each of the sacrificial film 158Bf and the mask film 159Bf can be processed by a wet etching method or a dry etching method. The sacrificial film 158Bf and the mask film 159Bf are preferably processed by wet etching.

The use of a wet etching method can reduce damage to the organic compound film 103Bf in processing of the sacrificial film 158Bf and the mask film 159Bf, as compared to the case of using a dry etching method. In the case of using a wet etching method, it is preferable to use a developer, an aqueous solution of tetramethylammonium hydroxide (TMAH), dilute hydrofluoric acid, oxalic acid, phosphoric acid, acetic acid, nitric acid, or a chemical solution containing a mixed solution of any of these acids, for example.

Since the organic compound film 103Bf is not exposed in the processing of the mask film 159Bf, the range of choice for a processing method for the mask film 159Bf is wider than that for the sacrificial film 158Bf. Specifically, even in the case where a gas containing oxygen is used as the etching gas in the processing of the mask film 159Bf, deterioration of the organic compound film 103Bf can be suppressed.

In the case where a wet etching method is employed, it is particularly preferable to use an acidic chemical solution. As an acidic chemical solution, a chemical solution containing one of phosphoric acid, hydrofluoric acid, nitric acid, acetic acid, oxalic acid, sulfuric acid, and the like or a mixed chemical solution (also referred to as a mixed acid) that contains two or more of these acids is preferably used.

In the case of using a dry etching method to process the sacrificial film 158Bf, deterioration of the organic compound film 103Bf can be suppressed by not using a gas containing oxygen as the etching gas. In the case of using a dry etching method, it is preferable to use a gas containing $CF_4$, $C_4F_8$, $SF_6$, $CHF_3$, $Cl_2$, $H_2O$, $BCl_3$, or a Group 18 element such as He, for example, as the etching gas.

The resist mask 190B can be removed by a method similar to that for the resist mask 191. At this time, the sacrificial film 158Bf is positioned on the outermost surface, and the organic compound film 103Bf is not exposed; thus, the organic compound film 103Bf can be inhibited from being damaged in the step of removing the resist mask 190B. In addition, the range of choice of the method for removing the resist mask 190B can be widened.

Next, as illustrated in FIG. 6E, the organic compound film 103Bf is processed, so that the organic compound layer 103B is formed. For example, part of the organic compound film 103Bf is removed using the mask layer 159B and the sacrificial layer 158B as a hard mask, whereby the organic compound layer 103B is formed.

In this step, a side surface of the organic compound layer 103B is exposed. Thus, the subsequent substrate holding step (including transfer between manufacturing apparatuses and storage of the substrate) is performed in an environment where lighting is adjusted. In other words, lighting with which a deterioration product such as an oxygen adduct is not generated in the organic compound layer 103B is used. Specifically, the wavelength or illuminance lighting is adjusted.

Accordingly, as illustrated in FIG. 6E, the stacked-layer structure of the organic compound layer 103B, the sacrificial layer 158B, and the mask layer 159B remains over the conductive layer 152B. The conductive layers 152G and 152R are exposed.

The organic compound film 103Bf can be processed by dry etching or wet etching. In the case where the processing is performed by dry etching, for example, an etching gas containing oxygen can be used. When the etching gas contains oxygen, the etching rate can be increased. Thus, the etching can be performed under a low-power condition while an adequately high etching rate is maintained. Accordingly, damage to the organic compound film 103Bf can be inhibited. Furthermore, a defect such as attachment of a reaction product generated during the etching can be inhibited.

An etching gas that does not contain oxygen may be used. In that case, deterioration of the organic compound film 103Bf can be inhibited, for example.

As described above, in one embodiment of the present invention, the mask layer 159B is formed in the following manner: the resist mask 190B is formed over the mask film 159Bf and part of the mask film 159Bf is removed using the resist mask 190B. After that, part of the organic compound film 103Bf is removed using the mask layer 159B as a hard mask, so that the organic compound layer 103B is formed. In other words, the organic compound layer 103B is formed by processing the organic compound film 103Bf by a lithography method. Note that part of the organic compound film 103Bf may be removed using the resist mask 190B. Then, the resist mask 190B may be removed.

Here, hydrophobization treatment for the conductive layer 152G may be performed as necessary. At the time of processing the organic compound film 103Bf, a surface of the conductive layer 152G changes to have hydrophilic properties in some cases, for example. The hydrophobization treatment for the conductive layer 152G, for example, can increase the adhesion between the conductive layer 152G and a layer to be formed in a later step (which is the organic compound layer 103G here) and inhibit film peeling.

Figure 7A:
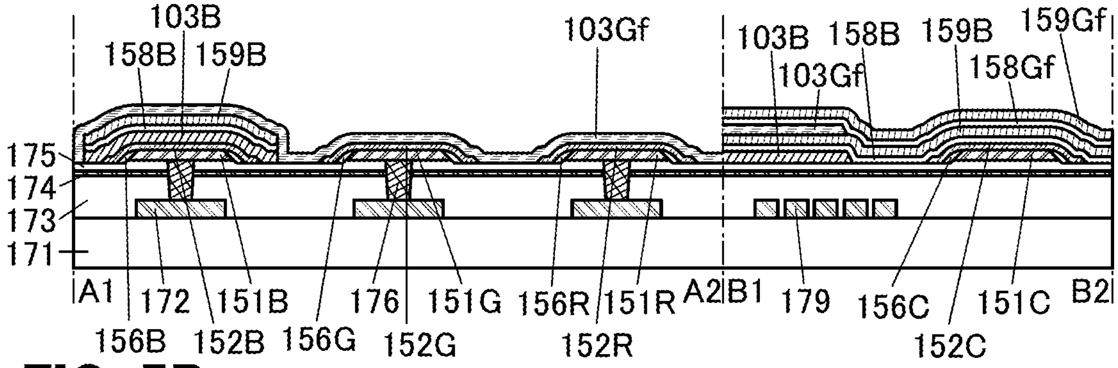
FIGS. 7A to 7C are cross-sectional views illustrating an example of a method for fabricating a light-emitting apparatus.

Next, as illustrated in FIG. 7A, an organic compound film 103Gf to be the organic compound layer 103G is formed over the conductive layer 152G, the conductive layer 152R, the mask layer 159B, and the insulating layer 175.

The organic compound film 103Gf can be formed by a method similar to that for forming the organic compound film 103Bf. The organic compound film 103Gf can have a structure similar to that of the organic compound film 103Bf.

The organic compound film 103Gf is exposed in this step and subsequent steps. Thus, the subsequent substrate holding step (including transfer between manufacturing apparatuses and storage of the substrate) is performed in an environment where lighting is adjusted. In other words, lighting with which a deterioration product such as an oxygen adduct is not generated in the organic compound film 103Gf is used. Specifically, the wavelength or illuminance lighting is adjusted.

Figure 7B:
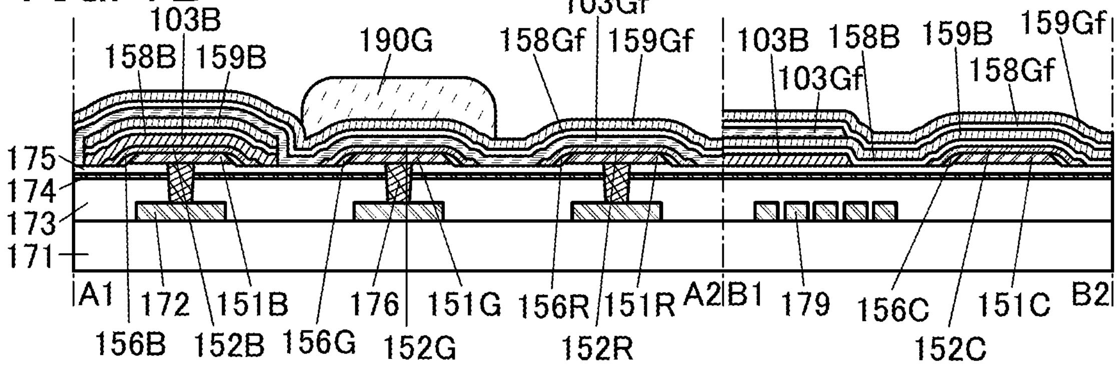

Then, as illustrated in FIG. 7B, a sacrificial film 158Gf to be a sacrificial layer 158G and a mask film 159Gf to be a mask layer 159G are sequentially formed over the organic compound film 103Gf and the mask layer 159B. After that, a resist mask 190G is formed. The materials and the formation methods of the sacrificial film 158Gf and the mask film 159Gf are similar to those for the sacrificial film 158Bf and the mask film 159Bf. The material and the formation method of the resist mask 190G are similar to those for the resist mask 190B.

Since the organic compound film 103Gf is sealed to block the atmosphere owing to the formation of the sacrificial film 158Gf and the mask film 159Gf, lighting adjustment is not necessarily performed between this film formation step and a step of processing the sacrificial film 158Gf.

The resist mask 190G is provided at a position overlapping the conductive layer 152G.

Figure 7C:
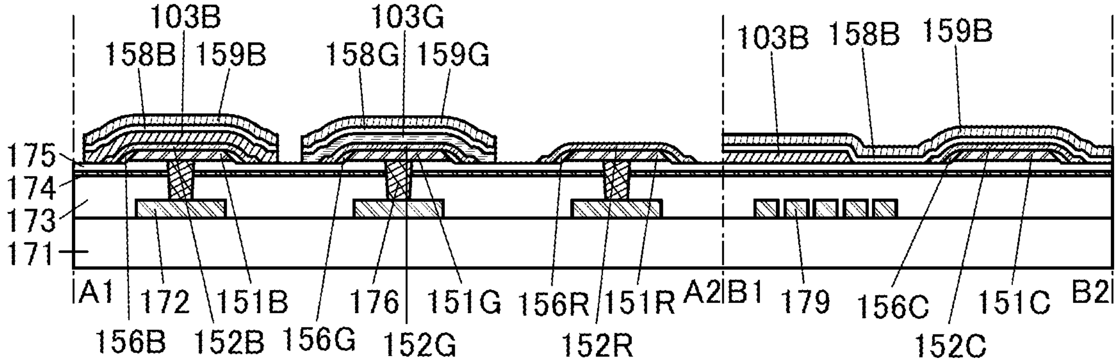

Subsequently, as illustrated in FIG. 7C, part of the mask film 159Gf is removed using the resist mask 190G, whereby the mask layer 159G is formed. The mask layer 159G remains over the conductive layer 152G. After that, the resist mask 190G is removed. Then, part of the sacrificial film 158Gf is removed using the mask layer 159G as a mask, whereby the sacrificial layer 158G is formed. Next, the organic compound film 103Gf is processed to form the organic compound layer 103G. For example, part of the organic compound film 103Gf is removed using the mask layer 159G and the sacrificial layer 158G as a hard mask to form the organic compound layer 103G.

In this step, side surfaces of the organic compound layers 103B and 103G are exposed. Thus, the subsequent substrate holding step (including transfer between manufacturing apparatuses and storage of the substrate) is performed in an environment where lighting is adjusted. In other words, lighting with which a deterioration product such as an oxygen adduct is not generated in the organic compound layers 103B and 103G is used. Specifically, the wavelength or illuminance lighting is adjusted.

Accordingly, as illustrated in FIG. 7C, the stacked-layer structure of the organic compound layer 103G, the sacrificial layer 158G, and the mask layer 159G remains over the conductive layer 152G. The mask layer 159B and the conductive layer 152R are exposed.

Hydrophobization treatment for the conductive layer 152R may be performed, for example.

Figure 8A:
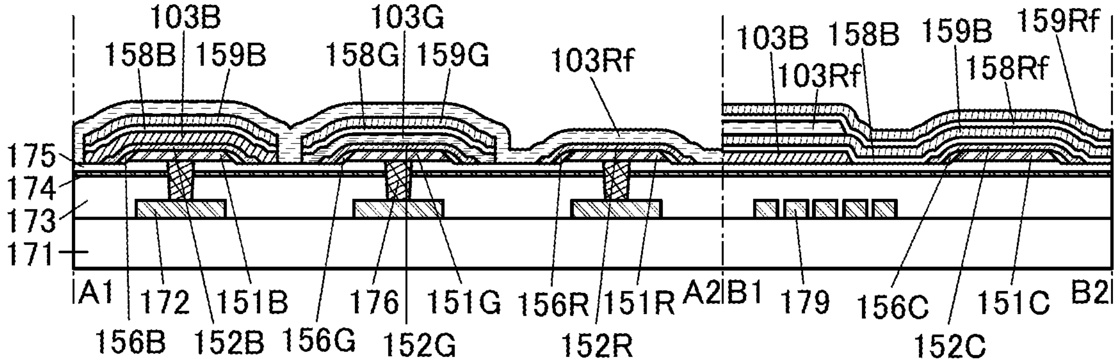
FIGS. 8A to 8C are cross-sectional views illustrating an example of a method for fabricating a light-emitting apparatus.

Next, as illustrated in FIG. 8A, an organic compound film 103Rf to be the organic compound layer 103R is formed over the conductive layer 152R, the mask layer 159G, the mask layer 159B, and the insulating layer 175.

The organic compound film 103Rf can be formed by a method similar to that for forming the organic compound film 103Gf. The organic compound film 103Rf can have a structure similar to that of the organic compound film 103Gf.

In this step and subsequent steps, the organic compound film 103Rf is exposed. Thus, the subsequent substrate holding step (including transfer between manufacturing apparatuses and storage of the substrate) is performed in an environment where lighting is adjusted. In other words, lighting with which a deterioration product such as an oxygen adduct is not generated in the organic compound film 103Rf is used. Specifically, the wavelength or illuminance lighting is adjusted.

Figure 8B:
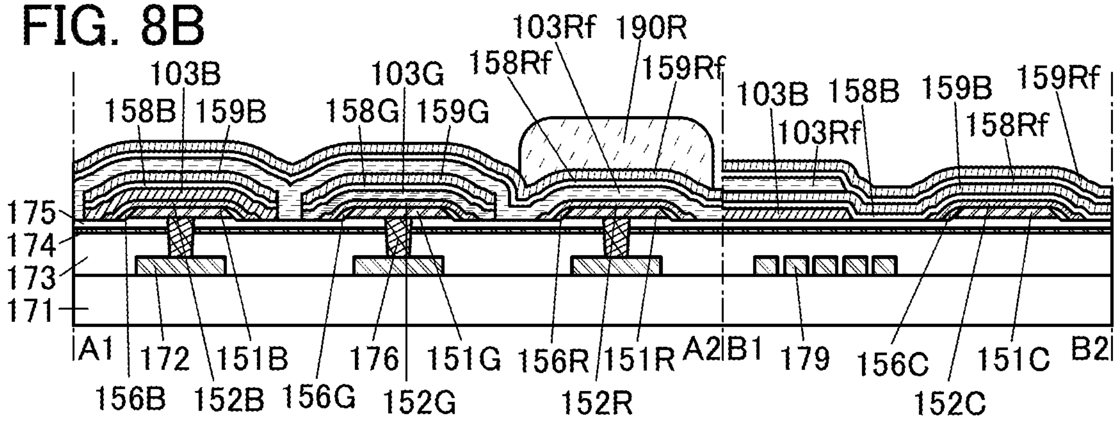
Figure 8C:
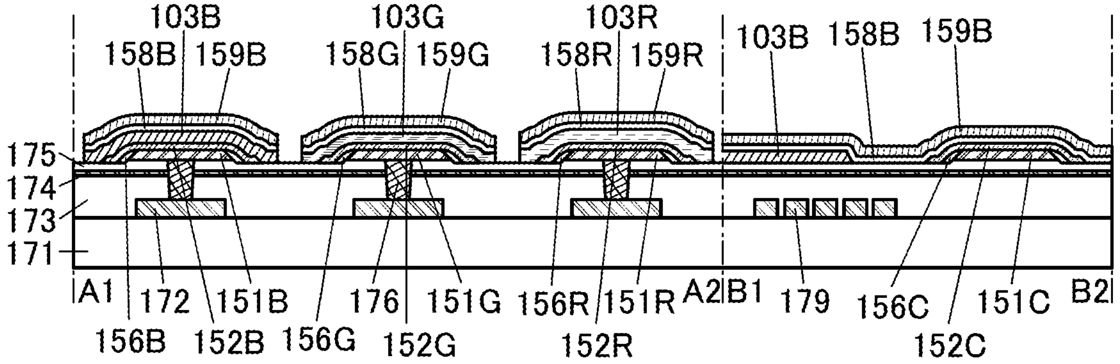

Subsequently, as illustrated in FIGS. 8B and 8C, a sacrificial layer 158R, a mask layer 159R, and the organic compound layer 103R are formed from a sacrificial film 158Rf, a mask film 159Rf, and the organic compound film 103Rf, respectively, using a resist mask 190R. For the formation methods of the sacrificial layer 158R, the mask layer 159R, and the organic compound layer 103R, the description for the organic compound layer 103G can be referred to.

In the case where the organic compound film 103Rf is exposed in the step of forming the organic compound layer 103R, the substrate holding step (including transfer between manufacturing apparatuses and storage of the substrate) is performed in an environment where lighting is adjusted. Note that lighting adjustment is not necessarily performed when the organic compound film 103Rf is sealed with the sacrificial film 158Rf or the like.

In the case where the organic compound layer 103 is exposed in the subsequent steps, the substrate holding step (including transfer between manufacturing apparatuses and storage of the substrate) is performed in an environment where lighting is adjusted.

Note that the side surfaces of the organic compound layers 103B, 103G, and 103R are preferably perpendicular or substantially perpendicular to their formation surfaces. For example, the angle between the formation surfaces and these side surfaces is preferably greater than or equal to 60° and less than or equal to 90°.

The distance between two adjacent layers among the organic compound layers 103B, 103G, and 103R, which are formed by a lithography method as described above, can be reduced to less than or equal to 8 μm, less than or equal to 5 μm, less than or equal to 3 μm, less than or equal to 2 μm, or less than or equal to 1 μm. Here, the distance can be specified, for example, by a distance between opposite edge portions of two adjacent layers among the organic compound layers 103B, 103G, and 103R. Reducing the distance between the island-shaped organic compound layers can provide a light-emitting apparatus having high resolution and a high aperture ratio. In addition, the distance between the first electrodes of adjacent light-emitting devices can also be shortened to be, for example, less than or equal to 10 μm, less than or equal to 8 μm, less than or equal to 5 μm, less than or equal to 3 μm, or less than or equal to 2 μm. Note that the distance between the first electrodes of adjacent light-emitting devices is preferably greater than or equal to 2 μm and less than or equal to 5 μm.

Figure 9A:
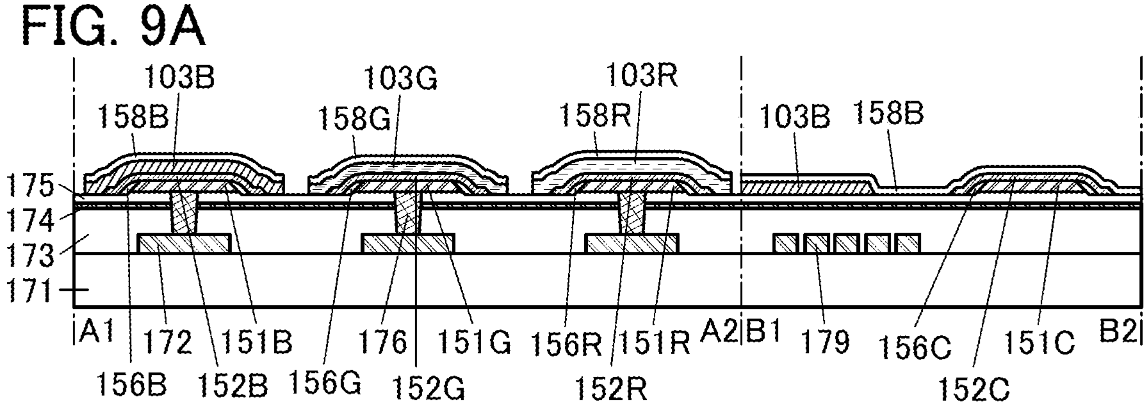
FIGS. 9A to 9C are cross-sectional views illustrating an example of a method for fabricating a light-emitting apparatus.

Next, as illustrated in FIG. 9A, the mask layers 159B, 159G, and 159R are removed.

This embodiment shows an example where the mask layers 159B, 159G, and 159R are removed; however, it is possible that the mask layers 159B, 159G, and 159R are not removed. For example, in the case where the mask layers 159B, 159G, and 159R contain the above-described material having a property of blocking ultraviolet rays, the procedure preferably proceeds to the next step without removing the mask layers 159B, 159G, and 159R, in which case the organic compound layer can be protected from light irradiation (including lighting).

The step of removing the mask layers can be performed by a method similar to that for the step of processing the mask layers. Specifically, by using a wet etching method, damage applied to the organic compound layers 103B, 103G, and 103R at the time of removing the mask layers can be reduced as compared to the case of using a dry etching method.

The mask layers may be removed by being dissolved in a solvent such as water or an alcohol. Examples of an alcohol include ethyl alcohol, methyl alcohol, isopropyl alcohol (IPA), and glycerin.

After the mask layers are removed, drying treatment may be performed in order to remove water included in the organic compound layers 103B, 103G, and 103R and water adsorbed on the surfaces of the organic compound layers 103B, 103G, and 103R. For example, heat treatment in an inert atmosphere or a reduced-pressure atmosphere can be performed. The heat treatment can be performed at a substrate temperature of higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case drying at a lower temperature is possible.

Figure 9B:
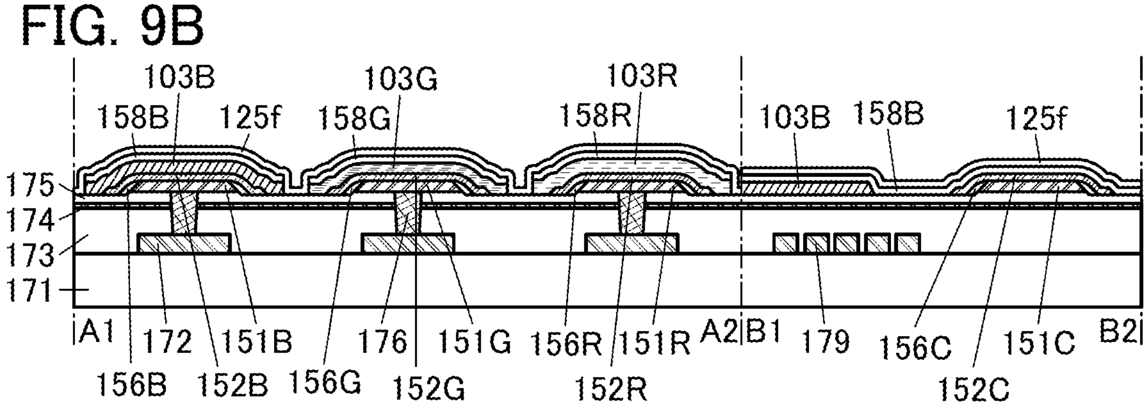

Next, as illustrated in FIG. 9B, the inorganic insulating film 125*f* to be the inorganic insulating layer 125 is formed to cover the organic compound layers 103B, 103G, and 103R and the sacrificial layers 158B, 158G, and 158R.

Since the organic compound layer 103 is sealed to block the atmosphere owing to the formation of the inorganic insulating film 125*f*, lighting adjustment is not necessarily performed after this step.

As described later, an insulating film to be the insulating layer 127 is to be formed in contact with the top surface of the inorganic insulating film 125*f*. Thus, the top surface of the inorganic insulating film 125*f* preferably has a high affinity for the material used for the insulating film to be the insulating layer 127 (e.g., a photosensitive resin composition containing an acrylic resin). To improve the affinity, surface treatment may be performed on the top surface of the inorganic insulating film 125*f*. Specifically, the surface of the inorganic insulating film 125*f* is preferably made hydrophobic (or its hydrophobic property is preferably improved). For example, it is preferable to perform the treatment using a silylation agent such as hexamethyldisilazane (HMDS). By making the top surface of the inorganic insulating film 125*f* hydrophobic in such a manner, an insulating film 127*f* can be formed with favorable adhesion.

Figure 9C:
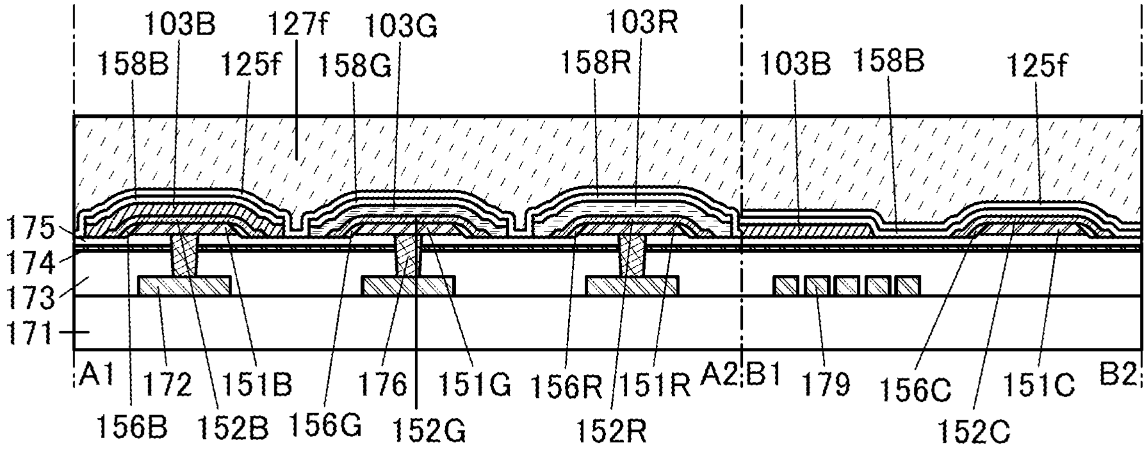

Then, as illustrated in FIG. 9C, an insulating film 127*f* to be the insulating layer 127 is formed over the inorganic insulating film 125*f*.

The inorganic insulating film 125*f* and the insulating film 127*f* are preferably formed by a formation method by which the organic compound layers 103B, 103G, and 103R are less damaged. The inorganic insulating film 125*f*, which is formed in contact with the side surfaces of the organic compound layers 103B, 103G, and 103R, is particularly preferably formed by a formation method that causes less damage to the organic compound layers 103B, 103G, and 103R than the method of forming the insulating film 127*f*.

Each of the insulating films 125*f* and 127*f* is formed at a temperature lower than the upper temperature limit of the organic compound layers 103B, 103G, and 103R. When the insulating film 125*f* is formed at a high substrate temperature, the formed insulating film 125*f*, even with a small thickness, can have a low impurity concentration and a high barrier property against at least one of water and oxygen.

The substrate temperature at the time of forming the inorganic insulating film 125*f* and the insulating film 127*f* is preferably higher than or equal to 60° C., higher than or equal to 80° C., higher than or equal to 100° C., or higher than or equal to 120° C. and lower than or equal to 200° C., lower than or equal to 180° C., lower than or equal to 160° C., lower than or equal to 150° C., or lower than or equal to 140° C.

As the inorganic insulating film 125*f*, an insulating film having a thickness of greater than or equal to 3 nm, greater than or equal to 5 nm, or greater than or equal to 10 nm and less than or equal to 200 nm, less than or equal to 150 nm, less than or equal to 100 nm, or less than or equal to 50 nm is preferably formed in the above-described range of the substrate temperature.

The inorganic insulating film 125*f* is preferably formed by an ALD method, for example. An ALD method is preferably used, in which case deposition damage is reduced and a film with good coverage can be formed. As the inorganic insulating film 125*f*, an aluminum oxide film is preferably formed by an ALD method, for example.

Alternatively, the inorganic insulating film 125*f* may be formed by a sputtering method, a CVD method, or a PECVD method, each of which has a higher deposition rate than an ALD method. In that case, a highly reliable light-emitting apparatus can be fabricated with high productivity.

The insulating film 127*f* is preferably formed by the aforementioned wet process. The insulating film 127*f* is preferably formed by spin coating using a photosensitive material, for example, and specifically preferably formed using a photosensitive resin composition containing an acrylic resin.

The insulating film 127*f* is preferably formed using a resin composition containing a polymer, an acid-generating agent, and a solvent, for example. The polymer is formed using one or more kinds of monomers and has a structure where one or more kinds of structural units (also referred to as building blocks) are repeated regularly or irregularly. As the acid-generating agent, one or both of a compound that generates an acid by light irradiation and a compound that generates an acid by heating can be used. The resin composition may also include one or more of a photosensitizing agent, a sensitizer, a catalyst, an adhesive aid, a surface-active agent, and an antioxidant.

Heat treatment (also referred to as prebaking) is preferably performed after the insulating film 127*f* is formed. The heat treatment is performed at a temperature lower than the upper temperature limit of the organic compound layers 103B, 103G, and 103R. The substrate temperature in the heat treatment is preferably higher than or equal to 50° C. and lower than or equal to 200° C., further preferably higher than or equal to 60° C. and lower than or equal to 150° C., still further preferably higher than or equal to 70° C. and lower than or equal to 120° C. Accordingly, the solvent contained in the insulating film 127*f* can be removed.

Then, part of the insulating film 127*f* is exposed to visible light or ultraviolet rays. Here, when a positive photosensitive resin composition containing an acrylic resin is used for the insulating film 127*f*, a region where the insulating layer 127 is not formed in a later step is irradiated with visible light or ultraviolet rays. The insulating layer 127 is formed in regions that are sandwiched between any two of the conductive layers 152B, 152G, and 152R and around the conductive layer 152C. Thus, the top surfaces of the conductive layers 152B, 152G, 152R, and 152C are irradiated with visible light or ultraviolet rays. Note that when a negative photosensitive material is used for the insulating film 127*f*, the region where the insulating layer 127 is to be formed is irradiated with visible light or ultraviolet rays.

The width of the insulating layer 127 formed later can be controlled in accordance with the exposed region of the insulating film 127*f*. In this embodiment, processing is performed such that the insulating layer 127 includes a portion overlapping the top surface of the conductive layer 151.

Here, when a barrier insulating layer against oxygen (e.g., an aluminum oxide film) is provided as one or both of the sacrificial layer 158 (the sacrificial layers 158B, 158G, and 158R) and the inorganic insulating film 125*f*, diffusion of oxygen to the organic compound layers 103B, 103G, and 103R can be suppressed. When the organic compound layer is irradiated with light (visible light or ultraviolet rays), the organic compound contained in the organic compound layer is brought into an excited state and a reaction between the organic compound and oxygen in the atmosphere is promoted in some cases. Specifically, when the organic compound layer is irradiated with light (visible light or ultraviolet rays) in an atmosphere including oxygen, oxygen might be bonded to the organic compound contained in the organic compound layer. By providing the sacrificial layer 158 and the inorganic insulating film 125*f* over the island-shaped organic compound layer, bonding of oxygen in the atmosphere to the organic compound contained in the organic compound layer can be suppressed.

Figure 10A:
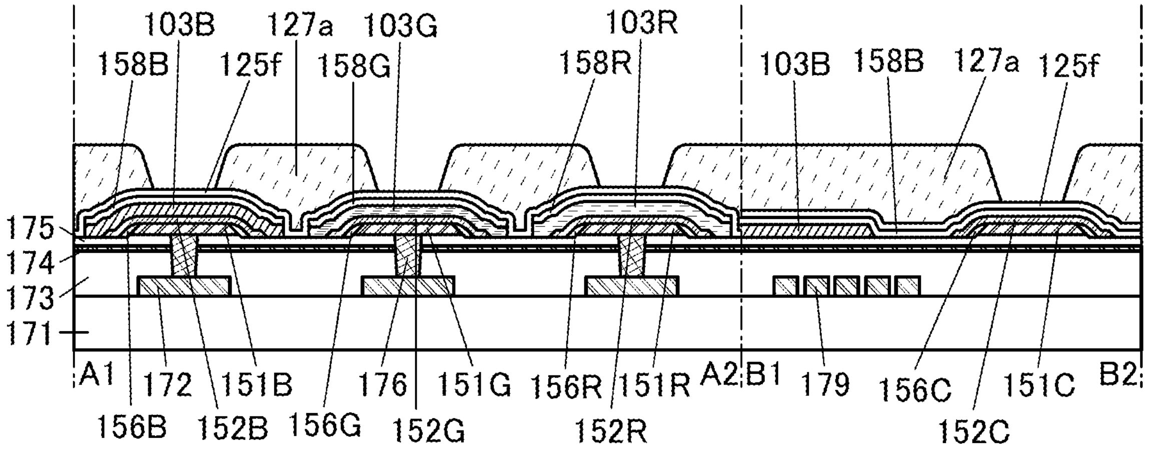
FIGS. 10A to 10C are cross-sectional views illustrating an example of a method for fabricating a light-emitting apparatus.

Next, as illustrated in FIG. 10A, development is performed to remove the exposed region of the insulating film 127*f*, whereby an insulating layer 127*a* is formed. The insulating layer 127*a* is formed in regions that are sandwiched between any two of the conductive layers 152B, 152G, and 152R and a region surrounding the conductive layer 152C. Here, when an acrylic resin is used for the insulating film 127*f*, an alkaline solution, such as TMAH, can be used as a developer.

Figure 10B:
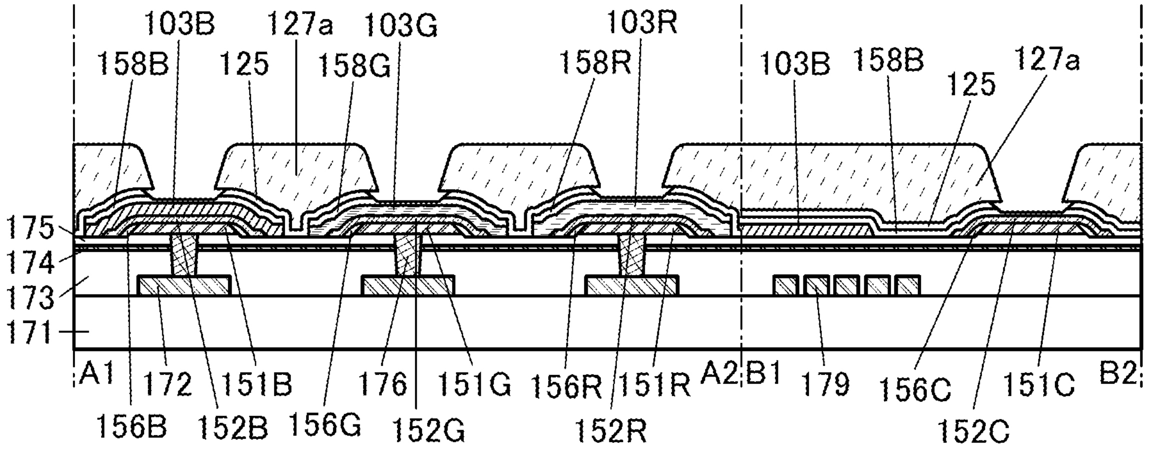
Figure 10C:
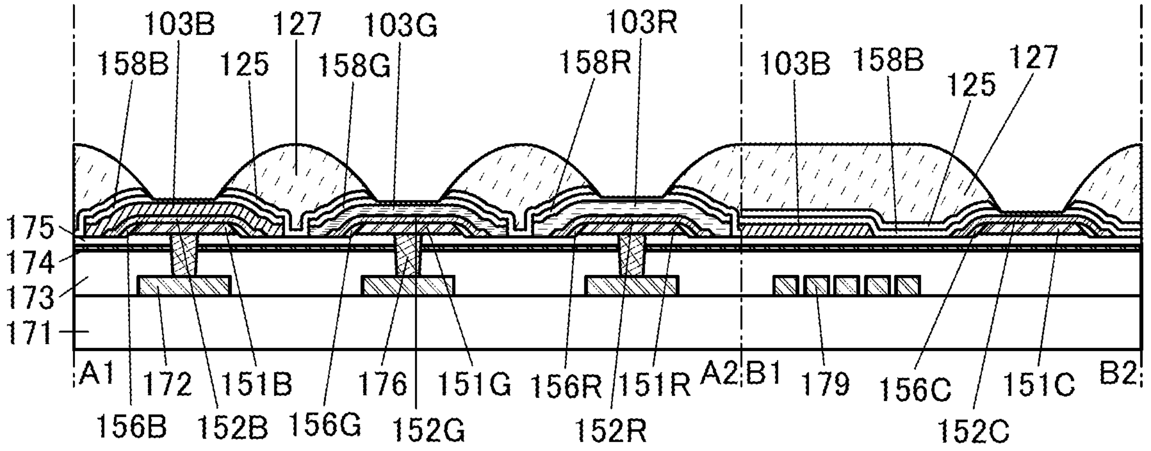

Next, as illustrated in FIG. 10B, etching treatment is performed with the insulating layer 127*a* as a mask to remove part of the inorganic insulating film 125*f* and reduce the thickness of part of the sacrificial layers 158B, 158G, and 158R. Thus, the inorganic insulating layer 125 is formed under the insulating layer 127*a*. Note that the etching treatment for processing the inorganic insulating film 125*f* using the insulating layer 127*a* as a mask may be hereinafter referred to as first etching treatment.

In other words, the sacrificial layers 158B, 158G, and 158R are not removed completely by the first etching treatment, and the etching treatment is stopped when the thickness thicknesses of the sacrificial layers 158B, 158G, and 158R are reduced. The corresponding sacrificial layers 158B, 158G, and 158R remain over the organic compound layers 103B, 103G, and 103R in this manner, whereby the organic compound layers 103B, 103G, and 103R can be prevented from being damaged by treatment in a later step.

The first etching treatment can be performed by dry etching or wet etching. Note that the inorganic insulating film 125*f* is preferably formed using a material similar to that of the sacrificial layers 158B, 158G, and 158R, in which case the processing of the inorganic insulating film 125*f* and thinning of the exposed part of the sacrificial layer 158 can be concurrently performed by the first etching treatment.

By etching using the insulating layer 127*a* with a tapered side surface as a mask, the side surface of the inorganic insulating layer 125 and upper edge portions of the side surfaces of the sacrificial layers 158B, 158G, and 158R can be made to have a tapered shape relatively easily.

In the case where the first etching treatment is performed by dry etching, for example, a chlorine-based gas can be used. As the chlorine-based gas, one of $Cl_2$, $BCl_3$, $SiCl_4$, $CCl_4$, and the like or a mixture of two or more of them can be used. Moreover, one of an oxygen gas, a hydrogen gas, a helium gas, an argon gas, and the like or a mixture of two or more of them can be added as appropriate to the chlorine-based gas. By the dry etching, the thin regions of the sacrificial layers 158B, 158G, and 158R can be formed with favorable in-plane uniformity.

The first etching treatment can be performed by wet etching, for example. The use of wet etching can reduce damage to the organic compound layers 103B, 103G, and 103R, as compared to the case of using dry etching.

The wet etching is preferably performed using an acidic chemical solution. As an acidic chemical solution, a chemical solution containing one of phosphoric acid, hydrofluoric acid, nitric acid, acetic acid, oxalic acid, sulfuric acid, and the like or a mixed chemical solution (also referred to as a mixed acid) that contains two or more of these acids is preferably used.

The wet etching can be performed using an alkaline solution. For instance, TMAH, which is an alkaline solution, can be used for the wet etching of an aluminum oxide film. In that case, puddle wet etching can be performed.

Then, heat treatment (also referred to as post-baking) is performed. The heat treatment can change the insulating layer 127*a* into the insulating layer 127 having a tapered side surface (see FIG. 10C). The heat treatment is conducted at a temperature lower than the upper temperature limit of the organic compound layer. The heat treatment can be performed at a substrate temperature of higher than or equal to 50° C. and lower than or equal to 200° C., preferably higher than or equal to 60° C. and lower than or equal to 150° C., further preferably higher than or equal to 70° C. and lower than or equal to 130° C. The heating atmosphere may be an air atmosphere or an inert atmosphere. Moreover, the heating atmosphere may be an atmospheric-pressure atmosphere or a reduced-pressure atmosphere. The substrate temperature in the heat treatment of this step is preferably higher than that in the heat treatment (prebaking) after the formation of the insulating film 127*f*.

The heat treatment can improve adhesion between the insulating layer 127 and the inorganic insulating layer 125 and increase corrosion resistance of the insulating layer 127. Furthermore, owing to the change in shape of the insulating layer 127*a*, an end portion of the inorganic insulating layer 125 can be covered with the insulating layer 127.

When the sacrificial layers 158B, 158G, and 158R are not completely removed by the first etching treatment and the thinned sacrificial layers 158B, 158G, and 158R are left, the organic compound layers 103B, 103G, and 103R can be prevented from being damaged and deteriorating in the heat treatment. This increases the reliability of the light-emitting device.

Figure 11A:
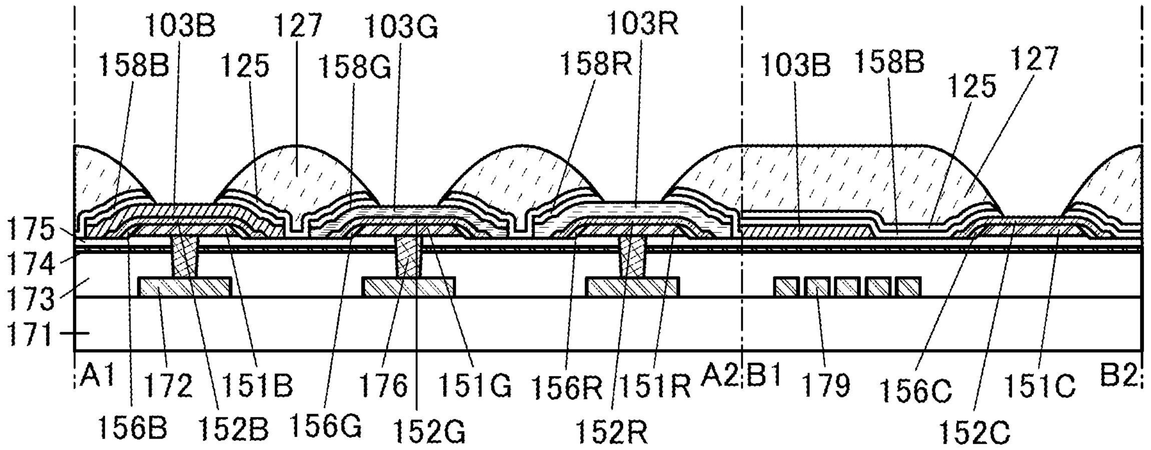
FIGS. 11A to 11C are cross-sectional views illustrating an example of a method for fabricating a light-emitting apparatus.

Next, as illustrated in FIG. 11A, etching treatment is performed with the insulating layer 127 as a mask to remove parts of the sacrificial layers 158B, 158G, and 158R. At this time, part of the inorganic insulating layer 125 is also removed in some cases. By the etching treatment, openings are formed in the sacrificial layers 158B, 158G, and 158R, and the top surfaces of the organic compound layers 103B, 103G, and 103R and the conductive layer 152C are exposed in the openings. Note that the etching treatment for exposing the organic compound layers 103B, 103G, and 103R using the insulating layer 127 as a mask may be hereinafter referred to as second etching treatment.

Since the organic compound layer 103 is exposed, the subsequent substrate holding step (including transfer between manufacturing apparatuses and storage of the substrate) is performed in an environment where lighting is adjusted. In other words, lighting with which an oxygen adduct is not generated in the organic compound layer 103 is used. Specifically, the wavelength or illuminance of the lighting is adjusted.

The second etching treatment is performed by wet etching. The use of a wet etching method can reduce damage to the organic compound layers 103B, 103G, and 103R, as compared to the case of using a dry etching method. The wet etching can be performed using an acidic chemical solution or an alkaline solution as in the case of the first etching treatment.

Heat treatment may be performed after the organic compound layers 103B, 103G, and 103R are partly exposed. By the heat treatment, water included in the organic compound layer and water adsorbed on the surface of the organic compound layer, for example, can be removed. The shape of the insulating layer 127 may be changed by the heat treatment. Specifically, the insulating layer 127 may be widened to cover at least one of the edge portion of the inorganic insulating layer 125, the edge portions of the sacrificial layers 158B, 158G, and 158R, and the top surfaces of the organic compound layers 103B, 103G, and 103R.

FIG. 11A illustrates an example in which part of the edge portion of the sacrificial layer 158G (specifically a tapered portion formed by the first etching treatment) is covered with the insulating layer 127 and a tapered portion formed by the second etching treatment is exposed (see FIG. 4A).

The insulating layer 127 may cover the entire edge portion of the sacrificial layer 158G. For example, the edge portion of the insulating layer 127 may droop to cover the edge portion of the sacrificial layer 158G. As another example, the edge portion of the insulating layer 127 may be in contact with the top surface of at least one of the organic compound layers 103B, 103G, and 103R.

Figure 11B:
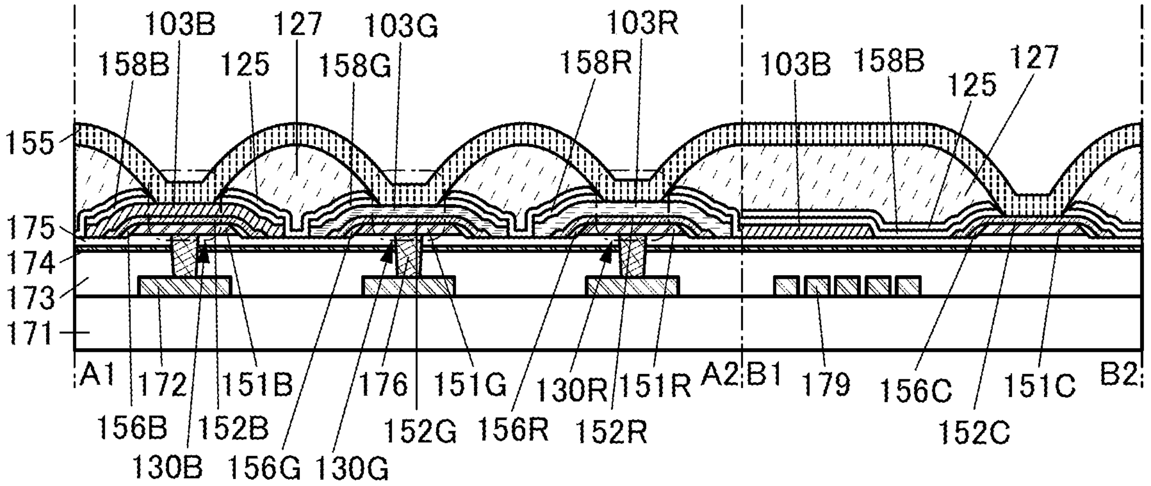

Next, as illustrated in FIG. 11B, the common electrode 155 is formed over the organic compound layers 103B, 103G, and 103R, the conductive layer 152C, and the insulating layer 127. The common electrode 155 can be formed by a sputtering method, a vacuum evaporation method, or the like. Alternatively, the common electrode 155 may be formed by stacking a film formed by an evaporation method and a film formed by a sputtering method.

Since the light-emitting device containing an organic compound is sealed to block the atmosphere owing to the formation of the common electrode 155, lighting adjustment is not necessarily performed in the subsequent steps.

Figure 11C:
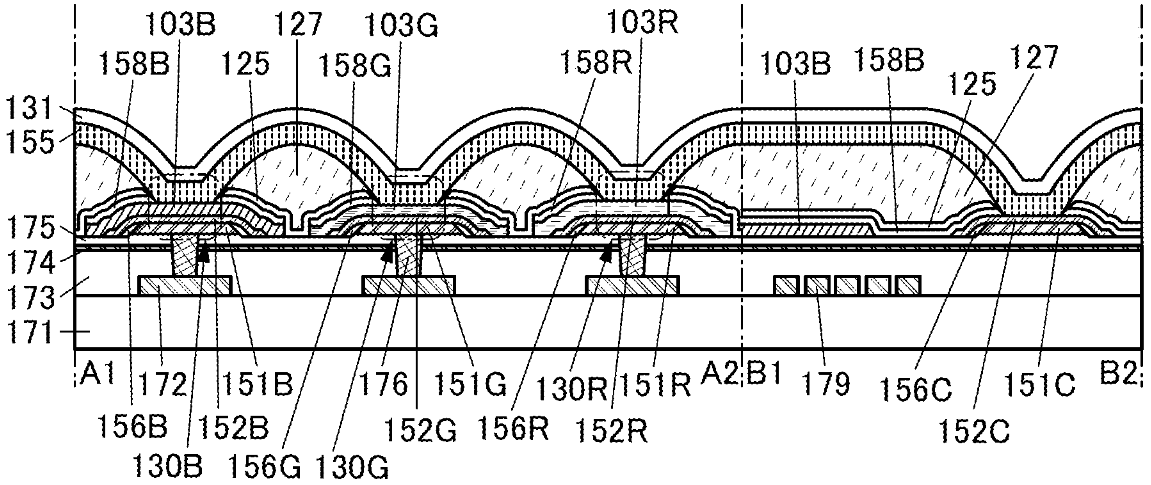

Next, as illustrated in FIG. 11C, the protective layer 131 is formed over the common electrode 155. The protective layer 131 can be formed by a vacuum evaporation method, a sputtering method, a CVD method, an ALD method, or the like.

Then, the substrate 120 is bonded over the protective layer 131 using the resin layer 122, whereby the light-emitting apparatus can be fabricated. In the method for fabricating the light-emitting apparatus of one embodiment of the present invention, the insulating layer 156 is formed to include a region overlapping the side surface of the conductive layer 151 and the conductive layer 152 is formed to cover the conductive layer 151 and the insulating layer 156 as described above. This can increase the yield of the light-emitting apparatus and inhibit generation of defects.

As described above, in the method for fabricating the light-emitting apparatus of one embodiment of the present invention, the island-shaped organic compound layers 103B, 103G, and 103R are formed not by using a fine metal mask but by processing a film formed on the entire surface; thus, the island-shaped layers can be formed to have a uniform thickness. Consequently, a high-resolution light-emitting apparatus or a light-emitting apparatus with a high aperture ratio can be obtained. Furthermore, even when the resolution or the aperture ratio is high and the distance between the subpixels is extremely short, the organic compound layers 103B, 103G, and 103R can be inhibited from being in contact with each other in the adjacent subpixels. As a result, generation of a leakage current between the subpixels can be inhibited. This can prevent crosstalk, so that a light-emitting apparatus with extremely high contrast can be obtained.

Embodiment 3

In this embodiment, other structures of the light-emitting device described in Embodiment 1 will be described with reference to FIGS. 12A to 12E.

<<Basic Structure of Light-Emitting Device>>

Figure 12A:
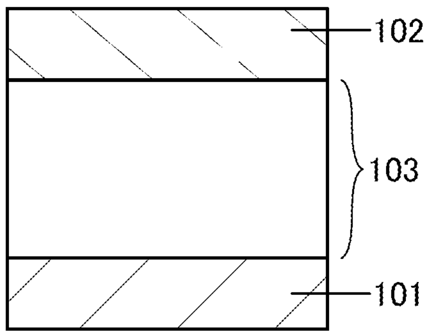
FIGS. 12A to 12E each illustrate a structure of a light-emitting device according to an embodiment.

A basic structure of a light-emitting device is described. FIG. 12A illustrates a light-emitting device including, between a pair of electrodes, an EL layer including a light-emitting layer. Specifically, the organic compound layer 103 is positioned between a first electrode 101 and a second electrode 102.

Figure 12B:
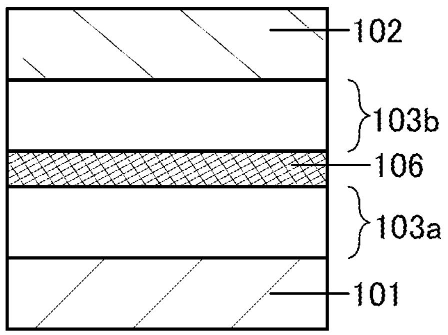

FIG. 12B illustrates a light-emitting device that has a stacked-layer structure (tandem structure) in which a plurality of EL (organic compound) layers (two layers **103*a* and 103*b* in FIG. 12B) are provided between a pair of electrodes and a charge-generation layer 106** is provided between the EL layers. A light-emitting device having a tandem structure enables fabrication of a light-emitting apparatus that has high efficiency without changing the amount of current.

The charge-generation layer 106 has a function of injecting electrons into one of the EL layers (**103*a* or 103*b*) and injecting holes into the other of the EL layers (103*b* or 103*a*) when a potential difference is caused between the first electrode 101 and the second electrode 102. Thus, when voltage is applied in FIG. 12B such that the potential of the first electrode 101 is higher than that of the second electrode 102, the charge-generation layer 106 injects electrons into the organic compound layer 103*a* and injects holes into the organic compound layer 103*b***.

Note that in terms of light extraction efficiency, the charge-generation layer 106 preferably has a property of transmitting visible light (specifically, the charge-generation layer 106 preferably has a visible light transmittance of 40% or more). The charge-generation layer 106 functions even if it has lower conductivity than the first electrode 101 or the second electrode 102.

Figure 12C:
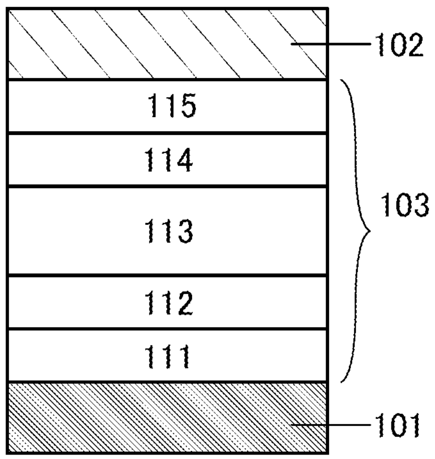

FIG. 12C illustrates a stacked-layer structure of the organic compound layer 103 in the light-emitting device of one embodiment of the present invention. In this case, the first electrode 101 is regarded as functioning as an anode and the second electrode 102 is regarded as functioning as a cathode. The organic compound layer 103 has a structure in which a hole-injection layer 111, a hole-transport layer 112, the light-emitting layer 113, an electron-transport layer 114, and an electron-injection layer 115 are stacked in this order over the first electrode 101. Note that the light-emitting layer 113 may have a stacked-layer structure of a plurality of light-emitting layers that emit light of different colors. For example, a light-emitting layer containing a light-emitting substance that emits red light, a light-emitting layer containing a light-emitting substance that emits green light, and a light-emitting layer containing a light-emitting substance that emits blue light may be stacked with or without a layer containing a carrier-transport material therebetween. Alternatively, a light-emitting layer containing a light-emitting substance that emits yellow light and a light-emitting layer containing a light-emitting substance that emits blue light may be used in combination. Note that the stacked-layer structure of the light-emitting layer 113 is not limited to the above. For example, the light-emitting layer 113 may have a stacked-layer structure of a plurality of light-emitting layers that emit light of the same color. For example, a first light-emitting layer containing a light-emitting substance that emits blue light and a second light-emitting layer containing a light-emitting substance that emits blue light may be stacked with or without a layer containing a carrier-transport material therebetween. The structure in which a plurality of light-emitting layers that emit light of the same color are stacked can achieve higher reliability than a single-layer structure in some cases. In the case where a plurality of EL layers are provided as in the tandem structure illustrated in FIG. 12B, the layers in each EL layer are sequentially stacked from the anode side as described above. When the first electrode 101 is the cathode and the second electrode 102 is the anode, the stacking order of the layers in the organic compound layer 103 is reversed. Specifically, the layer 111 over the first electrode 101 serving as the cathode is an electron-injection layer; the layer 112 is an electron-transport layer; the layer 113 is a light-emitting layer; the layer 114 is a hole-transport layer; and the layer 115 is a hole-injection layer.

The light-emitting layer 113 included in the EL layers (103, 103*a*, and 103*b*) contains an appropriate combination of a light-emitting substance and a plurality of substances, so that fluorescent light of a desired color or phosphorescent light of a desired color can be obtained. The light-emitting layer 113 may have a stacked-layer structure having different emission colors. In that case, light-emitting substances and other substances are different between the stacked light-emitting layers. Alternatively, the plurality of EL layers (103*a* and 103*b*) in FIG. 12B may exhibit their respective emission colors. Also in that case, the light-emitting substances and other substances are different between the stacked light-emitting layers.

The light-emitting device of one embodiment of the present invention can have a micro optical resonator (microcavity) structure when, for example, the first electrode 101 is a reflective electrode and the second electrode 102 is a transflective electrode in FIG. 12C. Thus, light from the light-emitting layer 113 in the organic compound layer 103 can be resonated between the electrodes and light emitted through the second electrode 102 can be intensified.

Note that when the first electrode 101 of the light-emitting device is a reflective electrode having a stacked-layer structure of a reflective conductive material and a light-transmitting conductive material (transparent conductive film), optical adjustment can be performed by adjusting the thickness of the transparent conductive film. Specifically, when the wavelength of light obtained from the light-emitting layer 113 is λ, the optical path length between the first electrode 101 and the second electrode 102 (the product of the thickness and the refractive index) is preferably adjusted to be $m\lambda/2$ (m is an integer of 1 or more) or close to $m\lambda/2$.

To amplify desired light (wavelength: λ) obtained from the light-emitting layer 113, it is preferable to adjust each of the optical path length from the first electrode 101 to a region where the desired light is obtained in the light-emitting layer 113 (light-emitting region) and the optical path length from the second electrode 102 to the region where the desired light is obtained in the light-emitting layer 113 (light-emitting region) to be $(2m'+1)\lambda/4$ (m' is an integer of 0 or more) or close to $(2m'+1)\lambda/4$. Here, the light-emitting region means a region where holes and electrons are recombined in the light-emitting layer 113.

By such optical adjustment, the spectrum of specific monochromatic light obtained from the light-emitting layer 113 can be narrowed and light emission with high color purity can be obtained.

In the above case, the optical path length between the first electrode 101 and the second electrode 102 is, to be exact, the total thickness from a reflective region in the first electrode 101 to a reflective region in the second electrode 102. However, it is difficult to precisely determine the reflective regions in the first electrode 101 and the second electrode 102; thus, it is assumed that the above effect can be sufficiently obtained wherever the reflective regions may be set in the first electrode 101 and the second electrode 102. Furthermore, the optical path length between the first electrode 101 and the light-emitting layer that emits the desired light is, to be exact, the optical path length between the reflective region in the first electrode 101 and the light-emitting region in the light-emitting layer that emits the desired light. However, it is difficult to precisely determine the reflective region in the first electrode 101 and the light-emitting region in the light-emitting layer that emits the desired light; thus, it is assumed that the above effect can be sufficiently obtained wherever the reflective region and the light-emitting region may be set in the first electrode 101 and the light-emitting layer that emits the desired light, respectively.

Figure 12D:
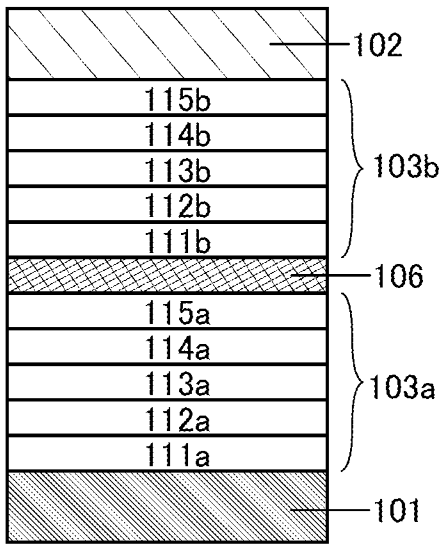

The light-emitting device illustrated in FIG. 12D is a light-emitting device having a tandem structure. Owing to a microcavity structure of the light-emitting device, light (monochromatic light) with different wavelengths from the EL layers (103*a* and 103*b*) can be extracted. Thus, it is unnecessary to separately form EL layers for obtaining a plurality of emission colors (e.g., R, G, and B). Therefore, high resolution can be easily achieved. A combination with coloring layers (color filters) is also possible. Furthermore, the emission intensity of light with a specific wavelength in the front direction can be increased, whereby power consumption can be reduced.

Figure 12E:
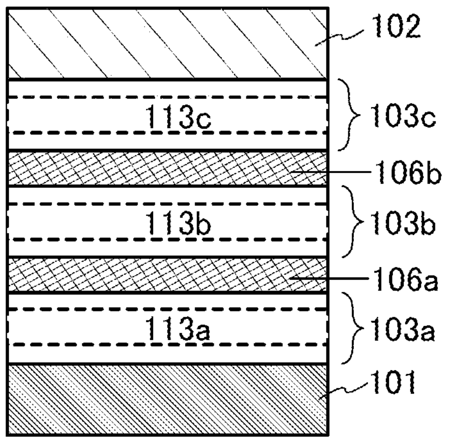

The light-emitting device illustrated in FIG. 12E is an example of the light-emitting device having the tandem structure illustrated in FIG. 12B, and includes three EL (organic compound) layers (103*a*, 103*b*, and 103*c*) stacked with charge-generation layers (106*a* and 106*b*) positioned therebetween, as illustrated in FIG. 12E. The three EL layers (103*a*, 103*b*, and 103*c*) include respective light-emitting layers (113*a*, 113*b*, and 113*c*), and the emission colors of the light-emitting layers can be selected freely. For example, the light-emitting layer 113*a* can emit blue light, the light-emitting layer 113*b* can emit red light, green light, or yellow light, and the light-emitting layer 113*c* can emit blue light, or the light-emitting layer 113*a* can emit red light, the light-emitting layer 113*b* can emit blue light, green light, or yellow light, and the light-emitting layer 113*c* can emit red light.

In the light-emitting device of one embodiment of the present invention, at least one of the first electrode 101 and the second electrode 102 is a light-transmitting electrode (e.g., a transparent electrode or a transflective electrode). In the case where the light-transmitting electrode is a transparent electrode, the transparent electrode has a visible light transmittance higher than or equal to 40%. In the case where the light-transmitting electrode is a transflective electrode, the transflective electrode has a visible light reflectance higher than or equal to 20% and lower than or equal to 80%, preferably higher than or equal to 40% and lower than or equal to 70%. These electrodes preferably have a resistivity of $1\times10^{-2}$ Ωcm or less.

When one of the first electrode 101 and the second electrode 102 is a reflective electrode in the light-emitting device of one embodiment of the present invention, the visible light reflectance of the reflective electrode is higher than or equal to 40% and lower than or equal to 100%, preferably higher than or equal to 70% and lower than or equal to 100%. This electrode preferably has a resistivity of $1\times10^{-2}$ Ωcm or less.

<<Specific Structure of Light-Emitting Device>>

Next, a specific structure of the light-emitting device of one embodiment of the present invention will be described. Here, the description is made using FIG. 12D illustrating the tandem structure. Note that the structure of the EL layer applies also to the structure of the light-emitting devices having a single structure in FIGS. 12A and 12C. When the light-emitting device in FIG. 12D has a microcavity structure, the first electrode 101 is formed as a reflective electrode and the second electrode 102 is formed as a transflective electrode. Thus, a single-layer structure or a stacked-layer structure can be formed using one or more kinds of desired electrode materials. Note that the second electrode 102 is formed after formation of the organic compound layer 103*b*, with the use of a material selected as appropriate.

<First Electrode and Second Electrode>

As materials for the first electrode 101 and the second electrode 102, any of the following materials can be used in an appropriate combination as long as the above functions of the electrodes can be fulfilled. For example, a metal, an alloy, an electrically conductive compound, a mixture of these, and the like can be used as appropriate. Specifically, an In—Sn oxide (also referred to as ITO), an In—Si—Sn oxide (also referred to as ITSO), an In—Zn oxide, or an In—W—Zn oxide can be used. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table that is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

In the light-emitting device in FIG. 12D, when the first electrode 101 is the anode, a hole-injection layer 111*a* and a hole-transport layer 112*a* of the organic compound layer 103*a* are sequentially stacked over the first electrode 101 by a vacuum evaporation method. After the organic compound layer 103*a* and the charge-generation layer 106 are formed, a hole-injection layer 111*b* and a hole-transport layer 112*b* of the organic compound layer 103*b* are sequentially stacked over the charge-generation layer 106 in a similar manner.

<Hole-Injection Layer>

The hole-injection layers (111, 111*a*, and 111*b*) inject holes from the first electrode 101 serving as the anode and the charge-generation layers (106, 106*a*, and 106*b*) to the EL layers (103, 103*a*, and 103*b*) and contain an organic acceptor material or a material having a high hole-injection property.

The organic acceptor material allows holes to be generated in another organic compound whose HOMO level is close to the LUMO level of the organic acceptor material when charge separation is caused between the organic acceptor material and the organic compound. Thus, as the organic acceptor material, a compound having an electron-withdrawing group (e.g., a halogen group or a cyano group), such as a quinodimethane derivative, a chloranil derivative, and a hexaazatriphenylene derivative, can be used. Examples of the organic acceptor material include 7,7,8,8-tetracyano-2,3,5,6-tetrafluoroquinodimethane (abbreviation: $F_4$-TCNQ), 3,6-difluoro-2,5,7,7,8,8-hexacyanoquinodimethane, chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylene-1,3,4,5,6,8,9,10-octafluoro-7H-pyren-2-ylidene)malononitrile. Note that among organic acceptor materials, a compound in which electron-withdrawing groups are bonded to fused aromatic rings each having a plurality of heteroatoms, such as HAT-CN, is particularly preferred because it has a high acceptor property and stable film quality against heat. Besides, a [3]radialene derivative having an electron-withdrawing group (particularly a cyano group or a halogen group such as a fluoro group), which has a very high electron-accepting property, is preferred; specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

As the material having a high hole-injection property, an oxide of a metal belonging to Group 4 to Group 8 in the periodic table (e.g., a transition metal oxide such as a molybdenum oxide, a vanadium oxide, a ruthenium oxide, a tungsten oxide, or a manganese oxide) can be used. Specific examples include molybdenum oxide, vanadium oxide, niobium oxide, tantalum oxide, chromium oxide, tungsten oxide, manganese oxide, and rhenium oxide. Among these oxides, molybdenum oxide is preferable because it is stable in the air, has a low hygroscopic property, and is easily handled. Other examples are phthalocyanine (abbreviation: $H_2Pc$), a phthalocyanine-based compound such as copper phthalocyanine (abbreviation: CuPc), and the like.

Other examples are aromatic amine compounds, which are low-molecular compounds, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), N,N'-bis[4-bis(3-methylphenyl)aminophenyl]-N,N'-diphenyl-4,4'-diaminobiphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Other examples are high-molecular compounds (e.g., oligomers, dendrimers, and polymers) such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD). Alternatively, it is possible to use a high-molecular compound to which acid is added, such as poly(3,4-ethylenedioxythiophene)/polystyrenesulfonic acid (abbreviation: PEDOT/PSS) or polyaniline/polystyrenesulfonic acid (abbreviation: PAni/PSS), for example.

As the material having a high hole-injection property, a mixed material containing a hole-transport material and the above-described organic acceptor material (electron-accepting material) can be used. In that case, the organic acceptor material extracts electrons from the hole-transport material, so that holes are generated in the hole-injection layer 111 and the holes are injected into the light-emitting layer 113 through the hole-transport layer 112. Note that the hole-injection layer 111 may be formed to have a single-layer structure using a mixed material containing a hole-transport material and an organic acceptor material (electron-accepting material), or a stacked-layer structure of a layer containing a hole-transport material and a layer containing an organic acceptor material (electron-accepting material).

The hole-transport material preferably has a hole mobility higher than or equal to $1\times10^{-6}$ $cm^2/Vs$ in the case where the square root of the electric field strength [V/cm] is 600. Note that other substances can also be used as long as the substances have hole-transport properties higher than electron-transport properties.

As the hole-transport material, materials having a high hole-transport property, such as a compound having a π-electron rich heteroaromatic ring (e.g., a carbazole derivative, a furan derivative, and a thiophene derivative) and an aromatic amine (an organic compound having an aromatic amine skeleton), are preferable.

Examples of the carbazole derivative (an organic compound having a carbazole ring) include a bicarbazole derivative (e.g., a 3,3'-bicarbazole derivative) and an aromatic amine having a carbazolyl group.

Specific examples of the bicarbazole derivative (e.g., a 3,3'-bicarbazole derivative) include 9,9'-diphenyl-9H,9'H-3,3'-bicarbazole (abbreviation: PCCP), 9,9'-bis(biphenyl-4-yl)-3,3'-bi-9H-carbazole (abbreviation: BisBPCz), 9,9'-bis(1,1'-biphenyl-3-yl)-3,3'-bi-9H-carbazole (abbreviation: BismBPCz), 9-(biphenyl-3-yl)-9'-(biphenyl-4-yl)-9H,9'H-3,3'-bicarbazole (abbreviation: mBPCCBP), and 9-(2-naphthyl)-9'-phenyl-9H,9'H-3,3'-bicarbazole (abbreviation: βNCCP).

Specific examples of the aromatic amine having a carbazolyl group include 4-phenyl-4'-(9-phenyl-9H-carbazol-3-yl)triphenylamine (abbreviation: PCBA1BP), N-(4-biphenyl)-N-(9,9-dimethyl-9H-fluoren-2-yl)-9-phenyl-9H-carbazol-3-amine (abbreviation: PCBiF), N-(biphenyl-4-yl)-N-[4-(9-phenyl-9H-carbazol-3-yl)phenyl]-9,9-dimethyl-9H-fluoren-2-amine (abbreviation: PCBBiF), N-[4-(9-phenyl-9H-carbazol-3-yl)phenyl]bis(9,9-dimethyl-9H-fluoren-2-yl)amine (abbreviation: PCBFF), N-(1,1'-biphenyl-4-yl)-N-[4-(9-phenyl-9H-carbazol-3-yl)phenyl]-9,9-dimethyl-9H-fluoren-4-amine, N-[4-(9-phenyl-9H-carbazol-3-yl)phenyl]-(9,9-dimethyl-9H-fluoren-2-yl)-9,9-dimethyl-9H-fluoren-4-amine, N-(1,1'-biphenyl-4-yl)-N-[4-(9-phenyl-9H-carbazol-3-yl)phenyl]-9,9-diphenyl-9H-fluoren-2-amine, N-(1,1'-biphenyl-4-yl)-N-[4-(9-phenyl-9H-carbazol-3-yl)phenyl]-9,9-diphenyl-9H-fluoren-4-amine, N-(1,1'-biphenyl-4-yl)-N-[4-(9-phenyl-9H-carbazol-3-yl)phenyl]-9,9'-spirobi(9H-fluoren)-2-amine, N-(1,1'-biphenyl-4-yl)-N-[4-(9-phenyl-9H-carbazol-3-yl)phenyl]-9,9'-spirobi(9H-fluoren)-4-amine, N-[4-(9-phenyl-9H-carbazol-3-yl)phenyl]-N-[1,1':3',1"-terphenyl-4-yl]-9,9-dimethyl-9H-fluoren-2-amine, N-[4-(9-phenyl-9H-carbazol-3-yl)phenyl]-N-[1,1':4',1"-terphenyl-4-yl]-9,9-dimethyl-9H-fluoren-2-amine, N-[4-(9-phenyl-9H-carbazol-3-yl)phenyl]-N-[1,1':3',1"-terphenyl-4-yl]-9,9-dimethyl-9H-fluoren-4-amine, N-[4-(9-phenyl-9H-carbazol-3-yl)phenyl]-N-[1,1':4',1"-terphenyl-4-yl]-9,9-dimethyl-9H-fluoren-4-amine, 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N,N'-triphenyl-N,N,N'-tris(9-phenylcarbazol-3-yl)benzene-1,3,5-triamine (abbreviation: PCA3B), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]-9,9'-spirobi[9H-fluoren]-2-amine (abbreviation: PCBASF), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 2-[N-(9-phenylcarbazol-3-yl)-N-phenylamino]-9,9'-spirobi[9H-fluorene] (abbreviation: PCASF), N-[4-(9H-carbazol-9-yl)phenyl]-N-(4-phenyl)phenylaniline (abbreviation: YGA1BP), N,N'-bis[4-(carbazol-9-yl)phenyl]-N,N'-diphenyl-9,9-dimethylfluorene-2,7-diamine (abbreviation: YGA2F), and 4,4',4"-tris(carbazol-9-yl)triphenylamine (abbreviation: TCTA).

Other examples of the carbazole derivative include 9-[4-(9-phenyl-9H-carbazol-3-yl)-phenyl]phenanthrene (abbreviation: PCPPn), 3-[4-(1-naphthyl)phenyl]-9-phenyl-9H-carbazole (abbreviation: PCPN), 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA).

Specific examples of the furan derivative (an organic compound having a furan ring) include 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II).

Specific examples of the thiophene derivative (an organic compound having a thiophene ring) include organic compounds having a thiophene ring, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV).

Specific examples of the aromatic amine include 4,4'-bis[N-(1-naphthyl)-N-phenylamino]biphenyl (abbreviation: NPB or α-NPD), N,N'-diphenyl-N,N'-bis(3-methylphenyl)-4,4'-diaminobiphenyl (abbreviation: TPD), N,N'-bis(9,9'-spirobi[9H-fluoren]-2-yl)-N,N'-diphenyl-4,4'-diaminobiphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]-9,9'-spirobi[9H-fluorene] (abbreviation: DPASF), 2,7-bis[N-(4-diphenylaminophenyl)-N-phenylamino]-9,9'-spirobi[9H-fluorene] (abbreviation: DPA2SF), 4,4',4"-tris[N-(1-naphthyl)-N-phenylamino]triphenylamine (abbreviation: 1'-TNATA), 4,4',4"-tris(N,N-diphenylamino)triphenylamine (abbreviation: TDATA), 4,4',4"-tris[N-(3-methylphenyl)-N-phenylamino]triphenylamine (abbreviation: m-MTDATA), N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), DNTPD, 1,3,5-tris[N-(4-diphenylaminophenyl)-N-phenylamino]benzene (abbreviation: DPA3B), N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis(biphenyl-4-yl)-9,9'-spirobi[9H-fluoren]-2-amine (abbreviation: BBASF), N,N-bis(biphenyl-4-yl)-9,9'-spirobi[9H-fluoren]-4-amine (abbreviation: BBASF(4)), N-(biphenyl-2-yl)-N-(9,9-dimethyl-9H-fluoren-2-yl)-9,9'-spirobi[9H-fluoren]-4-amine (abbreviation: oFBiSF), N-(biphenyl-4-yl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-[4-(9-phenylfluoren-9-yl)phenyl]triphenylamine (abbreviation: BPAFLBi), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

Other examples of the hole-transport material include high-molecular compounds (e.g., oligomers, dendrimers, and polymers) such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), and poly[N,N'-bis(4-butylphenyl)-N,N'-bis(phenyl)benzidine](abbreviation: Poly-TPD). Alternatively, it is possible to use a high-molecular compound to which acid is added, such as poly(3,4-ethylenedioxythiophene)/polystyrenesulfonic acid (abbreviation: PEDOT/PSS) or polyaniline/polystyrenesulfonic acid (abbreviation: PAni/PSS), for example.

Note that the hole-transport material is not limited to the above examples, and any of a variety of known materials may be used alone or in combination as the hole-transport material.

The hole-injection layers (111, 111*a*, and 111*b*) can be formed by any of known film formation methods such as a vacuum evaporation method.

<Hole-Transport Layer>

The hole-transport layers (112, 112*a*, and 112*b*) transport the holes, which are injected from the first electrodes 101 by the hole-injection layers (111, 111*a*, and 111*b*), to the light-emitting layers (113, 113*a*, and 113*b*). Note that the hole-transport layers (112, 112*a*, and 112*b*) each contain a hole-transport material. Thus, the hole-transport layers (112, 112*a*, and 112*b*) can be formed using hole-transport materials that can be used for the hole-injection layers (111, 111*a*, and 111*b*).

Note that in the light-emitting device of one embodiment of the present invention, the organic compound used for the hole-transport layers (112, 112*a*, and 112*b*) can also be used for the light-emitting layers (113, 113*a*, and 113*b*). The use of the same organic compound for the hole-transport layers (112, 112*a*, and 112*b*) and the light-emitting layers (113, 113*a*, and 113*b*) is preferable, in which case holes can be efficiently transported from the hole-transport layers (112, 112*a*, and 112*b*) to the light-emitting layers (113, 113*a*, and 113*b*).

<Light-Emitting Layer>

The light-emitting layers (113, 113*a*, and 113*b*) contain a light-emitting substance. Note that as a light-emitting substance that can be used in the light-emitting layers (113, 113*a*, and 113*b*), a substance whose emission color is blue, violet, bluish violet, green, yellowish green, yellow, orange, red, or the like can be used as appropriate. When a plurality of light-emitting layers are provided, the use of different light-emitting substances for the light-emitting layers enables a structure that exhibits different emission colors (e.g., white light emission obtained by a combination of complementary emission colors). Furthermore, one light-emitting layer may have a stacked-layer structure including different light-emitting substances.

The light-emitting layers (113, 113*a*, and 113*b*) may each contain one or more kinds of organic compounds (e.g., a host material) in addition to a light-emitting substance (a guest material).

In the case where a plurality of host materials are used in the light-emitting layers (113, 113*a*, and 113*b*), a second host material that is additionally used is preferably a substance having a larger energy gap than those of a known guest material and a first host material. Preferably, the lowest singlet excitation energy level (S1 level) of the second host material is higher than that of the first host material, and the lowest triplet excitation energy level (T1 level) of the second host material is higher than that of the guest material. Preferably, the lowest triplet excitation energy level (T1 level) of the second host material is higher than that of the first host material. With such a structure, an exciplex can be formed by the two kinds of host materials. To form an exciplex efficiently, it is particularly preferable to combine a compound that easily accepts holes (hole-transport material) and a compound that easily accepts electrons (electron-transport material). With the above structure, high efficiency, low voltage, and a long lifetime can be achieved at the same time.

As an organic compound used as the host material (including the first host material and the second host material), organic compounds such as the hole-transport materials usable for the hole-transport layers (112, 112*a*, and 112*b*) described above and electron-transport materials usable for electron-transport layers (114, 114*a*, and 114*b*) described later can be used as long as they satisfy requirements for the host material used in the light-emitting layer. Another example is an exciplex formed by two or more kinds of organic compounds (the first host material and the second host material). An exciplex whose excited state is formed by two or more kinds of organic compounds has an extremely small difference between the S1 level and the T1 level and functions as a TADF material capable of converting triplet excitation energy into singlet excitation energy. In an example of a preferred combination of two or more kinds of organic compounds forming an exciplex, one compound of the two or more kinds of organic compounds has a π-electron deficient heteroaromatic ring and the other compound has a π-electron rich heteroaromatic ring. A phosphorescent substance such as an iridium-, rhodium-, or platinum-based organometallic complex or a metal complex may be used as one compound of the combination for forming an exciplex.

There is no particular limitation on the light-emitting substances that can be used for the light-emitting layers (113, 113*a*, and 113*b*), and a light-emitting substance that converts singlet excitation energy into light in the visible light range or a light-emitting substance that converts triplet excitation energy into light in the visible light range can be used.

<<Light-Emitting Substance that Converts Singlet Excitation Energy into Light>>

The following substances that emit fluorescent light (fluorescent substances) can be given as examples of the light-emitting substance that converts singlet excitation energy into light and can be used in the light-emitting layers (113, 113*a*, and 113*b*): a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-diphenyl-N,N'-bis[4-(9-phenyl-9H-fluoren-9-yl)phenyl]pyrene-1,6-diamine (abbreviation: 1,6FLPAPrn), N,N'-bis(dibenzofuran-2-yl)-N,N'-diphenylpyrene-1,6-diamine (abbreviation: 1,6FrAPrn), N,N'-bis(dibenzothiophen-2-yl)-N,N'-diphenylpyrene-1,6-diamine (abbreviation: 1,6ThAPrn), N,N'-(pyrene-1,6-diyl)bis[(N-phenylbenzo[b]naphtho[1,2-d]furan)-6-amine] (abbreviation: 1,6BnfAPrn), N,N'-(pyrene-1,6-diyl)bis[(N-phenylbenzo[b]naphtho[1,2-d]furan)-8-amine](abbreviation: 1,6BnfAPrn-02), and N,N'-(pyrene-1,6-diyl)bis[(6,N-diphenylbenzo[b]naphtho[1,2-d]furan)-8-amine] (abbreviation: 1,6BnfAPrn-03).

In addition, it is possible to use, for example, 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra-tert-butylperylene (abbreviation: TBP), N,N''-(2-tert-butylanthracene-9,10-diyldi-4,1-phenylene)bis(N,N',N'-triphenyl-1,4-phenylenediamine) (abbreviation: DPABPA), N,9-diphenyl-N-[4-(9,10-diphenyl-2-anthryl)phenyl]-9H-carbazol-3-amine (abbreviation: 2PCAPPA), and N-[4-(9,10-diphenyl-2-anthryl)phenyl]-N,N',N'-triphenyl-1,4-phenylenediamine (abbreviation: 2DPAPPA).

It is also possible to use, for example, N-[9,10-bis(biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(biphenyl-2-yl)-2-anthryl]-N,N',N'-triphenyl-1,4-phenylenediamine (abbreviation: 2DPABPhA), 9,10-bis(biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), 1,6BnfAPrn-03, N,N'-diphenyl-N,N'-bis(9-phenyl-9H-carbazol-2-yl)naphtho[2,3-b;6,7-b']bisbenzofuran-3,10-diamine (abbreviation: 3,10PCA2Nbf(IV)-02), and 3,10-bis[N-(dibenzofuran-3-yl)-N-phenylamino]naphtho[2,3-b;6,7-b']bisbenzofuran (abbreviation: 3,10FrA2Nbf(IV)-02). In particular, pyrenediamine compounds such as 1,6FLPAPrn, 1,6mMemFLPAPrn, and 1,6BnfAPrn-03 can be used, for example.

<<Light-Emitting Substance that Converts Triplet Excitation Energy into Light>>

Examples of the light-emitting substance that converts triplet excitation energy into light and can be used in the light-emitting layer 113 include substances that emit phosphorescent light (phosphorescent substances) and thermally activated delayed fluorescent (TADF) materials that exhibit thermally activated delayed fluorescence.

A phosphorescent substance is a compound that emits phosphorescent light but does not emit fluorescent light at a temperature higher than or equal to a low temperature (e.g., 77 K) and lower than or equal to room temperature (i.e., higher than or equal to 77 K and lower than or equal to 313 K). The phosphorescent substance preferably contains a metal element with large spin-orbit interaction, and can be an organometallic complex, a metal complex (platinum complex), or a rare earth metal complex, for example. Specifically, the phosphorescent substance preferably contains a transition metal element. It is preferable that the phosphorescent substance contain a platinum group element (ruthenium (Ru), rhodium (Rh), palladium (Pd), osmium (Os), iridium (Ir), or platinum (Pt)), especially iridium, in which case the probability of direct transition between the singlet ground state and the triplet excited state can be increased.

<<Phosphorescent Substance (from 450 nm to 570 nm: Blue or Green)>>

As examples of a phosphorescent substance which emits blue or green light and whose emission spectrum has a peak wavelength of greater than or equal to 450 nm and less than or equal to 570 nm, the following substances can be given.

Examples include organometallic complexes having a 4H-triazole ring, such as tris{2-[5-(2-methylphenyl)-4-(2,6-dimethylphenyl)-4H-1,2,4-triazol-3-yl-κN$^2$]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), and tris[3-(5-biphenyl)-5-isopropyl-4-phenyl-4H-1,2,4-triazolato]iridium(III) (abbreviation: [Ir(iPr5btz)$_3$]); organometallic complexes having a 1H-triazole ring, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic complexes having an imidazole ring, such as fac-tris[1-(2,6-diisopropylphenyl)-2-phenyl-1H-imidazole]iridium(III) (abbreviation: [Ir(iPrpim)$_3$]) and tris[3-(2,6-dimethylphenyl)-7-methylimidazo[1,2-f]phenanthridinato]iridium(III) (abbreviation: [Ir(dmpimpt-Me)$_3$]); and organometallic complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIr(acac)).

<<Phosphorescent Substance (from 495 nm to 590 nm: Green or Yellow)>>

As examples of a phosphorescent substance which emits green or yellow light and whose emission spectrum has a peak wavelength of greater than or equal to 495 nm and less than or equal to 590 nm, the following substances can be given.

Examples of the phosphorescent substance include organometallic iridium complexes having a pyrimidine ring, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), (acetylacetonato)bis{4,6-dimethyl-2-[6-(2,6-dimethylphenyl)-4-pyrimidinyl-κN$^3$]phenyl-κC}iridium(III) (abbreviation: [Ir(dmppm-dmp)$_2$(acac)]), and (acetylacetonato)bis(4,6-diphenylpyrimidinato)iridium(III) (abbreviation: [Ir(dppm)$_2$(acac)]); organometallic iridium complexes having a pyrazine ring, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having a pyridine ring, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$ (acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), bis(2-phenylquinolinato-N,C$^{2'}$)iridium(III) acetylacetonate (abbreviation: [Ir(pq)$_2$(acac)]), bis[2-(2-pyridinyl-κN)phenyl-κC][2-(4-phenyl-2-pyridinyl-κN)phenyl-κC]iridium(III) (abbreviation: [Ir(ppy)$_2$(4dppy)]), bis[2-(2-pyridinyl-κN)phenyl-κC][2-(4-methyl-5-phenyl-2-pyridinyl-κN)phenyl-κC], [2-d3-methyl-8-(2-pyridinyl-κN)benzofuro[2,3-b]pyridine-κC]bis[2-(5-d3-methyl-2-pyridinyl-N)phenyl-κC]iridium(III) (abbreviation: [Ir(5mppy-d3)$_2$(mbfpypy-d3)]), [2-(methyl-d3)-8-[4-(1-methylethyl-1-d)-2-pyridinyl-κN]benzofuro[2,3-b]pyridin-7-yl-κC]bis[5-(methyl-d3)-2-[5-(methyl-d3)-2-pyridinyl-κN]phenyl-κC]iridium(III) (abbreviation: Ir(5mtpy-d6)$_2$(mbfpypy-iPr-d4)), [2-d3-methyl-(2-pyridinyl-κN)benzofuro[2,3-b]pyridine-κC]bis[2-(2-pyridinyl-κN)phenyl-κC]iridium(III) (abbreviation: Ir(ppy)$_2$(mbfpypy-d3)), and [2-(4-methyl-5-phenyl-2-pyridinyl-κN)phenyl-κC]bis[2-(2-pyridinyl-κN)phenyl-κC]iridium(III) (abbreviation: Ir(ppy)$_2$(mdppy)); organometallic complexes such as bis(2,4-diphenyl-1,3-oxazolato-N,C$^{2'}$)iridium(III) acetylacetonate (abbreviation: [Ir(dpo)$_2$(acac)]), bis{2-[4'-(perfluorophenyl)phenyl]pyridinato-N,C$^{2'}$}iridium(III) acetylacetonate (abbreviation: [Ir(p-PF-ph)$_2$(acac)]), and bis(2-phenylbenzothiazolato-N,C$^{2'}$)iridium(III) acetylacetonate (abbreviation: [Ir(bt)$_2$(acac)]); and a rare earth metal complex such as tris(acetylacetonato)(monophenanthroline)terbium(III) (abbreviation: [Tb(acac)$_3$(Phen)]).

<<Phosphorescent Substance (from 570 nm to 750 nm: Yellow or Red)>>

As examples of a phosphorescent substance which emits yellow or red light and whose emission spectrum has a peak wavelength of greater than or equal to 570 nm and less than or equal to 750 nm, the following substances can be given.

Examples of a phosphorescent substance include organometallic complexes having a pyrimidine ring, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), and (dipivaloylmethanato)bis[4,6-di(naphthalen-1-yl)pyrimidinato]iridium(III) (abbreviation: [Ir(d1npm)$_2$(dpm)]); organometallic complexes having a pyrazine ring, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), bis{4,6-dimethyl-2-[3-(3,5-dimethylphenyl)-5-phenyl-2-pyrazinyl-N]phenyl-κC}(2,6-dimethyl-3,5-heptanedionato-κ$^2$O,O')iridium(III) (abbreviation: [Ir(dmdppr-P)$_2$(dibm)]), bis{4,6-dimethyl-2-[5-(4-cyano-2,6-dimethylphenyl)-3-(3,5-dimethylphenyl)-2-pyrazinyl-N]phenyl-κC}(2,2,6,6-tetramethyl-3,5-heptanedionato-κ$^2$O,O')iridium(III) (abbreviation: [Ir(dmdppr-dmCP)$_2$(dpm)]), bis[2-(5-(2,6-dimethylphenyl)-3-(3,5-dimethylphenyl)-2-pyrazinyl-κN)-4,6-dimethylphenyl-κC](2,2',6,6'-tetramethyl-3,5-heptanedionato-κ$^2$O,O')iridium(III) (abbreviation: [Ir(dmdppr-dmp)$_2$(dpm)]), (acetylacetonato)bis[2-methyl-3-phenylquinoxalinato-N,C$^{2'}$]iridium(III) (abbreviation: [Ir(mpq)$_2$(acac)]), (acetylacetonato)bis(2,3-diphenylquinoxalinato-N,C$^{2'}$)iridium(III) (abbreviation: [Ir(dpq)$_2$(acac)]), and (acetylacetonato)bis[2,3-bis(4-fluorophenyl)quinoxalinato]

iridium(III) (abbreviation: $[Ir(Fdpq)_2(acac)]$); organometallic complexes having a pyridine ring, such as tris(1-phenylisoquinolinato-N,$C^{2'}$)iridium(III) (abbreviation: $[Ir(piq)_3]$), bis(1-phenylisoquinolinato-N,$C^{2'}$)iridium(III) acetylacetonate (abbreviation: $[Ir(piq)_2(acac)]$), and bis[4,6-dimethyl-2-(2-quinolinyl-κN)phenyl-κC](2,4-pentanedionato-$κ^2$O,O')iridium(III) (abbreviation: $[Ir(dmpqn)_2(acac)]$); a platinum complex such as 2,3,7,8,12,13,17,18-octaethyl-21H,23H-porphyrin platinum(II) (abbreviation: [PtOEP]); and rare earth metal complexes such as tris(1,3-diphenyl-1,3-propanedionato)(monophenanthroline)europium(III) (abbreviation: $[Eu(DBM)_3(Phen)]$) and tris[1-(2-thenoyl)-3,3,3-trifluoroacetonato](monophenanthroline)europium(III) (abbreviation: $[Eu(TTA)_3(Phen)]$).

<<TADF Material>>

Any of materials described below can be used as the TADF material. The TADF material is a material that has a small difference between its S1 and T1 levels (preferably less than or equal to 0.2 eV), enables up-conversion of a triplet excited state into a singlet excited state (i.e., reverse intersystem crossing) using a little thermal energy, and efficiently exhibits light (fluorescent light) from the singlet excited state. The thermally activated delayed fluorescence is efficiently obtained under the condition where the difference in energy between the triplet excitation energy level and the singlet excitation energy level is greater than or equal to 0 eV and less than or equal to 0.2 eV, preferably greater than or equal to 0 eV and less than or equal to 0.1 eV. Note that delayed fluorescent light by the TADF material refers to light emission having a spectrum similar to that of normal fluorescent light and an extremely long lifetime. The lifetime is longer than or equal to $1\times10^{-6}$ seconds, preferably longer than or equal to $1\times10^{-3}$ seconds.

Examples of the TADF material include fullerene, a derivative thereof, an acridine derivative such as proflavine, and eosin. Other examples thereof include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: $SnF_2$(Proto IX)), a mesoporphyrin-tin fluoride complex (abbreviation: $SnF_2$(Meso IX)), a hematoporphyrin-tin fluoride complex (abbreviation: $SnF_2$(Hemato IX)), a coproporphyrin tetramethyl ester-tin fluoride complex (abbreviation: $SnF_2$(Copro III-4Me)), an octaethylporphyrin-tin fluoride complex (abbreviation: $SnF_2$(OEP)), an etioporphyrin-tin fluoride complex (abbreviation: $SnF_2$(Etio I)), and an octaethylporphyrin-platinum chloride complex (abbreviation: $PtCl_2OEP$).

[Chemical Formula 1]

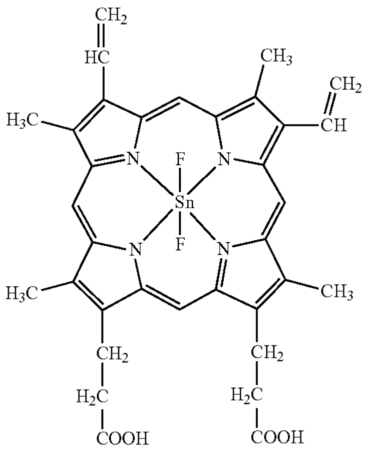

$SnF_2$(Proto IX)

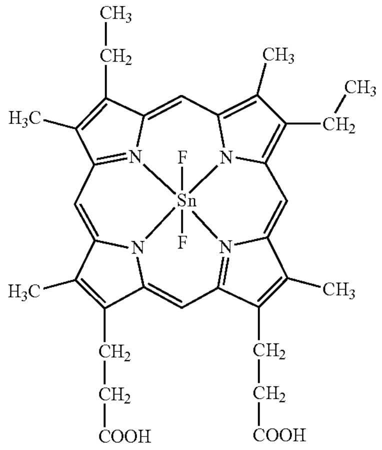

$SnF_2$(Meso IX)

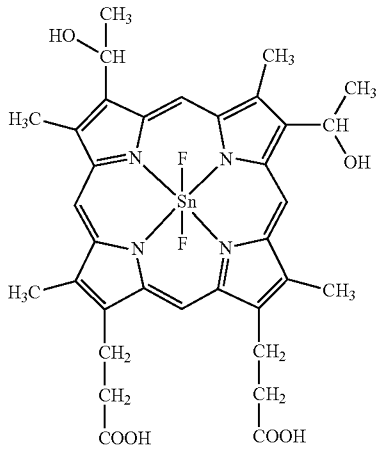

$SnF_2$(Hemato IX)

-continued

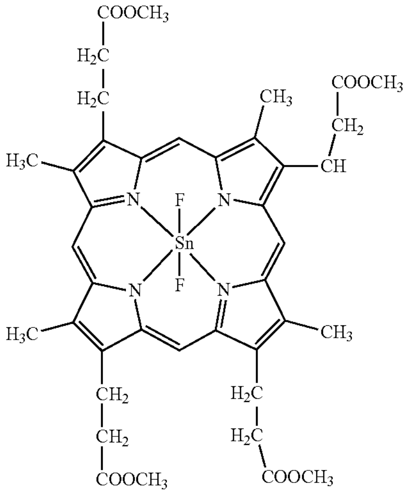

SnF2(Copro III-4Me)

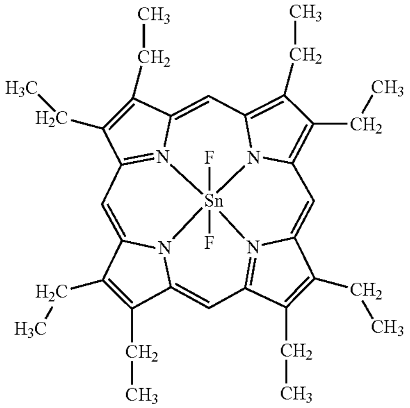

SnF2(OEP)

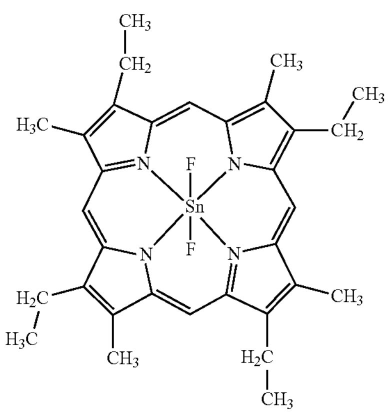

SnF2(Etio I)

-continued

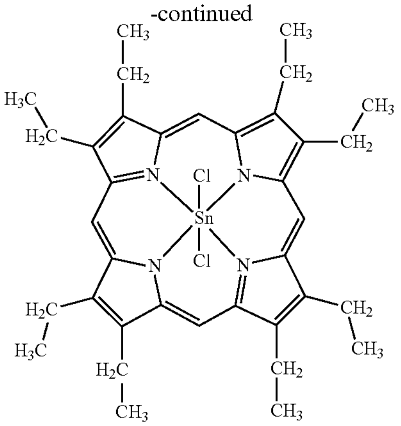

PtCl2OEP

Additionally, a heteroaromatic compound having a π-electron rich heteroaromatic compound and a π-electron deficient heteroaromatic compound, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl)phenyl]benzofuro[3,2-d]pyrimidine (abbreviation: 4PCCzPBfpm), or 9-[3-(4,6-diphenyl-1,3,5-triazin-2-yl)phenyl]-9'-phenyl-2,3'-bi-9H-carbazole (abbreviation: mPCCzPTzn-02) may be used.

Note that a substance in which a π-electron rich heteroaromatic compound is directly bonded to a π-electron deficient heteroaromatic compound is particularly preferable because both the donor property of the π-electron rich heteroaromatic compound and the acceptor property of the π-electron deficient heteroaromatic compound are improved and the energy difference between the singlet excited state and the triplet excited state becomes small. As the TADF material, a TADF material in which the singlet and triplet excited states are in thermal equilibrium (TADF100) may be used. Since such a TADF material enables a short emission lifetime (excitation lifetime), the efficiency of a light-emitting device in a high-luminance region can be less likely to decrease.

[Chemical Formula 2]
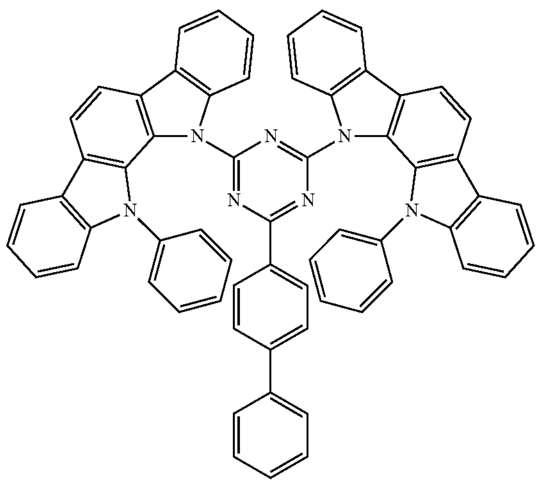
PIC-TRZ
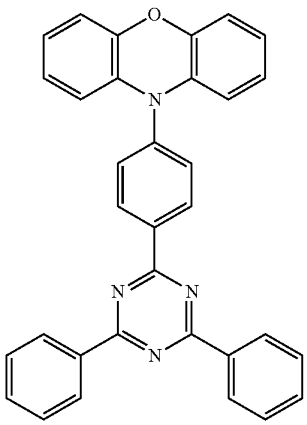
PXZ-TRZ
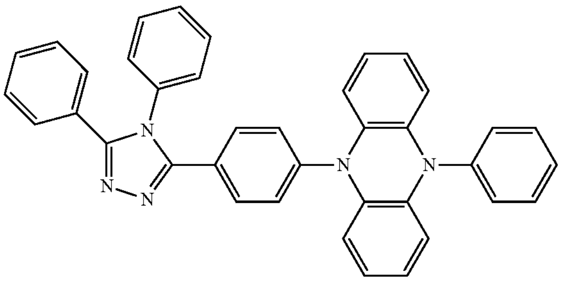
PPZ-3TPT
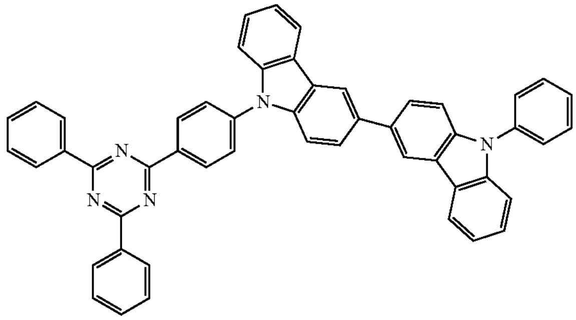
PCCzPTzn
-continued
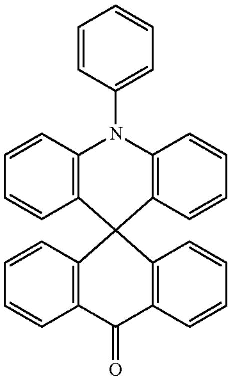
ACRSA
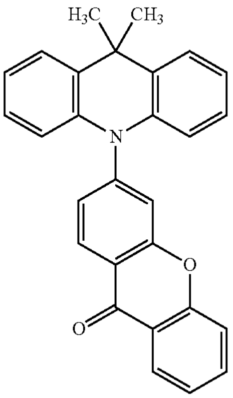
ACRXTN
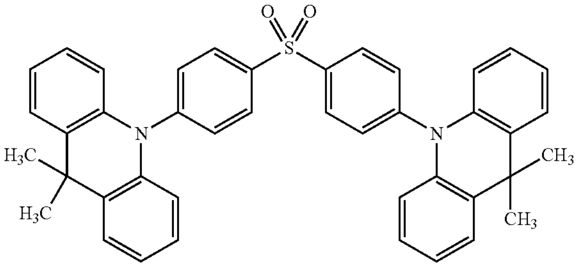
DMAC-DPS
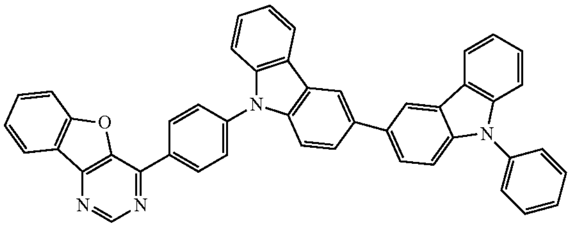
4PCCzPBfpm -continued

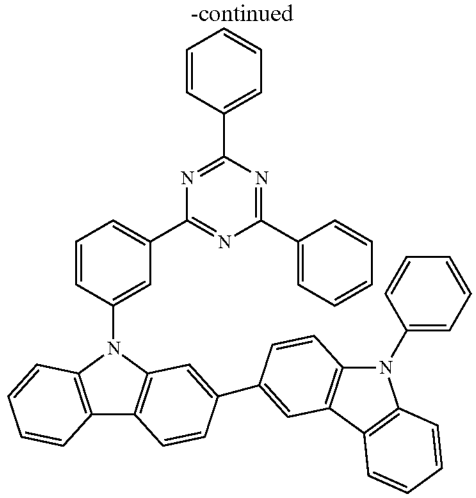

mPCCzPTzn-02

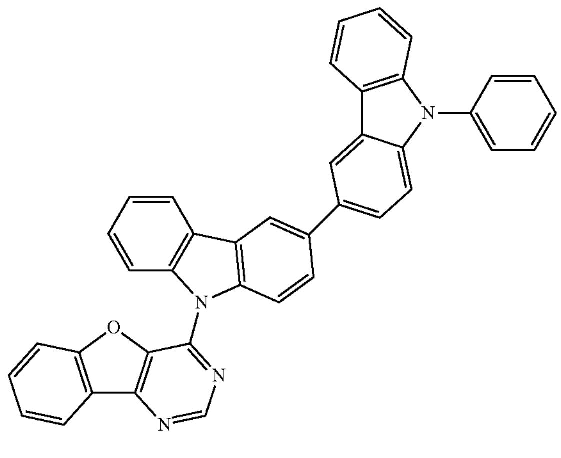

4PCCzBfpm

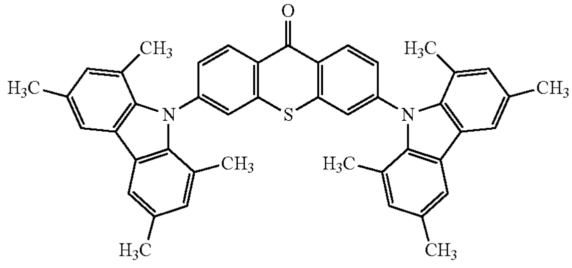

TADF100

In addition to the above, another example of a material having a function of converting triplet excitation energy into light is a nano-structure of a transition metal compound having a perovskite structure. In particular, a nano-structure of a metal halide perovskite material is preferable. The nano-structure is preferably a nanoparticle or a nanorod.

As the organic compound (e.g., the host material) used in combination with the above-described light-emitting substance (guest material) in the light-emitting layers (113, 113*a*, 113*b*, and 113*c*), one or more kinds selected from substances having a larger energy gap than the light-emitting substance (guest material) can be used.

<<High Molecular Material>>

A high molecular material may be used for the light-emitting layer. As a high molecular material, a polyparaphenylene vinylene derivative, a polythiophene derivative, a polyparaphenylene derivative, a polysilane derivative, a polyacetylene derivative, a polyfluorene derivative, a polyvinylcarbazole derivative, a material obtained by polymerizing any of metal complex-based light-emitting materials, or the like can be used.

Examples of a material that emits blue light include a distyrylarylene derivative, an oxadiazole derivative, polymers of the derivatives, a polyvinylcarbazole derivative, a polyparaphenylene derivative, and a polyfluorene derivative.

Examples of a material that emits green light include a quinacridone derivative, a coumarin derivative, polymers of the derivatives, a polyparaphenylene vinylene derivative, and a polyfluorene derivative.

Examples of a material that emits red light include a coumarin derivative, a thiophene ring compound, polymers of the derivative and the compound, a polyparaphenylene vinylene derivative, a polythiophene derivative, and a polyfluorene derivative.

<<Host Material for Fluorescent Light>>

In the case where the light-emitting substance used in the light-emitting layers (113, 113*a*, 113*b*, and 113*c*) is a fluorescent substance, an organic compound (host material) used in combination with the fluorescent substance is preferably an organic compound that has a high energy level in a singlet excited state and has a low energy level in a triplet excited state or an organic compound having a high fluorescence quantum yield. Therefore, the hole-transport material (described above) and the electron-transport material (described below) shown in this embodiment, for example, can be used as long as they are organic compounds that satisfy such a condition.

In terms of a preferred combination with the light-emitting substance (fluorescent substance), examples of the organic compound (host material), some of which overlap the above specific examples, include fused polycyclic aromatic compounds such as an anthracene derivative, a tetracene derivative, a phenanthrene derivative, a pyrene derivative, a chrysene derivative, and a dibenzo[g,p]chrysene derivative.

Specific examples of the organic compound (host material) that is preferably used in combination with the fluorescent substance include 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), 3-[4-(1-naphthyl)phenyl]-9-phenyl-9H-carbazole (abbreviation: PCPN), 9,10-diphenylanthracene (abbreviation: DPAnth), N,N'-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), 6,12-dimethoxy-5,11-diphenylchrysene, N,N,N',N',N",N",N"',N"'-octaphenyldibenzo[g,p]chrysene-2,7,10,15-tetraamine (abbreviation: DBC1), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]benzo[b]naphtho[1,2-d]furan (abbreviation: 2mBnfPPA), 9-phenyl-10-[4'-(9-phenyl-9H-fluoren-9-yl)biphenyl-4-yl]anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)

anthracene (abbreviation: t-BuDNA), 9-(1-naphthyl)-10-(2-naphthyl)anthracene (abbreviation: α,β-ADN), 2-(10-phenylanthracen-9-yl)dibenzofuran, 2-(10-phenyl-9-anthracenyl)benzo[b]naphtho[2,3-d]furan (abbreviation: Bnf(II)PhA), 9-(1-naphthyl)-10-[4-(2-naphthyl)phenyl]anthracene (abbreviation: αN-βNPAnth), 2,9-di(1-naphthyl)-10-phenylanthracene (abbreviation: 2αN-αNPhA), 9-(1-naphthyl)-10-[3-(1-naphthyl)phenyl]anthracene (abbreviation: αN-mαNPAnth), 9-(2-naphthyl)-10-[3-(1-naphthyl)phenyl]anthracene (abbreviation: βN-mαNPAnth), 9-(1-naphthyl)-10-[4-(1-naphthyl)phenyl] anthracene (abbreviation: α,N-αNPAnth), 9-(2-naphthyl)-10-[4-(2-naphthyl)phenyl]anthracene (abbreviation: βN-βNPAnth), 2-(1-naphthyl)-9-(2-naphthyl)-10-phenylanthracene (abbreviation: 2α,N-βNPhA), 9-(2-naphthyl)-10-[3-(2-naphthyl)phenyl]anthracene (abbreviation: βN-mβNPAnth), 1-{4-[10-(biphenyl-4-yl)-9-anthracenyl] phenyl}-2-ethyl-1H-benzimidazole (abbreviation: EtBImPBPhA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 5,12-diphenyltetracene, and 5,12-bis(biphenyl-2-yl)tetracene.

<<Host Material for Phosphorescent Light>>

In the case where the light-emitting substance used in the light-emitting layers (113, 113*a*, 113*b*, and 113*c*) is a phosphorescent substance, an organic compound having triplet excitation energy (an energy difference between a ground state and a triplet excited state) which is higher than that of the light-emitting substance is preferably selected as the organic compound (host material) used in combination with the phosphorescent substance. Note that when a plurality of organic compounds (e.g., a first host material and a second host material (or an assist material)) are used in combination with a light-emitting substance so that an exciplex is formed, the plurality of organic compounds are preferably mixed with the phosphorescent substance.

With such a structure, light emission can be efficiently obtained by exciplex-triplet energy transfer (ExTET), which is energy transfer from an exciplex to a light-emitting substance. Note that a combination of the plurality of organic compounds that easily forms an exciplex is preferred, and it is particularly preferable to combine a compound that easily accepts holes (hole-transport material) and a compound that easily accepts electrons (electron-transport material).

In terms of a preferred combination with the light-emitting substance (phosphorescent substance), examples of the organic compounds (the host material and the assist material), some of which overlap the above specific examples, include an aromatic amine (an organic compound having an aromatic amine skeleton), a carbazole derivative (an organic compound having a carbazole ring), a dibenzothiophene derivative (an organic compound having a dibenzothiophene ring), a dibenzofuran derivative (an organic compound having a dibenzofuran ring), an oxadiazole derivative (an organic compound having an oxadiazole ring), a triazole derivative (an organic compound having an triazole ring), a benzimidazole derivative (an organic compound having an benzimidazole ring), a quinoxaline derivative (an organic compound having a quinoxaline ring), a dibenzoquinoxaline derivative (an organic compound having a dibenzoquinoxaline ring), a pyrimidine derivative (an organic compound having a pyrimidine ring), a triazine derivative (an organic compound having a triazine ring), a pyridine derivative (an organic compound having a pyridine ring), a bipyridine derivative (an organic compound having a bipyridine ring), a phenanthroline derivative (an organic compound having a phenanthroline ring), a furodiazine derivative (an organic compound having a furodiazine ring), and zinc- or aluminum-based metal complexes.

Among the above organic compounds, specific examples of the aromatic amine and the carbazole derivative, which are organic compounds having a high hole-transport property, are the same as the specific examples of the hole-transport materials described above, and those materials are preferable as the host material.

Among the above organic compounds, specific examples of the dibenzothiophene derivative and the dibenzofuran derivative, which are organic compounds having a high hole-transport property, include 4-{3-[3-(9-phenyl-9H-fluoren-9-yl)phenyl]phenyl}dibenzofuran (abbreviation: mmDBFFLBi-II), 4,4',4"-(benzene-1,3,5-triyl)tri(dibenzofuran) (abbreviation: DBF3P-II), DBT3P-II, 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). Such derivatives are preferable as the host material.

Other examples of preferred host materials include metal complexes having an oxazole-based or thiazole-based ligand, such as bis[2-(2-benzoxazolyl)phenolato]zinc(II) (abbreviation: ZnPBO) and bis[2-(2-benzothiazolyl)phenolato]zinc(II) (abbreviation: ZnBTZ).

Among the above organic compounds, specific examples of the oxadiazole derivative, the triazole derivative, the benzimidazole derivative, the quinoxaline derivative, the dibenzoquinoxaline derivative, the quinazoline derivative, and the phenanthroline derivative, which are organic compounds having a high electron-transport property, include: an organic compound including a heteroaromatic ring having a polyazole ring such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), or 4,4'-bis(5-methylbenzoxazol-2-yl)stilbene (abbreviation: BzOs); an organic compound including a heteroaromatic ring having a pyridine ring such as bathophenanthroline (abbreviation: BPhen), bathocuproine (abbreviation: BCP), 2,9-di(naphthalen-2-yl)-4,7-diphenyl-1,10-phenanthroline (abbreviation: NBPhen), 2,2'-(1,3-phenylene)bis(9-phenyl-1,10-phenanthroline) (abbreviation: mPPhen2P), 2,2'-biphenyl-4,4'-diylbis(9-phenyl-1,10-phenanthroline) (abbreviation: PPhen2BP); 2-[3-(dibenzothiophen-4-yl)phenyl]dibenzo[f,h]quinoxaline (abbreviation: 2mDBTPDBq-II); 2-[3'-(dibenzothiophen-4-yl)biphenyl-3-yl]dibenzo[f,h]quinoxaline (abbreviation: 2mDBTBPDBq-II); 2-[3'-(9H-carbazol-9-yl)biphenyl-3-yl]dibenzo[f,h]quinoxaline (abbreviation: 2mCzBPDBq); 2-[4-(3,6-diphenyl-9H-carbazol-9-yl)phenyl]dibenzo[f,h]quinoxaline (abbreviation: 2CzPDBq-III); 7-[3-(dibenzothiophen-4-yl)phenyl]dibenzo[f,h]quinoxaline (abbreviation: 7mDBTPDBq-II); 6-[3-(dibenzothiophen-4-yl)phenyl]dibenzo[f,h]quinoxaline (abbreviation: 6mDBTPDBq-II); 2-{4-[9,10-di(2-naphthyl)-2-anthryl]phenyl}-1-phenyl-1H-benzimidazole (abbreviation: ZADN); and 2-[4'-(9-phenyl-9H-carbazol-3-yl)-3,1'-biphenyl-1-yl]

dibenzo[f,h]quinoxaline (abbreviation: 2mpPCBPDBq). Such organic compounds are preferable as the host material.

Among the above organic compounds, specific examples of the pyridine derivative, the diazine derivative (e.g., the pyrimidine derivative, the pyrazine derivative, and the pyridazine derivative), the triazine derivative, the furodiazine derivative, which are organic compounds having a high electron-transport property, include organic compounds including a heteroaromatic ring having a diazine ring such as 4,6-bis[3-(phenanthren-9-yl)phenyl]pyrimidine (abbreviation: 4,6mPnP2Pm), 4,6-bis[3-(4-dibenzothienyl)phenyl] pyrimidine (abbreviation: 4,6mDBTP2Pm-II), 4,6-bis[3-(9H-carbazol-9-yl)phenyl]pyrimidine (abbreviation: 4,6mCzP2Pm), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl) phenyl]-9'-phenyl-2,3'-bi-9H-carbazole (abbreviation: mPCCzPTzn-02), 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), 9,9'-[pyrimidine-4,6-diylbis(biphenyl-3,3'-diyl)]bis(9H-carbazole) (abbreviation: 4,6mCzBP2Pm), 2-[3'-(9,9-dimethyl-9H-fluoren-2-yl)biphenyl-3-yl]-4,6-diphenyl-1,3,5-triazine (abbreviation: mFBPTzn), 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 9-[3'-(dibenzothiophen-4-yl)biphenyl-3-yl]naphtho[1',2':4,5]furo[2,3-b]pyrazine (abbreviation: 9mDBtBPNfpr), 9-[3'-(dibenzothiophen-4-yl)biphenyl-4-yl]naphtho[1',2':4,5]furo[2,3-b]pyrazine (abbreviation: 9pmDBtBPNfpr), 11-[(3'-dibenzothiophen-4-yl)bipheny-3-yl]phenanthro[9',10':4,5]furo[2,3-b]pyrazine (abbreviation: 11mDBtBPPnfpr), 11-[3'-(dibenzothiophen-4-yl)biphenyl-4-yl]phenanthro[9',10':4,5]furo[2,3-b]pyrazine, 11-[3'-(9H-carbazol-9-yl)biphenyl-3-yl]phenanthro[9',10':4,5]furo[2,3-b]pyrazine, 12-(9'-phenyl-3,3'-bi-9H-carbazol-9-yl) phenanthro[9',10':4,5]furo[2,3-b]pyrazine (abbreviation: 12PCCzPnfpr), 9-[(3'-9-phenyl-9H-carbazol-3-yl)biphenyl-4-yl]naphtho[1',2':4,5]furo[2,3-b]pyrazine (abbreviation: 9pmPCBPNfpr), 9-(9'-phenyl-3,3'-bi-9H-carbazol-9-yl) naphtho[1',2':4,5]furo[2,3-b]pyrazine (abbreviation: 9PCCzNfpr), 10-(9'-phenyl-3,3'-bi-9H-carbazol-9-yl)naphtho[1',2':4,5]furo[2,3-b]pyrazine (abbreviation: 10PCCzNfpr), 9-[3'-(6-phenylbenzo[b]naphtho[1,2-d] furan-8-yl)biphenyl-3-yl]naphtho[1',2':4,5]furo[2,3-b]pyrazine (abbreviation: 9mBnfBPNfpr), 9-{3-[6-(9,9-dimethylfluoren-2-yl)dibenzothiophen-4-yl]phenyl}naphtho[1',2':4,5]furo[2,3-b]pyrazine (abbreviation: 9mFDBtPNfpr), 9-[3'-(6-phenyldibenzothiophen-4-yl)biphenyl-3-yl]naphtho[1',2':4,5]furo[2,3-b]pyrazine (abbreviation: 9mDBtBPNfpr-02), 9-[3-(9'-phenyl-3,3'-bi-9H-carbazol-9-yl)phenyl] naphtho[1',2':4,5]furo[2,3-b]pyrazine (abbreviation: 9mPCCzPNfpr), 9-{(3'-[2,8-diphenyldibenzothiophen-4-yl) biphenyl-3-yl}naphtho[1',2':4,5]furo[2,3-b]pyrazine, 11-{(3'-[2,8-diphenyldibenzothiophen-4-yl)biphenyl-3-yl] phenanthro[9',10':4,5]furo[2,3-b]pyrazine, 5-[3-(4,6-diphenyl-1,3,5-triazin-2-yl)phenyl]-7,7-dimethyl-5H,7H-indeno[2,1-b]carbazole (abbreviation: mINc(II)PTzn), 2-[3'-(triphenylen-2-yl)biphenyl-3-yl]-4,6-diphenyl-1,3,5-triazine (abbreviation: mTpBPTzn), 2-(biphenyl-4-yl)-4-phenyl-6-(9,9'-spirobi[9H-fluoren]-2-yl)-1,3,5-triazine (abbreviation: BP-SFTzn), 2,6-bis(4-naphthalen-1-ylphenyl)-4-[4-(3-pyridyl)phenyl]pyrimidine (abbreviation: 2,4NP-6PyPPm), 3-[9-(4,6-diphenyl-1,3,5-triazin-2-yl)-2-dibenzofuranyl]-9-phenyl-9H-carbazole (abbreviation: PCDBfTzn), 2-(biphenyl-3-yl)-4-phenyl-6-{8-[(1,1':4',1"-terphenyl)-4-yl]-1-dibenzofuranyl}-1,3,5-triazine (abbreviation: mBP-TPDBfTzn), 6-(biphenyl-3-yl)-4-[3,5-bis(9H-carbazol-9-yl)phenyl]-2-phenylpyrimidine (abbreviation: 6mBP-4Cz2PPm), 4-[3,5-bis(9H-carbazol-9-yl)phenyl]-2-phenyl-6-(biphenyl-4-yl)pyrimidine (abbreviation: 6BP-4Cz2PPm), and those materials are preferable as the host material.

Among the above organic compounds, specific examples of metal complexes that are organic compounds having a high electron-transport property include zinc- or aluminum-based metal complexes, such as tris(8-quinolinolato)aluminum(III) (abbreviation: Alq), tris(4-methyl-8-quinolinolato) aluminum(III) (abbreviation: $Almq_3$), bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), and bis(8-quinolinolato)zinc(II) (abbreviation: Znq), and metal complexes having a quinoline ring or a benzoquinoline ring. Such metal complexes are preferable as the host material.

Moreover, high-molecular compounds such as poly(2,5-pyridinediyl) (abbreviation: PPy), poly[(9,9-dihexylfluorene-2,7-diyl)-co-(pyridine-3,5-diyl)](abbreviation: PF-Py), and poly[(9,9-dioctylfluorene-2,7-diyl)-co-(2,2'-bipyridine-6,6'-diyl)] (abbreviation: PF-BPy) are preferable as the host material.

Furthermore, the following organic compounds having a diazine ring, which have bipolar properties, a high hole-transport property, and a high electron-transport property, can be used as the host material: 9-phenyl-9'-(4-phenyl-2-quinazolinyl)-3,3'-bi-9H-carbazole (abbreviation: PCCzQz), 2-[4'-(9-phenyl-9H-carbazol-3-yl)-3,1'-biphenyl-1-yl]dibenzo[f,h]quinoxaline (abbreviation: 2mpPCBPDBq), 5-[3-(4,6-diphenyl-1,3,5-triazin-2-yl)phenyl]-7,7-dimethyl-5H,7H-indeno[2,1-b]carbazole (abbreviation: mINc(II)PTzn), 11-[4-(biphenyl-4-yl)-6-phenyl-1,3,5-triazin-2-yl]-11,12-dihydro-12-phenylindolo[2,3-a] carbazole (abbreviation: BP-Icz(II)Tzn), and 7-[4-(9-phenyl-9H-carbazol-2-yl)quinazolin-2-yl]-7H-dibenzo[c,g] carbazole (abbreviation: PC-cgDBCzQz).

<Electron-Transport Layer>

The electron-transport layers (114, 114*a*, and 114*b*) transport the electrons, which are injected from the second electrode 102 and the charge-generation layers (106, 106*a*, and 106*b*) by electron-injection layers (115, 115*a*, and 115*b*) described later, to the light-emitting layers (113, 113*a*, and 113*b*). The heat resistance of the light-emitting device of one embodiment of the present invention can be improved by including the stacked electron-transport layers. The electron-transport material used in the electron-transport layers (114, 114*a*, and 114*b*) is preferably a substance having an electron mobility of $1\times10^{-6}$ $cm^2/Vs$ or higher in the case where the square root of the electric field strength [V/cm] is 600. Note that any other substance can also be used as long as the substance has an electron-transport property higher than a hole-transport property. The electron-transport layers (114, 114*a*, and 114*b*) can function even with a single-layer structure and may have a stacked-layer structure including two or more layers. When a photolithography process is performed over the electron-transport layer including the above-described mixed material, which has heat resistance, an adverse effect of the thermal process on the device characteristics can be reduced.

<<Electron-Transport Material>>

As the electron-transport material that can be used for the electron-transport layers (114, 114*a*, and 114*b*), an organic compound having a high electron-transport property can be used, and for example, a heteroaromatic compound can be used. The term “heteroaromatic compound” refers to a cyclic compound containing at least two different kinds of elements in a ring. Examples of cyclic structures include a three-membered ring, a four-membered ring, a five-membered ring, a six-membered ring, and the like, among which a five-membered ring and a six-membered ring are particularly preferred. The elements contained in the heteroaromatic compound are preferably one or more of nitrogen, oxygen, and sulfur, in addition to carbon. In particular, a heteroaromatic compound containing nitrogen (a nitrogen-containing heteroaromatic compound) is preferred, and any of materials having a high electron-transport property (electron-transport materials), such as a nitrogen-containing heteroaromatic compound and a π-electron deficient heteroaromatic compound including the nitrogen-containing heteroaromatic compound, is preferably used. Note that the electron-transport material is preferably different from the materials used in the light-emitting layer. Not all excitons formed by recombination of carriers in the light-emitting layer can contribute to light emission and some excitons are diffused into a layer in contact with the light-emitting layer or a layer in the vicinity of the light-emitting layer. In order to avoid this phenomenon, the energy level (the lowest singlet excitation level or the lowest triplet excitation level) of a material used for the layer in contact with the light-emitting layer or the layer in the vicinity of the light-emitting layer is preferably higher than that of a material used for the light-emitting layer. Thus, in order to obtain a highly efficient device, the electron-transport material is preferably different from the materials used in the light-emitting layer.

The heteroaromatic compound is an organic compound including at least one heteroaromatic ring.

The heteroaromatic ring includes any one of a pyridine ring, a diazine ring, a triazine ring, a polyazole ring, an oxazole ring, a thiazole ring, and the like. A heteroaromatic ring having a diazine ring includes a heteroaromatic ring having a pyrimidine ring, a pyrazine ring, a pyridazine ring, or the like. A heteroaromatic ring having a polyazole ring includes a heteroaromatic ring having an imidazole ring, a triazole ring, or an oxadiazole ring.

The heteroaromatic ring includes a fused heteroaromatic ring having a fused ring structure. Examples of the fused heteroaromatic ring include a quinoline ring, a benzoquinoline ring, a quinoxaline ring, a dibenzoquinoxaline ring, a quinazoline ring, a benzoquinazoline ring, a dibenzoquinazoline ring, a phenanthroline ring, a furodiazine ring, and a benzimidazole ring.

Examples of the heteroaromatic compound having a five-membered ring structure, which is a heteroaromatic compound containing carbon and one or more of nitrogen, oxygen, and sulfur, include a heteroaromatic compound having an imidazole ring, a heteroaromatic compound having a triazole ring, a heteroaromatic compound having an oxazole ring, a heteroaromatic compound having an oxadiazole ring, a heteroaromatic compound having a thiazole ring, and a heteroaromatic compound having a benzimidazole ring.

Examples of the heteroaromatic compound having a six-membered ring structure, which is a heteroaromatic compound containing carbon and one or more of nitrogen, oxygen, and sulfur, include a heteroaromatic compound having a heteroaromatic ring, such as a pyridine ring, a diazine ring (a pyrimidine ring, a pyrazine ring, a pyridazine ring, or the like), a triazine ring, or a polyazole ring. Other examples include a heteroaromatic compound having a bipyridine structure, a heteroaromatic compound having a terpyridine structure, and the like, which are included in examples of a heteroaromatic compound in which pyridine rings are connected.

Examples of the heteroaromatic compound having a fused ring structure partly including the above six-membered ring structure include a heteroaromatic compound having a fused heteroaromatic ring such as a quinoline ring, a benzoquinoline ring, a quinoxaline ring, a dibenzoquinoxaline ring, a phenanthroline ring, a furodiazine ring (including a structure in which an aromatic ring is fused to a furan ring of a furodiazine ring), or a benzimidazole ring.

Specific examples of the above-described heteroaromatic compound having a five-membered ring structure (a polyazole ring (including an imidazole ring, a triazole ring, or an oxadiazole ring), an oxazole ring, a thiazole ring, or a benzimidazole ring) include 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), and 4,4'-bis(5-methylbenzoxazol-2-yl)stilbene (abbreviation: BzOS).

Specific examples of the above-described heteroaromatic compound having a six-membered ring structure (including a heteroaromatic ring having a pyridine ring, a diazine ring, a triazine ring, or the like) include: a heteroaromatic compound including a heteroaromatic ring having a pyridine ring, such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB); a heteroaromatic compound including a heteroaromatic ring having a triazine ring, such as 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-[3'-(triphenylen-2-yl)biphenyl-3-yl]-4,6-diphenyl-1,3,5-triazine (abbreviation: mTpBPTzn), 2-(biphenyl-4-yl)-4-phenyl-6-(9,9'-spirobi[9H-fluoren]-2-yl)-1,3,5-triazine (abbreviation: BP-SFTzn), 2,6-bis(4-naphthalen-1-ylphenyl)-4-[4-(3-pyridyl)phenyl]pyrimidine (abbreviation: 2,4NP-6PyPPm), 3-[9-(4,6-diphenyl-1,3,5-triazin-2-yl)-2-dibenzofuranyl]-9-phenyl-9H-carbazole (abbreviation: PCDBfTzn), 2-(biphenyl-3-yl)-4-phenyl-6-{8-[(1,1':4',1''-terphenyl)-4-yl]-1-dibenzofuranyl}-1,3,5-triazine (abbreviation: mBP-TPDBfTzn), 2-{3-[3-(dibenzothiophen-4-yl)phenyl]phenyl}-4,6-diphenyl-1,3,5-triazine (abbreviation: mDBtBPTzn), or mFBPTzn; and a heteroaromatic compound including a heteroaromatic ring having a diazine (pyrimidine) ring, such as 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 4,6mCzBP2Pm, 6-(biphenyl-3-yl)-4-[3,5-bis(9H-carbazol-9-yl)phenyl]-2-phenylpyrimidine (abbreviation: 6mBP-4Cz2PPm), 4-[3,5-bis(9H-carbazol-9-yl)phenyl]-2-phenyl-6-(biphenyl-4-yl)pyrimidine (abbreviation: 6BP-4Cz2PPm), 4-[3-(dibenzothiophen-4-yl)phenyl]-8-(naphthalen-2-yl)-[1]benzofuro[3,2-d]pyrimidine (abbreviation: 8PN-4mDBtPBfpm), 8BP-4mDBtPBfpm, 9mDBtBPNfpr, 9pmDBtBPNfpr, 3,8-bis[3-(dibenzothiophen-4-yl)phenyl]benzofuro[2,3-b]pyrazine (abbreviation: 3,8mDBtP2Bfpr), 4,8-bis[3-(dibenzothiophen-4-yl)phenyl]-[1]benzofuro[3,2-d]pyrimidine (abbreviation: 4,8mDBtP2Bfpm), 8-[3'-(dibenzothiophene-4-yl)biphenil-3-yl]naphtho[1',2':4,5]furo[3,2-d]pyrimidine (abbreviation: 8mDBtBPNfpm), or 8-[(2,2'-binaphthalen)-6-yl]-4-[3-(dibenzothiophen-4-yl)phenyl]-[1]benzofuro[3,2-d]pyrimidine (abbreviation: 8(βN2)-4mDBtPBfpm). Note that the above aromatic compounds including a heteroaromatic ring include a heteroaromatic compound having a fused heteroaromatic ring.

Other examples include heteroaromatic compounds including a heteroaromatic ring having a diazine (pyrimidine) ring, such as 2,2'-(pyridine-2,6-diyl)bis(4-phenylbenzo[h]quinazoline) (abbreviation: 2,6(P-Bqn)$_2$Py), 2,2'-(2,2'-bipyridine-6,6'-diyl)bis(4-phenylbenzo[h]quinazoline) (abbreviation: 6,6'(P-Bqn)$_2$BPy), 2,2'-(pyridine-2,6-diyl)bis{4-[4-(2-naphthyl)phenyl]-6-phenylpyrimidine} (abbreviation: 2,6(NP-PPm)$_2$Py), or 6-(biphenyl-3-yl)-4-[3,5-bis(9H-carbazol-9-yl)phenyl]-2-phenylpyrimidine (abbreviation: 6mBP-4Cz2PPm), and a heteroaromatic compound including a heteroaromatic ring having a triazine ring, such as 2,4,6-tris[3'-(pyridin-3-yl)biphenyl-3-yl]-1,3,5-triazine (abbreviation: TmPPPyTz), 2,4,6-tris(2-pyridyl)-1,3,5-triazine (abbreviation: 2Py3Tz), or 2-[3-(2,6-dimethyl-3-pyridinyl)-5-(9-phenanthrenyl)phenyl]-4,6-diphenyl-1,3,5-triazine (abbreviation: mPn-mDMePyPTzn).

Specific examples of the above-described heteroaromatic compound having a fused ring structure partly including a six-membered ring structure (the heteroaromatic compound having a fused ring structure) include a heteroaromatic compound having a quinoxaline ring, such as bathophenanthroline (abbreviation: BPhen), bathocuproine (abbreviation: BCP), 2,9-di(naphthalen-2-yl)-4,7-diphenyl-1,10-phenanthroline (abbreviation: NBPhen), 2,2'-(1,3-phenylene)bis(9-phenyl-1,10-phenanthroline) (abbreviation: mPPhen2P), 2,2'-biphenyl-4,4'-diylbis(9-phenyl-1,10-phenanthroline) (abbreviation: PPhen2BP), 2,2'-(pyridin-2,6-diyl)bis(4-phenylbenzo[h]quinazoline) (abbreviation: 2,6(P-Bqn)$_2$Py), 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), or 2mpPCBPDBq.

For the electron-transport layers (114, 114*a*, and 114*b*), any of the metal complexes given below can be used as well as the heteroaromatic compounds described above. Examples of the metal complexes include a metal complex having a quinoline ring or a benzoquinoline ring, such as tris(8-quinolinolato)aluminum(III) (abbreviation: $Alq_3$), $Almq_3$, 8-quinolinolato-lithium (abbreviation: Liq), $BeBq_2$, bis(2-methyl-8-quinolinolato)(4-phenylphenolato)aluminum(III) (abbreviation: BAlq), or bis(8-quinolinolato)zinc(II) (abbreviation: Znq), and a metal complex having an oxazole ring or a thiazole ring, such as bis[2-(2-benzoxazolyl)phenolato]zinc(II) (abbreviation: ZnPBO), or bis[2-(2-benzothiazolyl)phenolato]zinc(II) (abbreviation: ZnBTZ).

High-molecular compounds such as poly(2,5-pyridinediyl) (abbreviation: PPy), poly[(9,9-dihexylfluorene-2,7-diyl)-co-(pyridine-3,5-diyl)] (abbreviation: PF-Py), and poly[(9,9-dioctylfluorene-2,7-diyl)-co-(2,2'-bipyridine-6,6'-diyl)] (abbreviation: PF-BPy) can be used as the electron-transport material.

Each of the electron-transport layers (114, 114*a*, and 114*b*) is not limited to a single layer and may be a stack of two or more layers each containing any of the above substances.

<Electron-Injection Layer>

The electron-injection layers (115, 115*a*, and 115*b*) contain a substance having a high electron-injection property. The electron-injection layers (115, 115*a*, and 115*b*) are layers for increasing the efficiency of electron injection from the second electrode 102 and are preferably formed using a material whose value of the LUMO level has a small difference (0.5 eV or less) from the work function of a material used for the second electrode 102. Thus, the electron-injection layer 115 can be formed using an alkali metal, an alkaline earth metal, or a compound thereof, such as lithium, cesium, lithium fluoride (LiF), cesium fluoride (CsF), calcium fluoride ($CaF_2$), 8-quinolinolato lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), an oxide of lithium ($LiO_x$), or cesium carbonate. A rare earth metal or a compound of a rare earth metal, such as erbium fluoride ($ErF_3$) or ytterbium (Yb), can also be used. For the electron-injection layers (115, 115*a*, and 115*b*), a plurality of kinds of materials given above may be mixed or stacked as films. Electride may also be used for the electron-injection layers (115, 115*a*, and 115*b*). Examples of the electride include a substance in which electrons are added at high concentration to calcium oxide-aluminum oxide. Any of the substances used for the electron-transport layers (114, 114*a*, and 114*b*), which are given above, can also be used.

A mixed material in which an organic compound and an electron donor (donor) are mixed may also be used for the electron-injection layers (115, 115*a*, and 115*b*). Such a mixed material is excellent in an electron-injection property and an electron-transport property because electrons are generated in the organic compound by the electron donor. The organic compound here is preferably a material excellent in transporting the generated electrons; specifically, for example, the above-described electron-transport materials used for the electron-transport layers (114, 114*a*, and 114*b*), such as a metal complex and a heteroaromatic compound, can be used. As the electron donor, a substance showing an electron-donating property with respect to an organic compound is preferably used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. Alternatively, a Lewis base such as magnesium oxide can be used. Further alternatively, an organic compound such as tetrathiafulvalene (abbreviation: TTF) can be used. Alternatively, a stack of two or more of these materials may be used.

A mixed material in which an organic compound and a metal are mixed may also be used for the electron-injection layers (115, 115*a*, and 115*b*). The organic compound used here preferably has a lowest unoccupied molecular orbital (LUMO) level higher than or equal to −3.6 eV and lower than or equal to −2.3 eV. Moreover, a material having an unshared electron pair is preferable.

Thus, as the organic compound used in the above mixed material, a mixed material obtained by mixing a metal and the heteroaromatic compound given above as the material that can be used for the electron-transport layer may be used. Preferred examples of the heteroaromatic compound include materials having an unshared electron pair, such as a heteroaromatic compound having a five-membered ring structure (e.g., an imidazole ring, a triazole ring, an oxazole ring, an oxadiazole ring, a thiazole ring, or a benzimidazole ring), a heteroaromatic compound having a six-membered ring structure (e.g., a pyridine ring, a diazine ring (including a pyrimidine ring, a pyrazine ring, a pyridazine ring, or the like), a triazine ring, a bipyridine ring, or a terpyridine ring), and a heteroaromatic compound having a fused ring structure partly including a six-membered ring structure (e.g., a quinoline ring, a benzoquinoline ring, a quinoxaline ring, a dibenzoquinoxaline ring, or a phenanthroline ring). Since the materials are specifically described above, description thereof is omitted here.

As a metal used for the above mixed material, a transition metal that belongs to Group 5, Group 7, Group 9, or Group 11 or a material that belongs to Group 13 in the periodic table is preferably used, and examples include Ag, Cu, Al, and In. Here, the organic compound forms a singly occupied molecular orbital (SOMO) with the transition metal.

To amplify light obtained from the light-emitting layer 113*b*, for example, the optical path length between the second electrode 102 and the light-emitting layer 113*b* is preferably less than one fourth of the wavelength λ of light emitted from the light-emitting layer 113*b*. In that case, the optical path length can be adjusted by changing the thickness of the electron-transport layer 114*b* or the electron-injection layer 115*b*.

When the charge-generation layer 106 is provided between the two EL layers (103*a* and 103*b*) as in the light-emitting device in FIG. 12D, a structure in which a plurality of EL layers are stacked between the pair of electrodes (the structure is also referred to as a tandem structure) can be obtained.

<Charge-Generation Layer>

The charge-generation layer 106 has a function of injecting electrons into the organic compound layer 103*a* and injecting holes into the organic compound layer 103*b* when voltage is applied between the first electrode (anode) 101 and the second electrode (cathode) 102. The charge-generation layer 106 may have either a structure in which an electron acceptor (acceptor) is added to a hole-transport material or a structure in which an electron donor (donor) is added to an electron-transport material. Alternatively, both of these structures may be stacked. Note that forming the charge-generation layer 106 with the use of any of the above materials can inhibit an increase in driving voltage caused by the stack of the EL layers.

In the case where the charge-generation layer 106 has a structure in which an electron acceptor is added to a hole-transport material, which is an organic compound, any of the materials described in this embodiment can be used as the hole-transport material. Examples of the electron acceptor include 7,7,8,8-tetracyano-2,3,5,6-tetrafluoroquinodimethane (abbreviation: $F_4$-TCNQ) and chloranil. Other examples include oxides of metals that belong to Group 4 to Group 8 of the periodic table. Specific examples include vanadium oxide, niobium oxide, tantalum oxide, chromium oxide, molybdenum oxide, tungsten oxide, manganese oxide, and rhenium oxide.

In the case where the charge-generation layer 106 has a structure in which an electron donor is added to an electron-transport material, any of the materials described in this embodiment can be used as the electron-transport material. As the electron donor, it is possible to use an alkali metal, an alkaline earth metal, a rare earth metal, a metal belonging to Group 2 or Group 13 of the periodic table, or an oxide or a carbonate thereof. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may be used as the electron donor.

Although FIG. 12D illustrates the structure in which two organic compound layers 103 are stacked, three or more EL layers may be stacked with charge-generation layers each provided between two adjacent EL layers.

<Substrate>

The light-emitting device described in this embodiment can be formed over a variety of substrates. Note that the type of substrate is not limited to a certain type. Examples of the substrate include semiconductor substrates (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film.

Examples of the glass substrate include a barium borosilicate glass substrate, an aluminoborosilicate glass substrate, and a soda lime glass substrate. Examples of the flexible substrate, the attachment film, and the base material film include plastics typified by polyethylene terephthalate (PET), polyethylene naphthalate (PEN), and polyether sulfone (PES), a synthetic resin such as acrylic resin, polypropylene, polyester, polyvinyl fluoride, polyvinyl chloride, polyamide, polyimide, aramid, epoxy resin, an inorganic vapor deposition film, and paper.

For fabrication of the light-emitting device in this embodiment, a gas phase method such as an evaporation method or a liquid phase method such as a spin coating method or an ink-jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the layers having various functions (the hole-injection layer 111, the hole-transport layer 112, the light-emitting layer 113, the electron-transport layer 114, and the electron-injection layer 115) included in the EL layers of the light-emitting device can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

In the case where a film formation method such as the coating method or the printing method is employed, a high-molecular compound (e.g., an oligomer, a dendrimer, or a polymer), a middle-molecular compound (a compound between a low-molecular compound and a high-molecular compound with a molecular weight of 400 to 4000), an inorganic compound (e.g., a quantum dot material), or the like can be used. The quantum dot material can be a colloidal quantum dot material, an alloyed quantum dot material, a core-shell quantum dot material, a core quantum dot material, or the like.

Materials that can be used for the layers (the hole-injection layer 111, the hole-transport layer 112, the light-emitting layer 113, the electron-transport layer 114, and the electron-injection layer 115) included in the organic compound layer 103 of the light-emitting device described in this embodiment are not limited to the materials described in this embodiment, and other materials can be used in combination as long as the functions of the layers are fulfilled.

Note that in this specification and the like, the terms "layer" and "film" can be interchanged with each other as appropriate.

The structures described in this embodiment can be used in combination with any of the structures described in the other embodiments as appropriate.

Embodiment 4

In this embodiment, the light-emitting apparatus of one embodiment of the present invention will be described with reference to FIGS. 13A to 13G and FIGS. 14A to 14I.

[Pixel Layout]

In this embodiment, pixel layouts different from that in FIGS. 3A and 3B will be mainly described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and PenTile arrangement.

In this embodiment, the top surface shapes of the subpixels shown in the diagrams correspond to top surface shapes of light-emitting regions.

Examples of a top surface shape of the subpixel include polygons such as a triangle, a tetragon (including a rectangle and a square), and a pentagon; polygons with rounded corners; an ellipse; and a circle.

The circuit constituting the subpixel is not necessarily placed within the dimensions of the subpixel illustrated in the diagrams and may be placed outside the subpixel.

Figure 13A:
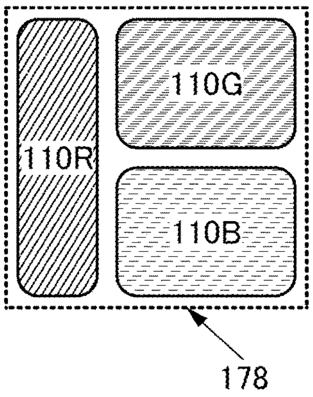
FIGS. 13A to 13G are top views each illustrating a structure example of a pixel.

The pixel 178 illustrated in FIG. 13A employs S-stripe arrangement. The pixel 178 illustrated in FIG. 13A includes three subpixels, the subpixel 110R, the subpixel 110G, and the subpixel 110B.

Figure 13B:
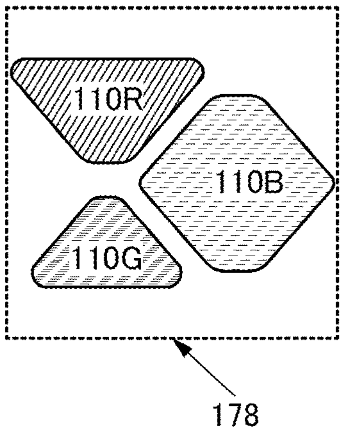

The pixel 178 illustrated in FIG. 13B includes the subpixel 110R whose top surface has a rough trapezoidal shape with rounded corners, the subpixel 110G whose top surface has a rough triangle shape with rounded corners, and the subpixel 110B whose top surface has a rough tetragonal or rough hexagonal shape with rounded corners. The subpixel 110R has a larger light-emitting area than the subpixel 110G. In this manner, the shapes and sizes of the subpixels can be determined independently. For example, the size of a subpixel including a light-emitting device with higher reliability can be smaller.

Figure 13C:
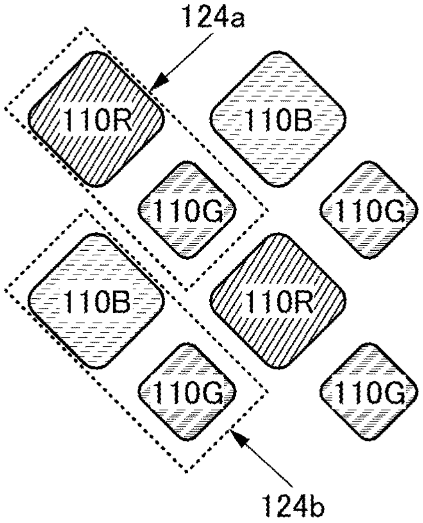

Pixels 124*a* and 124*b* illustrated in FIG. 13C employ PenTile arrangement. FIG. 13C shows an example in which the pixels 124*a* including the subpixels 110R and 110G and the pixels 124*b* including the subpixels 110G and 110B are alternately arranged.

Figure 13D:
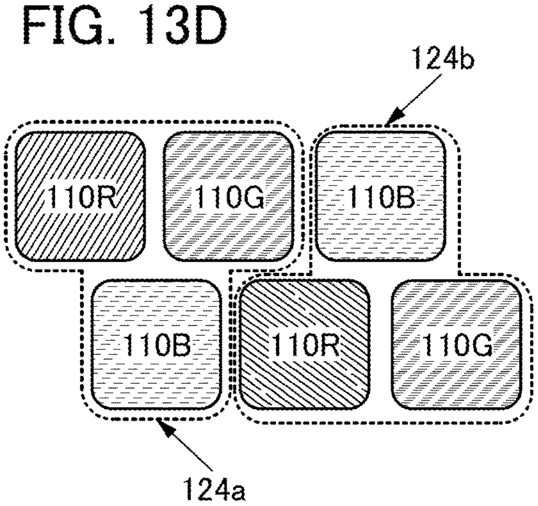
Figure 13E:
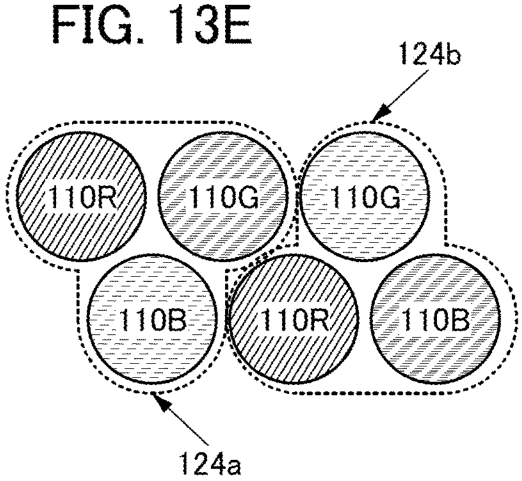
Figure 13F:
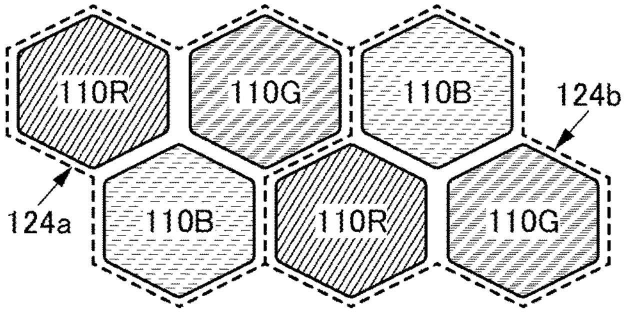

The pixels 124*a* and 124*b* illustrated in FIGS. 13D to 13F employ delta arrangement. The pixel 124*a* includes two subpixels (the subpixels 110R and 110G) in the upper row (first row) and one subpixel (the subpixel 110B) in the lower row (second row). The pixel 124*b* includes one subpixel (the subpixel 110B) in the upper row (first row) and two subpixels (the subpixels 110R and 110G) in the lower row (second row).

FIG. 13D illustrates an example where each subpixel has a rough tetragonal top surface with rounded corners. FIG. 13E illustrates an example where each subpixel has a circular top surface. FIG. 13F illustrates an example where each subpixel has a rough hexagonal top surface with rounded corners.

In FIG. 13F, each subpixel is placed inside one of close-packed hexagonal regions. Focusing on one of the subpixels, the subpixel is placed so as to be surrounded by six subpixels. The subpixels are arranged such that subpixels that emit light of the same color are not adjacent to each other. For example, focusing on the subpixel 110R, the subpixel 110R is surrounded by three subpixels 110G and three subpixels 110B that are alternately arranged.

Figure 13G:
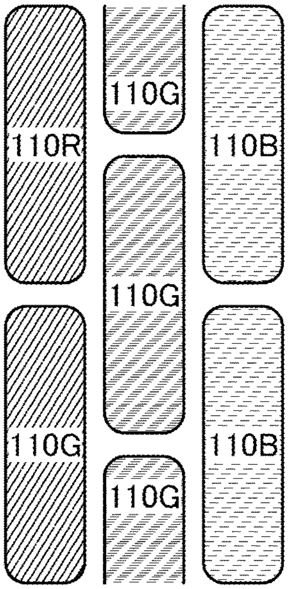

FIG. 13G shows an example where subpixels of different colors are arranged in a zigzag manner. Specifically, the positions of the top sides of two subpixels arranged in the column direction (e.g., the subpixels 110R and 110G or the subpixels 110G and 110B) are not aligned in the top view.

In the pixels illustrated in FIGS. 13A to 13G, for example, it is preferred that the subpixel 110R be a subpixel R that emits red light, the subpixel 110G be a subpixel G that emits green light, and the subpixel 110B be a subpixel B that emits blue light. Note that the structures of the subpixels are not limited thereto, and the colors and the order of the subpixels can be determined as appropriate. For example, the subpixel 110G may be the subpixel R that emits red light, and the subpixel 110R may be the subpixel G that emits green light.

In a lithography method, as a pattern to be formed by processing becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel may have a polygonal shape with rounded corners, an elliptical shape, a circular shape, or the like.

Furthermore, in the method for fabricating the light-emitting apparatus of one embodiment of the present invention, the organic compound layer is processed into an island shape with the use of a resist mask. A resist film formed over the organic compound layer needs to be cured at a temperature lower than the upper temperature limit of the organic compound layer. Therefore, the resist film is insufficiently cured in some cases depending on the upper temperature limit of the material of the organic compound layer and the curing temperature of the resist material. An insufficiently cured resist film may have a shape different from a desired shape by processing. As a result, the top surface of the organic compound layer may have a polygonal shape with rounded corners, an elliptical shape, a circular shape, or the like. For example, when a resist mask with a square top surface is intended to be formed, a resist mask with a circular top surface may be formed, and the top surface of the organic compound layer may be circular.

To obtain a desired top surface shape of the organic compound layer, a technique of correcting a mask pattern in advance so that a transferred pattern agrees with a design pattern (an optical proximity correction (OPC) technique) may be used. Specifically, with the OPC technique, a pattern for correction is added to a corner portion of a figure on a mask pattern, for example.

As illustrated in FIGS. 14A to 14I, the pixel can include four types of subpixels.

Figure 14A:
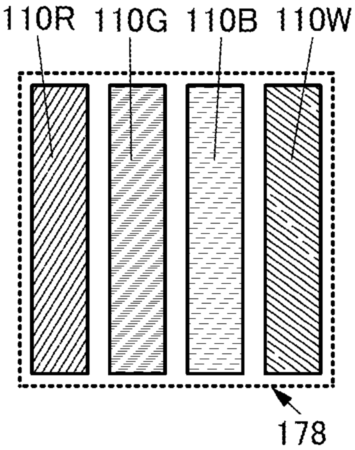
FIGS. 14A to 14I are top views each illustrating a structure example of a pixel.
Figure 14B:
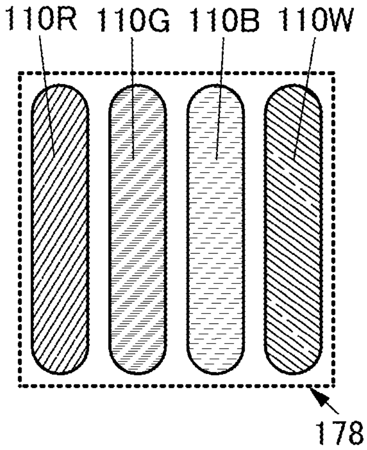
Figure 14C:
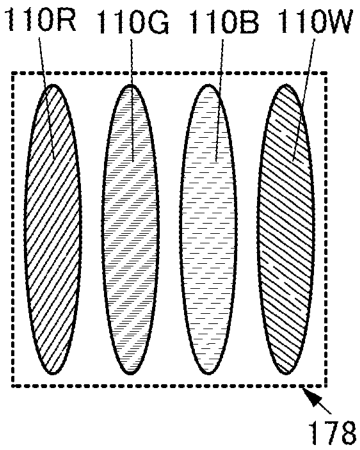

The pixels 178 illustrated in FIGS. 14A to 14C employ stripe arrangement.

FIG. 14A illustrates an example where each subpixel has a rectangular top surface. FIG. 14B illustrates an example where each subpixel has a top surface shape formed by combining two half circles and a rectangle. FIG. 14C illustrates an example where each subpixel has an elliptical top surface.

Figure 14D:
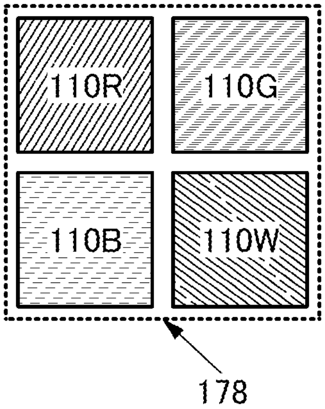
Figure 14E:
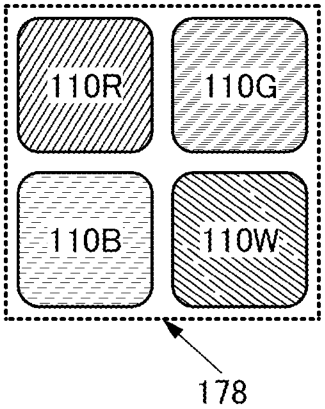
Figure 14F:
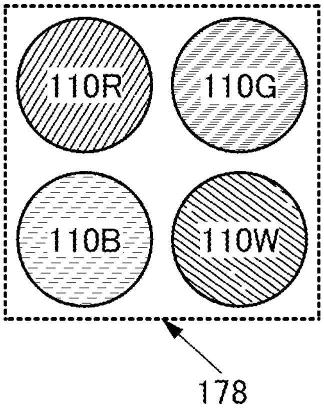

The pixels 178 illustrated in FIGS. 14D to 14F employ matrix arrangement.

FIG. 14D illustrates an example where each subpixel has a square top surface. FIG. 14E illustrates an example where each subpixel has a substantially square top surface with rounded corners. FIG. 14F illustrates an example where each subpixel has a circular top surface.

Figure 14G:
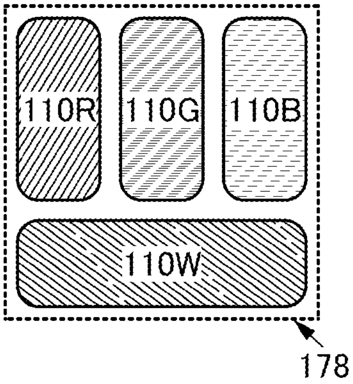
Figure 14H:
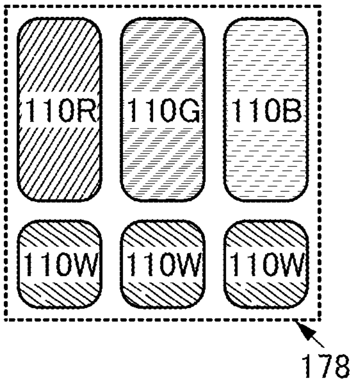

FIGS. 14G and 14H each illustrate an example where one pixel 178 is composed of two rows and three columns.

The pixel 178 illustrated in FIG. 14G includes three subpixels (the subpixels 110R, 110G, and 110B) in the upper row (first row) and one subpixel (a subpixel 110W) in the lower row (second row). In other words, the pixel 178 includes the subpixel 110R in the left column (first column), the subpixel 110G in the middle column (second column), the subpixel 110B in the right column (third column), and the subpixel 110W across these three columns.

The pixel 178 illustrated in FIG. 14H includes three subpixels (the subpixels 110R, 110G, and 110B) in the upper row (first row) and three of the subpixels 110W in the lower row (second row). In other words, the pixel 178 includes the subpixels 110R and 110W in the left column (first column), the subpixels 110G and 110W in the middle column (second column), and the subpixels 110B and 110W in the right column (third column). Matching the positions of the subpixels in the upper row and the lower row as illustrated in FIG. 14H enables dust that would be produced in the fabrication process, for example, to be removed efficiently. Thus, a light-emitting apparatus having high display quality can be provided.

In the pixel 178 illustrated in FIGS. 14G and 14H, the subpixels 110R, 110G, and 110B are arranged in a stripe pattern, whereby the display quality can be improved.

Figure 14I:
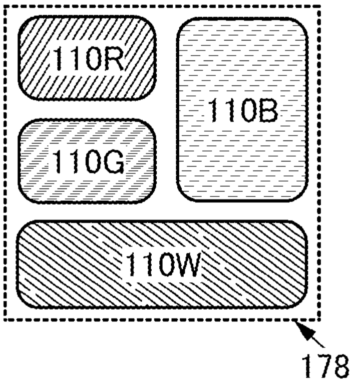

FIG. 14I illustrates an example where one pixel 178 is composed of three rows and two columns.

The pixel 178 illustrated in FIG. 14I includes the subpixel 110R in the upper row (first row), the subpixel 110G in the middle row (second row), the subpixel 110B across the first row and the second row, and one subpixel (the subpixel 110W) in the lower row (third row). In other words, the pixel 178 includes the subpixels 110R and 110G in the left column (first column), the subpixel 110B in the right column (second column), and the subpixel 110W across these two columns.

In the pixel 178 illustrated in FIG. 14I, the subpixels 110R, 110G, and 110B are arranged in what is called an S-stripe pattern, whereby the display quality can be improved.

The pixel 178 illustrated in each of FIGS. 14A to 14I is composed of four subpixels, which are the subpixels 110R, 110G, 110B, and 110W. For example, the subpixel 110R can be a subpixel that emits red light, the subpixel 110G can be a subpixel that emits green light, the subpixel 110B can be a subpixel that emits blue light, and the subpixel 110W can be a subpixel that emits white light. Note that at least one of the subpixels 110R, 110G, 110B, and 110W may be a subpixel that emits cyan light, magenta light, yellow light, or near-infrared light.

As described above, the pixel composed of the subpixels each including the light-emitting device can employ any of a variety of layouts in the light-emitting apparatus of one embodiment of the present invention.

This embodiment can be combined as appropriate with the other embodiments or an example. In this specification, in the case where a plurality of structure examples are shown in one embodiment, the structure examples can be combined as appropriate.

Embodiment 5

In this embodiment, a light-emitting apparatus of one embodiment of the present invention will be described.

The light-emitting apparatus in this embodiment can be a high-resolution light-emitting apparatus. Thus, the light-emitting apparatus in this embodiment can be used for display portions of information terminals (wearable devices) such as watch-type and bracelet-type information terminals and display portions of wearable devices capable of being worn on a head, such as a VR device like a head mounted display (HMD) and a glasses-type AR device.

The light-emitting apparatus in this embodiment can be a high-definition light-emitting apparatus or a large-sized light-emitting apparatus. Accordingly, the light-emitting apparatus in this embodiment can be used for display portions of a digital camera, a digital video camera, a digital photo frame, a mobile phone, a portable game console, a portable information terminal, and an audio reproducing device, in addition to display portions of electronic devices with a relatively large screen, such as a television device, desktop and notebook personal computers, a monitor of a computer and the like, digital signage, and a large game machine such as a pachinko machine.

[Display Module]

Figure 15A:
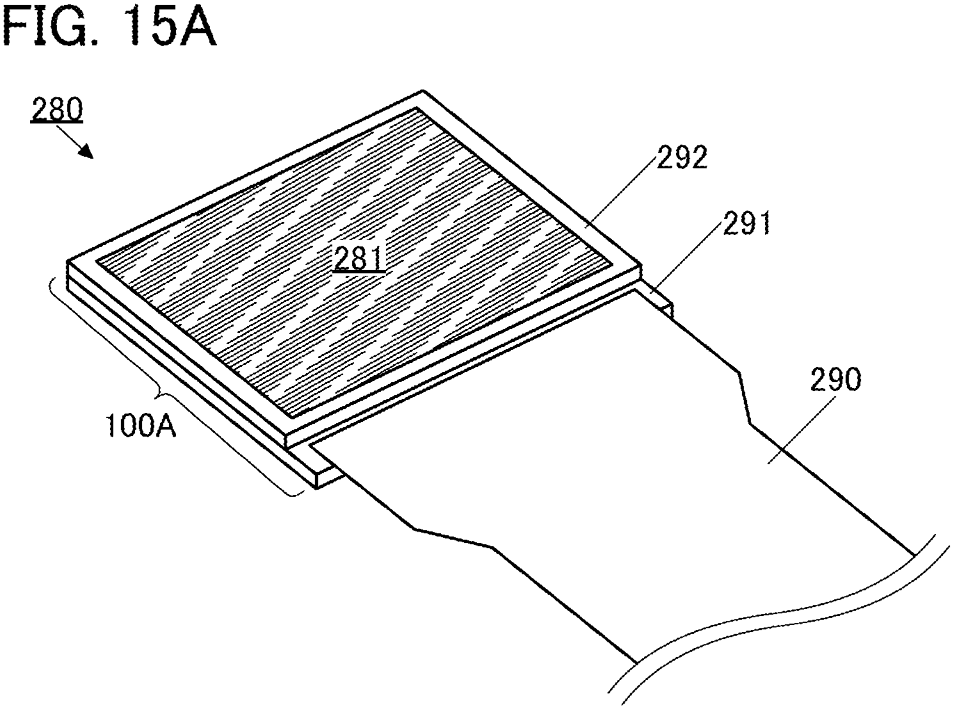
FIGS. 15A and 15B are perspective views illustrating a structure example of a display module.

FIG. 15A is a perspective view of a display module 280. The display module 280 includes a light-emitting apparatus 100A and an FPC 290. Note that the light-emitting apparatus included in the display module 280 is not limited to the light-emitting apparatus 100A and may be any of light-emitting apparatuses 100B to 100C described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 15B:
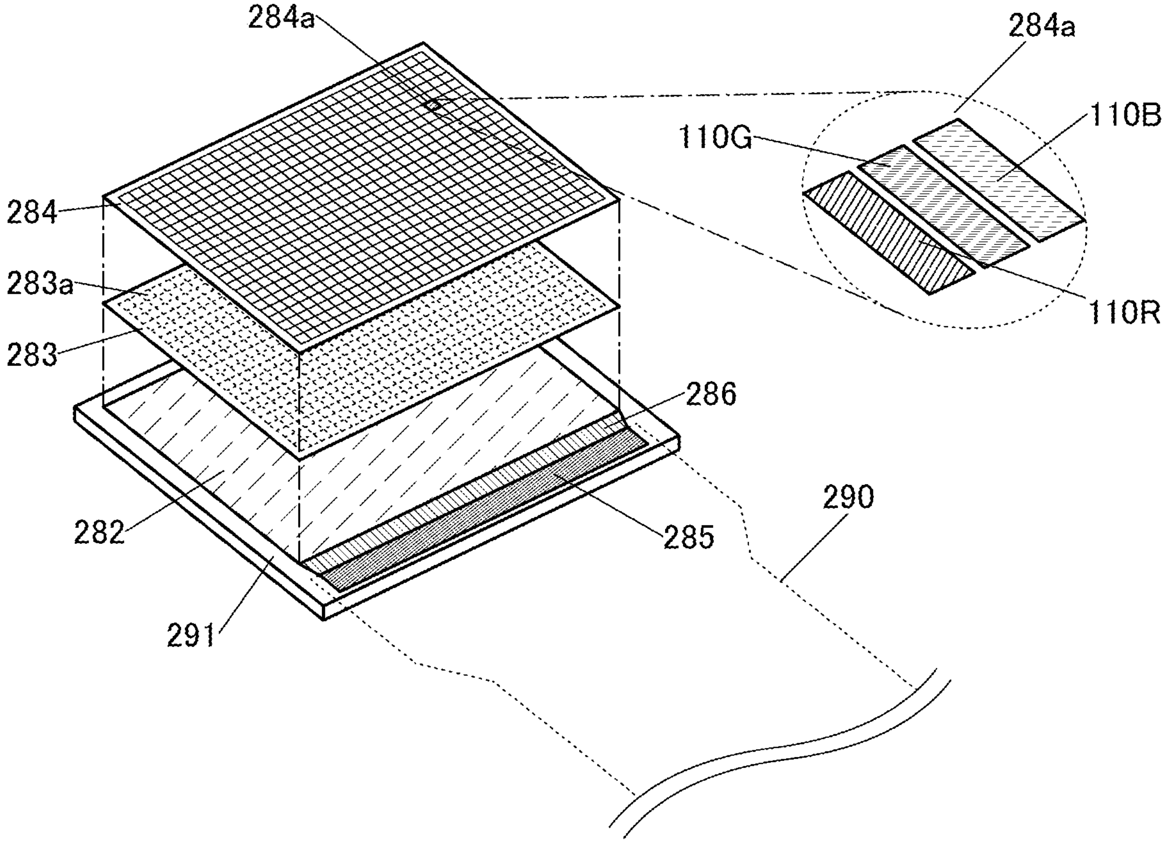

FIG. 15B is a perspective view schematically illustrating the structure on the substrate 291 side. Over the substrate 291, a circuit portion 282, a pixel circuit portion 283 over the circuit portion 282, and the pixel portion 284 over the pixel circuit portion 283 are stacked. In addition, a terminal portion 285 for connection to the FPC 290 is included in a portion not overlapped by the pixel portion 284 over the substrate 291. The terminal portion 285 and the circuit portion 282 are electrically connected to each other through a wiring portion 286 formed of a plurality of wirings.

The pixel portion 284 includes a plurality of pixels **284*a* arranged periodically. An enlarged view of one pixel 284*a* is illustrated on the right side in FIG. 15B. The pixels 284*a* can employ any of the structures described in the above embodiments. FIG. 15B illustrates an example where the pixel 284*a* has a structure similar to that of the pixel 178 illustrated in FIGS. 3A and 3**B.

The pixel circuit portion 283 includes a plurality of pixel circuits **283*a*** arranged periodically.

One pixel circuit **283*a* is a circuit that controls driving of a plurality of elements included in one pixel 284*a*. One pixel circuit 283*a* can be provided with three circuits each of which controls light emission of one light-emitting device. For example, the pixel circuit 283*a*** can include at least one selection transistor, one current control transistor (driving transistor), and a capacitor for one light-emitting device. A gate signal is input to a gate of the selection transistor, and a video signal is input to a source or a drain of the selection transistor. With such a structure, an active-matrix light-emitting apparatus is achieved.

The circuit portion 282 includes a circuit for driving the pixel circuits 283*a* in the pixel circuit portion 283. For example, the circuit portion 282 preferably includes one or both of a gate line driver circuit and a source line driver circuit. The circuit portion 282 may also include at least one of an arithmetic circuit, a memory circuit, a power supply circuit, and the like.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284*a* can be arranged extremely densely and thus the display portion 281 can have significantly high resolution. For example, the pixels 284*a* are preferably arranged in the display portion 281 with a resolution of greater than or equal to 2000 ppi, further preferably greater than or equal to 3000 ppi, still further preferably greater than or equal to 5000 ppi, yet still further preferably greater than or equal to 6000 ppi, and less than or equal to 20000 ppi or less than or equal to 30000 ppi.

Such a display module 280 has extremely high resolution, and thus can be suitably used for a VR device such as a HMD or a glasses-type AR device. For example, even in the case of a structure in which the display portion of the display module 280 is seen through a lens, pixels of the extremely-high-resolution display portion 281 included in the display module 280 are prevented from being recognized when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a wrist watch.

[Light-Emitting Apparatus 100A]

Figure 16A:
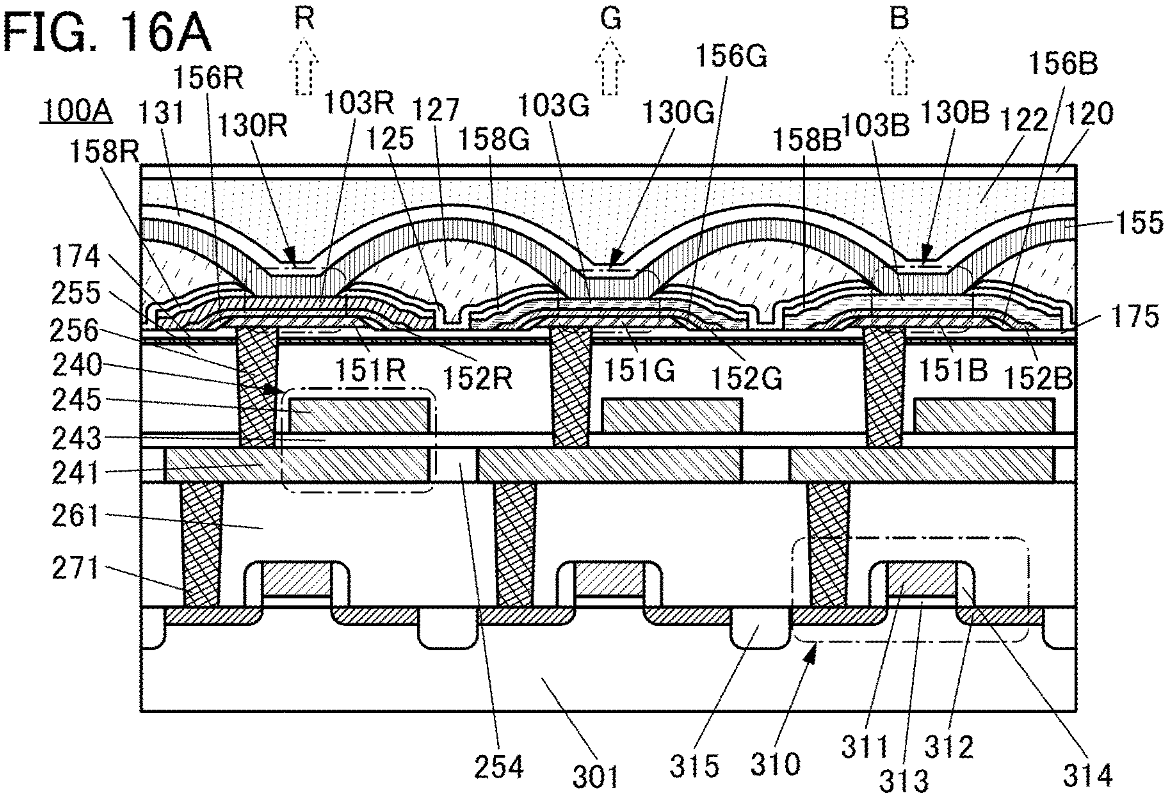
FIGS. 16A and 16B are cross-sectional views each illustrating a structure example of a light-emitting apparatus.

The light-emitting apparatus 100A illustrated in FIG. 16A includes a substrate 301, the light-emitting devices 130R, 130G, and 130B, a capacitor 240, and a transistor 310.

The substrate 301 corresponds to the substrate 291 in FIGS. 15A and 15B. The transistor 310 includes a channel formation region in the substrate 301. As the substrate 301, a semiconductor substrate such as a single crystal silicon substrate can be used, for example. The transistor 310 includes part of the substrate 301, a conductive layer 311, a low-resistance region 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as a source or a drain. The insulating layer 314 is provided to cover the side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 between the conductive layers 241 and 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping the conductive layer 241 with the insulating layer 243 therebetween.

An insulating layer 255 is provided to cover the capacitor 240. The insulating layer 174 is provided over the insulating layer 255. The insulating layer 175 is provided over the insulating layer 174. The light-emitting devices 130R, 130G, and 130B are provided over the insulating layer 175. FIG. 16A illustrates an example in which the light-emitting devices 130R, 130G, and 130B each have the stacked-layer structure illustrated in FIG. 6A. An insulator is provided in regions between adjacent light-emitting devices. For example, in FIG. 16A, the inorganic insulating layer 125 and the insulating layer 127 over the inorganic insulating layer 125 are provided in those regions.

The insulating layer 156R is provided to include a region overlapping the side surface of the conductive layer 151R of the light-emitting device 130R. The insulating layer 156G is provided to include a region overlapping the side surface of the conductive layer 151G of the light-emitting device 130G. The insulating layer 156B is provided to include a region overlapping the side surface of the conductive layer 151B of the light-emitting device 130B. The conductive layer 152R is provided to cover the conductive layer 151R and the insulating layer 156R. The conductive layer 152G is provided to cover the conductive layer 151G and the insulating layer 156G. The conductive layer 152B is provided to cover the conductive layer 151B and the insulating layer 156B. The sacrificial layer 158R is positioned over the organic compound layer 103R of the light-emitting device 130R. The sacrificial layer 158G is positioned over the organic compound layer 103G of the light-emitting device 130G. The sacrificial layer 158B is positioned over the organic compound layer 103B of the light-emitting device 130B.

Each of the conductive layers 151R, 151G, and 151B is electrically connected to one of the source and the drain of the corresponding transistor 310 through a plug 256 embedded in the insulating layers 243, 255, 174, and 175, the conductive layer 241 embedded in the insulating layer 254, and the plug 271 embedded in the insulating layer 261. The top surface of the insulating layer 175 and the top surface of the plug 256 are level with or substantially level with each other. Any of a variety of conductive materials can be used for the plugs.

The protective layer 131 is provided over the light-emitting devices 130R, 130G, and 130B. The substrate 120 is bonded to the protective layer 131 with the resin layer 122. Embodiment 2 can be referred to for the details of the light-emitting device 130 and the components thereover up to the substrate 120. The substrate 120 corresponds to the substrate 292 in FIG. 15A.

Figure 16B:
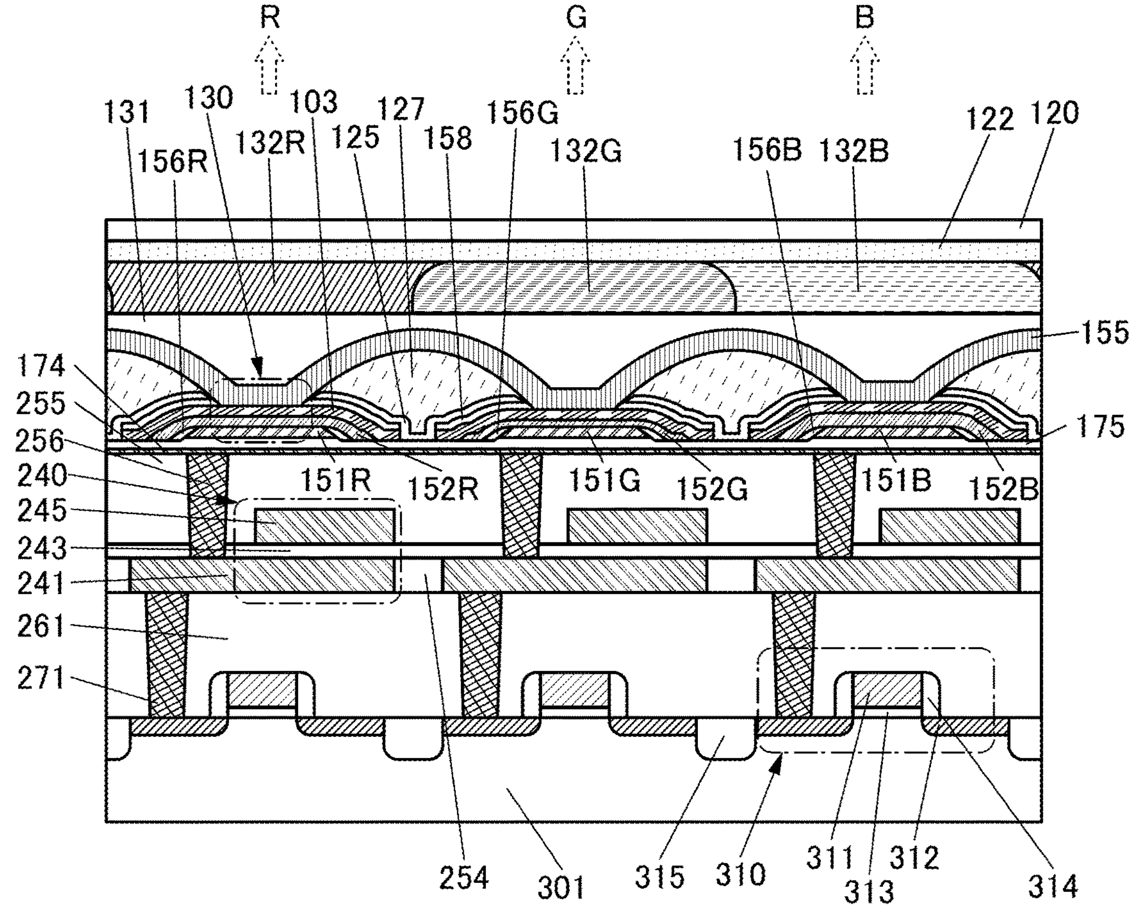

FIG. 16B illustrates a variation example of the light-emitting apparatus 100A illustrated in FIG. 16A. The light-emitting apparatus illustrated in FIG. 16B includes the coloring layers 132R, 132G, and 132B, and each of the light-emitting devices 130 includes a region overlapped by one of the coloring layers 132R, 132G, and 132B. In the light-emitting apparatus illustrated in FIG. 16B, the light-emitting device 130 can emit white light, for example. For example, the coloring layer 132R, the coloring layer 132G, and the coloring layer 132B can transmit red light, green light, and blue light, respectively.

[Light-Emitting Apparatus 100B]

Figure 17:
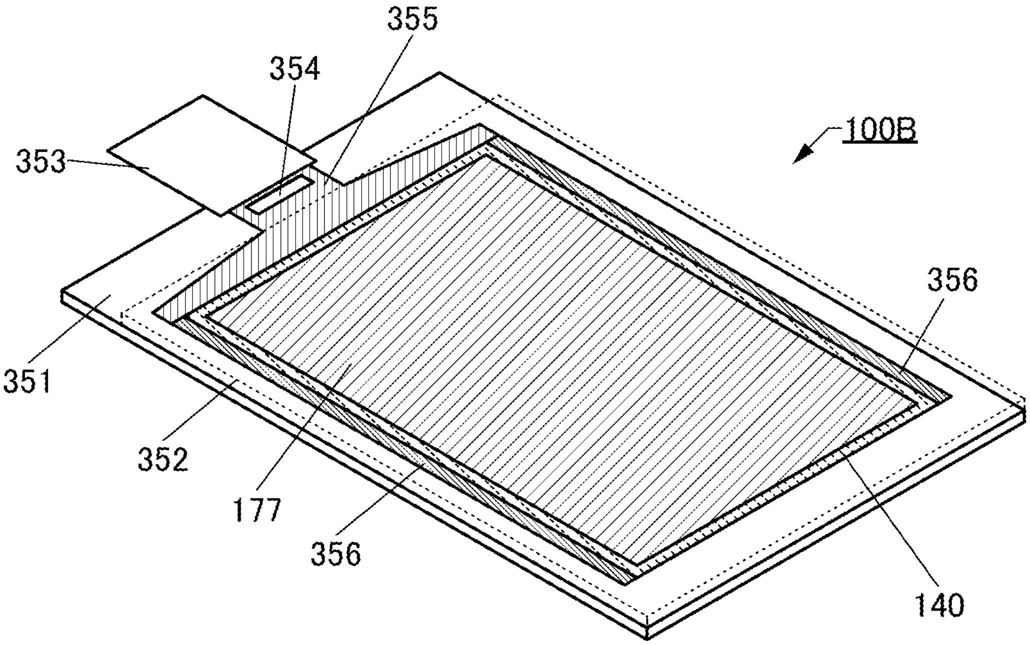
FIG. 17 is a perspective view illustrating a structure example of a light-emitting apparatus.
Figures 18A, 18B, 18C:
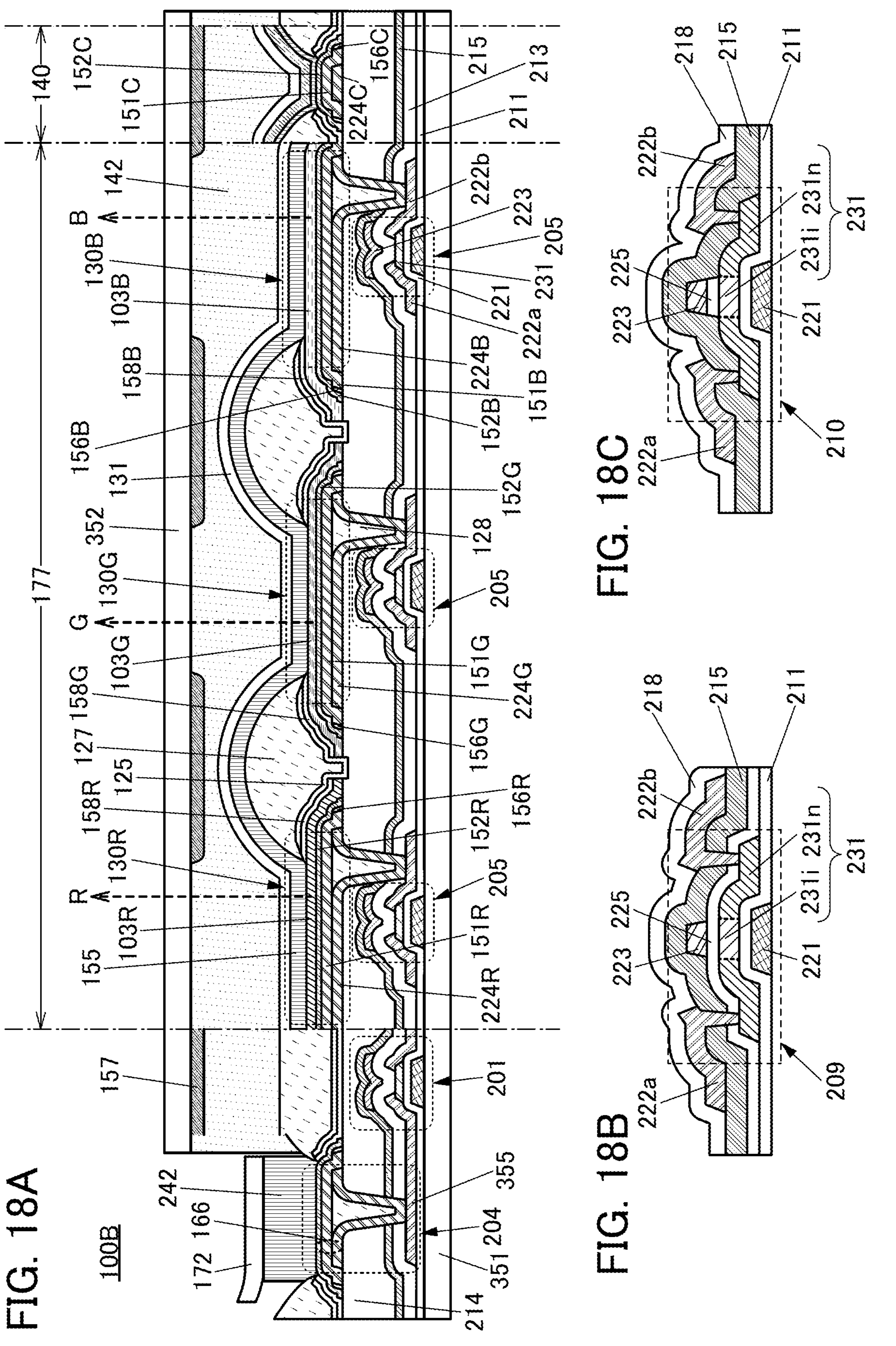
FIG. 18A is a cross-sectional view illustrating a structure example of a light-emitting apparatus.
FIGS. 18B and 18C are cross-sectional views each illustrating a structure example of a transistor.

FIG. 17 is a perspective view of the light-emitting apparatus 100B, and FIG. 18A is a cross-sectional view of the light-emitting apparatus 100B.

In the light-emitting apparatus 100B, a substrate 352 and a substrate 351 are bonded to each other. In FIG. 17, the substrate 352 is denoted by a dashed line.

The light-emitting apparatus 100B includes the pixel portion 177, the connection portion 140, a circuit 356, a wiring 355, and the like. FIG. 17 illustrates an example in which an IC 354 and an FPC 353 are mounted on the light-emitting apparatus 100B. Thus, the structure illustrated in FIG. 17 can be regarded as a display module including the light-emitting apparatus 100B, the integrated circuit (IC), and the FPC. Here, a light-emitting apparatus in which a substrate is equipped with a connector such as an FPC or mounted with an IC is referred to as a display module.

The connection portion 140 is provided outside the pixel portion 177. The connection portion 140 can be provided along one side or a plurality of sides of the pixel portion 177. The number of connection portions 140 may be one or more. FIG. 17 illustrates an example in which the connection portion 140 is provided to surround the four sides of the pixel portion 177. In the connection portion 140, a common electrode of a light-emitting device is electrically connected to a conductive layer, so that a potential can be supplied to the common electrode.

As the circuit 356, a scan line driver circuit can be used, for example.

The wiring 355 has a function of supplying a signal and power to the pixel portion 177 and the circuit 356. The signal and power are input to the wiring 355 from the outside through the FPC 353 or from the IC 354.

FIG. 17 illustrates an example in which the IC 354 is provided over the substrate 351 by a chip on glass (COG) method, a chip on film (COF) method, or the like. An IC including a scan line driver circuit, a signal line driver circuit, or the like can be used as the IC 354, for example. Note that the light-emitting apparatus 100B and the display module are not necessarily provided with an IC. Alternatively, the IC may be mounted on the FPC by a COF method, for example.

FIG. 18A illustrates an example of cross sections of part of a region including the FPC 353, part of the circuit 356, part of the pixel portion 177, part of the connection portion 140, and part of a region including an edge portion of the light-emitting apparatus 100B.

The light-emitting apparatus 100B illustrated in FIG. 18A includes a transistor 201, a transistor 205, the light-emitting device 130R that emits red light, the light-emitting device 130G that emits green light, the light-emitting device 130B that emits blue light, and the like between the substrate 351 and the substrate 352.

The stacked-layer structure of each of the light-emitting devices 130R, 130G, and 130B is the same as that illustrated in FIG. 6A except for the structure of the pixel electrode. Embodiments 1 and 2 can be referred to for the details of the light-emitting devices.

The light-emitting device 130R includes a conductive layer 224R, the conductive layer 151R over the conductive layer 224R, and the conductive layer 152R over the conductive layer 151R. The light-emitting device 130G includes a conductive layer 224G, the conductive layer 151G over the conductive layer 224G, and the conductive layer 152G over the conductive layer 151G. The light-emitting device 130B includes a conductive layer 224B, the conductive layer 151B over the conductive layer 224B, and the conductive layer 152B over the conductive layer 151B. Here, the conductive layers 224R, 151R, and 152R can be collectively referred to as the pixel electrode of the light-emitting device 130R; the conductive layers 151R and 152R excluding the conductive layer 224R can also be referred to as the pixel electrode of the light-emitting device 130R. Similarly, the conductive layers 224G, 151G, and 152G can be collectively referred to as the pixel electrode of the light-emitting device 130G; the conductive layers 151G and 152G excluding the conductive layer 224G can also be referred to as the pixel electrode of the light-emitting device 130G. The conductive layers 224B, 151B, and 152B can be collectively referred to as the pixel electrode of the light-emitting device 130B; the conductive layers 151B and 152B excluding the conductive layer 224B can also be referred to as the pixel electrode of the light-emitting device 130B.

The conductive layer 224R is connected to a conductive layer 222*b* included in the transistor 205 through the opening provided in an insulating layer 214. The edge portion of the conductive layer 151R is positioned outward from the edge portion of the conductive layer 224R. The insulating layer 156R is provided to include a region that is in contact with the side surface of the conductive layer 151R, and the conductive layer 152R is provided to cover the conductive layer 151R and the insulating layer 156R.

The conductive layers 224G, 151G, and 152G and the insulating layer 156G in the light-emitting device 130G are not described in detail because they are respectively similar to the conductive layers 224R, 151R, and 152R and the insulating layer 156R in the light-emitting device 130R; the same applies to the conductive layers 224B, 151B, and 152B and the insulating layer 156B in the light-emitting device 130B.

The conductive layers 224R, 224G, and 224B each have a depression portion covering an opening provided in the insulating layer 214. A layer 128 is embedded in the depression portion.

The layer 128 has a function of filling the depression portions of the conductive layers 224R, 224G, and 224B to obtain planarity. Over the conductive layers 224R, 224G, and 224B and the layer 128, the conductive layers 151R, 151G, and 151B that are respectively electrically connected to the conductive layers 224R, 224G, and 224B are provided. Thus, the regions overlapping the depression portions of the conductive layers 224R, 224G, and 224B can also be used as light-emitting regions, whereby the aperture ratio of the pixel can be increased.

The layer 128 may be an insulating layer or a conductive layer. Any of a variety of inorganic insulating materials, organic insulating materials, and conductive materials can be used for the layer 128 as appropriate. Specifically, the layer 128 is preferably formed using an insulating material and is particularly preferably formed using an organic insulating material. The layer 128 can be formed using an organic insulating material usable for the insulating layer 127, for example.

The protective layer 131 is provided over the light-emitting devices 130R, 130G, and 130B. The protective layer 131 and the substrate 352 are bonded to each other with an adhesive layer 142. The substrate 352 is provided with a light-blocking layer 157. A solid sealing structure, a hollow sealing structure, or the like can be employed to seal the light-emitting device 130. In FIG. 18A, a solid sealing structure is employed, in which a space between the substrate 352 and the substrate 351 is filled with the adhesive layer 142. Alternatively, the space may be filled with an inert gas (e.g., nitrogen or argon), i.e., a hollow sealing structure may be employed. In that case, the adhesive layer 142 may be provided not to overlap the light-emitting device. Alternatively, the space may be filled with a resin other than the frame-like adhesive layer 142.

FIG. 18A illustrates an example in which the connection portion 140 includes a conductive layer 224C obtained by processing the same conductive film as the conductive layers 224R, 224G, and 224B; the conductive layer 151C obtained by processing the same conductive film as the conductive layers 151R, 151G, and 151B; and the conductive layer 152C obtained by processing the same conductive film as the conductive layers 152R, 152G, and 152B. In the example illustrated in FIG. 18A, the insulating layer 156C is provided to include a region overlapping the side surface of the conductive layer 151C.

The light-emitting apparatus 100B has a top-emission structure. Light from the light-emitting device is emitted toward the substrate 352. For the substrate 352, a material having a high visible-light-transmitting property is preferably used. The pixel electrode contains a material that reflects visible light, and the counter electrode (the common electrode 155) contains a material that transmits visible light.

The transistor 201 and the transistor 205 are formed over the substrate 351. These transistors can be fabricated using the same materials in the same steps.

An insulating layer 211, an insulating layer 213, an insulating layer 215, and the insulating layer 214 are provided in this order over the substrate 351. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities to the transistors from the outside and increase the reliability of the light-emitting apparatus.

An inorganic insulating film is preferably used as each of the insulating layers 211, 213, and 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating layer is suitable as the insulating layer 214 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. The insulating layer 214 may have a stacked-layer structure of an organic insulating layer and an inorganic insulating layer. The outermost layer of the insulating layer 214 preferably functions as an etching protective layer. This can inhibit formation of a recessed portion in the insulating layer 214 at the time of processing of the conductive layer 224R, 151R, or 152R or the like. Alternatively, a recessed portion may be provided in the insulating layer 214 at the time of processing of the conductive layer 224R, 151R, or 152R or the like.

Each of the transistors 201 and 205 includes a conductive layer 221 functioning as a gate, the insulating layer 211 functioning as a gate insulating layer, a conductive layer 222*a* and a conductive layer 222*b* functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the light-emitting apparatus of this embodiment. For example, a planar transistor, a staggered transistor, or an inverted staggered transistor can be used. A top-gate transistor or a bottom-gate transistor can be used. Alternatively, gates may be provided above and below a semiconductor layer where a channel is formed.

The structure in which the semiconductor layer where a channel is formed is provided between two gates is used for the transistors 201 and 205. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistors, and either an amorphous semiconductor or a semiconductor having crystallinity (a microcrystalline semiconductor, a polycrystalline semiconductor, a single crystal semiconductor, or a semiconductor partly including crystal regions) can be used. A semiconductor having crystallinity is preferably used, in which case deterioration of transistor characteristics can be suppressed.

The semiconductor layer of the transistor preferably includes a metal oxide. That is, a transistor including a metal oxide in its channel formation region (hereinafter, also referred to as an OS transistor) is preferably used in the light-emitting apparatus of this embodiment.

Examples of an oxide semiconductor having crystallinity include a c-axis-aligned crystalline oxide semiconductor (CAAC-OS) and a nanocrystalline oxide semiconductor (nc-OS).

Alternatively, a transistor including silicon in its channel formation region (a Si transistor) may be used. Examples of silicon include single crystal silicon, polycrystalline silicon, and amorphous silicon. In particular, a transistor containing low-temperature polysilicon (LTPS) in its semiconductor layer (hereinafter also referred to as an LTPS transistor) can be used. The LTPS transistor has high field-effect mobility and excellent frequency characteristics.

With the use of Si transistors such as LTPS transistors, a circuit required to be driven at a high frequency (e.g., a source driver circuit) can be formed on the same substrate as the display portion. This allows for simplification of an external circuit mounted on the light-emitting apparatus and a reduction in costs of parts and mounting costs.

An OS transistor has much higher field-effect mobility than a transistor containing amorphous silicon. In addition, the OS transistor has an extremely low leakage current between a source and a drain in an off state (hereinafter also referred to as an off-state current), and charge accumulated in a capacitor that is connected in series to the transistor can be held for a long period. Furthermore, the power consumption of the light-emitting apparatus can be reduced with the OS transistor.

To increase the luminance of the light-emitting device included in the pixel circuit, the amount of current fed through the light-emitting device needs to be increased. To increase the current amount, the source-drain voltage of a driving transistor included in the pixel circuit needs to be increased. An OS transistor has a higher breakdown voltage between a source and a drain than a Si transistor; hence, a high voltage can be applied between the source and the drain of the OS transistor. Therefore, when an OS transistor is used as the driving transistor in the pixel circuit, the amount of current flowing through the light-emitting device can be increased, so that the luminance of the light-emitting device can be increased.

When transistors operate in a saturation region, a change in a source-drain current relative to a change in a gate-source voltage can be smaller in an OS transistor than in a Si transistor. Accordingly, when an OS transistor is used as the driving transistor in the pixel circuit, a current flowing between the source and the drain can be set minutely by a change in a gate-source voltage; hence, the amount of current flowing through the light-emitting device can be controlled. Consequently, the number of gray levels expressed by the pixel circuit can be increased.

Regarding saturation characteristics of a current flowing when transistors operate in a saturation region, even in the case where the source-drain voltage of an OS transistor increases gradually, a more stable current (saturation current) can be fed through the OS transistor than through a Si transistor. Thus, by using an OS transistor as the driving transistor, a stable current can be fed through light-emitting devices even when the current-voltage characteristics of the light-emitting devices vary, for example. In other words, when the OS transistor operates in the saturation region, the source-drain current hardly changes with an increase in the source-drain voltage; hence, the luminance of the light-emitting device can be stable.

As described above, by using OS transistors as the driving transistors included in the pixel circuits, it is possible to inhibit black-level degradation, increase the luminance, increase the number of gray levels, and suppress variations in light-emitting devices, for example.

The semiconductor layer preferably contains indium, M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more of aluminum, gallium, yttrium, and tin.

It is particularly preferable that an oxide containing indium (In), gallium (Ga), and zinc (Zn) (also referred to as IGZO) be used for the semiconductor layer. It is preferable to use an oxide containing indium, tin, and zinc. It is preferable to use an oxide containing indium, gallium, tin, and zinc. It is preferable to use an oxide containing indium (In), aluminum (Al), and zinc (Zn) (also referred to as IAZO). It is preferable to use an oxide containing indium (In), aluminum (Al), gallium (Ga), and zinc (Zn) (also referred to as IAGZO).

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide are In:M:Zn=1:1:1, 1:1:1.2, 2:1:3, 3:1:2, 4:2:3, 4:2:4.1, 5:1:3, 5:1:6, 5:1:7, 5:1:8, 6:1:6, and 5:2:5 and a composition in the vicinity of any of the above atomic ratios. Note that the vicinity of the atomic ratio includes ±30% of an intended atomic ratio.

For example, in the case of describing an atomic ratio of In:Ga:Zn=4:2:3 or a composition in the vicinity thereof, the case is included in which with the atomic proportion of In being 4, the atomic proportion of Ga is greater than or equal to 1 and less than or equal to 3 and the atomic proportion of Zn is greater than or equal to 2 and less than or equal to 4. In the case of describing an atomic ratio of In:Ga:Zn=5:1:6 or a composition in the vicinity thereof, the case is included in which with the atomic proportion of In being 5, the atomic proportion of Ga is greater than 0.1 and less than or equal to 2 and the atomic proportion of Zn is greater than or equal to 5 and less than or equal to 7. In the case of describing an atomic ratio of In:Ga:Zn=1:1:1 or a composition in the vicinity thereof, the case is included in which with the atomic proportion of In being 1, the atomic proportion of Ga is greater than 0.1 and less than or equal to 2 and the atomic proportion of Zn is greater than 0.1 and less than or equal to 2.

The transistors included in the circuit 356 and the transistors included in the pixel portion 177 may have the same structure or different structures. One structure or two or more kinds of structures may be employed for a plurality of transistors included in the circuit 356. Similarly, one structure or two or more kinds of structures may be employed for a plurality of transistors included in the pixel portion 177.

All transistors included in the pixel portion 177 may be OS transistors, or all transistors included in the pixel portion 177 may be Si transistors. Alternatively, some of the transistors included in the pixel portion 177 may be OS transistors and the others may be Si transistors.

For example, when both an LTPS transistor and an OS transistor are used in the pixel portion 177, the light-emitting apparatus can have low power consumption and high driving capability. Note that a structure in which an LTPS transistor and an OS transistor are used in combination is referred to as LTPO in some cases. For example, it is preferable that an OS transistor be used as a transistor functioning as a switch for controlling electrical continuity between wirings and an LTPS transistor be used as a transistor for controlling a current.

For example, one transistor included in the pixel portion 177 functions as a transistor for controlling a current flowing through the light-emitting device and can be referred to as a driving transistor. One of a source and a drain of the driving transistor is electrically connected to the pixel electrode of the light-emitting device. An LTPS transistor is preferably used as the driving transistor. In that case, the amount of current flowing through the light-emitting device can be increased in the pixel circuit.

Another transistor included in the pixel portion 177 functions as a switch for controlling selection or non-selection of a pixel and can be referred to as a selection transistor. A gate of the selection transistor is electrically connected to a gate line, and one of a source and a drain thereof is electrically connected to a source line (signal line). An OS transistor is preferably used as the selection transistor. In that case, the gray level of the pixel can be maintained even with an extremely low frame frequency (e.g., lower than or equal to 1 fps); thus, power consumption can be reduced by stopping the driver in displaying a still image.

As described above, the light-emitting apparatus of one embodiment of the present invention can have all of a high aperture ratio, high resolution, high display quality, and low power consumption.

Note that the light-emitting apparatus of one embodiment of the present invention has a structure including the OS transistor and the light-emitting device having a metal maskless (MML) structure. This structure can significantly reduce a leakage current that would flow through a transistor and a leakage current that would flow between adjacent light-emitting devices (sometimes referred to as a horizontal leakage current or a lateral leakage current). Displaying images on the light-emitting apparatus having this structure can bring one or more of image crispness, image sharpness, high color saturation, and a high contrast ratio to the viewer. When a leakage current that would flow through the transistor and a lateral leakage current that would flow between the light-emitting devices are extremely low, leakage of light at the time of black display (black-level degradation) or the like can be minimized.

In particular, in the case where a light-emitting device having an MML structure employs the above-described side-by-side (SBS) structure, a layer provided between light-emitting devices (for example, also referred to as an organic layer or a common layer which is shared by the light-emitting devices) is disconnected; accordingly, side leakage can be prevented or be made extremely low.

FIGS. 18B and 18C illustrate other structure examples of transistors.

Transistors 209 and 210 each include the conductive layer 221 functioning as a gate, the insulating layer 211 functioning as a gate insulating layer, the semiconductor layer 231 including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned at least between the conductive layer 223 and the channel formation region 231*i*. Furthermore, an insulating layer 218 covering the transistor may be provided.

FIG. 18B illustrates an example of the transistor 209 in which the insulating layer 225 covers the top and side surfaces of the semiconductor layer 231. The conductive layer 222*a* and the conductive layer 222*b* are connected to the corresponding low-resistance regions 231*n* through openings provided in the insulating layer 225 and the insulating layer 215. One of the conductive layers 222*a* and 222*b* functions as a source, and the other functions as a drain.

In the transistor 210 illustrated in FIG. 18C, the insulating layer 225 overlaps the channel formation region 231*i* of the semiconductor layer 231 and does not overlap the low-resistance regions 231*n*. The structure illustrated in FIG. 18C is obtained by processing the insulating layer 225 with the conductive layer 223 as a mask, for example. In FIG. 18C, the insulating layer 215 is provided to cover the insulating layer 225 and the conductive layer 223, and the conductive layer 222*a* and the conductive layer 222*b* are connected to the corresponding low-resistance regions 231*n* through openings in the insulating layer 215.

A connection portion 204 is provided in a region of the substrate 351 where the substrate 352 does not overlap. In the connection portion 204, the wiring 355 is electrically connected to the FPC 353 through a conductive layer 166 and a connection layer 242. As an example, the conductive layer 166 has a stacked-layer structure of a conductive film obtained by processing the same conductive film as the conductive layers 224R, 224G, and 224B; a conductive film obtained by processing the same conductive film as the conductive layers 151R, 151G, and 151B; and a conductive film obtained by processing the same conductive film as the conductive layers 152R, 152G, and 152B. On the top surface of the connection portion 204, the conductive layer 166 is exposed. Thus, the connection portion 204 and the FPC 353 can be electrically connected to each other through the connection layer 242.

A light-blocking layer 157 is preferably provided on the surface of the substrate 352 on the substrate 351 side. The light-blocking layer 157 can be provided over a region between adjacent light-emitting devices, in the connection portion 140, in the circuit 356, and the like. A variety of optical members can be arranged on the outer surface of the substrate 352.

A material that can be used for the substrate 120 can be used for each of the substrates 351 and 352.

A material that can be used for the resin layer 122 can be used for the adhesive layer 142.

As the connection layer 242, an anisotropic conductive film (ACF), an anisotropic conductive paste (ACP), or the like can be used.

[Light-Emitting Apparatus 100H]

Figure 19:
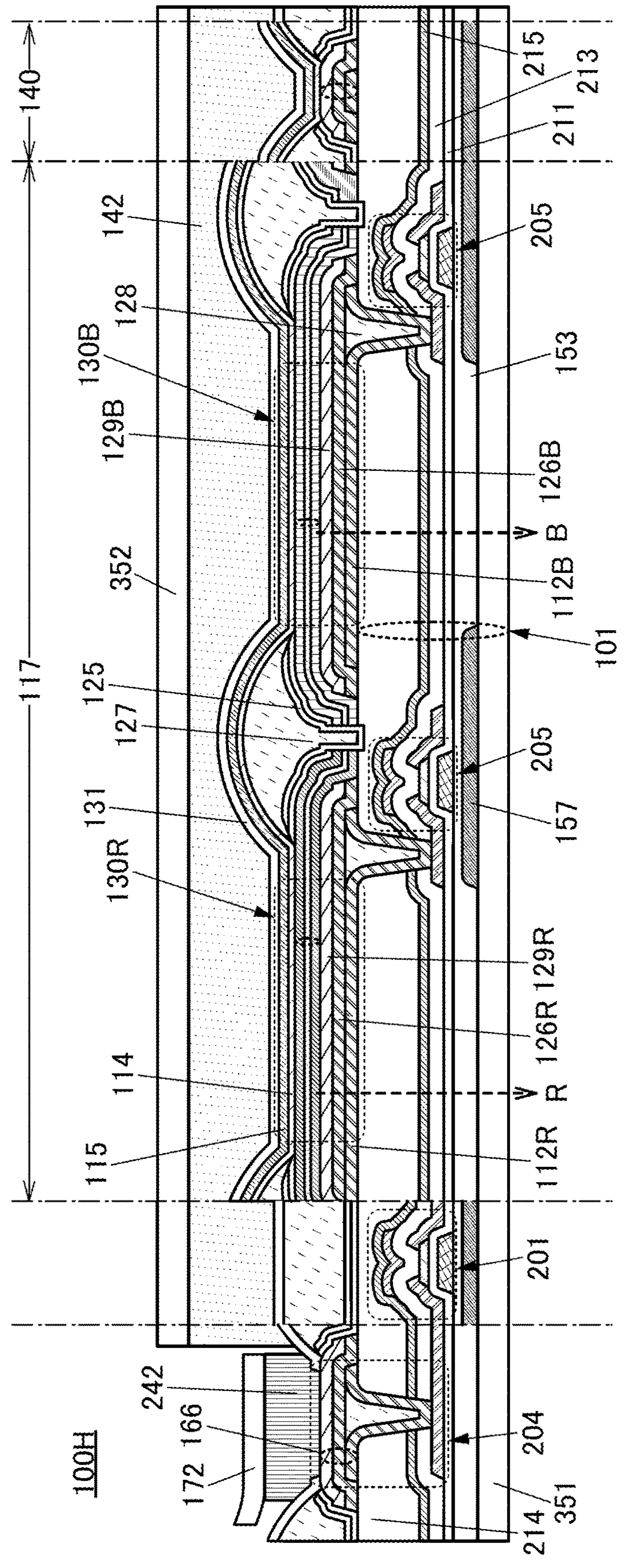
FIG. 19 is a cross-sectional view illustrating a structure example of a light-emitting apparatus.

A light-emitting apparatus 100H illustrated in FIG. 19 differs from the light-emitting apparatus 100B illustrated in FIG. 18A mainly in having a bottom-emission structure.

Light from the light-emitting device is emitted toward the substrate 351. For the substrate 351, a material having a high visible-light-transmitting property is preferably used. By contrast, there is no limitation on the light-transmitting property of a material used for the substrate 352.

The light-blocking layer 157 is preferably formed between the substrate 351 and the transistor 201 and between the substrate 351 and the transistor 205. FIG. 19 illustrates an example in which the light-blocking layer 157 is provided over the substrate 351, an insulating layer 153 is provided over the light-blocking layer 157, and the transistors 201 and 205 and the like are provided over the insulating layer 153.

The light-emitting device 130R includes a conductive layer 112R, a conductive layer 126R over the conductive layer 112R, and a conductive layer 129R over the conductive layer 126R.

The light-emitting device 130B includes a conductive layer 112B, a conductive layer 126B over the conductive layer 112B, and a conductive layer 129B over the conductive layer 126B.

A material having a high visible-light-transmitting property is used for each of the conductive layers 112R, 112B, 126R, 126B, 129R, and 129B. A material that reflects visible light is preferably used for the common electrode 155.

Although not illustrated in FIG. 19, the light-emitting device 130G is also provided.

Although FIG. 19 and the like illustrate an example in which the top surface of the layer 128 includes a flat portion, the shape of the layer 128 is not particularly limited.

[Light-Emitting Apparatus 100C]

The light-emitting apparatus 100C illustrated in FIG. 20A is a variation example of the light-emitting apparatus 100B illustrated in FIG. 18A and differs from the light-emitting apparatus 100B mainly in including the coloring layers 132R, 132G, and 132B.

In the light-emitting apparatus 100C, the light-emitting device 130 includes a region overlapped by one of the coloring layers 132R, 132G, and 132B. The coloring layers 132R, 132G, and 132B can be provided on a surface of the substrate 352 on the substrate 351 side. The edge portions of the coloring layers 132R, 132G, and 132B can overlap the light-blocking layer 157.

In the light-emitting apparatus 100C, the light-emitting device 130 can emit white light, for example. The coloring layer 132R, the coloring layer 132G, and the coloring layer 132B can transmit red light, green light, and blue light, respectively, for example. Note that in the light-emitting apparatus 100C, the coloring layers 132R, 132G, and 132B may be provided between the protective layer 131 and the adhesive layer 142.

Although FIG. 18A, FIG. 20A, and the like illustrate an example in which the top surface of the layer 128 includes a flat portion, the shape of the layer 128 is not particularly limited. FIGS. 20B to 20D illustrate variation examples of the layer 128.

As illustrated in FIGS. 20B and 20D, the top surface of the layer 128 can have a shape such that its middle and the vicinity thereof are depressed (i.e., a shape including a concave surface) in the cross section.

As illustrated in FIG. 20C, the top surface of the layer 128 can have a shape in which its center and vicinity thereof bulge, i.e., a shape including a convex surface, in the cross section.

The top surface of the layer 128 may include one or both of a convex surface and a concave surface. The number of convex surfaces and the number of concave surfaces included in the top surface of the layer 128 are not limited and can each be one or more.

The level of the top surface of the layer 128 and the level of the top surface of the conductive layer 224R may be the same or substantially the same, or may be different from each other. For example, the level of the top surface of the layer 128 may be either lower or higher than the level of the top surface of the conductive layer 224R.

FIG. 20B can be regarded as illustrating an example in which the layer 128 fits in the depression portion of the conductive layer 224R. By contrast, as illustrated in FIG. 20D, the layer 128 may exist also outside the depression portion of the conductive layer 224R, i.e., the top surface of the layer 128 may extend beyond the depression portion.

This embodiment can be combined as appropriate with the other embodiments or an example. In this specification, in the case where a plurality of structure examples are shown in one embodiment, the structure examples can be combined as appropriate.

Embodiment 6

In this embodiment, electronic devices of embodiments of the present invention will be described.

Electronic devices of this embodiment include the light-emitting apparatus of one embodiment of the present invention in their display portions. The light-emitting apparatus of one embodiment of the present invention is highly reliable and can be easily increased in resolution and definition. Thus, the light-emitting apparatus of one embodiment of the present invention can be used for display portions of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and notebook personal computers, a monitor of a computer and the like, digital signage, and a large game machine such as a pachinko machine.

In particular, the light-emitting apparatus of one embodiment of the present invention can have high resolution, and thus can be favorably used for an electronic device having a relatively small display portion. Examples of such an electronic device include watch-type and bracelet-type information terminal devices (wearable devices) and wearable devices worn on the head, such as a VR device like a head-mounted display, a glasses-type AR device, and an MR device.

The definition of the light-emitting apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, definition of 4K, 8K, or higher is preferable. The pixel density (resolution) of the light-emitting apparatus of one embodiment of the present invention is preferably higher than or equal to 100 ppi, further preferably higher than or equal to 300 ppi, further preferably higher than or equal to 500 ppi, further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With such a light-emitting apparatus having one or both of high definition and high resolution, the electronic device can provide higher realistic sensation, sense of depth, and the like in personal use such as portable use or home use. There is no particular limitation on the screen ratio (aspect ratio) of the light-emitting apparatus of one embodiment of the present invention. For example, the light-emitting apparatus is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays).

The electronic device in this embodiment can have a variety of functions. For example, the electronic device in this embodiment can have a function of displaying a variety of data (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices are described with reference to FIGS. 21A to 21D. These wearable devices have at least one of a function of displaying AR contents, a function of displaying VR contents, a function of displaying SR contents, and a function of displaying MR contents. The electronic device having a function of displaying contents of at least one of AR, VR, SR, MR, and the like enables the user to feel a higher level of immersion.

Figure 21A:
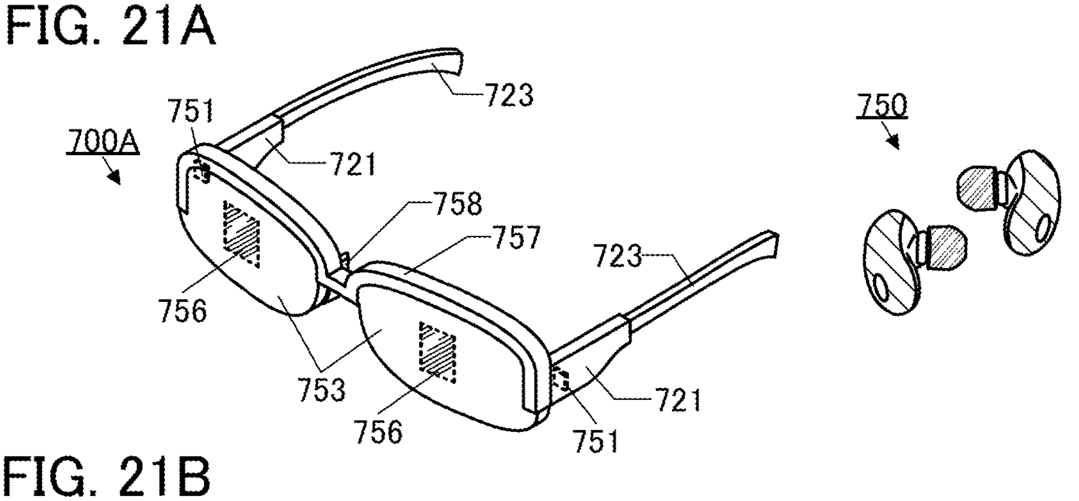
FIGS. 21A to 21D illustrate examples of electronic devices.
Figure 21B:
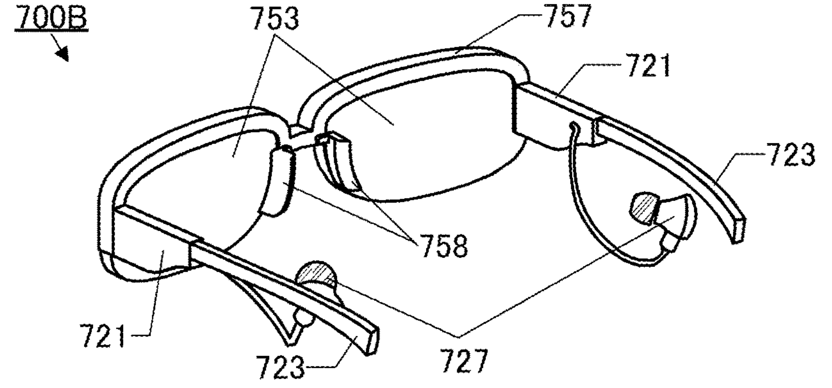

An electronic device 700A illustrated in FIG. 21A and an electronic device 700B illustrated in FIG. 21B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The light-emitting apparatus of one embodiment of the present invention can be used for the display panels 751. Thus, a highly reliable electronic device is obtained.

The electronic devices 700A and 700B can each project images displayed on the display panels 751 onto display regions 756 of the optical members 753. Since the optical members 753 have a light-transmitting property, the user can see images displayed on the display regions, which are superimposed on transmission images seen through the optical members 753. Accordingly, the electronic devices 700A and 700B are electronic devices capable of AR display.

In the electronic devices 700A and 700B, a camera capable of capturing images of the front side may be provided as the image capturing portion. Furthermore, when the electronic devices 700A and 700B are provided with an acceleration sensor such as a gyroscope sensor, the orientation of the user's head can be sensed and an image corresponding to the orientation can be displayed on the display regions 756.

The communication portion includes a wireless communication device, and a video signal, for example, can be supplied by the wireless communication device. Instead of or in addition to the wireless communication device, a connector that can be connected to a cable for supplying a video signal and a power supply potential may be provided.

The electronic devices 700A and 700B are provided with a battery, so that they can be charged wirelessly and/or by wire.

A touch sensor module may be provided in the housing 721. The touch sensor module has a function of detecting a touch on the outer surface of the housing 721. Detecting a tap operation, a slide operation, or the like by the user with the touch sensor module enables various types of processing. For example, a video can be paused or restarted by a tap operation, and can be fast-forwarded or fast-reversed by a slide operation. When the touch sensor module is provided in each of the two housings 721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion device (also referred to as a photoelectric conversion element) can be used as a light-receiving element. One or both of an inorganic semiconductor and an organic semiconductor can be used for an active layer of the photoelectric conversion device.

Figure 21C:
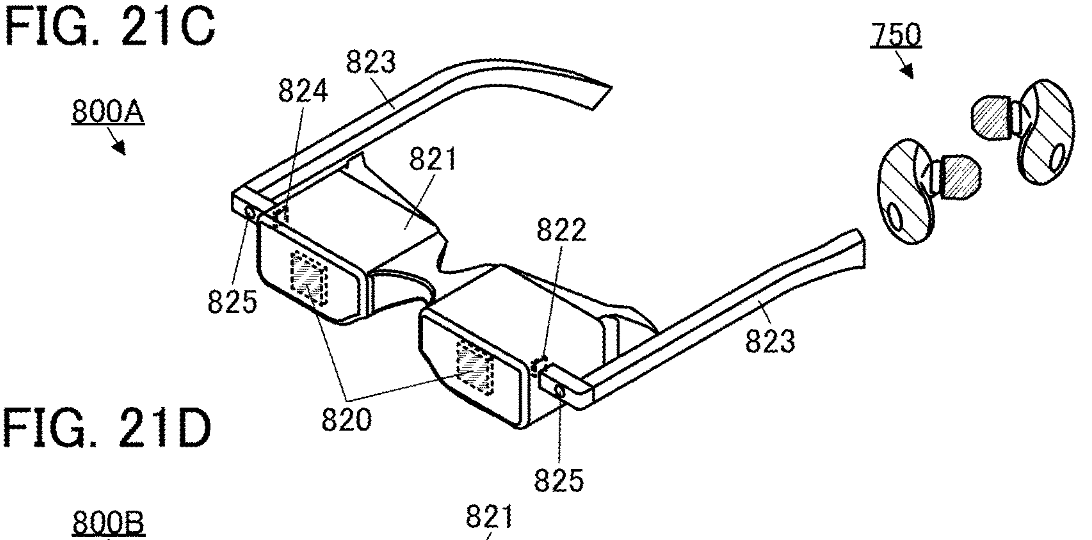
Figure 21D:
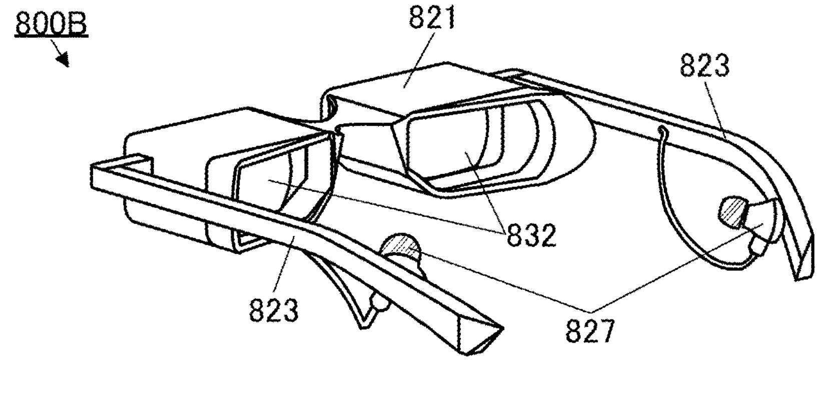

An electronic device 800A illustrated in FIG. 21C and an electronic device 800B illustrated in FIG. 21D each include a pair of display portions 820, a housing 821, a communication portion 822, a pair of wearing portions 823, a control portion 824, a pair of image capturing portions 825, and a pair of lenses 832.

The light-emitting apparatus of one embodiment of the present invention can be used in the display portions 820. Thus, a highly reliable electronic device is obtained.

The display portions 820 are positioned inside the housing 821 so as to be seen through the lenses 832. When the pair of display portions 820 display different images, three-dimensional display using parallax can be performed.

The electronic devices 800A and 800B can be regarded as electronic devices for VR. The user who wears the electronic device 800A or the electronic device 800B can see images displayed on the display portions 820 through the lenses 832.

The electronic devices 800A and 800B preferably include a mechanism for adjusting the lateral positions of the lenses 832 and the display portions 820 so that the lenses 832 and the display portions 820 are positioned optimally in accordance with the positions of the user's eyes. Moreover, the electronic devices 800A and 800B preferably include a mechanism for adjusting focus by changing the distance between the lenses 832 and the display portions 820.

The electronic device 800A or the electronic device 800B can be mounted on the user's head with the wearing portions 823. FIG. 21C, for instance, shows an example where the wearing portion 823 has a shape like a temple (also referred to as a joint or the like) of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to cover a plurality of fields of view, such as a telescope field of view and a wide field of view.

Although an example where the image capturing portions 825 are provided is shown here, a range sensor (hereinafter also referred to as a sensing portion) capable of measuring a distance between the user and an object just needs to be provided. In other words, the image capturing portion 825 is one embodiment of the sensing portion. As the sensing portion, an image sensor or a range image sensor such as a light detection and ranging (LiDAR) sensor can be used, for example. By using images obtained by the camera and images obtained by the range image sensor, more information can be obtained and a gesture operation with higher accuracy is possible.

The electronic device 800A may include a vibration mechanism that functions as bone-conduction earphones. For example, at least one of the display portion 820, the housing 821, and the wearing portion 823 can include the vibration mechanism. Thus, without additionally requiring an audio device such as headphones, earphones, or a speaker, the user can enjoy video and sound only by wearing the electronic device 800A.

The electronic devices 800A and 800B may each include an input terminal. To the input terminal, a cable for supplying a video signal from a video output device or the like, power for charging a battery provided in the electronic device, and the like can be connected.

The electronic device of one embodiment of the present invention may have a function of performing wireless communication with earphones 750. The earphones 750 include a communication portion (not illustrated) and has a wireless communication function. The earphones 750 can receive information (e.g., audio data) from the electronic device with the wireless communication function. For example, the electronic device 700A in FIG. 21A has a function of transmitting information to the earphones 750 with the wireless communication function. As another example, the electronic device 800A in FIG. 21C has a function of transmitting information to the earphones 750 with the wireless communication function.

The electronic device may include an earphone portion. The electronic device 700B in FIG. 21B includes earphone portions 727. For example, the earphone portion 727 can be connected to the control portion by wire. Part of a wiring that connects the earphone portion 727 and the control portion may be positioned inside the housing 721 or the mounting portion 723.

Similarly, the electronic device 800B in FIG. 21D includes earphone portions 827. For example, the earphone portion 827 can be connected to the control portion 824 by wire. Part of a wiring that connects the earphone portion 827 and the control portion 824 may be positioned inside the housing 821 or the mounting portion 823. Alternatively, the earphone portions 827 and the mounting portions 823 may include magnets. This is preferred because the earphone portions 827 can be fixed to the mounting portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic devices 700A and 700B) and the goggles-type device (e.g., the electronic devices 800A and 800B) are preferable as the electronic device of one embodiment of the present invention.

The electronic device of one embodiment of the present invention can transmit information to earphones by wire or wirelessly.

Figure 22A:
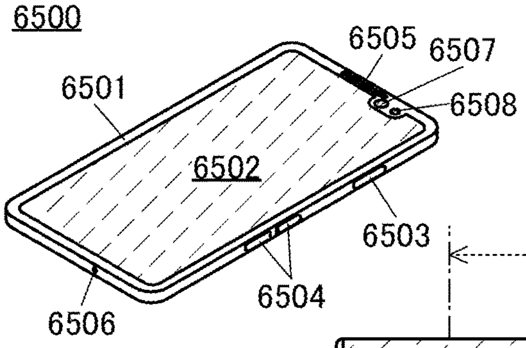
FIGS. 22A to 22F illustrate examples of electronic devices.

An electronic device 6500 illustrated in FIG. 22A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The light-emitting apparatus of one embodiment of the present invention can be used in the display portion 6502. Thus, a highly reliable electronic device is obtained.

Figure 22B:
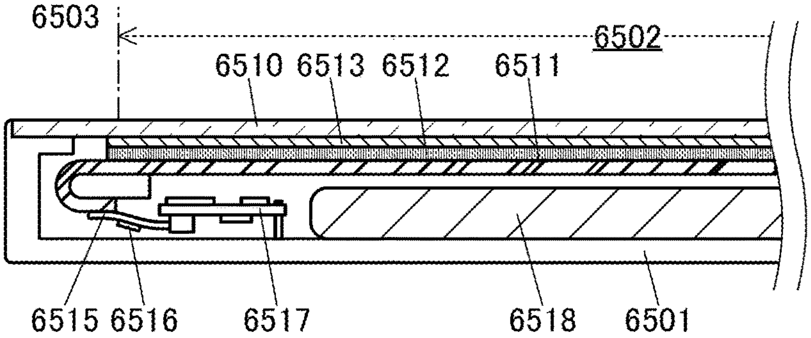

FIG. 22B is a schematic cross-sectional view including an edge portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

The light-emitting apparatus of one embodiment of the present invention can be used in the display panel 6511. Thus, an extremely lightweight electronic device can be achieved. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the pixel portion, whereby an electronic device with a narrow bezel can be achieved.

Figure 22C:
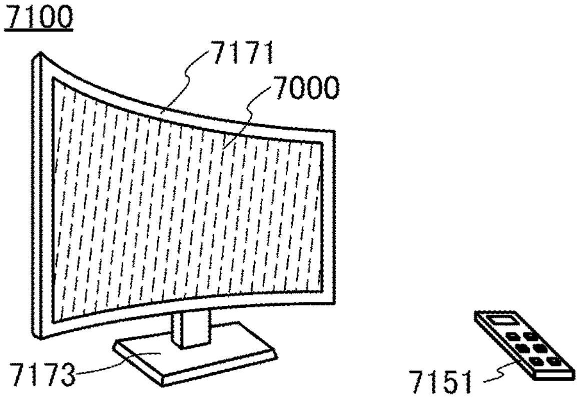

FIG. 22C illustrates an example of a television device. In a television device 7100, a display portion 7000 is incorporated in a housing 7171. Here, the housing 7171 is supported by a stand 7173.

The light-emitting apparatus of one embodiment of the present invention can be used in the display portion 7000. Thus, a highly reliable electronic device is obtained.

Operation of the television device 7100 illustrated in FIG. 22C can be performed with an operation switch provided in the housing 7171 and a separate remote controller 7151. Alternatively, the display portion 7000 may include a touch sensor, and the television device 7100 may be operated by touch on the display portion 7000 with a finger or the like. The remote controller 7151 may be provided with a display portion for displaying information output from the remote controller 7151. With operation keys or a touch panel of the remote controller 7151, channels and volume can be controlled and images displayed on the display portion 7000 can be controlled.

Note that the television device 7100 includes a receiver, a modem, and the like. A general television broadcast can be received with the receiver. When the television device is connected to a communication network with or without wires via the modem, one-way (from a transmitter to a receiver) or two-way (e.g., between a transmitter and a receiver or between receivers) information communication can be performed.

Figure 22D:
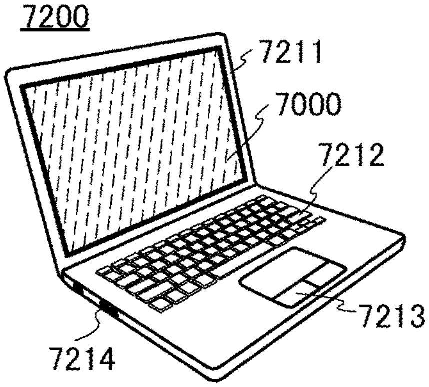

FIG. 22D illustrates an example of a notebook personal computer. A notebook personal computer 7200 includes a housing 7211, a keyboard 7212, a pointing device 7213, an external connection port 7214, and the like. The display portion 7000 is incorporated in the housing 7211.

The light-emitting apparatus of one embodiment of the present invention can be used in the display portion 7000. Thus, a highly reliable electronic device is obtained.

Figure 22E:
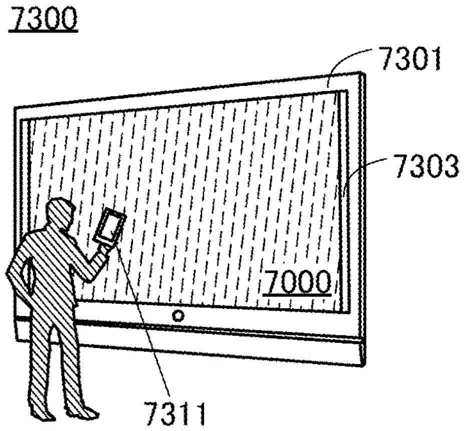
Figure 22F:
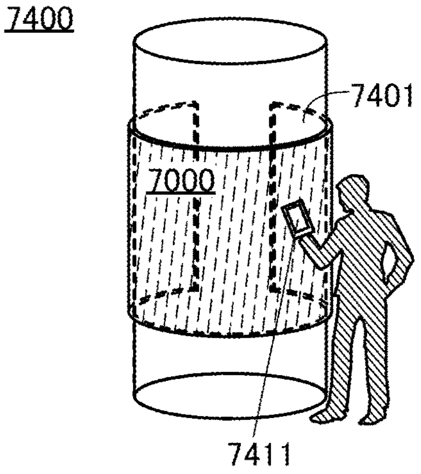

FIGS. 22E and 22F illustrate examples of digital signage.

Digital signage 7300 illustrated in FIG. 22E includes a housing 7301, the display portion 7000, a speaker 7303, and the like. The digital signage 7300 can also include an LED lamp, operation keys (including a power switch or an operation switch), a connection terminal, a variety of sensors, a microphone, and the like.

FIG. 22F shows digital signage 7400 attached to a cylindrical pillar 7401. The digital signage 7400 includes the display portion 7000 provided along a curved surface of the pillar 7401.

In FIGS. 22E and 22F, the light-emitting apparatus of one embodiment of the present invention can be used in the display portion 7000. Thus, a highly reliable electronic device is obtained.

A larger area of the display portion 7000 can increase the amount of information that can be provided at a time. The display portion 7000 having a larger area attracts more attention, so that the effectiveness of the advertisement can be increased, for example.

The touch panel is preferably used in the display portion 7000, in which case in addition to display of still or moving images on the display portion 7000, intuitive operation by a user is possible. Moreover, in the case of an application for providing information such as route information or traffic information, usability can be enhanced by intuitive operation.

As illustrated in FIGS. 22E and 22F, it is preferable that the digital signage 7300 or the digital signage 7400 can work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, a displayed image on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIGS. 23A to 23G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 9008, and the like.

The electronic devices illustrated in FIGS. 23A to 23G have a variety of functions. For example, the electronic devices can have a function of displaying a variety of information (e.g., a still image, a moving image, and a text image) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may be provided with a camera or the like and have a function of taking a still image or a moving image, a function of storing the taken image in a storage medium (an external storage medium or a storage medium incorporated in the camera), a function of displaying the taken image on the display portion, and the like.

The electronic devices in FIGS. 23A to 23G are described in detail below.

Figure 23A:
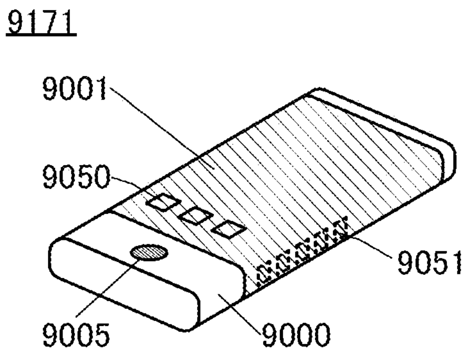
FIGS. 23A to 23G illustrate examples of electronic devices.

FIG. 23A is a perspective view of a portable information terminal 9171. The portable information terminal 9171 can be used as a smartphone, for example. The portable information terminal 9171 may include the speaker 9003, the connection terminal 9006, the sensor 9007, or the like. The portable information terminal 9171 can display text and image information on its plurality of surfaces. FIG. 23A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, an incoming call, or the like, the title and sender of an e-mail, an SNS message, or the like, the date, the time, remaining battery, and the radio field intensity. Alternatively, the icon 9050 or the like may be displayed at the position where the information 9051 is displayed.

Figure 23B:
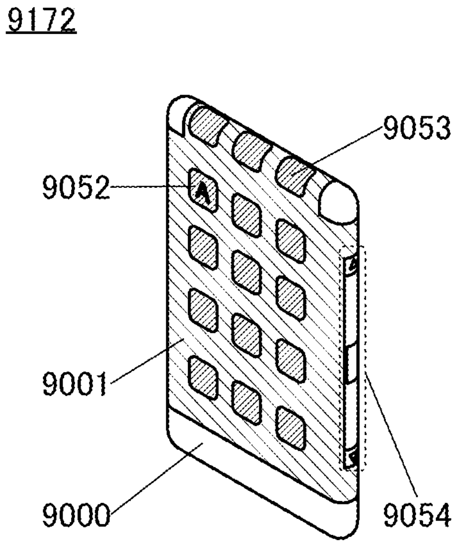

FIG. 23B is a perspective view of a portable information terminal 9172. The portable information terminal 9172 has a function of displaying information on three or more surfaces of the display portion 9001. Here, information 9052, information 9053, and information 9054 are displayed on different surfaces. For example, the user of the portable information terminal 9172 can check the information 9053 displayed such that it can be seen from above the portable information terminal 9172, with the portable information terminal 9172 put in a breast pocket of his/her clothes. Thus, the user can see the display without taking out the portable information terminal 9172 from the pocket and decide whether to answer the call, for example.

Figure 23C:
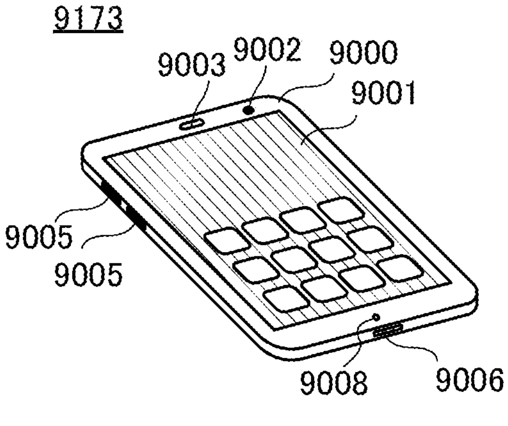

FIG. 23C is a perspective view of a tablet terminal 9173. The tablet terminal 9173 is capable of executing a variety of applications such as mobile phone calls, e-mailing, viewing and editing texts, music reproduction, Internet communication, and a computer game, for example. The tablet terminal 9173 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 23D:
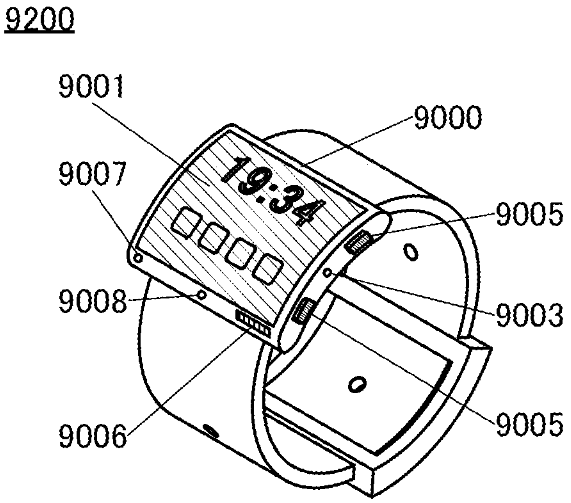

FIG. 23D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 23E:
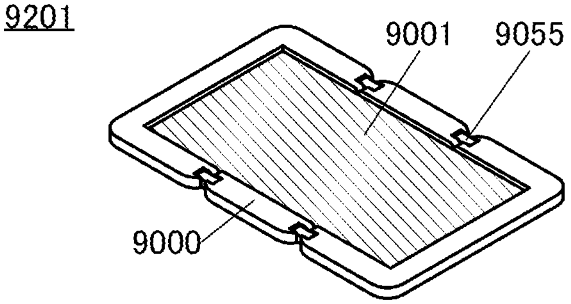
Figure 23F:
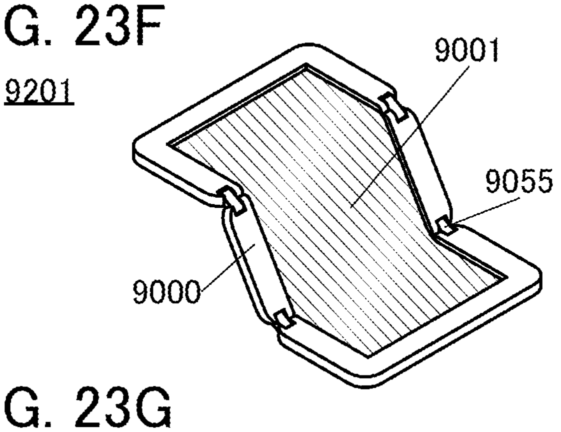
Figure 23G:
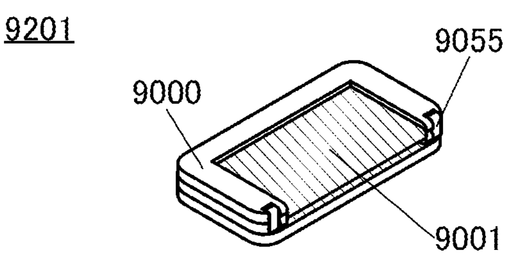

FIGS. 23E to 23G are perspective views of a foldable portable information terminal 9201. FIG. 23E is a perspective view showing the portable information terminal 9201 that is opened. FIG. 23G is a perspective view showing the portable information terminal 9201 that is folded. FIG. 23F is a perspective view showing the portable information terminal 9201 that is shifted from one of the states in FIGS. 23E and 23G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

This embodiment can be combined as appropriate with the other embodiments or an example. In this specification, in the case where a plurality of structure examples are shown in one embodiment, the structure examples can be combined as appropriate.

Example 1

In this example, evaluation results of the characteristics of fabricated blue-light-emitting devices each of which is one embodiment of the present invention described in the above embodiment will be described.

Structural formulae of organic compounds used for each of the light-emitting devices are shown below.

[Chemical Formula 3]

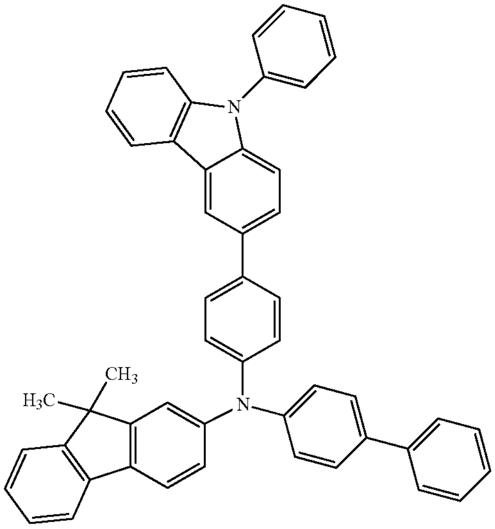

PCBBiF

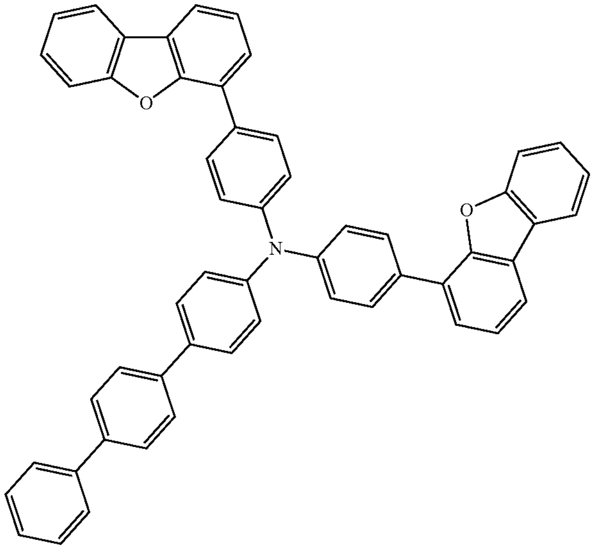

DBfBB1TP

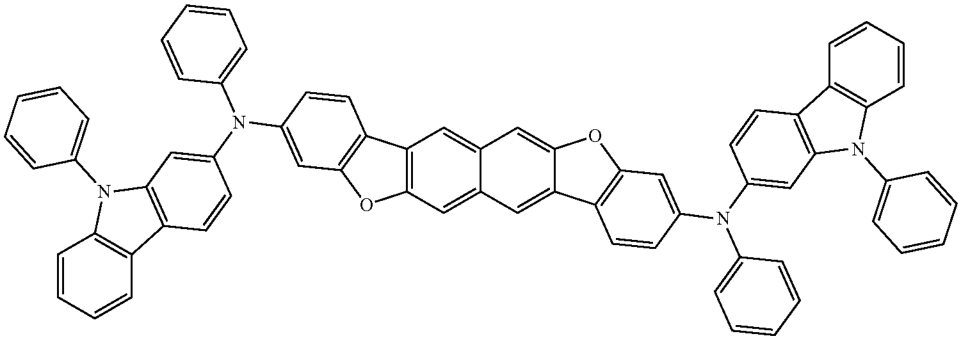

3,10PCA2Nbf(IV)-02

-continued

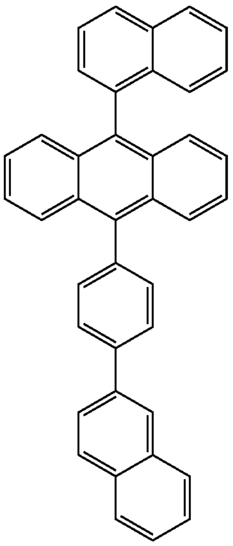

αN-β NPAnth

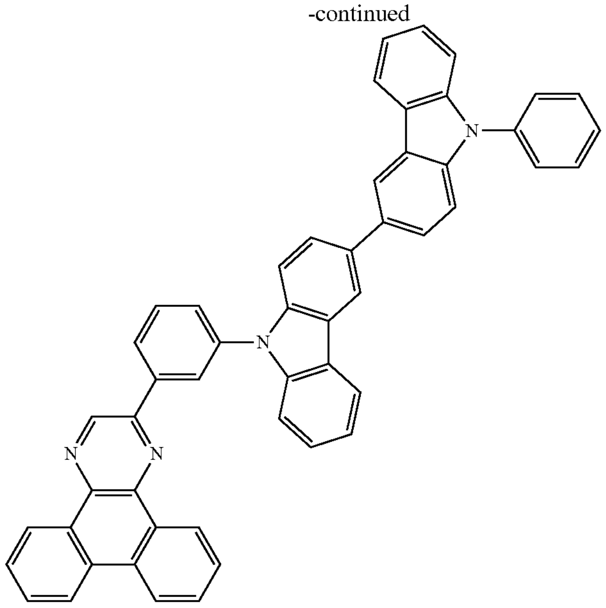

2mPCCzPDBq

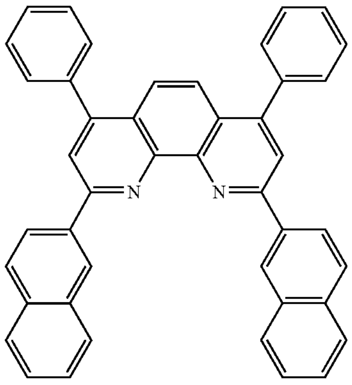

NBPhen

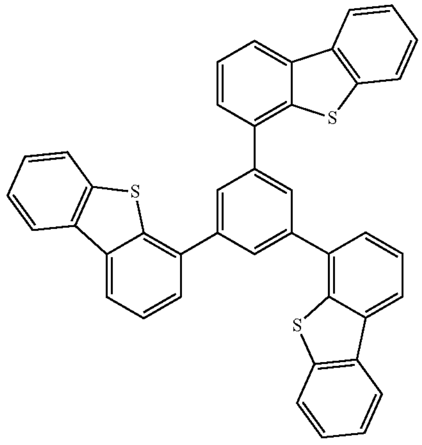

DBT3P-II

<Method for Fabricating Light-Emitting Devices>

Figure 24:
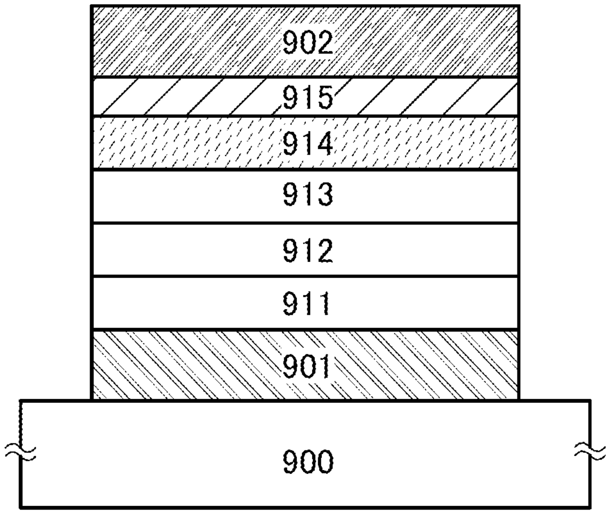
FIG. 24 illustrates a structure of samples in Example.

In each of the light-emitting devices, as illustrated in FIG. 24, a hole-injection layer 911, a hole-transport layer 912, a light-emitting layer 913, an electron-transport layer 914, and an electron-injection layer 915 were stacked in this order on a first electrode 901 formed on a glass substrate 900, and a second electrode 902 was stacked on the electron-injection layer 915.

First, silver (Ag) was deposited on the glass substrate 900 by a sputtering method and then indium oxide-tin oxide containing silicon or silicon oxide (abbreviation: ITSO) was deposited thereon by a sputtering method, whereby the first electrode 901 was formed. Note that the thickness of Ag was 100 nm, the thickness of ITSO was 85 nm, and the electrode area was 4 $mm^2$ (2 mm×2 mm).

Next, in pretreatment for forming each light-emitting device on the substrate, the surface of the substrate was washed with water and baking was performed at 200° C. for one hour. Then, the substrate was transferred into a vacuum evaporation apparatus where the pressure was reduced to approximately $10^{-4}$ Pa, and vacuum baking was performed at 170° C. for 60 minutes in a heating chamber of the vacuum evaporation apparatus. After that, natural cooling was performed for approximately 30 minutes.

Then, the substrate provided with the first electrode 901 was fixed to a substrate holder provided in the vacuum evaporation apparatus such that the surface on which the first electrode 901 was formed faced downward. On the first electrode 901, N-(biphenyl-4-yl)-N-[4-(9-phenyl-9H-carbazol-3-yl)phenyl]-9,9-dimethyl-9H-fluoren-2-amine (abbreviation: PCBBiF) and an electron acceptor material containing fluorine and having a molecular weight of 672 (abbreviation: OCHD-003) were deposited by co-evaporation using a resistance-heating method to a thickness of 10 nm such that the weight ratio of PCBBiF to OCHD-003 was 1:0.04, whereby the hole-injection layer 911 was formed.

Subsequently, on the hole-injection layer 911, PCBBiF was deposited to a thickness of 30 nm by evaporation, and then N,N-bis[4-(dibenzofuran-4-yl)phenyl]-4-amino-p-terphenyl (abbreviation: DBfBB1TP) was deposited to a thickness of 10 nm by evaporation, whereby the hole-transport layer 912 was formed.

Next, the light-emitting layer 913 was formed on the hole-transport layer 912. The light-emitting layer 913 was formed by co-evaporation of 9-(1-naphthyl)-10-[4-(2-naphthyl)phenyl]anthracene (abbreviation: αN-βNPAnth) and N,N-diphenyl-N,N-bis(9-phenyl-9H-carbazol-2-yl)naphtho[2,3-b; 6,7-H]bisbenzofuran-3,10-di amine (abbreviation: 3,10PCA2Nbf(IV)-02) to a thickness of 20 nm using a resistance-heating method such that the weight ratio of αN-βNPAnth to 3,10PCA2Nbf(IV)-02 was 1:0.015.

Next, on the light-emitting layer 913, 2-{3-[3-(N-phenyl-9H-carbazol-3-yl)-9H-carbazol-9-yl]phenyl}dibenzo[f,h]quinoxaline (abbreviation: 2mPCCzPDBq) was deposited by evaporation to a thickness of 20 nm, and then 2,9-di(naphthalen-2-yl)-4,7-diphenyl-1,10-phenanthroline (abbreviation: NBPhen) was deposited by evaporation to a thickness of 15 nm to form the electron-transport layer 914.

Here, each of the light-emitting devices was exposed to the air while being irradiated with light of a fluorescent lamp through an optical filter that can cut a wavelength shorter than or equal to a specific wavelength. Table 1 below shows the conditions of the wavelength cut filters. The light-emitting devices using optical filters with different transmission limit wavelengths were referred to as light-emitting devices 1A to 1G. Note that the transmission limit wavelength is a wavelength corresponding to the midpoint of the wavelength inclined width between a wavelength with a transmittance of 72% or higher (high transmission limit wavelength) and a wavelength with a transmittance of 5% or lower (absorption limit wavelength) in spectral transmission of the filter. A comparative light-emitting device 1 used as a reference was exposed to the air and irradiated with light of a fluorescent lamp through no optical filter. A comparative light-emitting device 2 used as a reference was not exposed to the air and not irradiated with light of a fluorescent lamp (in other words, the device was fabricated in a continuous vacuum process).

TABLE 1

| | Conditions for fluorescent lamp light irradiation | | |
|---|---|---|---|
| Sample | Exposure to the air | Transmission limit wavelength of optical filter | Illuminance |
| Light-emitting device 1A | Performed | 340 nm | 295 lx |
| Light-emitting device 1B | Performed | 380 nm | 285 lx |
| Light-emitting device 1C | Performed | 420 nm | 288 lx |
| Light-emitting device 1D | Performed | 440 nm | 286 lx |
| Light-emitting device 1E | Performed | 480 nm | 282 lx |
| Light-emitting device 1F | Performed | 500 nm | 272 lx |
| Light-emitting device 1G | Performed | 850 nm | 3.6 lx |
| Comparative light-emitting device 1 | Performed | Irradiation without optical filter | 317 lx |
| Comparative light-emitting device 2 | Not performed | No irradiation | — |

Next, vacuum baking was performed at 80° C. for 60 minutes under a reduced pressure of approximately $10^{-4}$ Pa. After that, natural cooling was performed.

Then, on the electron-transport layer 914, lithium fluoride (LiF) and ytterbium (Yb) were deposited by co-evaporation to a thickness of 2 nm such that the volume ratio of LiF to Yb was 1:1 to form the electron-injection layer 915.

Subsequently, on the electron-injection layer 915, Ag and Mg were deposited by co-evaporation to a thickness of 20 nm such that the volume ratio of Ag to Mg was 1:0.1 to form the second electrode 902. Note that the second electrode 902 was a semi-transmissive and semi-reflective electrode having functions of transmitting light and reflecting light.

After that, 4,4',4"-(benzene-1,3,5-triyl)tri(dibenzothiophene) (abbreviation: DBT3P-II) was deposited by evaporation to a thickness of 70 nm as a cap layer.

The structures of the light-emitting devices (the light-emitting devices 1A to 1G) are listed in Table 2 below.

TABLE 2

| | Film thickness [nm] | Material |
|---|---|---|
| Cap layer | 70 | DBT3P-II |
| Second electrode | 20 | Ag:Mg (1:0.1) |
| Electron-injection layer | 2 | LiF:Yb (1:1) |
| Electron-transport layer | 15 | NBPhen |
| | 20 | 2mPCCzPDBq |
| Light-emitting layer | 20 | αN-βNPAnth:3,10PCA2Nbf(IV)-02 (1:0.015) |
| Hole-transport layer | 10 | DBfBB1TP |
| | 30 | PCBBiF |
| Hole-injection layer | 10 | PCBBiF:OCHD-003 (1:0.04) |
| First electrode | 85 | ITSO |
| | 100 | Ag |

Through the above steps, the light-emitting devices were fabricated.

<Characteristics of Light-Emitting Devices>

Measurements of the light-emitting devices (the light-emitting devices 1A to 1G) each irradiated with light of a fluorescent lamp through an optical filter, the comparative light-emitting device 1, and the comparative light-emitting device 2 were performed. Before the measurements, each of the light-emitting devices, the comparative light-emitting device 1, and the comparative light-emitting device 2 was sealed using a glass substrate in a glove box containing a nitrogen atmosphere so as not to be exposed to the air (a sealing material was applied to surround the device and UV treatment and heat treatment at 80° C. for 1 hour were performed at the time of sealing). Note that luminance, CIE chromaticity, and the emission spectra were measured with a spectroradiometer (SR-UL1R manufactured by TOPCON TECHNOHOUSE CORPORATION).

Figure 25:
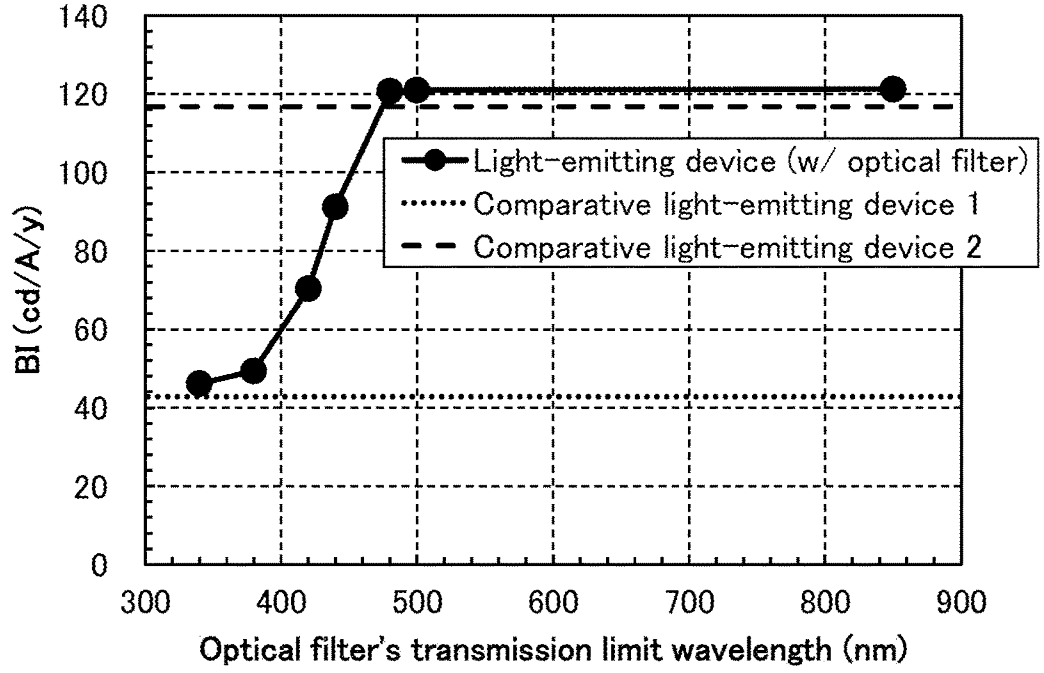
FIG. 25 shows the BI-optical filter's transmission limit wavelength relationships of samples in Example.

FIG. 25 shows the relationships between the transmission limit wavelength of the optical filter and the blue index (BI) when the current density of each of the light-emitting devices (the light-emitting devices 1A to 1G) is 50 [mA/$cm^2$]. Note that the BI values of the comparative light-emitting device 1 and the comparative light-emitting device 2 are shown by dashed lines as reference values.

Note that the blue index (BI) is a value obtained by dividing current efficiency (cd/A) by chromaticity y, and is one of the indicators of characteristics of blue light emission. As the chromaticity y is smaller, the color purity of blue light emission tends to be higher. With high color purity of blue light emission, a desired color can be expressed even with a small number of luminance components and the luminance needed for expressing blue is reduced; hence, power consumption can be reduced. Thus, BI that is based on chromaticity y, which is one of the indicators of color purity of blue, is used as a means for showing efficiency of blue light emission in some cases. A light-emitting device with higher BI can be regarded as a blue-light-emitting device having higher efficiency for a display.

Figure 26:
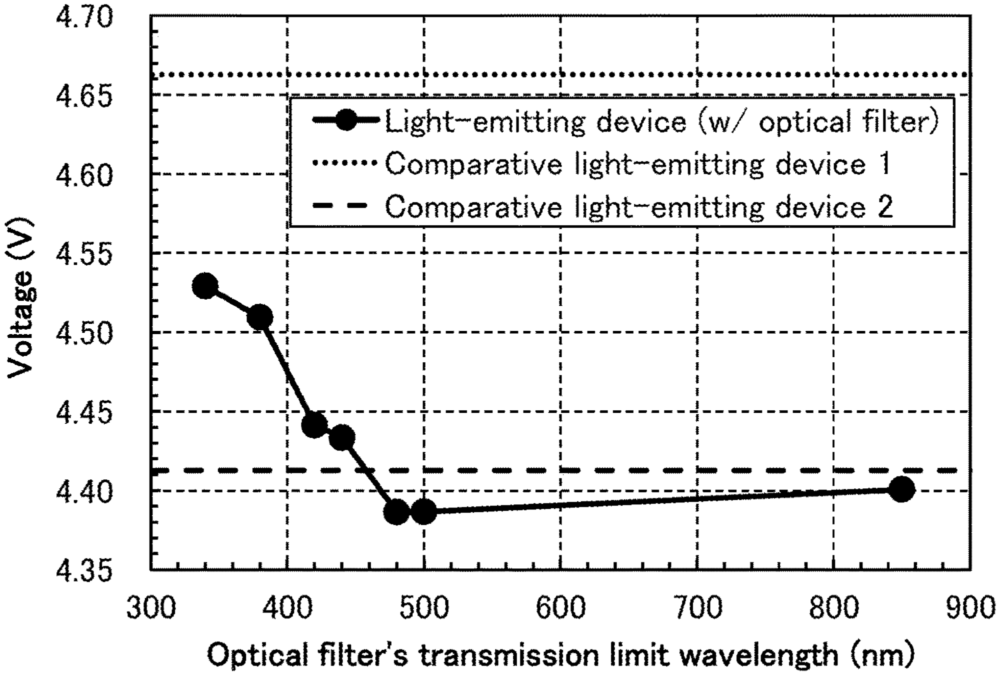
FIG. 26 shows the voltage-optical filter's transmission limit wavelength relationships of samples in Example.

FIG. 26 shows the relationships between the transmission limit wavelength of the optical filter and the voltage when the current density is 50 [mA/$cm^2$] in initial characteristics. Note that the voltages of the comparative light-emitting device 1 and the comparative light-emitting device 2 are shown by dashed lines as reference values.

The results in FIGS. 25 and 26 indicate that the devices irradiated with light having a wavelength shorter than 480 nm in the air have deteriorated initial characteristics. The results also indicate that, even though being exposed to the air, the devices irradiated with light having a wavelength longer than or equal to 480 nm can have characteristics equivalent to those of the comparative light-emitting device 2 (fabricated in a continuous vacuum process) without deterioration of the initial characteristics.

<Reliability Test Results>

Figure 27:
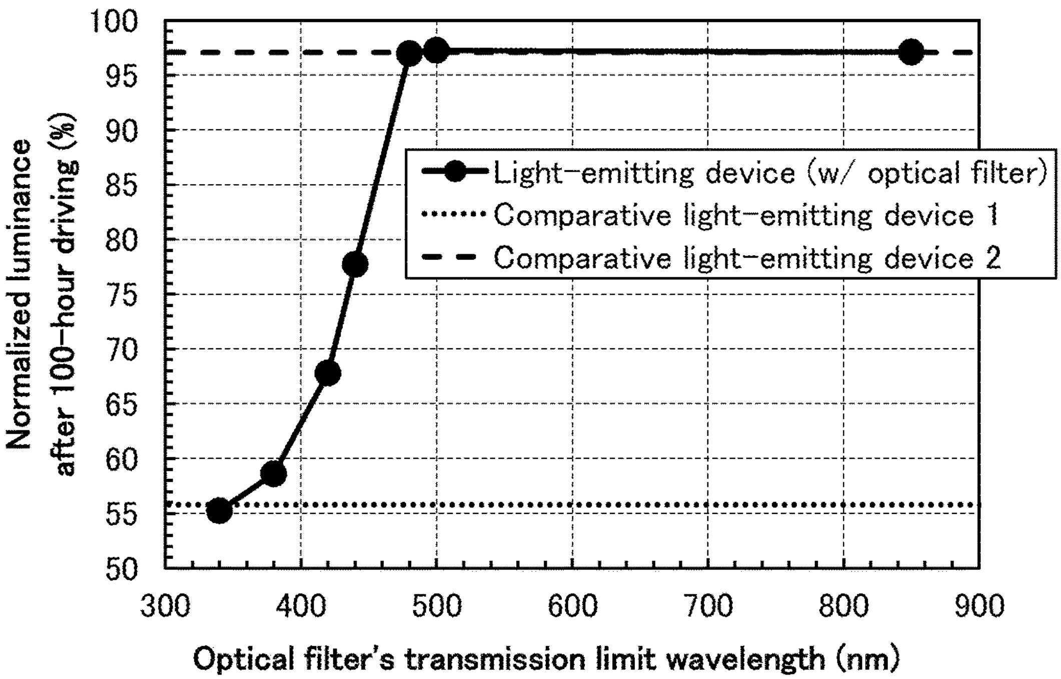
FIG. 27 shows the luminance-optical filter's transmission limit wavelength relationships of samples in Example.
Figure 28:
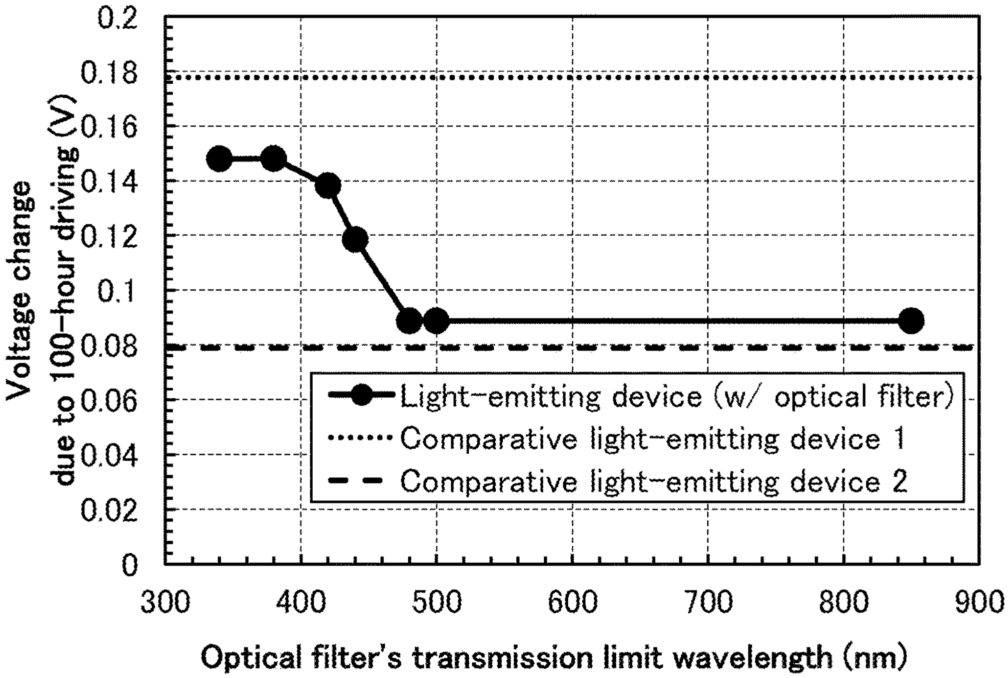
FIG. 28 shows the voltage change-optical filter's transmission limit wavelength relationships of samples in Example.

Reliability tests were performed on the light-emitting devices (the light-emitting devices 1A to 1G). In FIG. 27, the vertical axis represents the normalized luminance after 100-hour driving at a constant current density (50 [$mA/cm^2$]) when the luminance at the start of light emission is regarded as 100%, and the lateral axis represents the transmission limit wavelength of the optical filter. Note that the normalized luminance of the comparative light-emitting device 1 and the normalized luminance of the comparative light-emitting device 2 are shown by dashed lines as reference values. In FIG. 28, the vertical axis represents the voltage change (V) due to 100-hour driving at a constant current density (50 [$mA/cm^2$]), and the lateral axis represents the transmission limit wavelength of the optical filter. Note that the voltage change of the comparative light-emitting device 1 and the voltage change of the comparative light-emitting device 2 are shown by dashed lines as reference values.

The results in FIGS. 27 and 28 indicate that the devices irradiated with light having a wavelength shorter than 480 nm in the air have decreased reliability. The results also indicate that, even though being exposed to the air, the devices irradiated with light having a wavelength longer than or equal to 480 nm can have characteristics equivalent to those of the comparative light-emitting device 2 (fabricated in a continuous vacuum process) without a decrease in reliability.

It can be estimated from FIGS. 25 to 28 that the light-emitting device deteriorates when supplied with light energy higher than or equal to a certain level in an air atmosphere containing oxygen. This reveals that the deterioration of the light-emitting device can be inhibited when light irradiation is performed in an air atmosphere containing oxygen as long as the energy of the irradiated light is adjusted or when light irradiation is performed in an inert atmosphere containing no oxygen.

Figure 29:
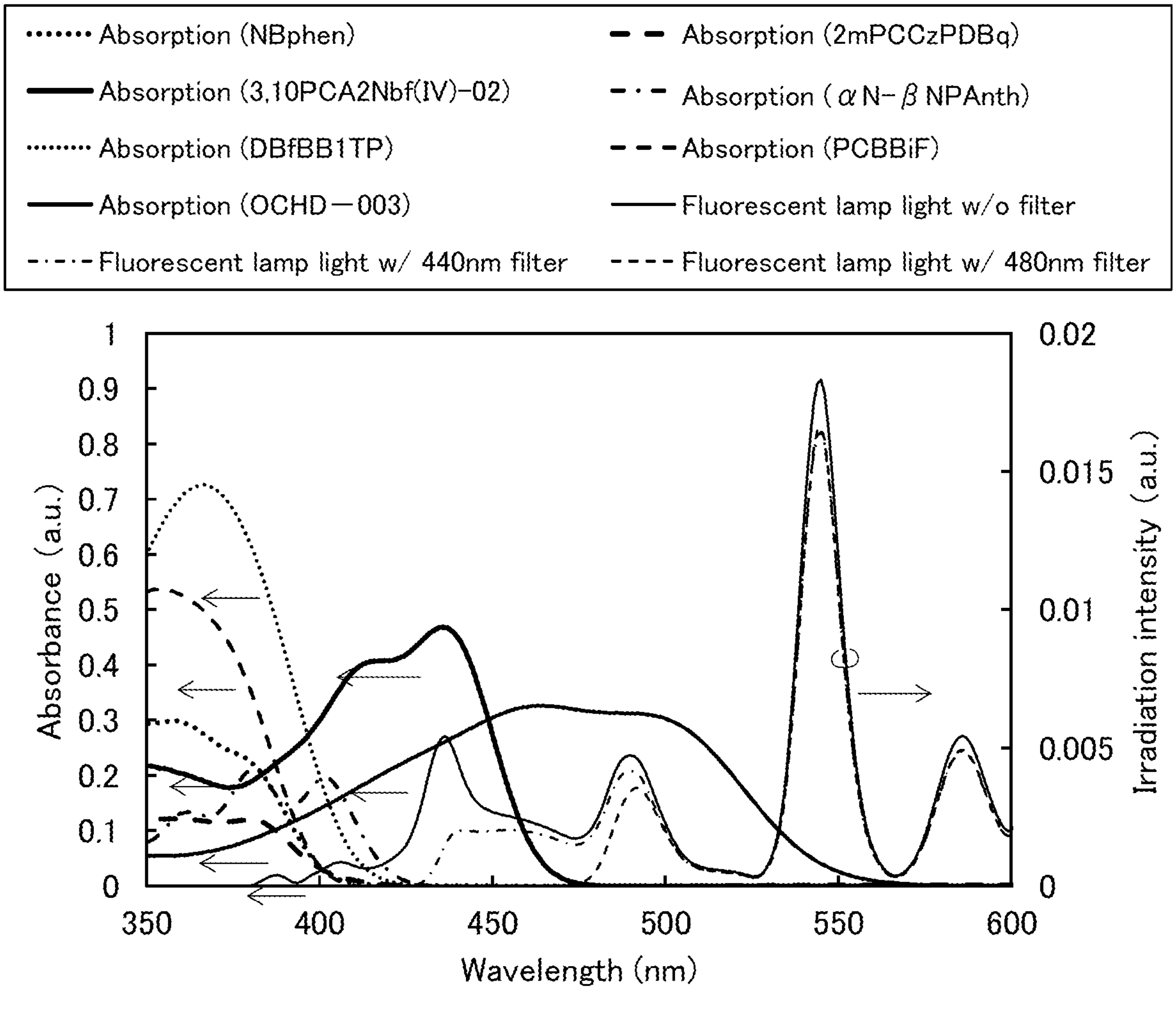
FIG. 29 shows the absorption spectra of samples in Example and the spectra of irradiated light.

FIG. 29 shows the absorption spectra of the organic compounds used for each of the light-emitting devices and the spectra of representative irradiated light (each of which is light of a fluorescent lamp through an optical filter). Note that the absorption spectra of the organic compounds were obtained as follows: a thin film of each organic compound was formed to a thickness of 50 nm over a quartz substrate and measurement was performed.

FIG. 29 indicates that a compound having the longest-wavelength absorption edge among the organic compounds contained in the light-emitting layer is 3,10PCA2Nbf(IV)-02. The absorption edge of the compound is at 462 nm. The absorption edge is determined as the intersection of a tangent and the lateral axis (representing wavelength) or the baseline. The tangent is drawn at the half maximum of the longest-wavelength peak of the absorption spectrum on a longer wavelength side.

The light of a fluorescent lamp through the optical filter whose transmission limit wavelength is 480 nm has the shortest-wavelength peak or the shortest-wavelength shoulder peak at 492 nm. The light of a fluorescent lamp through the optical filter whose transmission limit wavelength is 440 nm has the shortest-wavelength peak or the shortest-wavelength shoulder peak at 441 nm. The light of a fluorescent lamp which does not passes through an optical filter has the shortest-wavelength peak or the shortest-wavelength shoulder peak at 388 nm.

The results indicate that the light-emitting device deteriorates when the spectrum of lighting has a peak or a shoulder peak at a wavelength shorter than the wavelength of the ab sorption edge of 3,10PCA2Nbf(IV)-02.

Note that 3,10PCA2Nbf(IV)-02 has the longest-wavelength absorption edge of the absorption spectrum among the organic compounds contained in the light-emitting layer. The characteristics of the light-emitting device do not deteriorate even when the light-emitting device is irradiated with light in an atmosphere containing oxygen in the case where the irradiated light of a fluorescent lamp through an optical filter has the shortest-wavelength peak or the shortest-wavelength shoulder peak at a wavelength longer than the absorption edge of 3,10PCA2Nbf(IV)-02.

According to the above, it is highly probable that 3,10PCA2Nbf(IV)-02 contributes to the deterioration of the light-emitting device in this example. Thus, it is found that a highly reliable light-emitting device can be fabricated even when the light-emitting device is exposed to an air atmosphere as long as irradiation of light with a wavelength that is absorbed by 3,10PCA2Nbf(IV)-02 is reduced in an environment where the light-emitting device is fabricated.

The HOMO levels of αN-βNPAnth and 3,10PCA2Nbf(IV)-02 were obtained by cyclic voltammetry (CV) measurement. An electrochemical analyzer (ALS model 600A or 600C, manufactured by BAS Inc.) was used for the measurement. According to the measurement results, the HOMO level of αN-βNPAnth was −5.85 eV and the HOMO level of 3,10PCA2Nbf(IV)-02 was −5.41 eV. Thus, it is found that, in the case of using an organic compound having a high HOMO level, such as 3,10PCA2Nbf(IV)-02, a highly reliable light-emitting device can be fabricated even when the light-emitting device is exposed to an air atmosphere as long as irradiation of light with a wavelength that is absorbed by the organic compound is reduced.

Example 2

In this example, the light-emitting apparatus of one embodiment of the present invention described in Embodiment 2 was fabricated by an MML process.

<Light-Emitting Apparatuses>

Figure 30A:
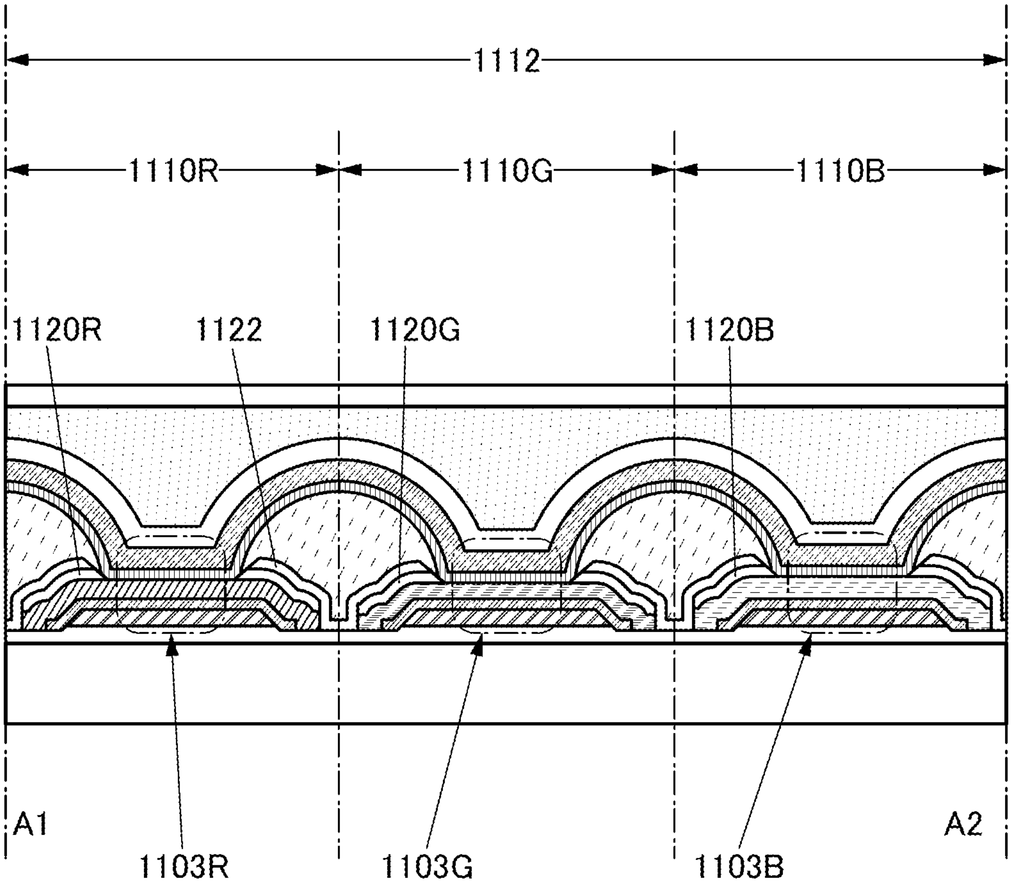
FIGS. 30A and 30B illustrate a structure of samples in Example.

A light-emitting apparatus A, a light-emitting apparatus B, and a light-emitting apparatus C each included a pixel 1112 formed over a substrate as illustrated in FIG. 30A. The pixel 1112 included a subpixel 1110R, a subpixel 1110G, and a subpixel 1110B. The subpixels 1110 (the subpixel 1110R, the subpixel 1110G, and the subpixel 1110B) included their respective light-emitting devices 1103 (a light-emitting device 1103R, a light-emitting device 1103G, and a light-emitting device 1103B).

In each of the light-emitting apparatuses, the sizes of the subpixel 1110R, the subpixel 1110G, and the subpixel 1110B were 3.0 μm×3.0 μm, 3.0 μm×3.0 μm, and 2.8 μm×6.7 μm, respectively. Each of the light-emitting apparatuses included 3840×2880 of the pixels 1112 in a display region with a size of 30.41 mm×22.81 mm and had a pixel density of 3207 ppi.

Figure 30B:
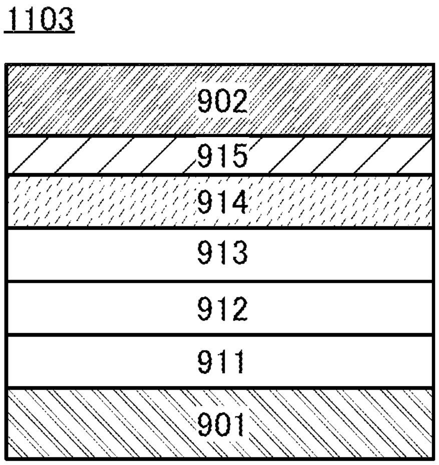

In each of the light-emitting devices, as illustrated in FIG. 30B, the hole-injection layer 911, the hole-transport layer 912, the light-emitting layer 913, the electron-transport layer 914, and the electron-injection layer 915 were stacked in this order over the first electrode 901, and the second electrode 902 was stacked over the electron-injection layer 915.

Between adjacent light-emitting devices, an insulating layer 1120 (an insulating layer 1120R, an insulating layer 1120G, or an insulating layer 1120B) was provided. In a region between adjacent light-emitting devices, a structure body including an insulating layer 1122 was provided.

<Method for Fabricating Light-Emitting Apparatuses>

The light-emitting apparatuses A to C were exposed to the air in the fabrication process. The light-emitting apparatus A was irradiated with light of a fluorescent lamp during exposure to the air. The light-emitting apparatus B was irradiated with light of a fluorescent lamp in some steps and with orange light in other steps during exposure to the air. The light-emitting apparatus C was irradiated with only orange light during exposure to the air, and a transfer carrier having a light shielding property was used. Table 3 below shows differences in the process among the light-emitting apparatus A, the light-emitting apparatus B, and the light-emitting apparatus C.

TABLE 3

| | Conditions for exposure to the air | | |
|---|---|---|---|
| | Fluorescent lamp light irradiation | Orange light irradiation | Transfer carrier |
| Light-emitting apparatus A | Performed | Not performed | Dose not shield light |
| Light-emitting apparatus B | Partly performed | Partly performed | Dose not shield light |
| Light-emitting apparatus C | Not performed | Performed | Shields light |

First, a conductor was formed in the following manner: titanium (Ti) was deposited by a sputtering method to a thickness of 50 nm on a silicon substrate, aluminum (Al) was then deposited by a sputtering method to a thickness of 70 nm, and titanium (Ti) was then deposited by a sputtering method to a thickness of 6 nm. After that, baking was performed in the air at 300° C. for one hour so that Ti was oxidized. Then, indium oxide-tin oxide containing silicon or silicon oxide (abbreviation: ITSO) was deposited by sputtering method to a thickness of 10 nm, whereby the first electrode 901 was formed.

Next, a first hole-injection layer 911, a first hole-transport layer 912, a first light-emitting layer 913, and a first electron-transport layer 914 were formed by an evaporation method. Note that the first light-emitting layer 913 contained N,N'-diphenyl-N,N'-bis(9-phenyl-9H-carbazol-2-yl)naphtho[2,3-b;6,7-b']bisbenzofuran-3,10-diamine (abbreviation: 3,10PCA2Nbf(IV)-02), which was a fluorescent material that emits blue light.

Subsequently, the substrate was exposed to an atmosphere containing oxygen. At this time, irradiation of light was performed as shown in Table 3. After that, an aluminum oxide (abbreviation: $AlO_x$) film with a thickness of 30 nm and a tungsten (abbreviation: W) film with a thickness of 54 nm were formed in this order as a sacrificial layer by an ALD method and a sputtering method, respectively. Then, a positive-type photoresist was applied to a thickness of 700 nm, and exposure to light and development were performed, whereby a photomask was formed. Next, part of the tungsten film was removed by a dry etching method using the formed photomask as a mask, and then the photomask was removed. Subsequently, part of the aluminum oxide film was removed by a dry etching method using the tungsten film as a mask. Then, the first hole-injection layer 911, the first hole-transport layer 912, the first light-emitting layer 913, and the first electron-transport layer 914 were subjected to patterning by a dry etching method using the tungsten film and the aluminum oxide film as a mask to have island shapes in a region of the subpixel 1110B.

Next, a second hole-injection layer 911, a second hole-transport layer 912, a second light-emitting layer 913, and a second electron-transport layer 914 were formed by an evaporation method. Note that the second light-emitting layer 913 contained a phosphorescent material that emits green light.

Subsequently, the substrate was exposed to an atmosphere containing oxygen. At this time, irradiation of light was performed as shown in Table 3. After that, an aluminum oxide (abbreviation: $AlO_x$) film with a thickness of 30 nm and a tungsten (abbreviation: W) film with a thickness of 54 nm were formed in this order as a sacrificial layer by an ALD method and a sputtering method, respectively. Then, a positive-type photoresist was applied to a thickness of 700 nm, and exposure to light and development were performed, whereby a photomask was formed. Next, part of the tungsten film was removed by a dry etching method using the formed photomask as a mask, and then the photomask was removed. Subsequently, part of the aluminum oxide film was removed by a dry etching method using the tungsten film as a mask. Then, the second hole-injection layer 911, the second hole-transport layer 912, the second light-emitting layer 913, and the second electron-transport layer 914 were subjected to patterning by a dry etching method using the tungsten film and the aluminum oxide film as a mask to have island shapes in a region of the subpixel 1110G.

Next, a third hole-injection layer 911, a third hole-transport layer 912, a third light-emitting layer 913, and a third electron-transport layer 914 were formed by an evaporation method. Note that the third light-emitting layer 913 contained a phosphorescent material that emits red light.

Subsequently, the substrate was exposed to an atmosphere containing oxygen. At this time, irradiation of light was performed as shown in Table 3. After that, an aluminum oxide (abbreviation: $AlO_x$) film with a thickness of 30 nm and a tungsten (abbreviation: W) film with a thickness of 54 nm were formed in this order as a sacrificial layer by an ALD method and a sputtering method, respectively. Then, a positive-type photoresist was applied to a thickness of 700 nm, and exposure to light and development were performed, whereby a photomask was formed. Next, part of the tungsten film was removed by a dry etching method using the formed photomask as a mask, and then the photomask was removed. Subsequently, part of the aluminum oxide film was removed by a dry etching method using the tungsten film as a mask. Then, the third hole-injection layer 911, the third hole-transport layer 912, the third light-emitting layer 913, and the third electron-transport layer 914 were subjected to patterning by a dry etching method using the tungsten film and the aluminum oxide film as a mask to have island shapes in a region of the subpixel 1110R.

Next, the substrate was exposed to an atmosphere containing oxygen and then the tungsten film was removed by a dry etching method. After that, another aluminum oxide film was formed by an ALD method to a thickness of 15 nm so as to cover top and side surfaces of the exposed aluminum oxide film and the entire pixel 1112.

Subsequently, a photosensitive organic resin was applied to a thickness of 400 nm, and exposure to light and development were performed, whereby an insulating layer having openings overlapping with regions where the light-emitting devices (the subpixel 1110R, the subpixel 1110G, and the subpixel 1110B) were to be fabricated was formed. Then, $O_2$ ashing was performed, followed by baking at 100° C. for 10 minutes. After that, parts of the aluminum oxide films (the total thickness was 45 nm) in the regions where the light-emitting devices (the subpixel 1110R, the subpixel 1110G, and the subpixel 1110B) were to be fabricated, which were exposed in the openings, were removed. The parts of the aluminum oxide films were removed by wet etching using an acidic chemical solution.

Next, the substrate was exposed to an atmosphere containing oxygen. At this time, irradiation of light was performed as shown in Table 3. Then, vacuum baking was performed at 70° C. for 90 minutes under a reduced pressure of approximately $10^{-4}$ Pa. After that, the electron-injection layer 915 was formed by an evaporation method over the first to third electron-transport layers 914 exposed in the regions where the light-emitting devices were to be fabricated. Subsequently, the second electrode 902 was formed over the electron-injection layer 915 by a resistance-heating method and a sputtering method, whereby the light-emitting apparatus was fabricated.

In the above manner, the light-emitting apparatus A, the light-emitting apparatus B, and the light-emitting apparatus C were fabricated.

<Characteristics of Blue-Light-Emitting Device in Light-Emitting Apparatus>

The emission characteristics of the subpixel 1110B which was exposed to the air at least four times and included in the light-emitting apparatus C were measured. Before the measurement, the light-emitting apparatus C was sealed using a glass substrate in a glove box such that the light-emitting devices were not exposed to the air (a sealing material was applied to surround the devices and UV treatment and heat treatment at 80° C. for 1 hour were performed at the time of sealing).

Figure 31:
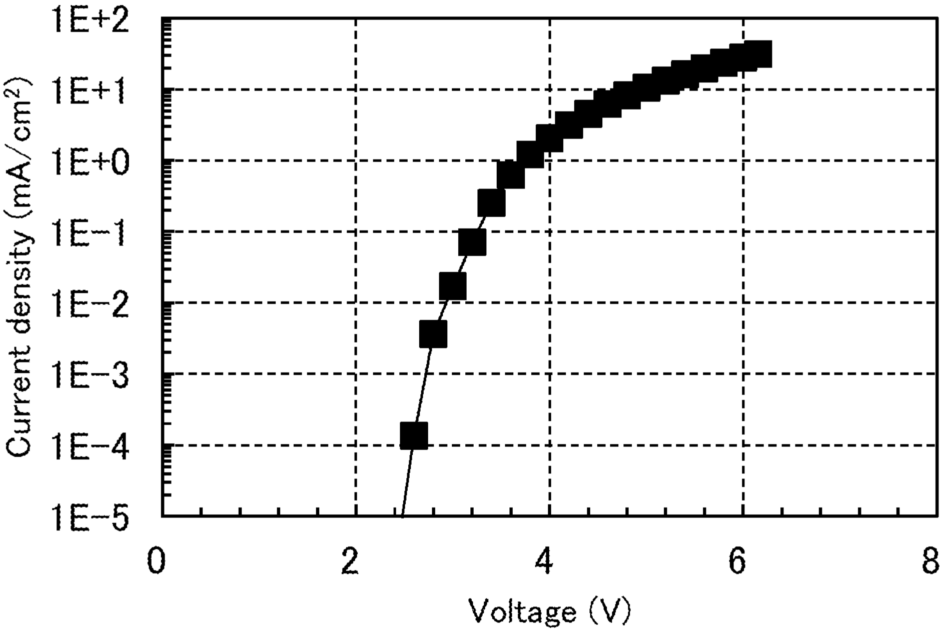
FIG. 31 shows the current density-voltage characteristics of a sample in Example.
Figure 32:
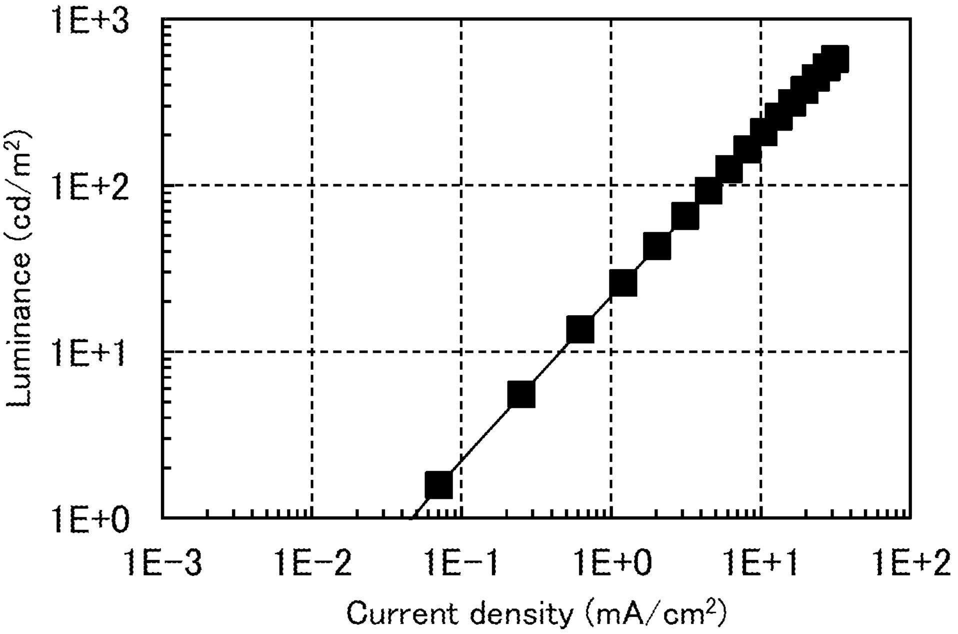
FIG. 32 shows the luminance-current density characteristics of a sample in Example.
Figure 33:
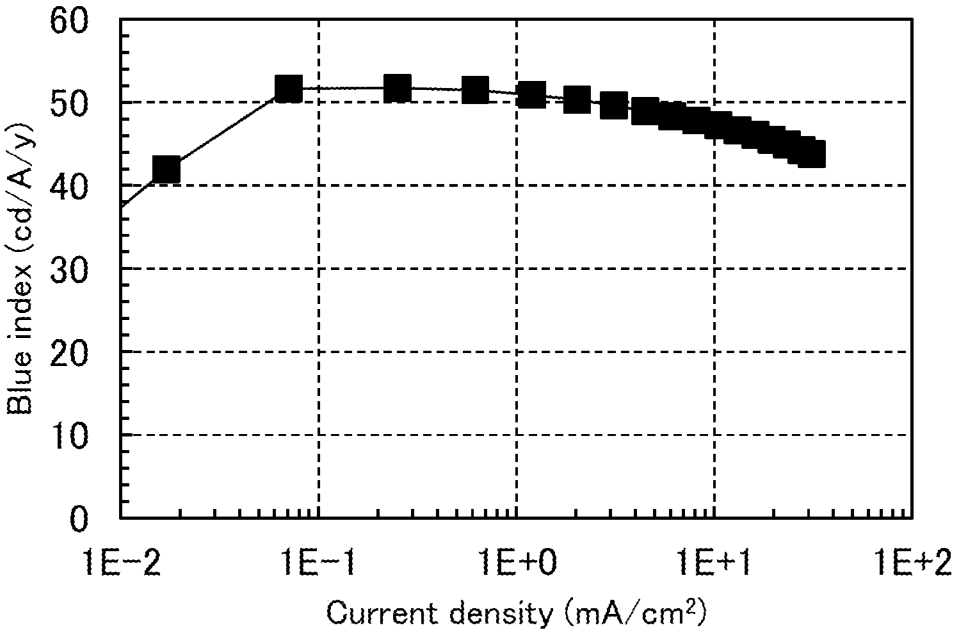
FIG. 33 shows the BI-current density characteristics of a sample in Example.
Figure 34:
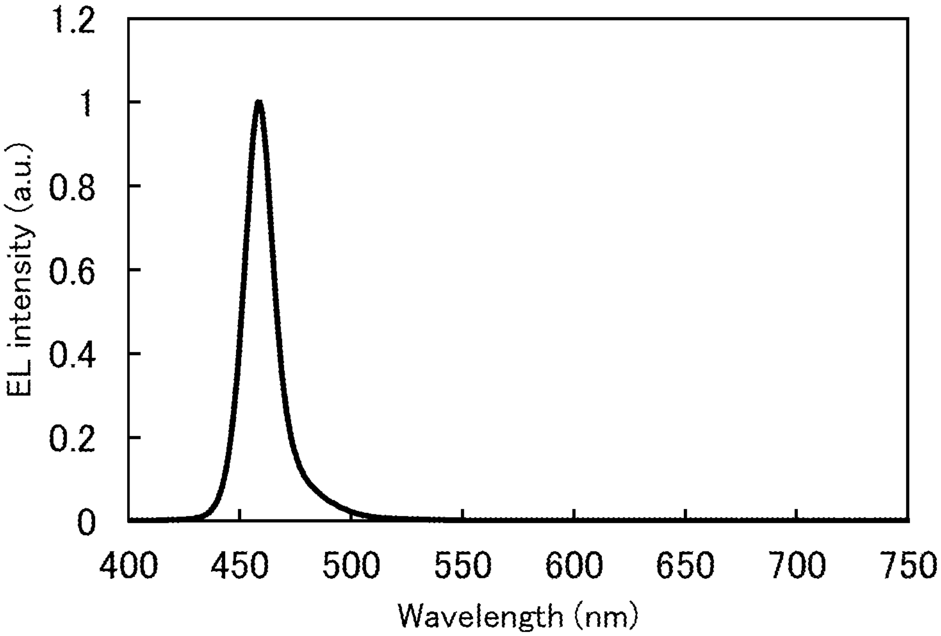
FIG. 34 shows the EL intensity spectrum of a sample in Example.
Figure 35:
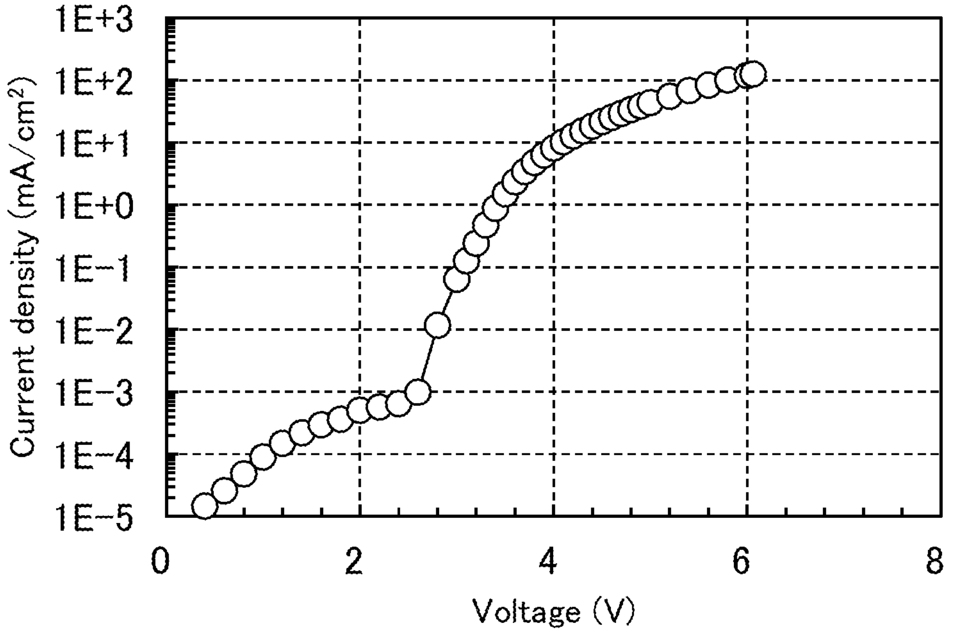
FIG. 35 shows the current density-voltage characteristics of a comparative example in Example.
Figure 36:
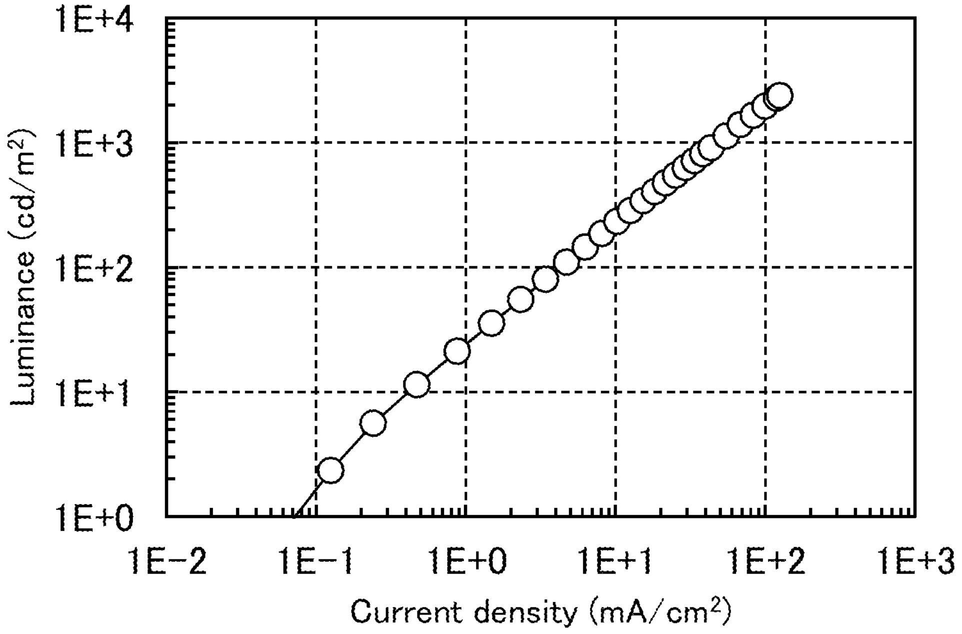
FIG. 36 shows the luminance-current density characteristics of a comparative example in Example.
Figure 37:
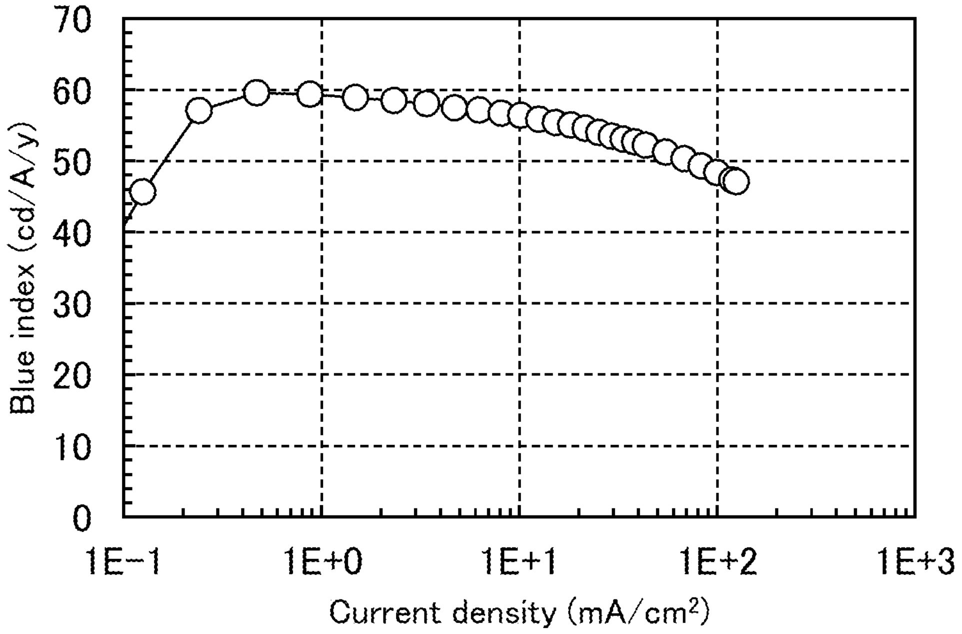
FIG. 37 shows the BI-current density characteristics of a comparative example in Example.
Figure 38:
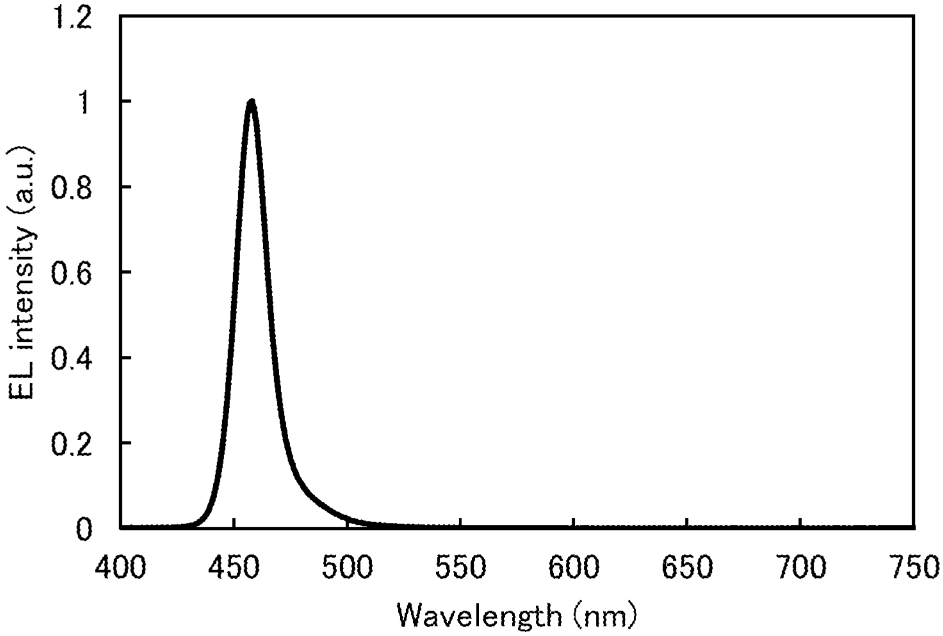
FIG. 38 shows the EL intensity spectrum of a comparative example in Example.

FIG. 31 shows the current density-voltage characteristic of the subpixel 1110B in the light-emitting apparatus C, FIG. 32 shows the luminance-current density characteristics of the subpixel 1110B, FIG. 33 shows the BI-current density characteristics of the subpixel 1110B, and FIG. 34 shows the emission spectrum of the subpixel 1110B. For reference, FIG. 35 shows the current density-voltage characteristics of a subpixel in a comparative light-emitting apparatus fabricated in a continuous vacuum process, FIG. 36 shows the luminance-current density characteristics of the subpixel, FIG. 37 shows the BI-current density characteristics of the subpixel, and FIG. 38 shows the emission spectrum of the subpixel. Note that luminance, CIE chromaticity, and the emission spectra were measured with a spectroradiometer (SR-UL1R manufactured by TOPCON TECHNOHOUSE CORPORATION).

The comparative light-emitting apparatus was fabricated as follows. First, the first hole-injection layer 911, the first hole-transport layer 912, the first light-emitting layer 913, and the first electron-transport layer 914 were formed over the first electrode 901 using the same materials as those in the light-emitting apparatuses A to C. Subsequently, the electron-injection layer 915 and the second electrode 902 were formed over the first electron-transport layer 914 without exposure to the air. The size of the subpixel 1110B in the comparative light-emitting apparatus was 2 mm×2 mm.

The results in FIGS. 31 to 38 indicate that the subpixel 1110B in the light-emitting apparatus C has characteristics equivalent to or better than those of the comparative light-emitting apparatus fabricated in a continuous vacuum process.

<Reliability of Blue-Light-Emitting Device in Light-Emitting Apparatus>

Reliability tests were performed on the light-emitting apparatuses A to C each including the subpixels 1110B which were exposed to the air at least four times.

Figure 39:
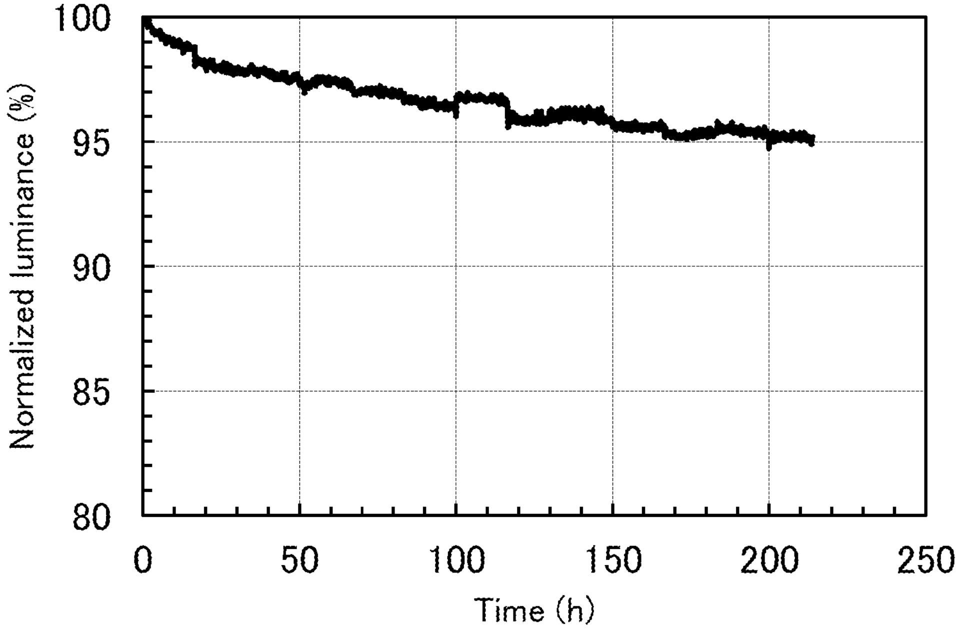
FIG. 39 shows the normalized luminance-time relationship of a sample in Example.
Figure 40:
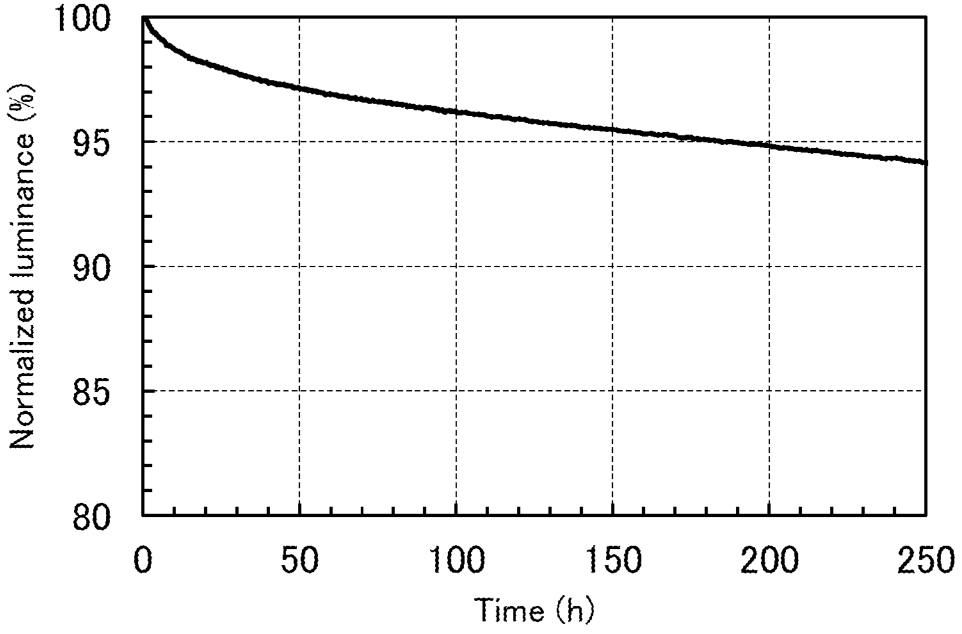
FIG. 40 shows the normalized luminance-time relationship of a comparative example in Example.

FIG. 39 shows a time-dependent change in normalized luminance at the time of constant current density driving (50 [mA/$cm^2$]) of the light-emitting apparatus C. Note that the normalized luminance (%) was obtained by regarding the luminance at the start of light emission as 100%. For reference, FIG. 40 shows a time-dependent change in normalized luminance at the time of constant current density driving (50 [mA/$cm^2$]) of the comparative light-emitting apparatus fabricated in a continuous vacuum process.

The results show that the value of LT95 (h), which is a time taken until the measurement luminance reduces to 95% of the initial luminance, of the light-emitting apparatus C is 200 hours, which indicates that the light-emitting apparatus C has reliability equivalent to or higher than that of the comparative light-emitting apparatus fabricated in a continuous vacuum process.

Table 4 below shows the values of LT95 (h), which is a time taken until the measurement luminance reduces to 95% of the initial luminance, of the light-emitting apparatuses A to C and the comparative light-emitting apparatus.

TABLE 4

| | Light-emitting apparatus A | Light-emitting apparatus B | Light-emitting apparatus C | Comparative light-emitting apparatus |
|---|---|---|---|---|
| LT95 [h] | 34.2 | 116.7 | 200.0 | 185.0 |

Figure 41:
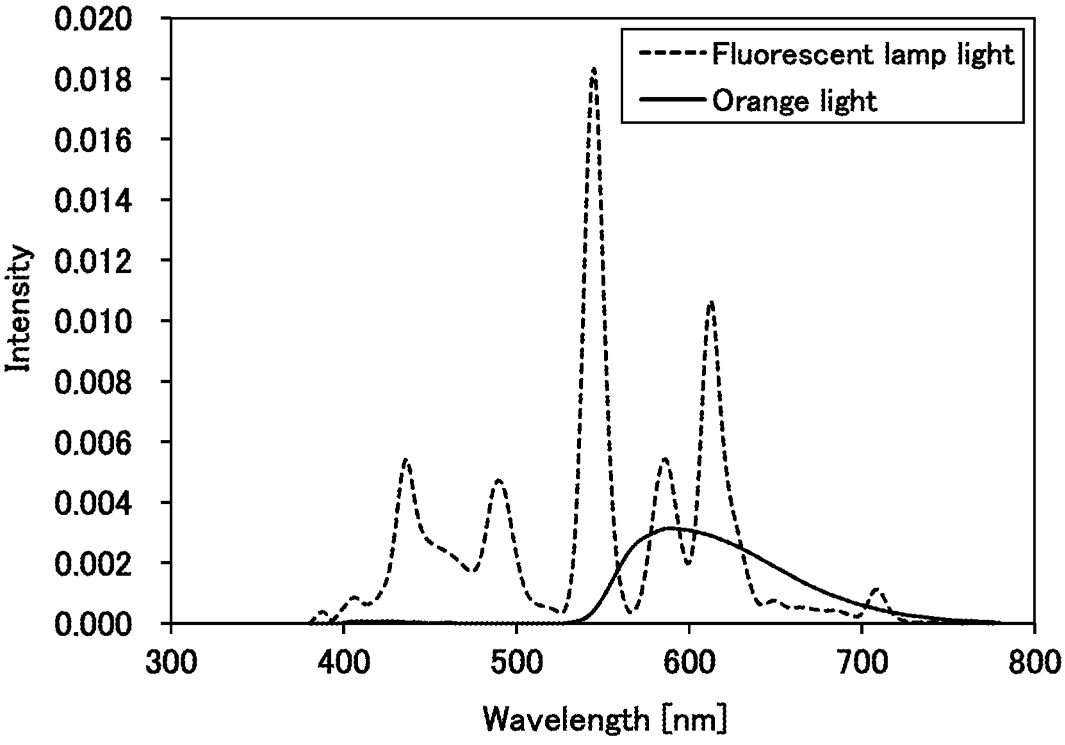
FIG. 41 shows the emission spectra of lightings used in a fabrication process in Example.

FIG. 41 shows the spectra of light of a fluorescent lamp and orange light. The shortest-wavelength peak of the light of a fluorescent lamp is positioned at 388 nm. The shortest-wavelength peak of the orange light is positioned at 588 nm. The orange light does not have a spectrum at a wavelength shorter than or equal to 530 nm. The illuminance of the light of a fluorescent lamp was 317 lux and the illuminance of the orange light was 111 lux. The absorption edge of 3,10PCA2Nbf(IV)-02, which was the organic compound contained in the first light-emitting layer 913, was positioned at 462 nm.

Thus, it is found that the characteristics of the light-emitting apparatus deteriorate when irradiation of the light of a fluorescent lamp having a peak at a wavelength shorter than the wavelength of the absorption edge of 3,10PCA2Nbf(IV)-02 is performed at the time of exposure to the air in fabricating the light-emitting apparatus. The characteristics of the light-emitting apparatus do not deteriorate even when irradiation of the orange light having a peak at a wavelength longer than the wavelength of the absorption edge of 3,10PCA2Nbf(IV)-02 is performed at the time of exposure to the air in fabricating the light-emitting apparatus.

The above results show that the characteristics of the light-emitting apparatus can be improved when the wavelength and the amount of the light used for irradiation at the time of exposure to the air are adjusted.

Thus, the use of the fabrication process of one embodiment of the present invention can be regarded as effective in improving the reliability of the light-emitting device.

The above shows that employing one embodiment of the present invention makes it possible to provide a favorable light-emitting apparatus.

Example 3

In this example, evaluation results of the characteristics of blue-light-emitting devices fabricated for describing the present invention described in the above embodiment will be described.

Structural formulae of organic compounds used for each of the light-emitting devices are shown below.

[Chemical Formula 4]
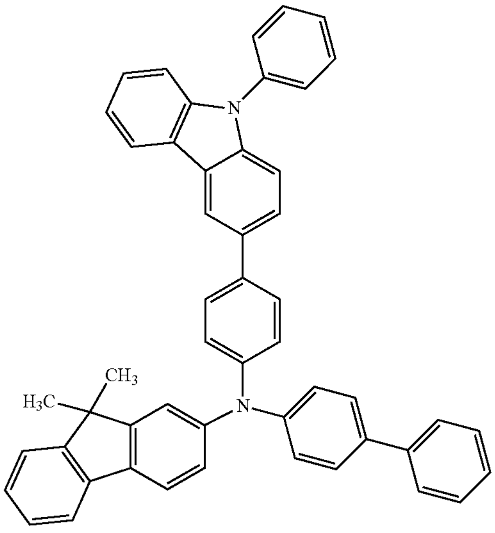
PCBBiF
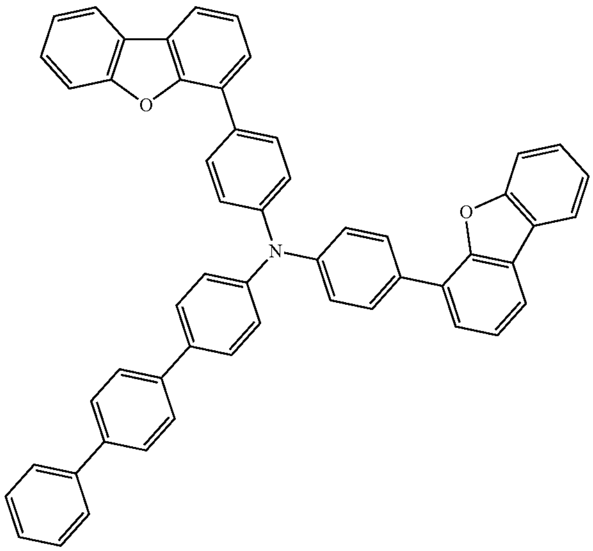
DBfBB1TP
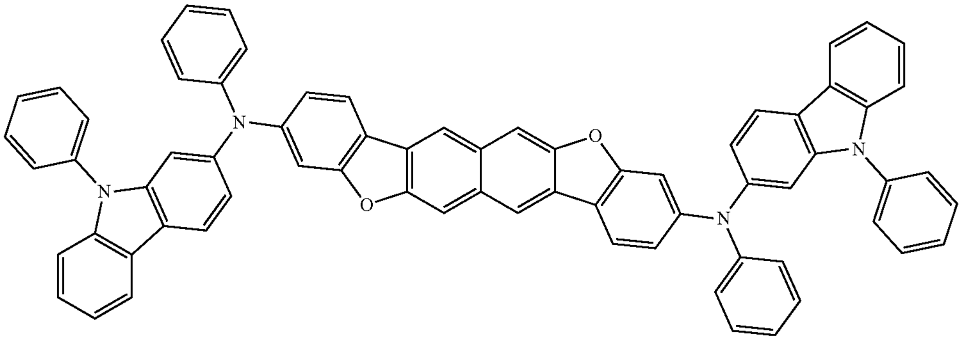
3,10PCA2Nbf(IV)-02
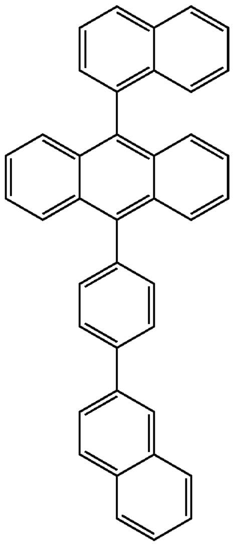
αN-β NPAnth
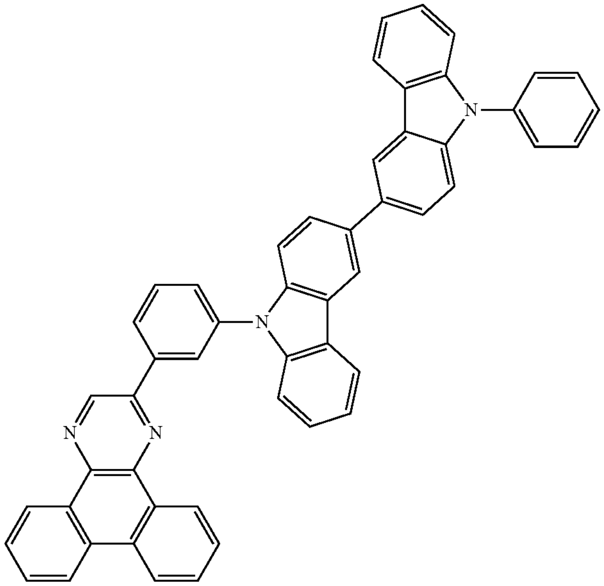
2mPCCzPDBq -continued

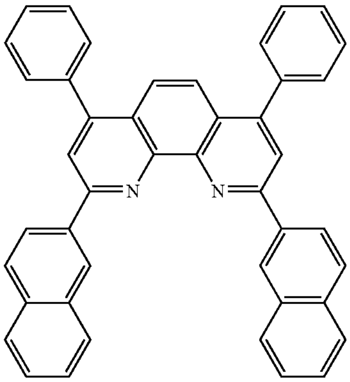

NBPhen

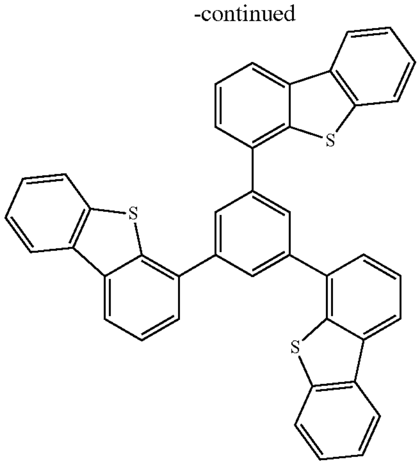

DBT3P-II

<Method for Fabricating Light-Emitting Devices>

In each of the light-emitting devices, as illustrated in FIG. 24, the hole-injection layer 911, the hole-transport layer 912, the light-emitting layer 913, the electron-transport layer 914, and the electron-injection layer 915 were stacked in this order on the first electrode 901 formed on the glass substrate 900, and the second electrode 902 was stacked on the electron-injection layer 915.

First, silver (Ag) was deposited on the glass substrate 900 by a sputtering method and then indium oxide-tin oxide containing silicon or silicon oxide (abbreviation: ITSO) was deposited thereon by a sputtering method, whereby the first electrode 901 was formed. Note that the thickness of Ag was 100 nm, the thickness of ITSO was 80 nm, and the electrode area was 4 $mm^2$ (2 mm×2 mm).

Next, in pretreatment for forming each light-emitting device on the substrate, the surface of the substrate was washed with water and baking was performed at 200° C. for one hour. Then, the substrate was transferred into a vacuum evaporation apparatus where the pressure was reduced to approximately $10^{-4}$ Pa, and vacuum baking was performed at 170° C. for 30 minutes in a heating chamber of the vacuum evaporation apparatus. After that, natural cooling was performed for approximately 30 minutes.

Then, the substrate provided with the first electrode 901 was fixed to a substrate holder provided in the vacuum evaporation apparatus such that the surface on which the first electrode 901 was formed faced downward. On the first electrode 901, N-(biphenyl-4-yl)-N-[4-(9-phenyl-9H-carbazol-3-yl)phenyl]-9,9-dimethyl-9H-fluoren-2-amine (abbreviation: PCBBiF) and an electron acceptor material containing fluorine and having a molecular weight of 672 (abbreviation: OCHD-003) were deposited by co-evaporation using a resistance-heating method to a thickness of 10 nm such that the weight ratio of PCBBiF to OCHD-003 was 1:0.04, whereby the hole-injection layer 911 was formed.

Subsequently, on the hole-injection layer 911, PCBBiF was deposited to a thickness of 25 nm by evaporation, and then N,N-bis[4-(dibenzofuran-4-yl)phenyl]-4-amino-p-terphenyl (abbreviation: DBfBB1TP) was deposited to a thickness of 10 nm by evaporation, whereby the hole-transport layer 912 was formed.

Next, the light-emitting layer 913 was formed on the hole-transport layer 912. The light-emitting layer 913 was formed by co-evaporation of 9-(1-naphthyl)-10-[4-(2-naphthyl)phenyl]anthracene (abbreviation: αN-(3NPAnth) and N,N'-diphenyl-N,N-bis(9-phenyl-9H-carbazol-2-yl)naphtho[2,3-b;6,7-b']bisbenzofuran-3,10-diamine (abbreviation: 3,10PCA2Nbf(IV)-02) to a thickness of 20 nm using a resistance-heating method such that the weight ratio of αN-βNPAnth to 3,10PCA2Nbf(IV)-02 was 1:0.015.

Next, on the light-emitting layer 913, 2-{3-[3-(N-phenyl-9H-carbazol-3-yl)-9H-carbazol-9-yl]phenyl}dibenzo[f,h]quinoxaline (abbreviation: 2mPCCzPDBq) was deposited by evaporation to a thickness of 20 nm, and then 2,9-di(naphthalen-2-yl)-4,7-diphenyl-1,10-phenanthroline (abbreviation: NBPhen) was deposited by evaporation to a thickness of 15 nm to form the electron-transport layer 914.

Here, each of the light-emitting devices was exposed to the air while being irradiated with light of a fluorescent lamp. The table below shows irradiation time of light of a fluorescent lamp. The light-emitting devices irradiated with light of a fluorescent lamp for different periods of time were referred to as light-emitting devices 3A to 3H.

TABLE 5

| | Irradiation time [sec] |
|---|---|
| Light-emitting device 3A | 0 |
| Light-emitting device 3B | 5 |
| Light-emitting device 3C | 10 |
| Light-emitting device 3D | 30 |
| Light-emitting device 3E | 60 |
| Light-emitting device 3F | 300 |
| Light-emitting device 3G | 1800 |
| Light-emitting device 3H | 3600 |

Next, the light-emitting devices (the light-emitting devices 3A to 3H) were subjected to vacuum baking at 80° C. for 60 minutes under a reduced pressure of approximately $10^{-4}$ Pa. After that, natural cooling was performed.

Then, on the electron-transport layer 914, lithium fluoride (LiF) and ytterbium (Yb) were deposited by co-evaporation to a thickness of 2 nm such that the volume ratio of LiF to Yb was 1:1 to form the electron-injection layer 915.

Subsequently, on the electron-injection layer 915, Ag and Mg were deposited by co-evaporation to a thickness of 20 nm such that the volume ratio of Ag to Mg was 1:0.1 to form the second electrode 902. Note that the second electrode 902 was a semi-transmissive and semi-reflective electrode having functions of transmitting light and reflecting light.

After that, 4,4',4"-(benzene-1,3,5-triyl)tri(dibenzothiophene) (abbreviation: DBT3P-II) was deposited by evaporation to a thickness of 70 nm as a cap layer.

The structures of the light-emitting devices (the light-emitting devices 3A to 3H) are listed in the table below.

TABLE 6

| | Film thickness [nm] | Material |
|---|---|---|
| Cap layer | 70 | DBT3P-II |
| Second electrode | 20 | Ag:Mg (1:0.1) |
| Electron-injection layer | 2 | LiF:Yb (1:1) |
| Electron-transport layer | 15 | NBPhen |
| | 20 | 2mPCCzPDBq |
| Light-emitting layer | 40 | αN-βNPAnth:3,10PCA2Nbf(IV)-02 (1:0.015) |
| Hole-transport layer | 70 | PCBBiF |
| Hole-injection layer | 10 | PCBBiF:OCHD-003 (1:0.04) |
| First electrode | 85 | ITSO |
| | 100 | Ag |

Through the above steps, the light-emitting devices 3A to 3H were fabricated.

<Characteristics of Light-Emitting Devices>

Measurements of the light-emitting devices (the light-emitting devices 3A to 3H) each irradiated with light of a fluorescent lamp were performed. Before the measurements, each of the light-emitting devices was sealed using a glass substrate in a glove box containing a nitrogen atmosphere so as not to be exposed to the air (a sealing material was applied to surround the device and UV treatment and heat treatment at 80° C. for 1 hour were performed at the time of sealing).

Figure 42:
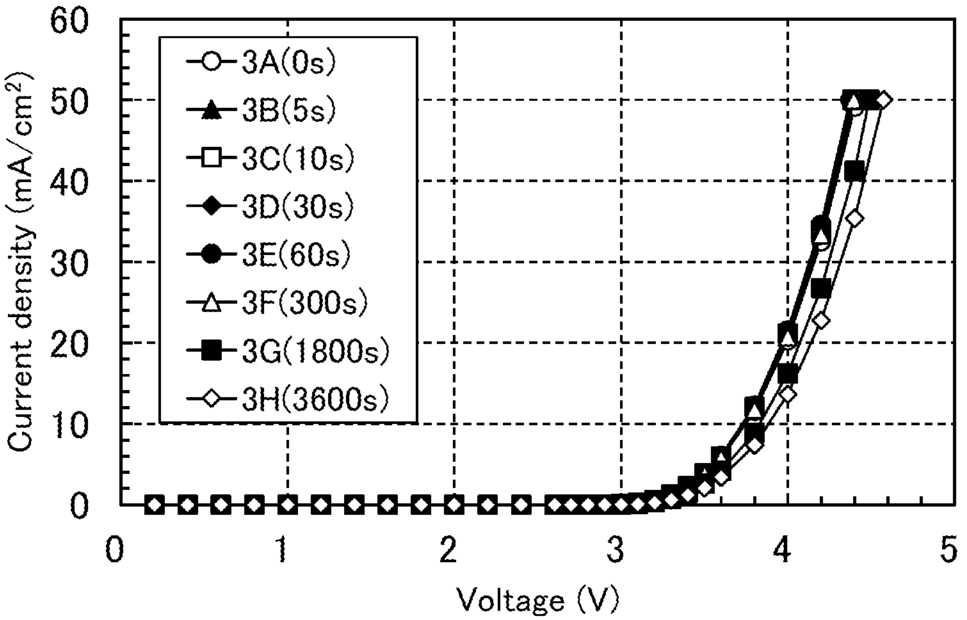
FIG. 42 shows the current density-voltage characteristics of samples in Example.
Figure 43:
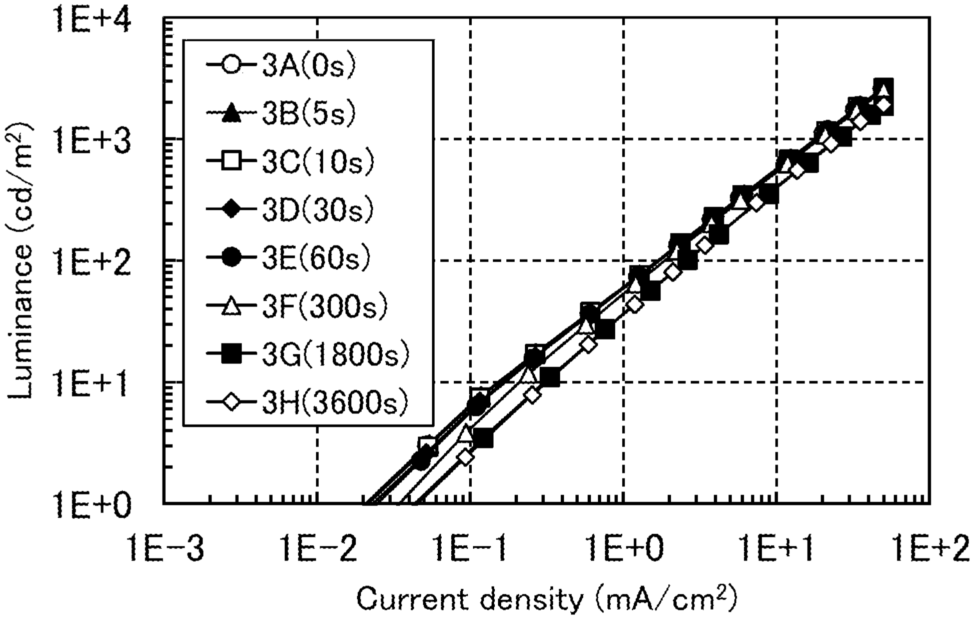
FIG. 43 shows the luminance-current density characteristics of samples in Example.
Figure 44:
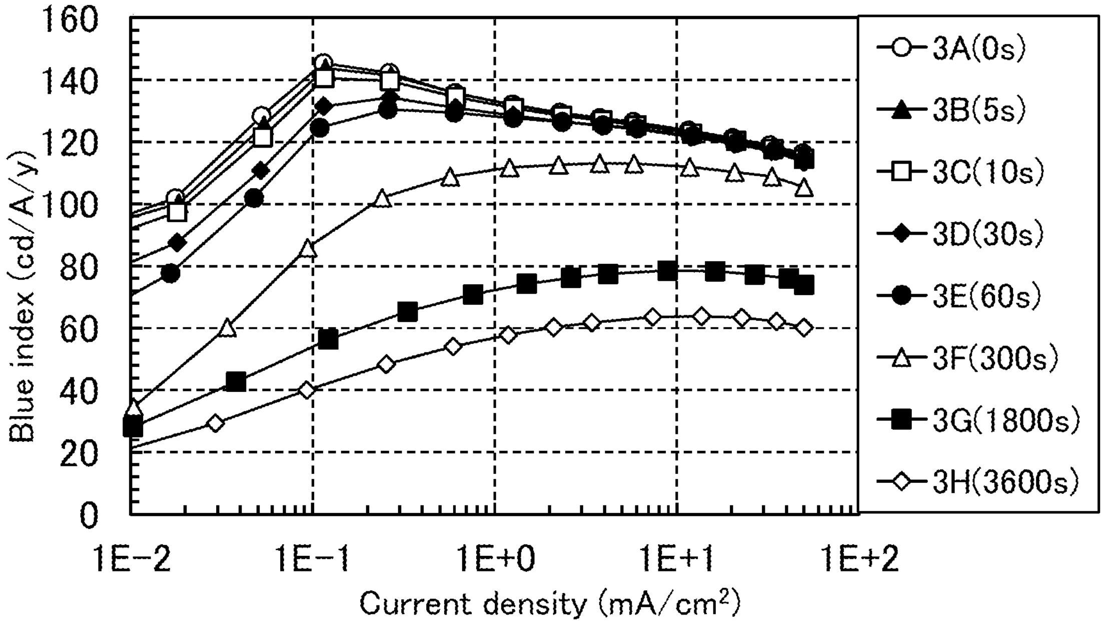
FIG. 44 shows the BI-current density characteristics of samples in Example.
Figure 45:
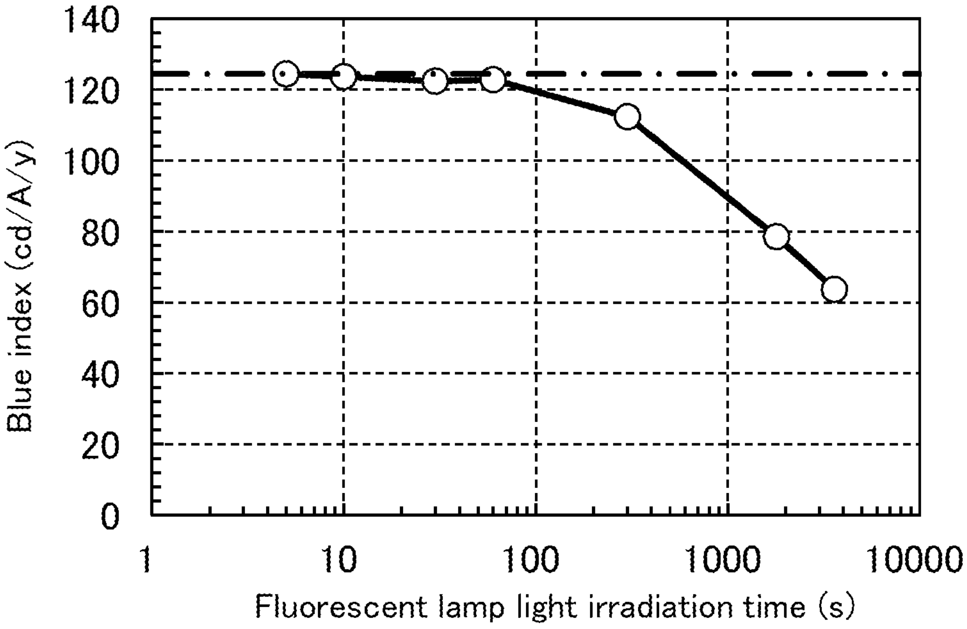
FIG. 45 shows the BI-fluorescent lamp light irradiation time relationship of samples in Example.
Figure 46:
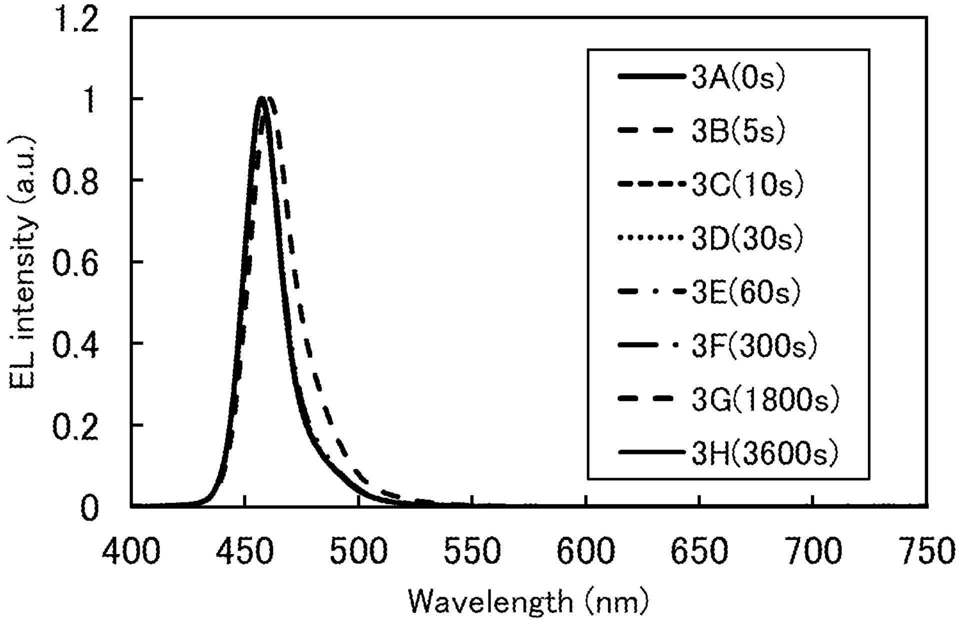
FIG. 46 shows the EL intensity spectra of samples in Example.

FIG. 42 shows the current density-voltage characteristics of the light-emitting devices, FIG. 43 shows the luminance-current density characteristics of the light-emitting devices, and FIG. 44 shows blue index (BI)-current density characteristics of the light-emitting devices. FIG. 45 shows the blue indices (BI) of the light-emitting devices 3B to 3H when the current density is 50 [mA/cm$^2$]. Note that the value of the light-emitting device 3A not irradiated with light of a fluorescent lamp is shown by a dashed-dotted line. FIG. 46 shows the emission spectra of the light-emitting devices.

The results in FIGS. 42 to 45 indicate that the longer the time for irradiation of light of a fluorescent lamp in the air is, the more the initial characteristics deteriorate. The results also indicate that the BI value significantly decreases particularly when the irradiation time is longer than or equal to 60 seconds.

<Reliability Test Results>

Figure 47:
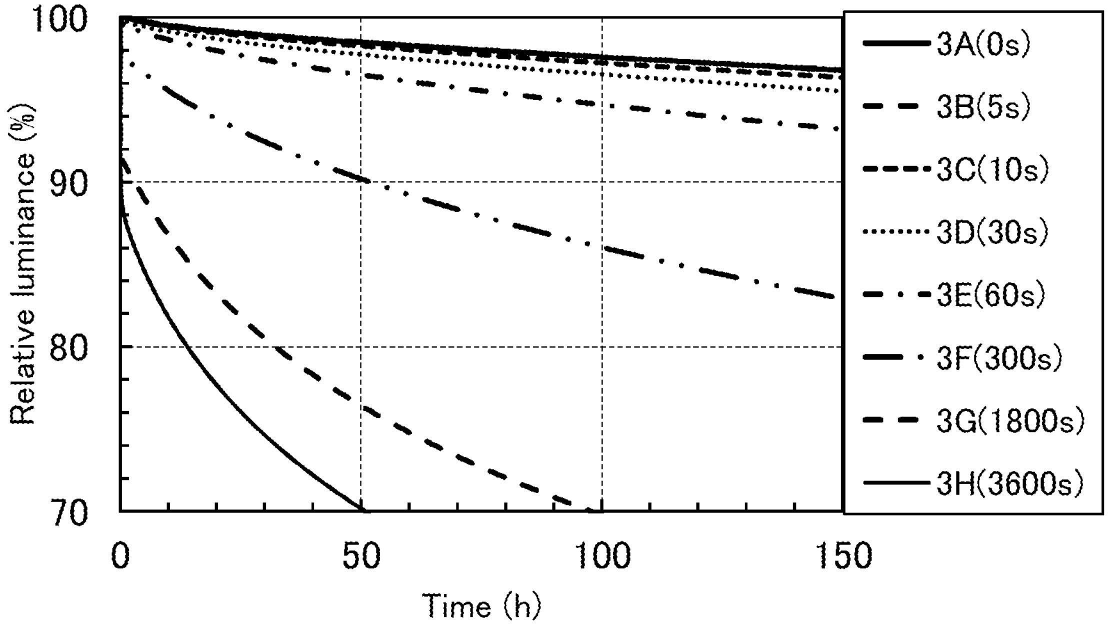
FIG. 47 shows the normalized luminance-time relationships of samples in Example.

Reliability tests were performed on the light-emitting devices. FIG. 47 shows time-dependent changes in normalized luminance at the time of constant current density driving (50 [mA/cm$^2$]) of the light-emitting devices. Note that the normalized luminance (%) was obtained by regarding the luminance at the start of light emission as 100%.

Figure 48:
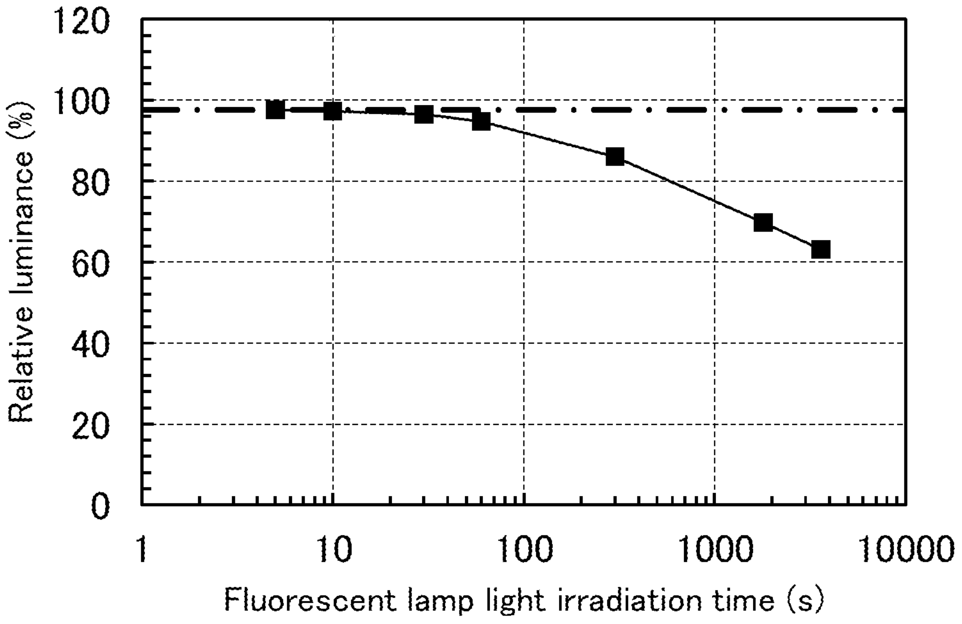
FIG. 48 shows the normalized luminance-fluorescent lamp light irradiation time relationships of samples in Example.

FIG. 48 shows the normalized luminance of each of the light-emitting devices 3B to 3H after 100-hour driving at a constant current density (50 [mA/cm$^2$]) when the luminance at the start of light emission is regarded as 100%. The lateral axis represents the time for irradiating light of a fluorescent lamp in fabricating the light-emitting devices. Note that the value of the light-emitting device 3A not irradiated with light of a fluorescent lamp is shown by a dashed-dotted line.

Figure 49:
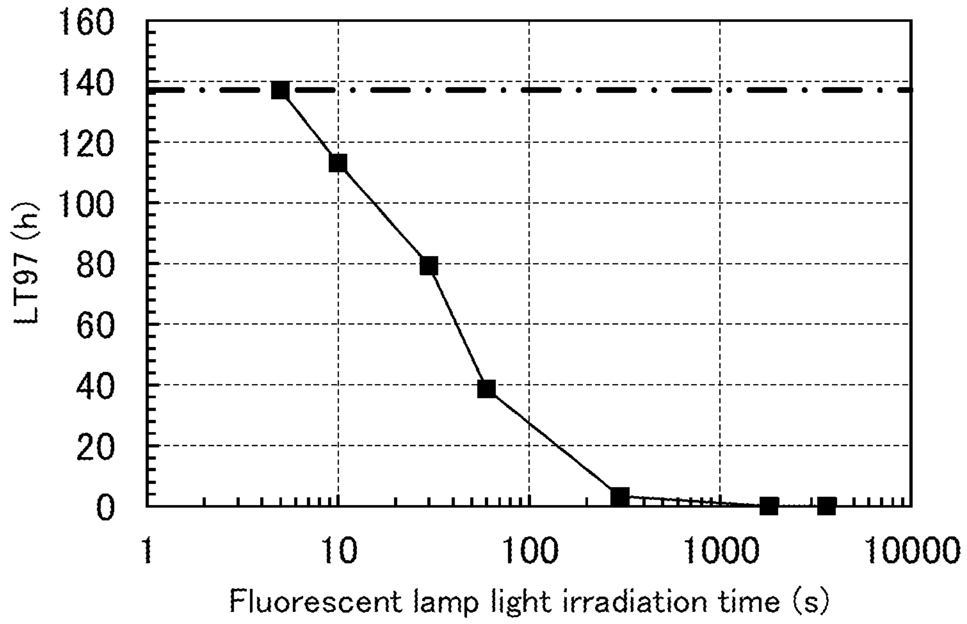
FIG. 49 shows the LT97-fluorescent lamp light irradiation time relationships of samples in Example.

FIG. 49 shows the values of LT97 (h), which is a time taken until the measurement luminance reduces to 97% of the initial luminance, of the light-emitting devices 3B to 3H. The lateral axis represents the time for irradiating light of a fluorescent lamp in fabricating the light-emitting devices. Note that the value of the light-emitting device 3A not irradiated with light of a fluorescent lamp is shown by a dashed-dotted line.

The results in FIGS. 47 to 49 indicate that the reliability decreases when irradiation of light of a fluorescent lamp is performed in the air. The results also indicate that the reliability significantly decreases particularly when irradiation of light of a fluorescent lamp is performed for longer than 10 seconds.

Example 4

In this example, a device 4A emitting green light, which is one embodiment of the present invention described in the above embodiment, a comparative device 4B, and a comparative device 4C were fabricated. Evaluation results of the characteristics of the devices will be described in this example.

Structural formulae of organic compounds used for each of the device 4A, the comparative device 4B, and the comparative device 4C are shown below.

[Chemical Formula 5]

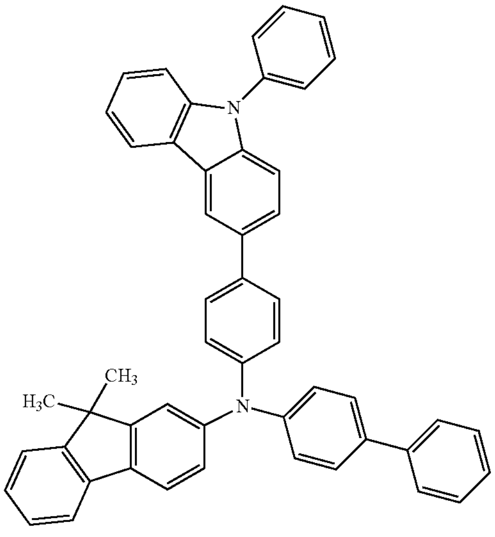

PCBBiF

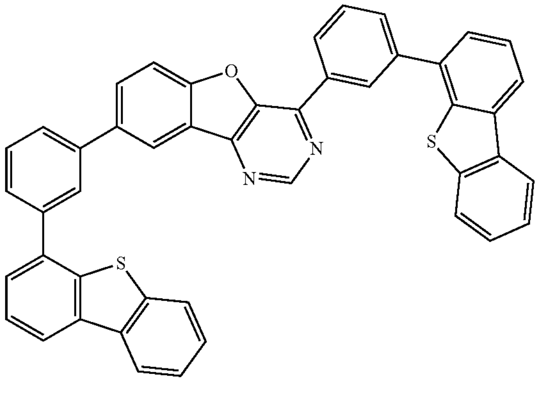

4,8mDBtP2Bfpm

-continued

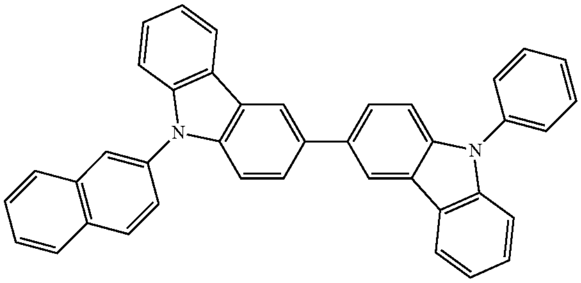

β NCCP

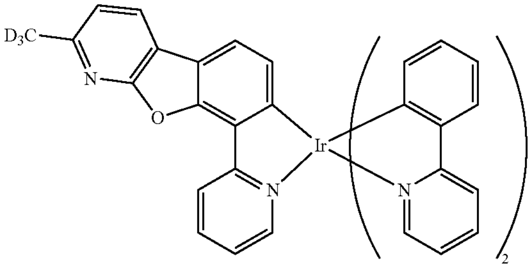

Ir(ppy)$_2$(mbfpypy-d3)

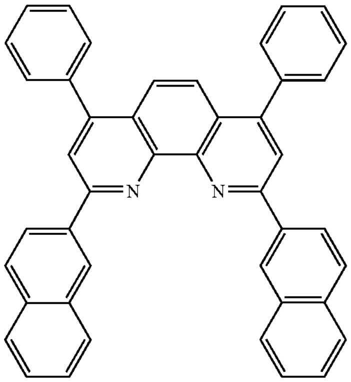

NBPhen

-continued

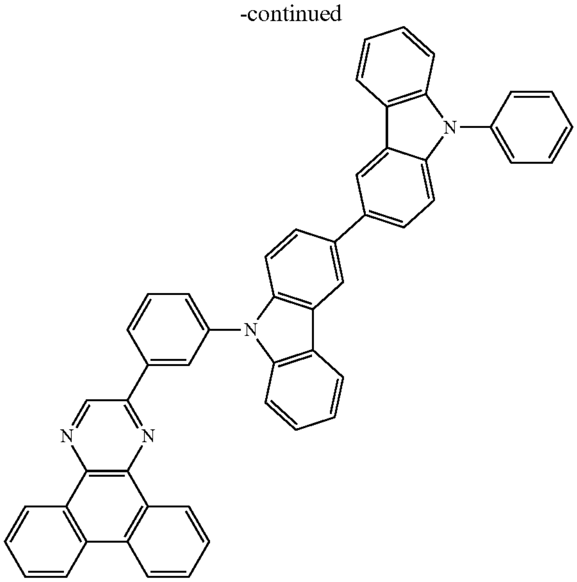

2mPCCzPDBq

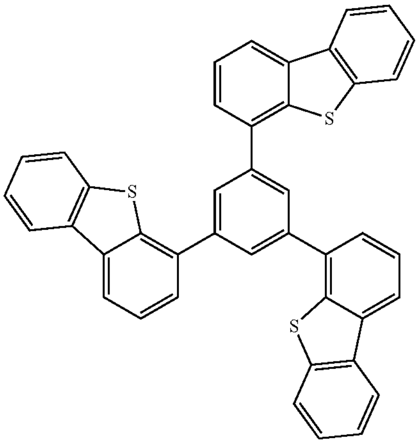

DBT3P-II

The structures of the device 4A, the comparative device 4B, and the comparative device 4C are shown in the table below.

TABLE 7

| | Film thickness [nm] | Material |
|---|---|---|
| Cap layer | 70 | DBT3P-II |
| Second electrode | 20 | Ag:Mg (1:0.1) |
| Electron-injection layer | 2 | LiF:Yb (1:1) |
| Electron-transport layer | 15 | NBPhen |
| | 20 | 2mPCCzPDBq |
| Light-emitting layer | 40 | 4,8mDBtP2Bfpm:βNCCP:Ir(ppy)$_2$(mbfpypy-d3) (0.6:0.4:0.1) |
| Hole-transport layer | 70 | PCBBiF |
| Hole-injection layer | 10 | PCBBiF:OCHD-003 (1:0.04) |
| First electrode | 85 | ITSO |
| | 100 | Ag |

<Method for Fabricating Devices>

In each of the device 4A, the comparative device 4B, and the comparative device 4C, as illustrated in FIG. 24, the hole-injection layer 911, the hole-transport layer 912, the light-emitting layer 913, the electron-transport layer 914, and the electron-injection layer 915 were stacked in this order on the first electrode 901 formed on the glass substrate 900, and the second electrode 902 was stacked on the electron-injection layer 915.

First, silver (Ag) was deposited on the glass substrate 900 by a sputtering method and then indium oxide-tin oxide containing silicon or silicon oxide (abbreviation: ITSO) was deposited thereon by a sputtering method, whereby the first electrode 901 was formed. Note that the thickness of Ag was 100 nm, the thickness of ITSO was 85 nm, and the electrode area was 4 $mm^2$ (2 mm×2 mm).

Next, in pretreatment for forming each of the device 4A, the comparative device 4B, and the comparative device 4C on the substrate, the surface of the substrate was washed with water and baking was performed at 200° C. for one hour. Then, the substrate was transferred into a vacuum evaporation apparatus where the pressure was reduced to approximately $10^{-4}$ Pa, and vacuum baking was performed at 170° C. for 30 minutes in a heating chamber of the vacuum evaporation apparatus. After that, natural cooling was performed for approximately 30 minutes.

Then, the substrate provided with the first electrode 901 was fixed to a substrate holder provided in the vacuum evaporation apparatus such that the surface on which the first electrode 901 was formed faced downward. On the first electrode 901, N-(biphenyl-4-yl)-N-[4-(9-phenyl-9H-carbazol-3-yl)phenyl]-9,9-dimethyl-9H-fluoren-2-amine (abbreviation: PCBBiF) and an electron acceptor material containing fluorine and having a molecular weight of 672 (abbreviation: OCHD-003) were deposited by co-evaporation using a resistance-heating method to a thickness of 10 nm such that the weight ratio of PCBBiF to OCHD-003 was 1:0.04, whereby the hole-injection layer 911 was formed.

Subsequently, on the hole-injection layer 911, PCBBiF was deposited to a thickness of 70 nm by evaporation, whereby the hole-transport layer 912 was formed.

Next, the light-emitting layer 913 was formed on the hole-transport layer 912. The light-emitting layer 913 was formed by co-evaporation of 4,8-bis[3-(dibenzothiophen-4-yl)phenyl]-[1]benzofuro[3,2-d]pyrimidine (abbreviation: 4,8mDBtP2Bfpm), 9-(2-naphthyl)-9'-phenyl-9H,9'H-3,3'-bicarbazole (abbreviation: βNCCP), and [2-d3-methyl-(2-pyridinyl-κN)benzofuro[2,3-b]pyridine-κC]bis[2-(2-pyridinyl-κN)phenyl-κC]iridium(III) (abbreviation: $Ir(ppy)_2$(mbfpypy-d3)) to a thickness of 40 nm using a resistance-heating method such that the weight ratio of 4,8mDBtP2Bfpm to βNCCP and $Ir(ppy)_2$(mbfpypy-d3) was 0.6:0.4:0.1.

Next, on the light-emitting layer 913, 2-{3-[3-(N-phenyl-9H-carbazol-3-yl)-9H-carbazol-9-yl]phenyl}dibenzo[f,h]quinoxaline (abbreviation: 2mPCCzPDBq) was deposited by evaporation to a thickness of 20 nm, and then 2,9-di(naphthalen-2-yl)-4,7-diphenyl-1,10-phenanthroline (abbreviation: NBPhen) was deposited by evaporation to a thickness of 15 nm to form the electron-transport layer 914.

Here, the device 4A and the comparative device 4B were exposed to the air for one hour. The device 4A was exposed to the air under orange light irradiation. The comparative device 4B was exposed to the air while being in a black box having a light shielding property so as not to be irradiated with light. The table below shows the irradiation conditions. The comparative device 4C used as a reference was not exposed to the air and not irradiated with orange light (in other words, the device was fabricated in a continuous vacuum process).

TABLE 8

| | Exposure to the air (1 h) | Irradiated light |
|---|---|---|
| Device 4A | Performed | Orange light |
| Comparative device 4B | Performed | Not irradiated |
| Comparative device 4C | Not performed | Not irradiated |

Next, the device 4A and the comparative device 4B were subjected to vacuum baking at 80° C. for 60 minutes under a reduced pressure of approximately $10^{-4}$ Pa. After that, natural cooling was performed. The comparative device 4C was not subjected to the vacuum baking.

Then, on the electron-transport layer 914, lithium fluoride (LiF) and ytterbium (Yb) were deposited by co-evaporation to a thickness of 2 nm such that the volume ratio of LiF to Yb was 1:1 to form the electron-injection layer 915.

Subsequently, on the electron-injection layer 915, Ag and Mg were deposited by co-evaporation to a thickness of 20 nm such that the volume ratio of Ag to Mg was 1:0.1 to form the second electrode 902. Note that the second electrode 902 was a semi-transmissive and semi-reflective electrode having functions of transmitting light and reflecting light.

After that, 4,4',4''-(benzene-1,3,5-triyl)tri(dibenzothiophene) (abbreviation: DBT3P-II) was deposited by evaporation to a thickness of 70 nm as a cap layer.

Through the above steps, the device 4A, the comparative device 4B, and the comparative device 4C were fabricated.

<Characteristics of Devices>

Measurements of the device 4A irradiated with orange light, the comparative device 4B, and the comparative device 4C were performed. Before the measurements, each of the device 4A, the comparative device 4B, and the comparative device 4C was transferred from a vacuum chamber to a glove box containing a nitrogen atmosphere, and sealed using a glass substrate in the glove box containing a nitrogen atmosphere so as not to be exposed to the air (a sealing material was applied to surround the device and UV treatment and heat treatment at 80° C. for 1 hour were performed at the time of sealing).

Figure 50:
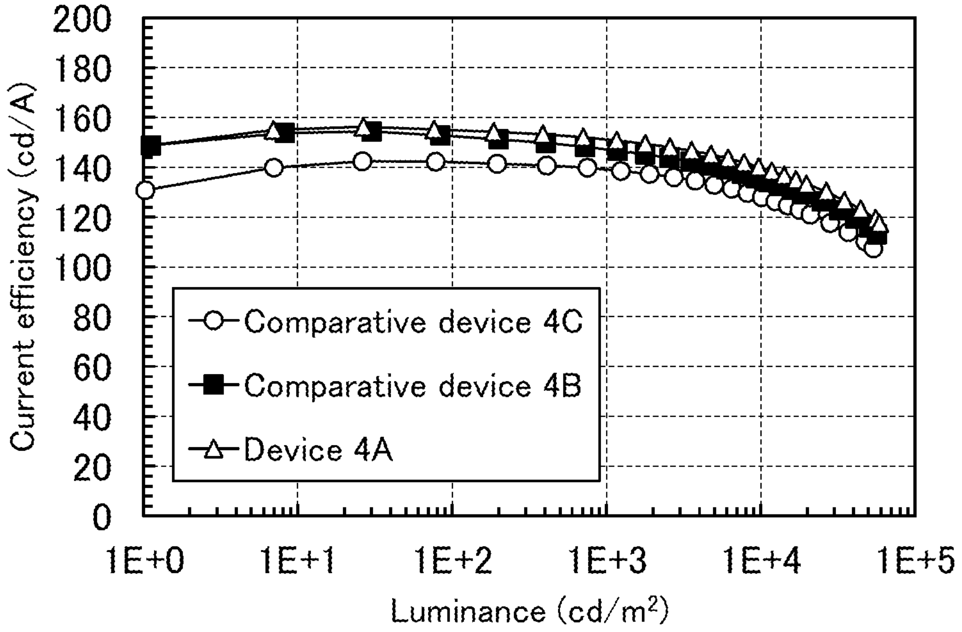
FIG. 50 shows the current efficiency-luminance characteristics of a sample in Example.
Figure 51:
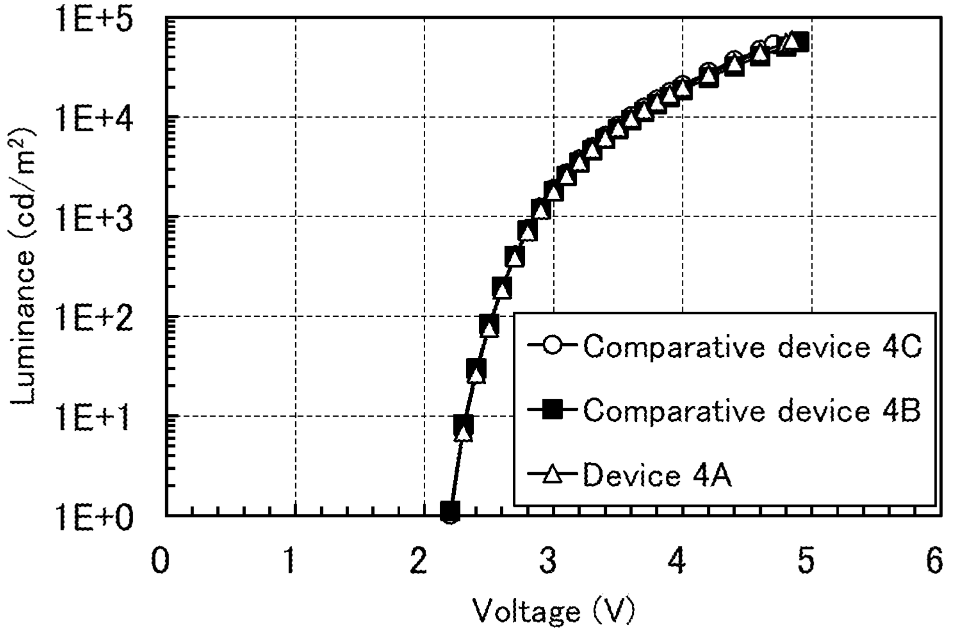
FIG. 51 shows the luminance-voltage characteristics of a sample in Example.
Figure 52:
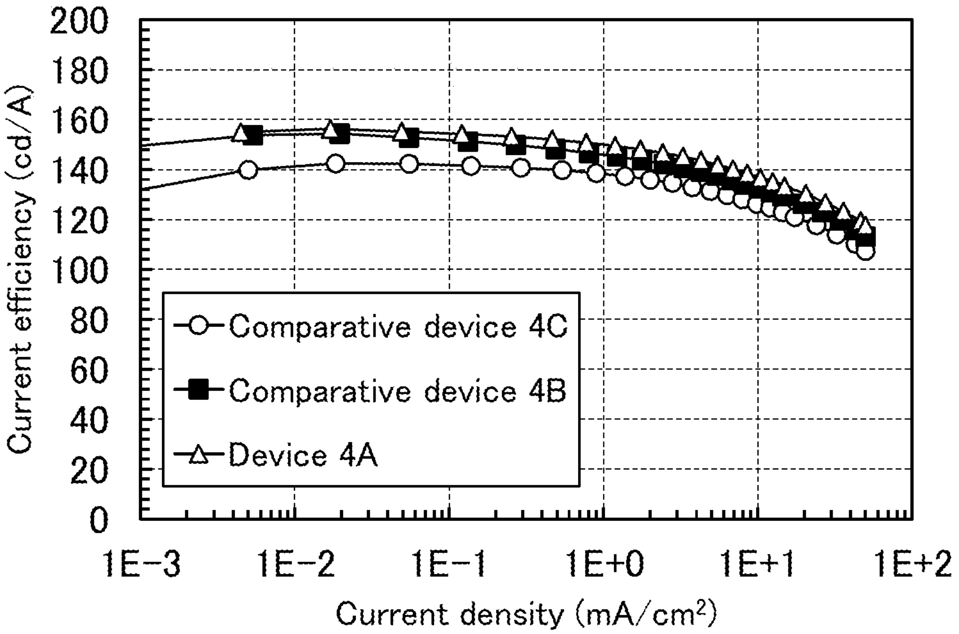
FIG. 52 shows the current efficiency-current density characteristics of a sample in Example.
Figure 53:
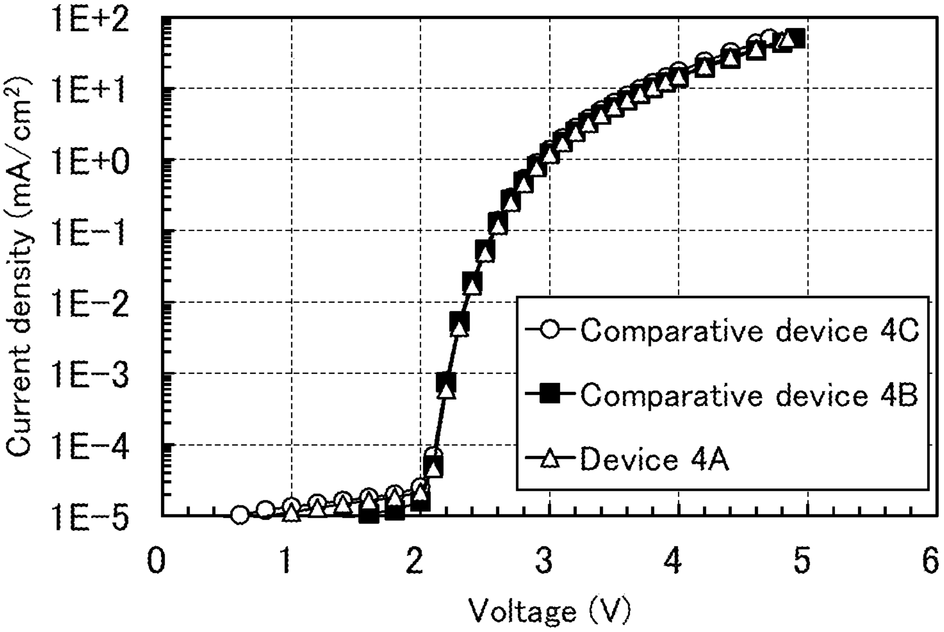
FIG. 53 shows the current density-voltage characteristics of a sample in Example.
Figure 54:
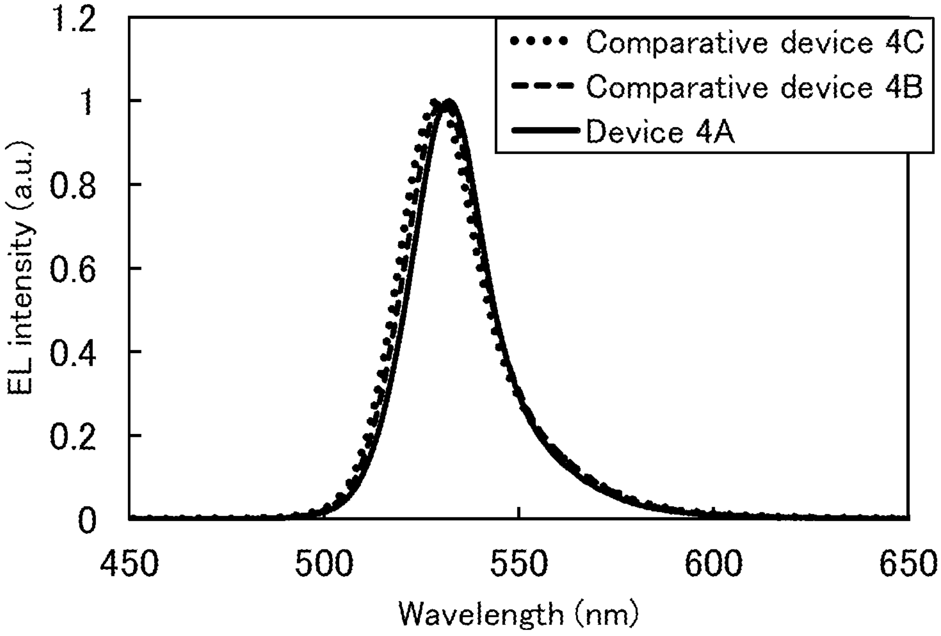
FIG. 54 shows the EL intensity spectrum of a sample in Example.

FIG. 50 shows the current efficiency-luminance characteristics of the device 4A, the comparative device 4B, and the comparative device 4C, FIG. 51 shows the luminance-voltage characteristics of the devices, FIG. 52 shows the current efficiency—current density characteristics of the devices, FIG. 53 shows the current density-voltage characteristics of the devices, and FIG. 54 shows the emission spectra of the devices. Note that luminance, CIE chromaticity, and the emission spectra were measured with a spectroradiometer (SR-UL1R manufactured by TOPCON TECHNOHOUSE CORPORATION).

The results in FIGS. 50 to 54 indicate that the device 4A and the comparative device 4B have characteristics equivalent to those of the comparative device 4C fabricated in a continuous vacuum process.

<Reliability Test Results>

Figure 55:
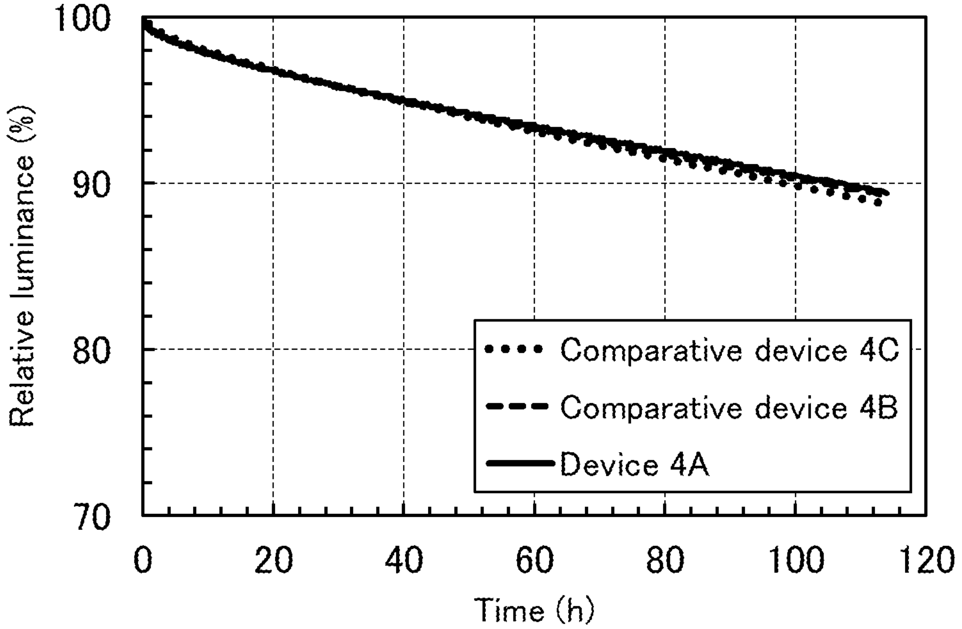
FIG. 55 shows the normalized luminance-time relationships of a sample in Example.

Reliability tests were performed on the device 4A, the comparative device 4B, and the comparative device 4C. FIG. 55 shows time-dependent changes in luminance (%) at the time of constant current density driving (50 [$mA/cm^2$]) when the luminance at the start of light emission is regarded as 100%.

The results in FIG. 55 indicate that the device 4A and the comparative device 4B have characteristics equivalent to those of the comparative device 4C fabricated in a continuous vacuum process.

The table below shows the normalized luminance (%) after 100-hour driving and the voltage change (V) due to the 100-hour driving.

TABLE 9

| | Value after 100-hour driving | |
|---|---|---|
| | Relative luminance [%] | Voltage change [V] |
| Device 4A | 91 | 0.08 |
| Comparative device 4B | 90 | 0.04 |
| Comparative device 4C | 90 | 0.07 |

FIG. 55 indicates that the device 4A, even though being irradiated with orange light in the air atmosphere, can have characteristics equivalent to those of the comparative device 4B not irradiated with orange light and the comparative device 4C fabricated in a continuous vacuum process without a decrease in reliability.

In other words, it is found that the device 4A does not deteriorate even when supplied with light energy in an air atmosphere containing oxygen.

Figure 56:
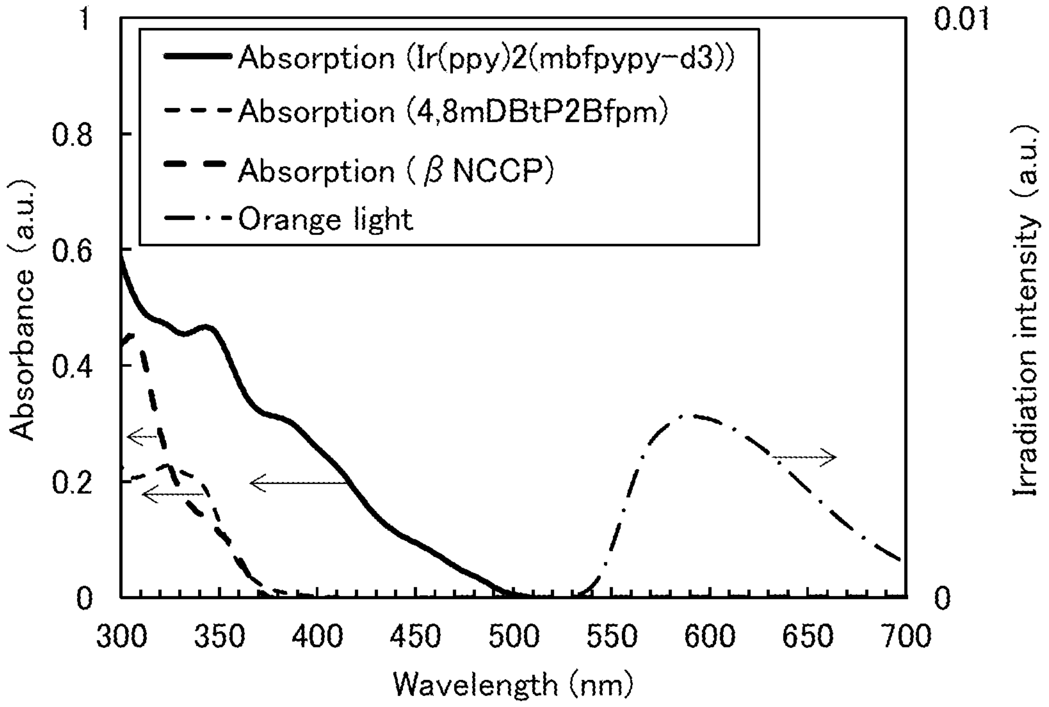
FIG. 56 shows the emission spectrum and the absorption spectra of a sample in Example.

FIG. 56 shows the absorption spectra of the organic compounds used for the light-emitting layer 913 and the emission spectrum of the irradiated orange light. Note that for the measurement of the absorption spectrum of $Ir(ppy)_2$(mbfpypy-d3), a dichloromethane solution was formed. For the measurement of the absorption spectra of the other organic compounds, a thin film of each organic compound was formed to a thickness of 50 nm over a quartz substrate.

FIG. 56 indicates that a compound having the longest-wavelength absorption edge among the organic compounds contained in the light-emitting layer is $Ir(ppy)_2$(mbfpypy-d3). The absorption edge of the compound is at 522 nm. The shortest-wavelength peak of the orange light is positioned at 588 nm. The orange light does not have a spectrum at a wavelength shorter than or equal to 530 nm.

The absorption edge of $Ir(ppy)_2$(mbfpypy-d3) is positioned at a wavelength shorter than the longest-wavelength peak of the orange light. Note that the absorption edge is determined as the intersection of a tangent and the lateral axis (representing wavelength) or the baseline. The tangent is drawn at the half maximum of the longest-wavelength peak (or the longest-wavelength shoulder peak) of the absorption spectrum on a longer wavelength side.

The above indicate that the device 4A does not deteriorate because the longest-wavelength peak in the emission spectrum of the orange light is positioned at a wavelength longer than the wavelength of the absorption edge of $Ir(ppy)_2$(mbfpypy-d3). Thus, it is found that a highly reliable device can be fabricated even when the device is exposed to an air atmosphere as long as irradiation of light with a wavelength that is absorbed by the organic compound used for the light-emitting layer is reduced in an environment where the device is fabricated.

Example 5

In this example, a device 5A, which is one embodiment of the present invention described in the above embodiment, and a comparative device 5B were fabricated. Evaluation results of the characteristics of the devices will be described in this example.

Structural formulae of organic compounds used for each of the device 5A and the comparative device 5B are shown below.

[Chemical Formula 6]

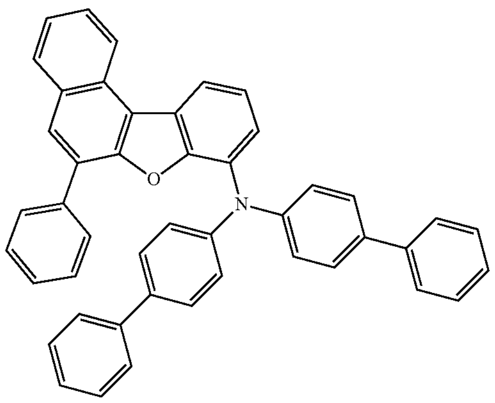

BBABnf

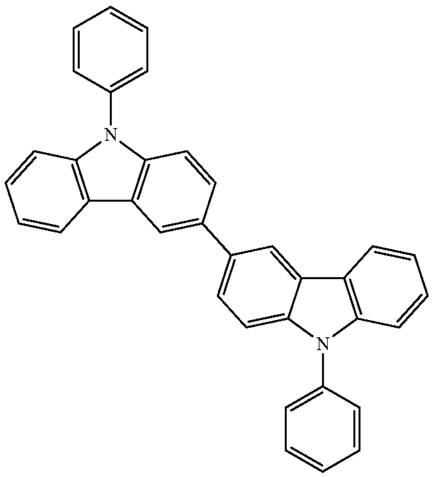

PCCP

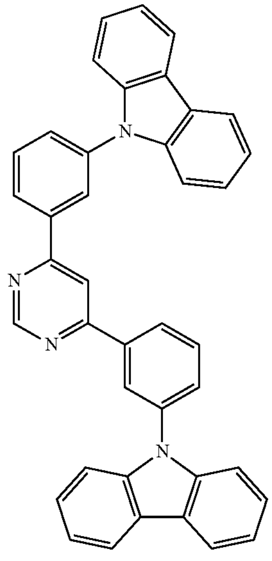

4,6mCzP2Pm

-continued

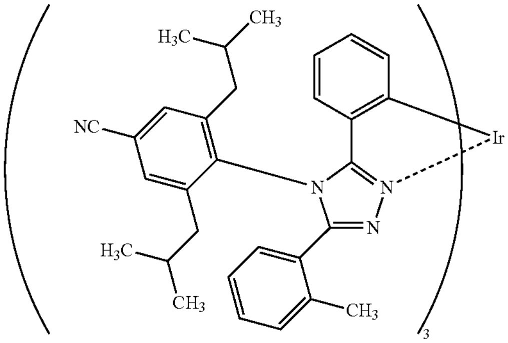

Ir(mpptz-diBuCNp)3

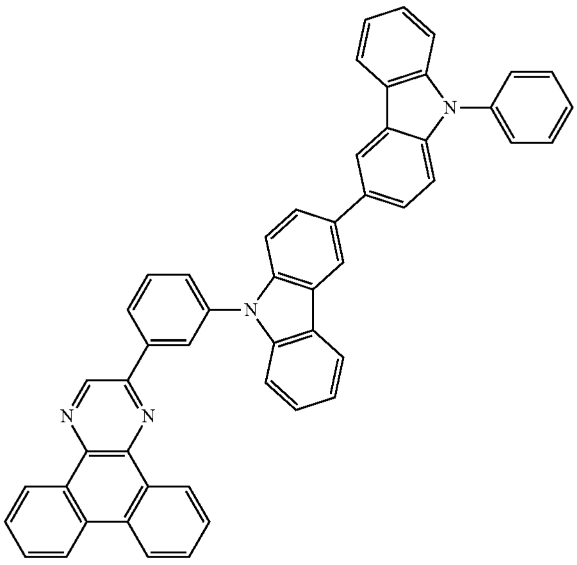

2mPCCzPDBq

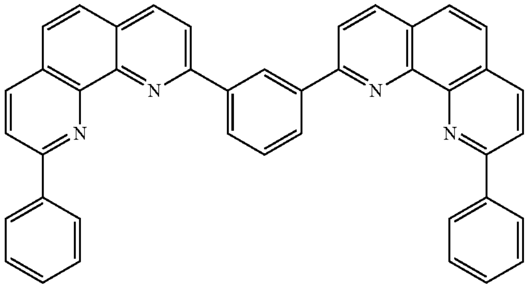

mPPhen2P

-continued

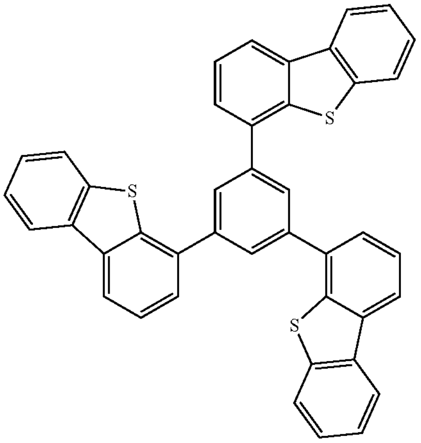

DBT3P-II

The structures of the device 5A and the comparative device 5B are shown in the table below.

TABLE 10

| | Film thickness [nm] | Material |
|---|---|---|
| Cap layer | 70 | DBT3P-II |
| Second electrode | 15 | Ag:Mg (1:0.1) |
| Electron-injection layer | 1.5 | LiF:Yb (2:1) |
| Electron-transport layer | 15 | mPPhen2P |
| | 10 | 2mPCCzPDBq |
| Light-emitting layer | 10 | 4,6mCzP2Pm:PCCP:Ir(mpptz-diBuCNp)$_3$ (0.8:0.2:0.06) |
| | 30 | 4,6mCzP2Pm:PCCP:Ir(mpptz-diBuCNp)$_3$ (0.5:0.5:0.06) |
| Hole-transport layer | 20 | PCCP |
| | 40 | BBABnf |
| Hole-injection layer | 10 | BBABnf:OCHD-003 (1:0.10) |
| First electrode | 85 | ITSO |
| | 100 | Ag |

<Method for Fabricating Devices>

In each of the device 5A and the comparative device 5B, as illustrated in FIG. 24, the hole-injection layer 911, the hole-transport layer 912, the light-emitting layer 913, the electron-transport layer 914, and the electron-injection layer 915 were stacked in this order on the first electrode 901 formed on the glass substrate 900, and the second electrode 902 was stacked on the electron-injection layer 915.

First, silver (Ag) was deposited on the glass substrate 900 by a sputtering method and then indium oxide-tin oxide containing silicon or silicon oxide (abbreviation: ITSO) was deposited thereon by a sputtering method, whereby the first electrode 901 was formed. Note that the thickness of Ag was 100 nm, the thickness of ITSO was 85 nm, and the electrode area was 4 $mm^2$ (2 mm×2 mm).

Next, in pretreatment for forming each of the device 5A and the comparative device 5B on the substrate, the surface of the substrate was washed with water and baking was performed at 200° C. for one hour. Then, the substrate was transferred into a vacuum evaporation apparatus where the pressure was reduced to approximately $10^{-4}$ Pa, and vacuum baking was performed at 170° C. for 30 minutes in a heating chamber of the vacuum evaporation apparatus. After that, natural cooling was performed for approximately 30 minutes.

Then, the substrate provided with the first electrode 901 was fixed to a substrate holder provided in the vacuum evaporation apparatus such that the surface on which the first electrode 901 was formed faced downward. On the first electrode 901, N,N-bis(4-biphenyl)-6-phenylbenzo[b]naphtho[1,2-d]furan-8-amine (abbreviation: BBABnf) and an electron acceptor material containing fluorine having a molecular weight of 672 (abbreviation: OCHD-003) were deposited by co-evaporation using a resistance-heating method to a thickness of 10 nm such that the weight ratio of BBABnf to OCHD-003 was 1:0.10, whereby the hole-injection layer 911 was formed.

Subsequently, on the hole-injection layer 911, BBABnf was deposited to a thickness of 40 nm by evaporation and then 9,9'-diphenyl-9H,9'H-3,3'-bicarbazole (abbreviation: PCCP) was deposited to a thickness of 20 nm by evaporation, whereby the hole-transport layer 912 was formed.

Next, the light-emitting layer 913 was formed on the hole-transport layer 912. The light-emitting layer 913 was formed by co-evaporation of 4,6-bis[3-(9H-carbazol-9-yl)phenyl]pyrimidine (abbreviation: 4,6mCzP2Pm), 9,9'-diphenyl-9H,9'H-3,3'-bicarbazole (abbreviation: PCCP), and tris{2-[4-(4-cyano-2,6-diisobutylphenyl)-5-(2-methylphenyl)-4H-1,2,4-triazol-3-yl-κ$N^2$]phenyl-κC}iridium(III) (abbreviation: $Ir(mpptz\text{-}diBuCNp)_3$) to a thickness of 30 nm using a resistance-heating method such that the weight ratio of 4,6mCzP2Pm to PCCP and $Ir(mpptz\text{-}diBuCNp)_3$ was 0.5:0.5:0.06 and then to a thickness of 10 nm using a resistance-heating method such that the weight ratio of 4,6mCzP2Pm to PCCP and $Ir(mpptz\text{-}diBuCNp)_3$ was 0.8:0.2:0.06.

Next, on the light-emitting layer 913, 2-{3-[3-(N-phenyl-9H-carbazol-3-yl)-9H-carbazol-9-yl]phenyl}dibenzo[f,h]quinoxaline (abbreviation: 2mPCCzPDBq) was deposited by evaporation to a thickness of 10 nm, and then 2,2'-(1,3-phenylene)bis(9-phenyl-1,10-phenanthroline) (abbreviation: mPPhen2P) was deposited by evaporation to a thickness of 15 nm to form the electron-transport layer 914.

Here, the device 5A was exposed to the air for one hour under orange light irradiation and then was subjected to vacuum baking at 110° C. for 60 minutes under a reduced pressure of approximately $10^{-4}$ Pa. After that, natural cooling was performed. The comparative device 5B used as a reference was not exposed to the air, not irradiated with orange light, and not subjected to vacuum baking (in other words, the device was fabricated in a continuous vacuum process).

TABLE 11

| | Exposure to the air (1 h) | Irradiated light |
|---|---|---|
| Device 5A | Performed | Orange light |
| Comparative device 5B | Not performed | Not irradiated |

Then, on the electron-transport layer 914, lithium fluoride (LiF) and ytterbium (Yb) were deposited by co-evaporation to a thickness of 1.5 nm such that the volume ratio of LiF to Yb was 1:1 to form the electron-injection layer 915.

Subsequently, on the electron-injection layer 915, Ag and Mg were deposited by co-evaporation to a thickness of 15 nm such that the volume ratio of Ag to Mg was 1:0.1 to form the second electrode 902. Note that the second electrode 902 was a semi-transmissive and semi-reflective electrode having functions of transmitting light and reflecting light.

After that, 4,4',4"-(benzene-1,3,5-triyl)tri(dibenzothiophene) (abbreviation: DBT3P-II) was deposited by evaporation to a thickness of 70 nm as a cap layer.

Through the above steps, the device 5A and the comparative device 5B were fabricated.

<Characteristics of Devices>

The emission characteristics of the device 5A irradiated with orange light and the comparative device 5B were measured. Before the measurements, each of the device 5A and the comparative device 5B was sealed using a glass substrate in a glove box containing a nitrogen atmosphere so as not to be exposed to the air (a sealing material was applied to surround the device and UV treatment and heat treatment at 80° C. for 1 hour were performed at the time of sealing).

Figure 57:
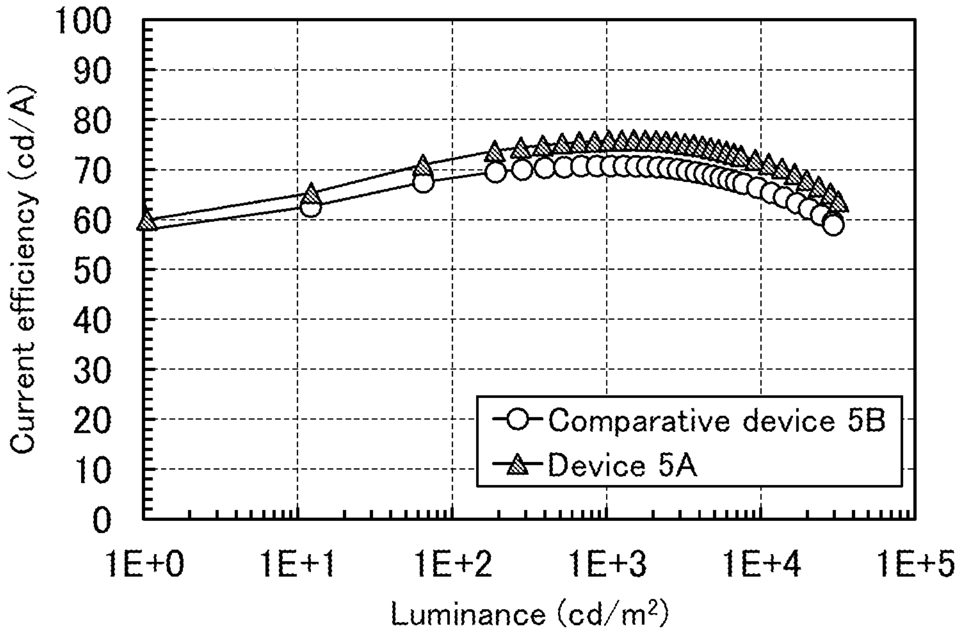
FIG. 57 shows the current efficiency-luminance characteristics of a sample in Example.
Figure 58:
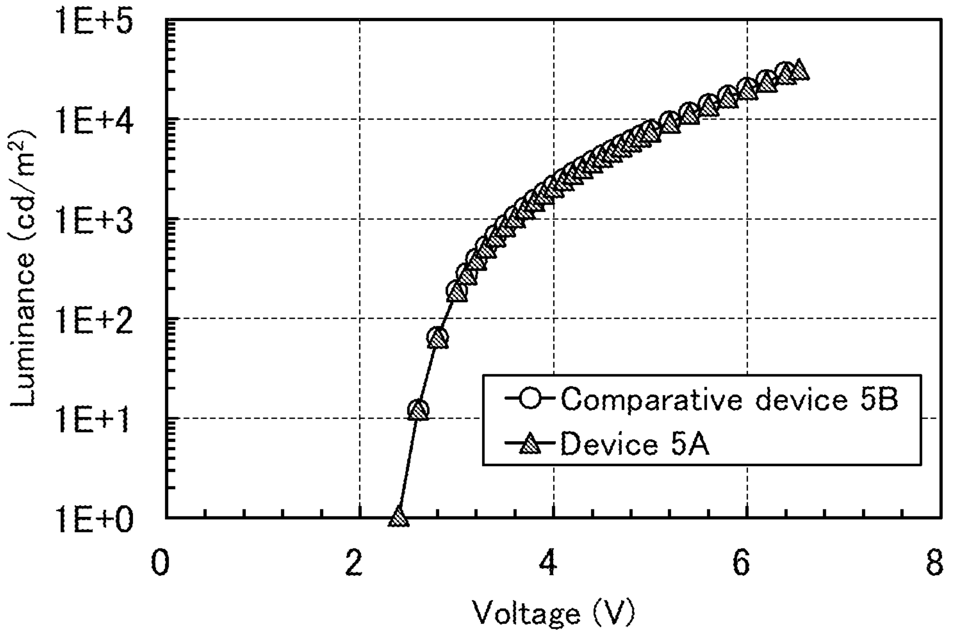
FIG. 58 shows the luminance-voltage characteristics of a sample in Example.
Figure 59:
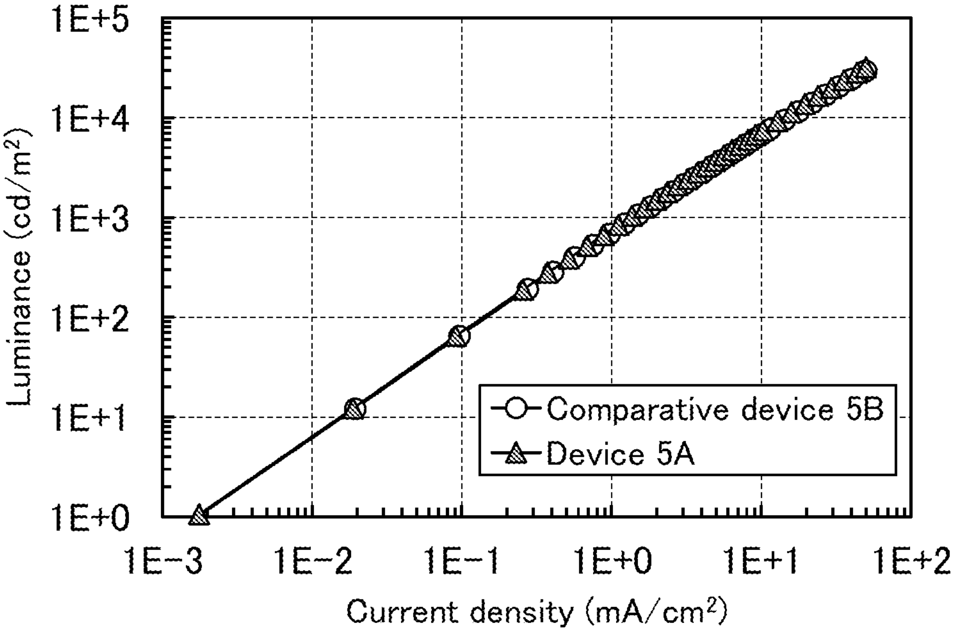
FIG. 59 shows the luminance-current density characteristics of a sample in Example.
Figure 60:
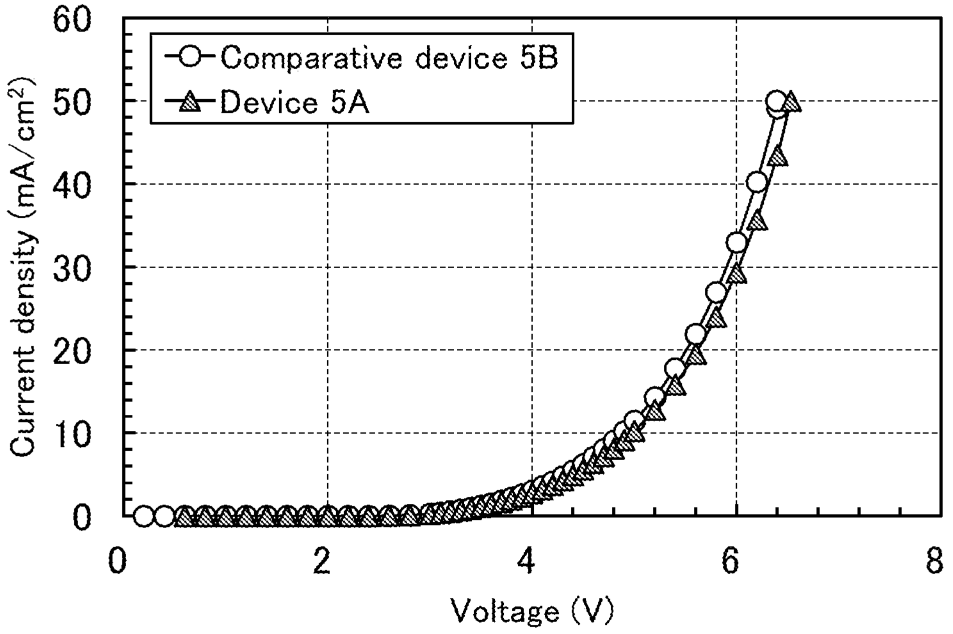
FIG. 60 shows the current density-voltage characteristics of a sample in Example.
Figure 61:
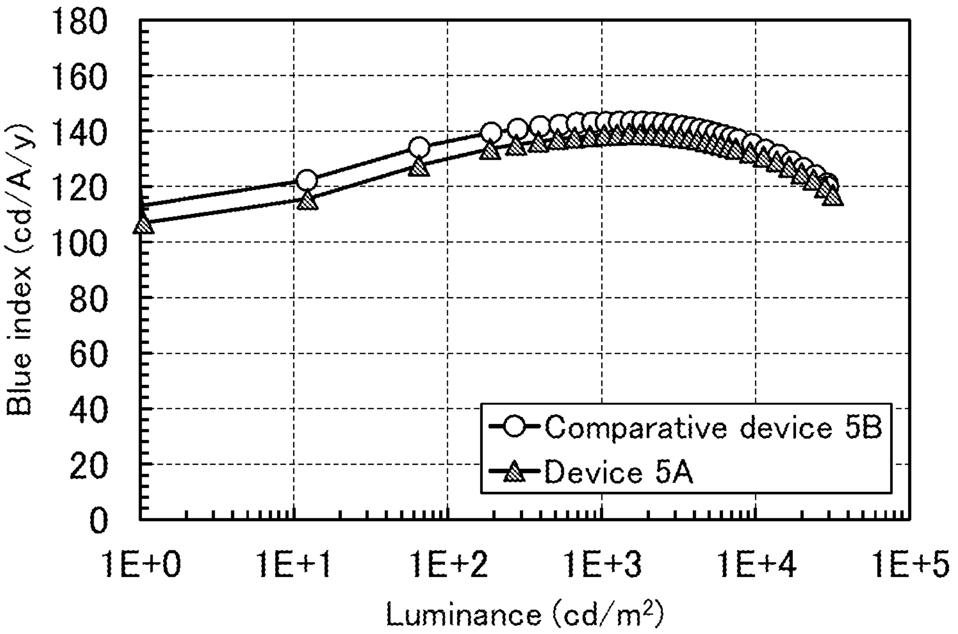
FIG. 61 shows the BI-luminance characteristics of a sample in Example.
Figure 62:
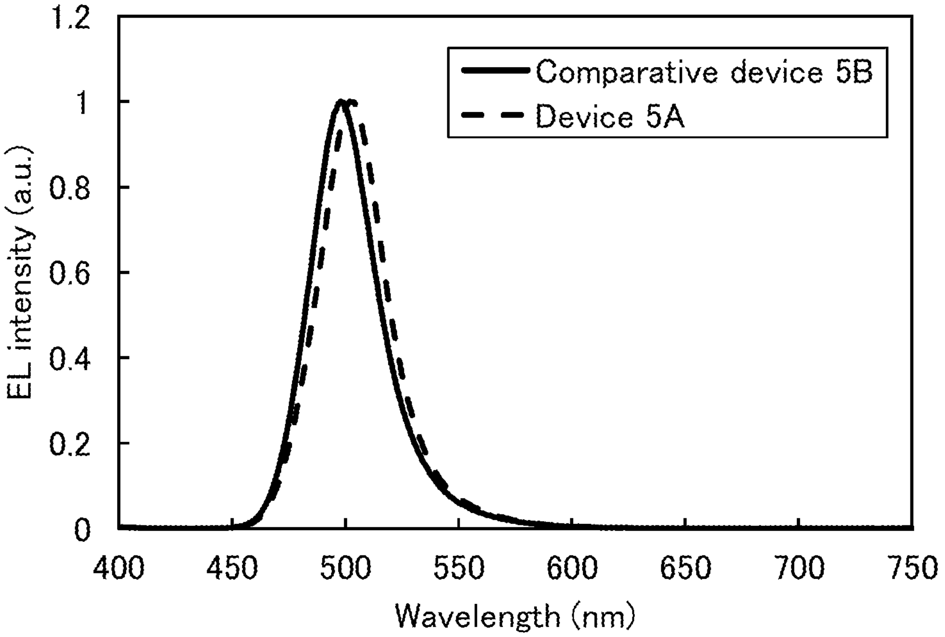
FIG. 62 shows the EL intensity spectrum of a sample in Example.

FIG. 57 shows the current efficiency-luminance characteristics of the device 5A and the comparative device 5B, FIG. 58 shows the luminance-voltage characteristics of the devices, FIG. 59 shows the luminance-current density characteristics of the devices, FIG. 60 shows the current density-voltage characteristics of the devices, FIG. 61 shows the blue index (BI)-luminance characteristics of the devices, and FIG. 62 shows the electric field emission spectra of the devices.

The table below shows the main characteristics of the device 5A and the comparative device 5B at a luminance of approximately 1000 cd/$m^2$. Note that luminance, CIE chromaticity, and the electroluminescence spectra were measured with a spectroradiometer (SR-UL1R manufactured by TOPCON TECHNOHOUSE CORPORATION).

TABLE 12

| | Voltage (V) | Current density (mA/$cm^2$) | Chromaticity x | Chromaticity y | Luminance (cd/$m^2$) | Current Efficiency (cd/A) | BI (cd/A/y) |
|---|---|---|---|---|---|---|---|
| Device 5A | 3.60 | 1.37 | 0.095 | 0.547 | 1036 | 75.8 | 139 |
| Comparative device 5B | 3.50 | 1.22 | 0.092 | 0.494 | 865 | 70.7 | 143 |

The results in FIGS. 57 to 62 and the above table indicate that the device 5A has characteristics equivalent to those of the comparative device 5B fabricated in a continuous vacuum process. The results also indicate that the device 5A is driven at a low voltage and emits light with high current efficiency. This is because the device 5A contains 4,6mCzP2Pm, which is an organic compound having a π-electron deficient heteroaromatic ring and having a high electron-transport property, and PCCP, which is an organic compound having a π-electron rich heteroaromatic ring and having a high hole-transport property, in its light-emitting layer, and 4,6mCzP2Pm and PCCP form an exciplex. Furthermore, the device 5A has regions with different concentration proportions of 4,6mCzP2Pm and PCCP in the light-emitting layer. In the light-emitting layer, the concentration proportion of PCCP is higher than or equal to that of 4,6mCzP2Pm in a region in contact with the hole-transport layer, and the concentration proportion of 4,6mCzP2Pm is higher than that of PCCP in a region in contact with the electron-transport layer. Accordingly, carrier recombination is more likely to occur in the light-emitting layer, which enables the device 5A to emit light with high current efficiency.

<Reliability Test Results>

Figure 63:
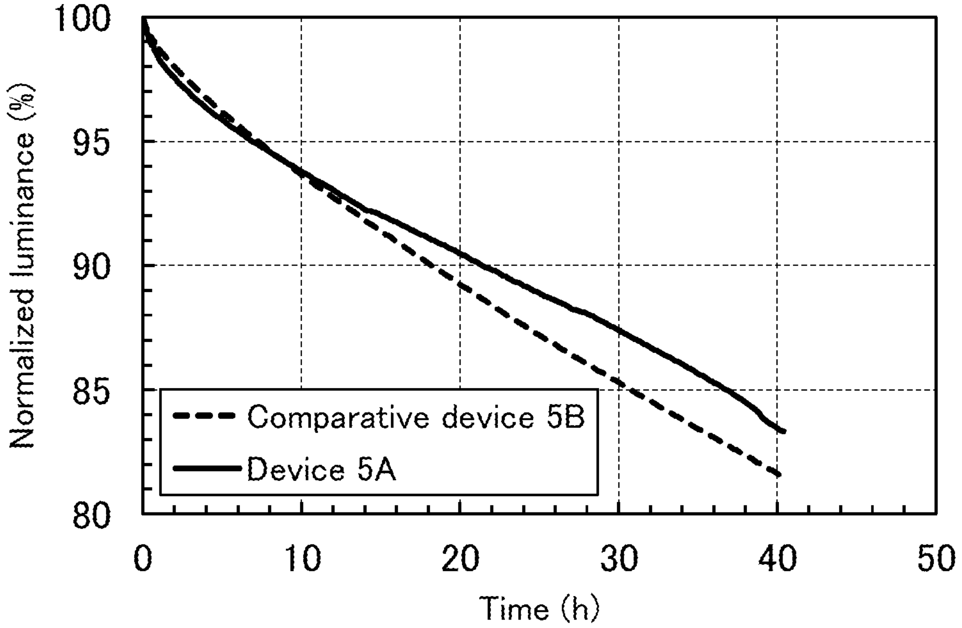
FIG. 63 shows the normalized luminance-time relationships of a sample in Example.

Reliability tests were performed on the device 5A and the comparative device 5B. FIG. 63 shows time-dependent changes in luminance (%) at the time of constant current density driving (10 [$mA/cm^2$]) when the luminance at the start of light emission is regarded as 100%.

FIG. 63 shows that the device 5A has higher reliability than the comparative device 5B fabricated in a continuous vacuum process. The values of LT90 (h), which is a time taken until the measurement luminance reduces to 90% of the initial luminance, of the device 5A and the comparative device 5B are 22 hours and 18 hours, respectively.

The results indicate that the device 5A, even though being irradiated with orange light in the air atmosphere, can have characteristics equivalent to those of the comparative device 5B fabricated in a continuous vacuum process without a decrease in reliability.

Figure 64:
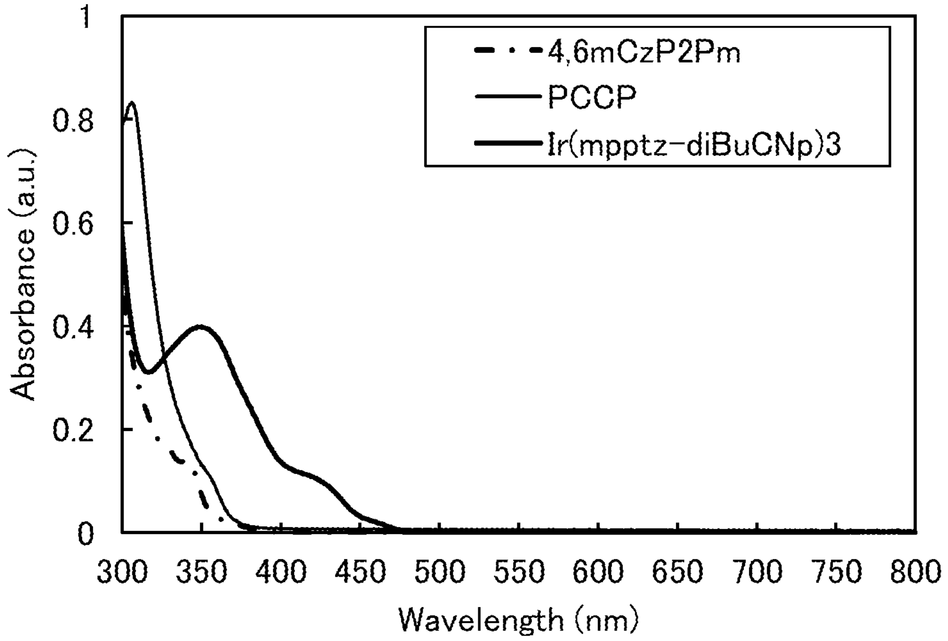
FIG. 64 shows the absorption spectra of a sample in Example.

FIG. 64 shows the absorption spectra of the organic compounds used for the light-emitting layer 913. Note that for the measurement of the absorption spectrum of Ir(mpptz-diBuCNp)$_3$, a dichloromethane solution was formed. For the measurement of the absorption spectra of the other organic compounds, a thin film of each organic compound was formed to a thickness of 50 nm over a quartz substrate.

Figure 65:
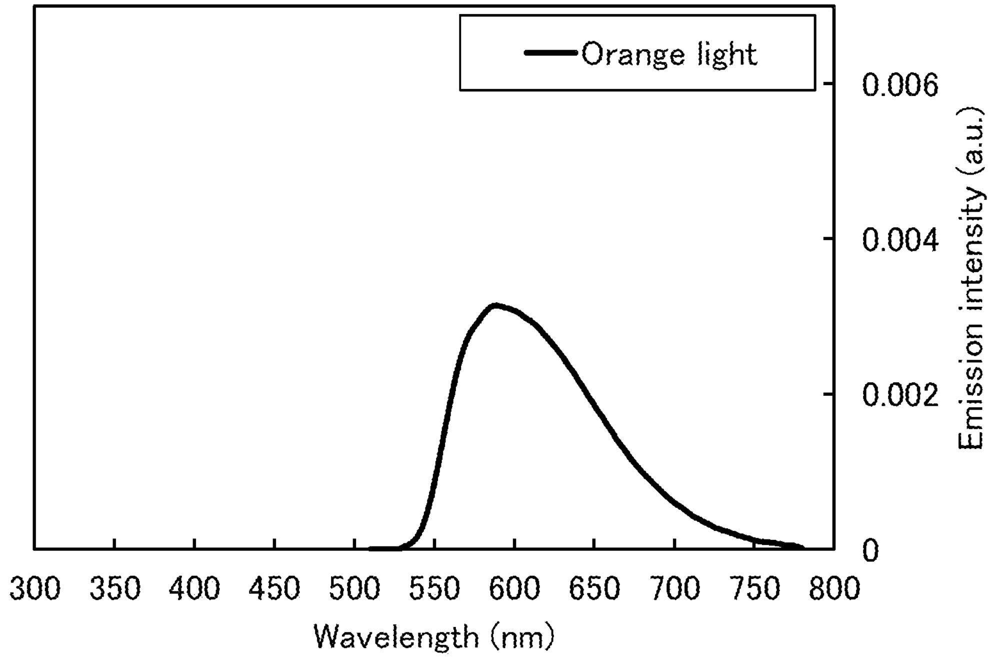
FIG. 65 shows the spectrum of orange light.

FIG. 64 indicates that a compound having the longest-wavelength absorption edge among the organic compounds contained in the light-emitting layer is Ir(mpptz-diBuCNp)$_3$. The absorption edge of the compound is at 478 nm. As apparent from the spectrum of the orange light shown in FIG. 65, the shortest-wavelength peak of the orange light is positioned at 588 nm. The orange light does not have a spectrum at a wavelength shorter than or equal to 530 nm.

The absorption edge of Ir(mpptz-diBuCNp)$_3$ is positioned at a wavelength shorter than the longest-wavelength peak of the orange light. Note that the absorption edge is determined as the intersection of a tangent and the lateral axis (representing wavelength) or the baseline. The tangent is drawn at the half maximum of the longest-wavelength peak (or the longest-wavelength shoulder peak) of the absorption spectrum on a longer wavelength side.

The above indicate that the device 5A does not deteriorate because the longest-wavelength peak in the emission spectrum of the orange light is positioned at a wavelength longer than the wavelength of the absorption edge of Ir(mpptz-diBuCNp)$_3$. Thus, it is found that a highly reliable device can be fabricated even when the device is exposed to an air atmosphere as long as irradiation of light with a wavelength that is absorbed by the organic compound used for the light-emitting layer is reduced in an environment where the device is fabricated.

This application is based on Japanese Patent Application Serial No. 2022-067439 filed with Japan Patent Office on Apr. 15, 2022 and Japanese Patent Application Serial No. 2022-107645 filed with Japan Patent Office on Jul. 4, 2022, the entire contents of which are hereby incorporated by reference.

What is claimed is:

1. A method for fabricating a light-emitting device, comprising the steps of:
- forming a light-emitting layer comprising organic compounds over a substrate provided with a first electrode;
- holding the substrate in lighting of a light source whose shortest-wavelength peak among spectrum peaks is positioned at a wavelength longer than a longest-wavelength absorption edge among absorption edges in absorption spectra of the organic compounds;
- forming a sacrificial layer over the light-emitting layer under the lighting;
- processing at least the light-emitting layer into an island shape by a lithography method under the lighting; and
- forming a second electrode over the light-emitting layer under the lighting.

2. The method for fabricating the light-emitting device, according to claim 1,
- wherein at least part of the sacrificial layer over the light-emitting layer is removed, and
- wherein the substrate is held under the lighting after the removement.

3. The method for fabricating the light-emitting device, according to claim 1, wherein an organic compound that has the longest-wavelength absorption edge among the organic compounds comprised in the light-emitting layer emits fluorescent light.

4. The method for fabricating the light-emitting device, according to claim 1, wherein an organic compound that has the longest-wavelength absorption edge among the organic compounds comprised in the light-emitting layer is not a complex.

5. The method for fabricating the light-emitting device, according to claim 1, wherein a HOMO level of an organic compound that has the longest-wavelength absorption edge among the organic compounds comprised in the light-emitting layer is higher than or equal to −5.8 eV.

6. The method for fabricating the light-emitting device, according to claim 1, wherein the substrate is held in an atmosphere comprising oxygen.

7. A method for fabricating a light-emitting device, comprising the steps of:
- forming a light-emitting layer over a substrate provided with a first electrode;
- holding the substrate in lighting of a light source whose shortest-wavelength peak among spectrum peaks is positioned at a wavelength longer than or equal to 480 nm;
- forming a sacrificial layer over the light-emitting layer under the lighting;
- processing at least the light-emitting layer into an island shape by a lithography method under the lighting; and
- forming a second electrode over the light-emitting layer under the lighting.

8. The method for fabricating the light-emitting device, according to claim 7,
- wherein at least part of the sacrificial layer over the light-emitting layer is removed, and
- wherein the substrate is held under the lighting after the removement.

9. The method for fabricating the light-emitting device, according to claim 7, wherein the shortest-wavelength peak among the spectrum peaks of the light source is positioned at a wavelength longer than or equal to 500 nm.

10. The method for fabricating the light-emitting device, according to claim 7, wherein the shortest-wavelength peak among the spectrum peaks of the light source is positioned at a wavelength longer than or equal to 550 nm.

11. The method for fabricating the light-emitting device, according to claim 7, wherein the substrate is held in an atmosphere comprising oxygen.

12. A method for fabricating a light-emitting device, comprising the steps of:

forming a light-emitting layer over a substrate provided with a first electrode;

holding the substrate under an illuminance less than or equal to 120 lux;

forming a sacrificial layer over the light-emitting layer under the illuminance;

processing at least the light-emitting layer into an island shape by a lithography method under the illuminance; and forming a second electrode over the light-emitting layer under the illuminance.

13. The method for fabricating the light-emitting device, according to claim 12, wherein at least part of the sacrificial layer over the light-emitting layer is removed, and wherein the substrate is held under the illuminance after the removement.

14. The method for fabricating the light-emitting device, according to claim 12, wherein the illuminance is less than or equal to 10 lux.

15. The method for fabricating the light-emitting device, according to claim 12, wherein the substrate is held in an atmosphere comprising oxygen in the holding step.

16. The method for fabricating the light-emitting device, according to claim 1, wherein the steps of forming the sacrificial layer over the light-emitting layer and processing at least the light-emitting layer into the island shape by the lithography method are performed after the step of forming the light-emitting layer comprising the organic compounds over the substrate provided with the first electrode, and wherein a step of removing at least part of the sacrificial layer over the light-emitting layer is performed between the step of processing at least the light-emitting layer into the island shape by the lithography method and the step of holding the substrate in the lighting.

17. The method for fabricating the light-emitting device, according to claim 7, wherein the steps of forming the sacrificial layer over the light-emitting layer and processing at least the light-emitting layer into the island shape by the lithography method are performed after the step of forming the light-emitting layer over the substrate provided with the first electrode, and wherein a step of removing at least part of the sacrificial layer over the light-emitting layer is performed between the step of processing at least the light-emitting layer into the island shape by the lithography method and the step of holding the substrate in the lighting.

18. The method for fabricating the light-emitting device, according to claim 12, wherein the steps of forming the sacrificial layer over the light-emitting layer and processing at least the light-emitting layer into the island shape by the lithography method are performed after the step of forming the light-emitting layer over the substrate provided with the first electrode, and wherein a step of removing at least part of the sacrificial layer over the light-emitting layer is performed between the step of processing at least the light-emitting layer into the island shape by the lithography method and the step of holding the substrate in the illuminance.

19. The method for fabricating the light-emitting device, according to claim 1, wherein the light-emitting layer is formed under the lighting.

* * * * *